United States Patent
Kawabata et al.

(10) Patent No.: US 8,603,727 B2
(45) Date of Patent: Dec. 10, 2013

(54) ACTIVE LIGHT RAY SENSITIVE OR RADIOACTIVE RAY SENSITIVE RESIN COMPOSITION, AND ACTIVE LIGHT RAY SENSITIVE OR RADIOACTIVE RAY SENSITIVE FILM AND PATTERN FORMING METHOD USING THE SAME

(75) Inventors: Takeshi Kawabata, Shizuoka (JP); Hidenori Takahashi, Shizuoka (JP); Tomotaka Tsuchimura, Shizuoka (JP); Shuji Hirano, Shizuoka (JP); Hideaki Tsubaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 119 days.

(21) Appl. No.: 13/252,657

(22) Filed: Oct. 4, 2011

(65) Prior Publication Data

US 2012/0082939 A1 Apr. 5, 2012

(30) Foreign Application Priority Data

Oct. 5, 2010 (JP) ................ P2010-225993

(51) Int. Cl.
- *G03F 7/00* (2006.01)
- *G03F 7/004* (2006.01)
- *G03F 7/26* (2006.01)

(52) U.S. Cl.
USPC ...................... 430/270.1; 430/322

(58) Field of Classification Search
USPC ...................................... 430/270.1
See application file for complete search history.

(56) References Cited

U.S. PATENT DOCUMENTS

| | | | |
|---|---|---|---|
| 5,945,250 A | 8/1999 | Aoai et al. | |
| 6,919,161 B2* | 7/2005 | Hatakeyama et al. | 430/270.1 |
| 6,977,131 B2* | 12/2005 | Tao | 430/270.1 |
| 7,026,098 B2 | 4/2006 | Komatsu et al. | |
| 7,078,147 B2* | 7/2006 | Harada et al. | 430/270.1 |
| 7,125,642 B2* | 10/2006 | Harada et al. | 430/270.1 |
| 7,198,880 B2* | 4/2007 | Sasaki et al. | 430/270.1 |
| 7,335,456 B2* | 2/2008 | Li et al. | 430/270.1 |
| 7,378,216 B2* | 5/2008 | Kishimura et al. | 430/270.1 |
| 7,455,950 B2* | 11/2008 | Endo et al. | 430/270.1 |
| 7,569,326 B2* | 8/2009 | Ohsawa et al. | 430/270.1 |
| 7,812,105 B2 | 10/2010 | Nagai et al. | |
| 8,062,828 B2* | 11/2011 | Ohsawa et al. | 430/270.1 |
| 8,105,748 B2* | 1/2012 | Ohashi et al. | 430/270.1 |
| 8,329,379 B2* | 12/2012 | Ito et al. | 430/270.1 |
| 8,361,693 B2* | 1/2013 | Masunaga et al. | 430/270.1 |
| 2006/0121390 A1 | 6/2006 | Gonsalves | |
| 2009/0202940 A1* | 8/2009 | Hatakeyama et al. | 430/270.1 |
| 2011/0177453 A1 | 7/2011 | Masubuchi et al. | |
| 2011/0244392 A1* | 10/2011 | Hirano et al. | 430/270.1 |
| 2012/0094235 A1* | 4/2012 | Tsuchihashi et al. | 430/285.1 |
| 2012/0156618 A1* | 6/2012 | Takahashi et al. | 430/283.1 |

FOREIGN PATENT DOCUMENTS

| | | |
|---|---|---|
| JP | 9-325497 A | 12/1997 |
| JP | 10-221852 A | 8/1998 |
| JP | 2004-158287 A | 6/2004 |
| JP | 2006-178317 A | 7/2006 |
| JP | 2007-197718 A | 8/2007 |
| JP | 2007249056 A | 9/2007 |
| JP | 2008-162101 A | 7/2008 |
| JP | 2010095643 A | 4/2010 |
| JP | 2011158879 A | 8/2011 |
| WO | 2006/121096 A1 | 11/2006 |

OTHER PUBLICATIONS

Notice of Reasons for Rejection, dated Sep. 4, 2012, issued in corresponding JP Application No. 2010-225993, 8 pages in English and Japanese.

Notice of Reasons for Rejection, dated Jan. 29, 2013, issued in corresponding JP Application No. 2010-225993, 11 pages in English and Japanese.

\* cited by examiner

*Primary Examiner* — Amanda C. Walke

(74) *Attorney, Agent, or Firm* — Sughrue Mion, PLLC

(57) ABSTRACT

An active light ray sensitive or radioactive ray sensitive resin composition which satisfies high sensitivity, high resolution, good pattern configuration, and good line edge roughness at the same time to a great extent, while having sufficiently good outgassing performance during exposure, and an active light ray sensitive or radioactive ray sensitive film formed by using the composition, and a pattern-forming method, are provided. The active light ray sensitive or radioactive ray sensitive resin composition according to the present invention includes a resin (P) containing a repeating unit (A) which decomposes by irradiation with active light ray or radioactive ray to generate an acid, and a repeating unit (C) containing a primary or secondary hydroxyl group.

15 Claims, No Drawings

ACTIVE LIGHT RAY SENSITIVE OR RADIOACTIVE RAY SENSITIVE RESIN COMPOSITION, AND ACTIVE LIGHT RAY SENSITIVE OR RADIOACTIVE RAY SENSITIVE FILM AND PATTERN FORMING METHOD USING THE SAME

BACKGROUND OF THE INVENTION

1. Field of the Invention

The present invention relates to an active light ray sensitive or radioactive ray sensitive resin composition, and an active light ray sensitive or radioactive ray sensitive film and a pattern-forming method using the same. For example, the present invention relates to an active light ray sensitive or radioactive ray sensitive resin composition which is preferably used in super-micro-lithography processes such as the manufacture of a super LSI and a high-capacity microchip, and other photo-fabrication processes, and an active light ray sensitive or radioactive ray sensitive film and a pattern-forming method using the same.

2. Description of the Related Art

In a process for manufacturing semiconductor devices such as an IC, LSI, and the like, fine processing using lithography with a photoresist composition has been conventionally carried out. In recent years, ultrafine pattern configuration of a sub-micron region and a quarter micron region has been required in accordance with higher integration of integrated circuits. In such a circumstance, an exposure wavelength has also showed a tendency to become shorter such as from g rays to i rays, and further to KrF excimer laser rays. Further, besides KrF excimer laser rays, development of lithography using soft X-rays such as an electron beam, X-rays, EUV light, or the like has also been progressing recently.

In particular, electron beam lithography is positioned as a pattern-forming technique of the next generation or the next after the next generation, and a positive resist of high sensitivity and high resolution is desired. For shortening the processing time of wafers, increase of sensitivity is a particularly important problem. However, pursuit of higher sensitivity in a positive resist for electron beams is accompanied by not only lowering of resolving power but also deterioration of line edge roughness; accordingly development of a resist satisfying these characteristics at the same time is strongly desired. Here, line edge roughness means that, since the edge at the interface between the pattern of a resist and a substrate irregularly fluctuates in the perpendicular direction to the line direction due to the characteristics of the resist, an uneven edge is seen when the pattern is viewed just above. This unevenness is transferred to the substrate in the etching process of using the resist as a mask and deteriorates electric characteristics to lower the yield. In particular, in a super fine region of 0.25 μm or less, line edge roughness is an extremely important problem to be improved. High sensitivity, high resolution, good pattern configuration, and good line edge roughness are in a tradeoff relationship, and how to satisfy these characteristics at the same time is very important.

It is also an important problem to satisfy high sensitivity, high resolution, good pattern configuration, and good line edge roughness at the same time in lithography using X-rays or EUV light, and a solution thereof is required.

Furthermore, in the case of using a light source emitting EUV light, the wavelength of the light belonging to an extreme-ultraviolet region and the energy of the light is high. Therefore, unlike a conventional light source, the light source emitting EUV light bring about such a prominent outgassing problem that a compound in an active light ray sensitive or radioactive ray sensitive film is destroyed by fragmentation and volatizes as a low-molecular-weight component during exposure to contaminate the environment in the exposure device.

As a method for solving these problems, use of a resin having a photoacid generator in the polymer main chain or side chain is investigated (see JP1997-325497A (JPH09-325497A), JP1998-221852A (JPH10-221852A), JP2006-178317A, JP2007-197718A, WO06/121096A, and US2006/121390A).

However, in JP1997-325497A (JPH09-325497A), a mixed system including a resin having a photoacid generator and a dissolution inhibiting compound whose solubility in an alkali developing liquid is increased by acid decomposition is used, so that because of the heterogeneous mixing of these materials, it is difficult to realize desirable pattern configuration and line edge roughness.

Furthermore, JP1998-221852A (JPH10-221852A), JP2006-178317A, JP2007-197718A, WO06/121096A, and US2006/121390A disclose a resin containing in the same molecule both a photoacid generating group and a group whose solubility in an alkali developing liquid is increased by acid decomposition, but it does not seem quite proper to state that the sensitivity to electron beams, X-rays, or EUV light is satisfactory.

As for the techniques as described in JP1997-325497A (JPH09-325497A), JP1998-221852A (JPH10-221852A), JP2006-178317A, JP2007-197718A, WO06/121096A, and US2006/121390A, if an acid generating site corresponding to an acid generator is included in a resin, there is a tendency that miscibility of the acid generator with the resin is insufficient, or for example, an acid generated from the acid generator due to exposure expands to an unintended region (unexposed portion and the like), which leads to reduction in deterioration of resolution. In addition, since a low-molecular-weight acid generator is not present, for example, in the case of irradiation with EUV light, there is a tendency that outgassing generation derived from the low-molecular-weight component is further reduced. However, this technique also has a task particularly to further improve the sensitivity to an electron beam, X-rays, or EUV light.

Particularly, it is the present situation in which in addition to further improvement of resolution or outgassing characteristics, better performances in sensitivity, line edge roughness, and pattern configuration are also demanded at the same time, in electron beam, X-rays, or EUV light lithography.

Fine processing with a resist composition is not only directly used in the manufacture of integrated circuits but also is applied to the manufacture of a mold structure for what is called imprinting (see, for example, JP2004-158287A, JP2008-162101A, and "Fundamentals of nanoimprint and its technology development/application deployment-technology of nanoimprint substrate and its latest technology deployment" edited by Yoshihiko Hirai, published by Frontier Publishing (issued in June, 2006)). Therefore, even when X-rays, soft X-rays, or an electron beam is used as an exposure light source, it is an important problem to satisfy high sensitivity, high resolution, good pattern configuration, and good roughness characteristics at the same time, and a solution thereof is required.

SUMMARY OF THE INVENTION

It is an object of the present invention is to provide an active light ray sensitive or radioactive ray sensitive resin composition which satisfies high sensitivity, high resolution, good pattern configuration, and good line edge roughness at the same time to a great extent while having sufficiently good outgassing performance during exposure, and an active light ray sensitive or radioactive ray sensitive film and a pattern-forming method using the same.

The active light ray sensitive or radioactive ray sensitive resin composition of the present invention for solving the above-described problems is characterized in that it includes a resin (P) containing a repeating unit (A) which decomposes by irradiation with the active light ray or the radioactive ray to generate an acid and a repeating unit (C) containing a primary or secondary hydroxyl group.

In the present invention, it is a preferable embodiment that the repeating unit (C) be represented by the following general formula (IV).

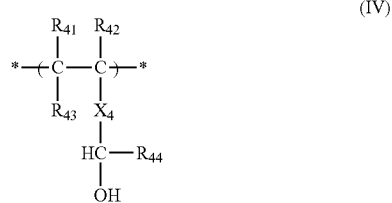

In the formula, each of $R_{41}$, $R_{42}$, and $R_{43}$ independently represents a hydrogen atom, an alkyl group, a monovalent aliphatic hydrocarbon ring group, a halogen atom, a cyano group, or an alkoxycarbonyl group. $R_{43}$ may be combined with $X_4$ to form a ring, and in this case, $R_{43}$ represents an alkylene group.

$R_{44}$ represents a hydrogen atom or a monovalent substituent. $R_{44}$ may be combined with $X_4$ to form a ring, and in this case, $R_{44}$ represents an alkylene group.

$X_4$ represent a linking group.

Furthermore, it is another preferable embodiment that the repeating unit (C) be represented by the following general formula (VII).

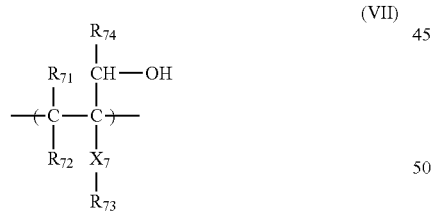

Each of $R_{71}$ and $R_{72}$ independently represents a hydrogen atom, an alkyl group, a monovalent aliphatic hydrocarbon ring group, a halogen atom, a cyano group, or an alkoxycarbonyl group. $R_{72}$ may be combined with $X_7$ to form a ring, and in this case, $R_{72}$ represents an alkylene group.

Each of $R_{73}$ and $R_{74}$ independently represents a hydrogen atom or a monovalent substituent.

$X_7$ represents a linking group.

In the present invention, it is also a preferable embodiment that the resin (P) further contain a repeating unit (B) which decomposes by the action of an acid to generate an alkali-soluble group, and the repeating unit (B) is represented by the following general formula (V) or (VI).

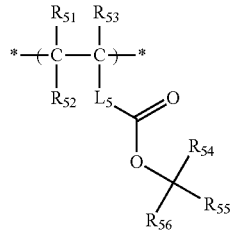

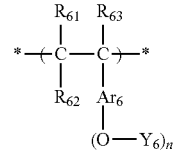

In the general formula (V), each of $R_{51}$, $R_{52}$, and $R_{53}$ independently represents a hydrogen atom, an alkyl group, a monovalent aliphatic hydrocarbon ring group, a halogen atom, a cyano group, or an alkoxycarbonyl group. $R_{52}$ may be combined with $L_5$ to form a ring, and in this case, $R_{52}$ represents an alkylene group.

$R_{54}$ represents an alkyl group, and each of $R_{55}$ and $R_{56}$ independently represents a hydrogen atom, an alkyl group, a monovalent aliphatic hydrocarbon ring group, or a monovalent aromatic ring group. $R_{55}$ and $R_{56}$ may be bonded to each other to form a ring, provided that $R_{55}$ and $R_{56}$ are not a hydrogen atom at the same time $L_5$ represents a single bond or a linking group.

In the general formula (VI), each of $R_{61}$, $R_{62}$, and $R_{63}$ independently represents a hydrogen atom, an alkyl group, a monovalent aliphatic hydrocarbon ring group, a halogen atom, a cyano group, or an alkoxycarbonyl group. $R_{62}$ may be combined with $Ar_6$ to form a ring, and in this case, $R_{62}$ represents an alkylene group.

$Ar_6$ represents an aromatic ring group.

In the case of $n \geq 2$, each of $Y_6$'s independently represents a hydrogen atom or a group that is cleaved by the action of an acid, provided that at least one of $Y_6$'s represents a group that is cleaved by the action of an acid.

n represents an integer of 1 to 4.

The present invention further includes an active light ray sensitive or radioactive ray sensitive film formed by using the composition as described above.

The present invention further includes a pattern-forming method, including a step of forming a film using the composition, a step of exposing the film, and a step of developing the exposed film.

According to the present invention, it is possible to provide an active light ray sensitive or radioactive ray sensitive resin composition which satisfies high sensitivity, high resolution, good pattern configuration, and good line edge roughness at the same time to a great extent while having sufficiently good outgassing performance during exposure, and an active light ray sensitive or radioactive ray sensitive film and a pattern-forming method using the same.

DESCRIPTION OF THE PREFERRED EMBODIMENTS

The present invention will be described in detail below.

With respect to the terms, for a group and an atomic group as used herein, even when there is no mention of "substituted and unsubstituted", the terms each encompass groups not only having no substituent but also having substituents. For example, the term "alkyl groups" encompasses not only an alkyl group having no substituent (an unsubstituted alkyl group) but also an alkyl group having a substituent (a substituted alkyl group).

Furthermore, the terms "active light ray" and "radioactive ray" as used herein mean, for example, brightline spectra from a mercury lamp and the like, far ultraviolet radiation, typically such as excimer laser, X-rays, soft X-rays such as extreme ultraviolet (EUV) rays and the like, or an electron beam (EB). The term "light" means active light ray or radioactive ray. The term "exposure" includes not only light irradiation with a mercury lamp, far ultraviolet radiation, X-rays, EUV light, or the like but also the lithography by means of particle beams such as an electron beam, an ion beam, and the like, unless otherwise specified.

The active light ray sensitive or radioactive ray sensitive resin composition according to the present invention includes a resin (P) as described below. By employing such a constitution, it is possible to satisfy high sensitivity, high resolution, good pattern configuration, and good line edge roughness at the same time to a great extent while accomplishing sufficiently good outgassing performance during exposure.

The composition according to the present invention is, for example, a positive type composition, and typically a positive type resist composition. The constitution of the composition will be described below.

[1] Resin (P)

The resin (P) includes a repeating unit (A) which decomposes by irradiation with active light ray or radioactive ray to generate an acid and a repeating unit (C) containing a primary or secondary hydroxyl group. The resin (P) may further contain, in addition to these, other repeating units.

[Repeating Unit (A)]

The repeating unit (A) is a repeating unit which decomposes by irradiation with active light ray or radioactive ray to generate an acid. The repeating unit (A) is preferably a repeating unit which decomposes by irradiation with active light ray or radioactive ray, and thus generates an acid anion in the side chain of the resin. In this case, the repeating unit (A) is more preferably a repeating unit which contains at least one aromatic ring in a portion excluding the countercation to the acid anion in the side chain.

More specifically the repeating unit (A) is preferably a repeating unit represented by the general formula (I) or the general formula (II).

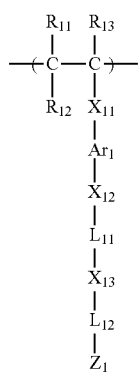

(I)

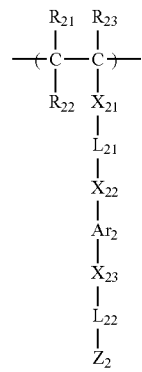

(II)

In the general formula (I), each of $R_{11}$, $R_{12}$, and $R_{13}$ independently represents a hydrogen atom, an alkyl group, a monovalent aliphatic hydrocarbon ring group, a halogen atom, a cyano group, or an alkoxycarbonyl group.

Examples of the alkyl group include a linear or branched alkyl group which may have a substituent, preferably, an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, a dodecyl group, and the like, each of which may have a substituent, more preferably an alkyl group having 8 or less carbon atoms, and particularly preferably an alkyl group having 3 or less carbon atoms.

The alkyl group contained in the alkoxycarbonyl group is preferably the same as that mentioned above with respect to $R_{11}$, $R_{12}$, and $R_{13}$.

Examples of the monovalent aliphatic hydrocarbon ring group include a monocyclic or polycyclic aliphatic hydrocarbon ring group which may have a substituent, preferably a monovalent aliphatic hydrocarbon ring group having 3 to 8 carbon atoms, such as a cyclopropyl group, a cyclopentyl group, and a cyclohexyl group, each of which may have a substituent.

Examples of the halogen atom include a fluorine atom, a chlorine atom, a bromine atom, and an iodine atom, and a fluorine atom is particularly preferred.

Examples, of the preferred substituents in each of these groups include a hydroxyl group, a halogen atom (fluorine, chlorine, bromine, and iodine), a nitro group, a cyano group, an amide group, a sulfonamide group, the alkyl groups mentioned with respect to $R_{11}$ to $R_{13}$, an alkoxy group (a methoxy group, an ethoxy group, a hydroxyethoxy group, a propoxy group, a hydroxypropoxy group, a butoxy group, and the like), an alkoxycarbonyl group (a methoxycarbonyl group, an ethoxycarbonyl group, and the like), an acyl group (a formyl group, an acetyl group, a benzoyl group, and the like), an acyloxy group (an acetoxy group, a butyryloxy group, and the like), and a carboxy group, and a hydroxyl group and a halogen atom are particularly preferred.

In the formula (I), as $R_{11}$, $R_{12}$, and $R_{13}$, a hydrogen atom, an alkyl group, and a halogen atom are more preferred, a hydrogen atom, a methyl group, an ethyl group, a trifluoromethyl group (—$CF_3$), a hydroxymethyl group (—$CH_2$—OH), a chloromethyl group (—$CH_2$—Cl), and a fluorine atom (—F) are particularly preferred.

Each of $X_{11}$, $X_{12}$, and $X_{13}$ independently represents a single bond, —O—, —S—, —CO—, —$SO_2$—, —NR— (wherein R represents a hydrogen atom or an alkyl group), a divalent nitrogen-containing non-aromatic heterocyclic group, or a group formed by combination thereof.

With respect to —NR—, the alkyl group represented by R is a linear or branched alkyl group which may have a substituent, and specific examples thereof are the same as those of the alkyl groups in $R_{11}$, $R_{12}$, and $R_{13}$. As R, a hydrogen atom, a methyl group, or an ethyl group is particularly preferred.

Furthermore, the divalent nitrogen-containing non-aromatic heterocyclic group refers to a preferably 3- to 8-membered non-aromatic heterocyclic group having at least one nitrogen atom. Specific examples thereof include divalent linking groups with the following structures.

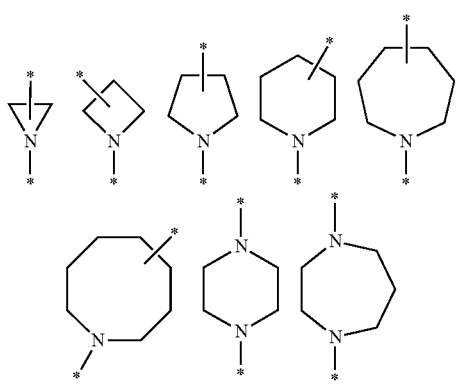

In the case where $X_{11}$ is a single bond, $R_{12}$ may be combined with $Ar_1$ to form a ring, and in this case, $R_{12}$ represents an alkylene group. $X_{11}$ is more preferably a single bond, —COO—, or —CONR— (wherein R is a hydrogen atom or an alkyl group), and particularly preferably a single bond or —COO—.

$X_{12}$ is preferably a single bond, —O—, —CO—, —SO$_2$—, —NR— (wherein R represents a hydrogen atom or an alkyl group), or a group formed by combination thereof. $X_{12}$ is particularly preferably a single bond, —OCO—, or —OSO$_2$—.

$X_{13}$ is preferably a single bond, —O—, —CO—, —SO$_2$—, —NR— (wherein R represents a hydrogen atom or an alkyl group), or a group formed by combination thereof. $X_{13}$ is particularly preferably a single bond, —COO—, or —OSO$_2$—.

$L_{11}$ represents a single bond, an alkylene group, an alkenylene group, a divalent aliphatic hydrocarbon ring group, a divalent aromatic ring group, or a group formed by combination of two or more thereof. In the group formed by combination, two or more groups combined together may be the same as or different from each other and may be linked to each other through, as a linking group, —O—, —S—, —CO—, —SO$_2$—, —NR— (wherein R represents a hydrogen atom or an alkyl group), a divalent nitrogen-containing non-aromatic heterocyclic group, or a group formed by combination thereof.

The alkylene group in $L_{11}$ may be linear or branched, and preferred examples thereof include an alkylene group having 1 to 8 carbon atoms, such as a methylene group, an ethylene group, a propylene group, a butylene group, a hexylene group, an octylene group, and the like. An alkylene group having 1 to 6 carbon atoms is more preferred, and an alkylene group having 1 to 4 carbon atoms is particularly preferred.

Examples of the alkenylene group include a group formed by introduction of a double bond in any position of the alkylene group described above with respect to $L_{11}$.

The divalent aliphatic hydrocarbon ring group may be monocyclic or polycyclic, and preferred examples thereof include a divalent aliphatic hydrocarbon ring group having 3 to 17 carbon atoms, such as a cyclobutylene group, a cyclopentylene group, a cyclohexylene group, a norbornanylene group, an adamantylene group, a diamantanylene group, and the like. A divalent aliphatic hydrocarbon ring group having 5 to 12 carbon atoms is more preferred, and a divalent aliphatic hydrocarbon ring group having 6 to 10 carbon atoms is particularly preferred.

Examples of the divalent aromatic ring group include an arylene group having 6 to 14 carbon atoms, which may have a substituent, such as a phenylene group, a tolylene group, a naphthylene group, and the like, and a divalent aromatic ring group containing a heteroring, such as thiophene, furan, pyrrole, benzothiophene, benzofuran, benzopyrrole, triazine, imidazole, benzimidazole, triazole, thiadiazole, thiazole, and the like.

Moreover, specific examples of each of the —NR— and the divalent nitrogen-containing non-aromatic heterocyclic group are the same as mentioned above with respect to $X_{11}$. Preferred examples are also the same.

$L_{11}$ is more preferably a single bond, an alkylene group, or a divalent aliphatic hydrocarbon ring group, and particularly preferably a single bond or an alkylene group.

$L_{12}$ represents a single bond, an alkylene group, an alkenylene group, a divalent aliphatic hydrocarbon ring group, a divalent aromatic ring group, or a group formed by combination of two or more thereof, in which the hydrogen atoms of these groups are partially or entirely substituted with a substituent selected from among a fluorine atom, a fluoroalkyl group, a nitro group, and a cyano group. In the group formed by combination, two or more groups combined together may be the same as or different from each other and may be linked to each other through, as a linking group, —O—, —S—, —CO—, —SO$_2$—, —NR— (wherein R represents a hydrogen atom or an alkyl group), a divalent nitrogen-containing non-aromatic heterocyclic group, or a group formed by combination thereof.

$L_{12}$ is more preferably an alkylene group, a divalent aromatic ring group, or a group formed by combination thereof whose hydrogen atoms are partially or entirely substituted with a fluorine atom or a fluoroalkyl group (more preferably a perfluoroalkyl group), and particularly preferably an alkylene group which is at least partially or entirely substituted with a fluorine atom. $L_{12}$ is most preferably an alkylene group in which 30 to 100% of the hydrogen atoms are substituted with a fluorine atom.

The alkylene group in $L_{12}$ may be linear or branched, and preferred examples thereof include an alkylene group having 1 to 8 carbon atoms, such as a methylene group, an ethylene group, a propylene group, a butylene group, a hexylene group, an octylene group, and the like. An alkylene group having 1 to 6 carbon atoms is more preferred, and an alkylene group having 1 to 4 carbon atoms is particularly preferred.

Examples of the alkenylene group include a group formed by introduction of a double bond in any position of the above alkylene group.

The divalent aliphatic hydrocarbon ring group may be monocyclic or polycyclic, and preferred examples thereof include a divalent aliphatic hydrocarbon ring group having 3 to 17 carbon atoms, such as a cyclobutylene group, a cyclopentylene group, a cyclohexylene group, a norbornanylene group, an adamantylene group, a diadamantanylene group, and the like.

Specific examples of the divalent aromatic ring group include the same groups as mentioned with respect to the divalent aromatic ring group as a linking group in $L_{11}$ as described above.

Specific examples of the —NR— and divalent nitrogen-containing non-aromatic heterocyclic group as a linking group in $L_{12}$ are the same as mentioned above with respect to $X_{11}$ as described above. Preferred examples are also the same.

Specific preferred examples of $L_{12}$ are shown below, but are not particularly limited thereto.

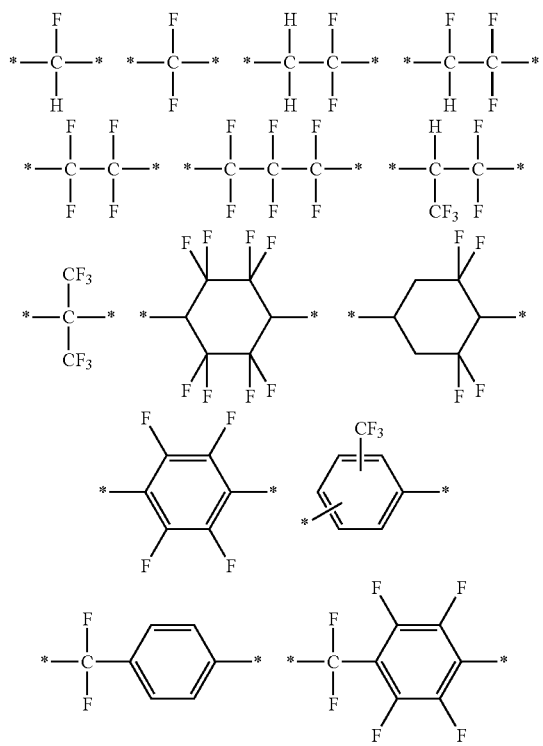

$Ar_1$ represents a divalent aromatic ring group, or a group formed by combination of a divalent aromatic ring group and an alkylene group.

A substituent may have a substituent, and preferred examples thereof include an arylene group having 6 to 18 carbon atoms, such as a phenylene group, a tolylene group, a naphthylene group, and the like; and a divalent aromatic ring group containing a heteroring, such as thiophene, furan, pyrrole, benzothiophene, benzofuran, benzopyrrole, triazine, imidazole, benzoimidazole, triazole, thiadiazole, thiazole, and the like.

Examples of the preferred substituents in each of these groups include the alkyl groups as mentioned with respect to $R_{11}$ to $R_{13}$, an alkoxy group such as a methoxy group, an ethoxy group, a hydroxyethoxy group, a propoxy group, a hydroxypropoxy group, a butoxy group, and the like; and an aryl group such as a phenyl group and the like.

Preferred example of the group formed by combination of a divalent aromatic ring group and an alkylene group include an aralkylene group formed by combination of any of the divalent aromatic ring groups as described above and for example, an alkylene group having 1 to 8 carbon atoms (may be linear or branched), such as a methylene group, an ethylene group, a propylene group, a butylene group, a hexylene group, an octylene group, and the like.

$Ar_1$ is more preferably an arylene group having 6 to 18 carbon atoms, which may be substituted, and particularly preferably a phenylene group, a naphthylene group, a biphenylene group, or a phenylene group substituted with a phenyl group.

$Z_1$ represents a moiety that is converted to a sulfonate group, an imidate group, or a methide group by irradiation with active light ray or radioactive ray. The moiety represented by $Z_1$ is preferably an onium salt, the onium salt is more preferably a sulfonium salt or an iodonium salt, and particularly preferably any of the structures represented by the following general formulae (ZI) to (ZIII) below.

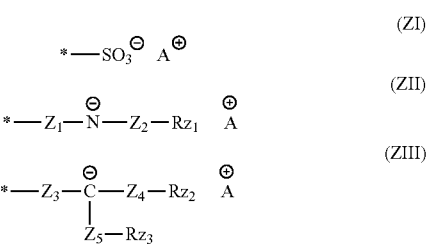

In the general formulae (ZII) and (ZIII), each of $Z_1$, $Z_2$, $Z_3$, $Z_4$, and $Z_5$ independently represents —CO— or —SO$_2$—, and preferably —SO$_2$—.

Each of $Rz_1$, $Rz_2$, and $Rz_3$ independently represents an alkyl group, a monovalent aliphatic hydrocarbon ring, group, an aryl group, or an aralkyl group. Forms of these groups having the hydrogen atoms thereof partially or entirely substituted with a fluorine atom or a fluoroalkyl group (more preferably a perfluoroalkyl group) are preferred. Forms of these groups having 30 to 100% of the hydrogen atoms thereof substituted with a fluorine atom are particularly preferred.

The above alkyl group may be linear or branched, and preferred examples thereof include an alkyl group having 1 to 8 carbon atoms, such as a methyl group, an ethyl group, a propyl group, a butyl group, a hexyl group, an octyl group and the like. An alkyl group having 1 to 6 carbon atoms is more preferred, and an alkyl group having 1 to 4 carbon atoms is particularly preferred.

The monovalent aliphatic hydrocarbon ring group is preferably, a monovalent aliphatic hydrocarbon ring group having 3 to 10 carbon atoms, such as a cyclobutyl group, a cyclopentyl group, a cyclohexyl group, and the like, and more preferably a monovalent aliphatic hydrocarbon ring group having 3 to 6 carbon atoms.

The aryl group is preferably one having 6 to 18 carbon atoms, more preferably an aryl group having 6 to 10 carbon atoms, and particularly preferably a phenyl group.

Preferred examples of the aralkyl group include one formed by bonding of the above aryl group to an alkylene group having 1 to 8 carbon atoms. An aralkyl group formed by bonding of the above aryl group to an alkylene group having 1 to 6 carbon atoms is more preferred, and an aralkyl group formed by bonding of the above aryl, group to an alkylene group having 1 to 4 carbon atoms is particularly preferred.

Each of $Rz_1$, $Rz_2$, and $Rz_3$ is more preferably an alkyl group having the hydrogen atoms thereof partially or entirely substituted with a fluorine atom or a fluoroalkyl group (especially a perfluoroalkyl group), and particularly preferably an alkyl group having 30 to 100% of the hydrogen atoms thereof substituted with a fluorine atom.

In the general formulae (ZI) to (ZIII), $A^+$ represents a sulfonium cation or an iodonium cation, and preferably a structure represented by the following general formula (ZA-1) or (ZA-2).

(ZA-1)

(ZA-2)

In the general formula (ZA-I), each of $R_{201}$, $R_{202}$, and $R_{203}$ independently represents organic group. The number of carbon atoms of the organic group represented by $R_{201}$, $R_{202}$, and $R_{203}$ is generally from 1 to 30, and preferably from 1 to 20.

Further, two of $R_{201}$ to $R_{203}$ may be bonded to each other to form a ring structure (including a condensed ring). This ring structure within the ring may contain an oxygen atom, a sulfur atom, an ester bond, an amido bond, or a carbonyl group in addition to the sulfur atom shown in the formula. Examples of the group formed by the mutual bonding of two of $R_{201}$ to $R_{203}$ include an alkylene group (for example, a butylene group or a pentylene group), and the like.

Examples of the organic groups as $R_{201}$, $R_{202}$, and $R_{203}$ include groups corresponding to the groups (ZA-1-1), (ZA-1-2), and (ZA-1-3) as described hereinafter. The groups represented by (ZA-1-1) and (ZA-1-3) are particularly preferred.

First, the group (ZA-1-1) will be described below.

The group (ZA-1-1) is a group having cations of arylsulfonium, in which at least one, of $R_{201}$ to $R_{203}$ in the general formula (ZA-1) is an aryl group.

All of the $R_{201}$ to $R_{203}$ may be aryl groups, or $R_{201}$ to $R_{203}$ may be partially an aryl group and the remainder may be an alkyl group or a monovalent aliphatic hydrocarbon ring group.

Examples of the arylsulfonium groups include groups corresponding to triarylsulfonium, diarylalkylsulfonium, aryldialkylsulfonium, diarylcycloalkylsulfonium, and aryldicycloalkylsulfonium.

The aryl group in the arylsulfonium is preferably a phenyl group or a naphthyl group. The aryl group may be one having a heterocyclic structure containing an oxygen atom, a nitrogen atom, a sulfur atom, or the like. Examples of the heterocyclic structure include structures of pyrrole, furan, thiophene, indole, benzofuran, benzothiophene, and the like.

In the case where the arylsulfonium compound has two or more aryl groups, the two or more aryl groups may be the same as or different from each other.

The alkyl group or the monovalent aliphatic hydrocarbon ring group contained in the arylsulfonium compound as necessary is preferably a linear or branched alkyl group having 1 to 15 carbon atoms or a monovalent aliphatic hydrocarbon ring group having 3 to 15 carbon atoms. Examples thereof include a methyl group, an ethyl group, a propyl group, an n-butyl group, a sec-butyl group, a t-butyl group, a cyclopropyl group, a cyclobutyl group, a cyclohexyl group, and the like.

The aryl group, the alkyl group, or the monovalent aliphatic hydrocarbon ring group of $R_{201}$ to $R_{203}$ may have as its substituent an alkyl group (for example, 1 to 15 carbon atoms), a monovalent aliphatic hydrocarbon ring group (for example, 3 to 15 carbon atoms), an aryl group (for example, 6 to 14 carbon atoms), an alkoxy group (for example, 1 to 15 carbon atoms), a halogen atom, a hydroxyl group, or a phenylthio group. Preferred substituents are a linear or branched alkyl group having 1 to 12 carbon atoms, a monovalent aliphatic hydrocarbon ring group having 3 to 12 carbon atoms and a linear, branched, or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in, all three of $R_{201}$ to $R_{203}$. Further, in the case where $R_{201}$ to $R_{203}$ each represent an aryl group, the substituent is preferably present at the p-position of the aryl group.

Preferred examples of the group represented by the formula (ZA-1-1) include triarylsulfonium, and structures represented by the following general formulae (ZA-1-1A) and (ZA-1-1B).

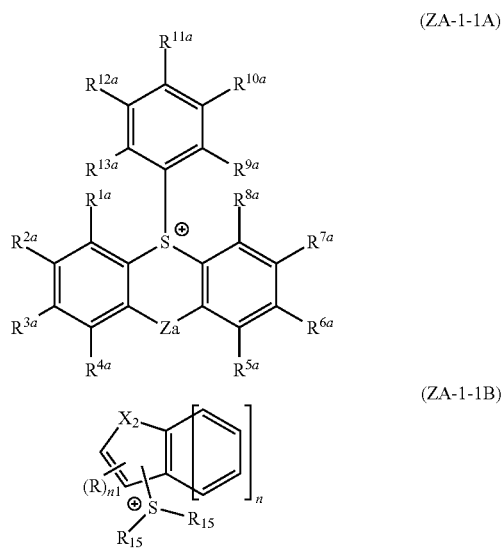

(ZA-1-1A)

(ZA-1-1B)

In the general formula (ZA-1-1A), each of $R^{1a}$ to $R^{13a}$ independently represents a hydrogen atom or substituent, and at least one of $R^{1a}$ to $R^{13a}$ is preferably a substituent containing an alcoholic hydroxyl group.

Za is a single bond or a linking group.

In the present invention, the alcoholic hydroxyl group is a hydroxyl group bonding to a carbon atom in, the chained or cyclic alkyl group.

In the case where $R^{1a}$ to $R^{13a}$ represent a substituent containing an alcoholic hydroxyl group, $R^{1a}$ to $R^{13a}$ are represented by —W—Y, in which Y is a chained or cyclic alkyl group, which is substituted with a hydroxyl group, and W is a single bond or a linking group.

Examples of the chained or cyclic alkyl group of Y include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, a cyclopropyl group, a cyclopentyl group, a cyclohexyl group, an adamantyl group, a norbornyl group, a bornyl group, and the like, preferably an ethyl group, a propyl group, an isopropyl group, an n-butyl group, an isobutyl group, and a sec-butyl group, and more preferably an ethyl group, a propyl group, and an isopropyl group. Particularly preferably, Y contains a structure of —$CH_2CH_2OH$.

W is preferably a single bond, or a divalent group as obtained by replacing with a single bond any hydrogen atom of a group selected from among an alkoxy group, an acyloxy group, an acylamino group, an alkyl- or arylsulfonylamino group, an alkylthio group, an alkylsulfonyl group, an acyl group, an alkoxycarbonyl group, and a carbamoyl group, and more preferably a single bond, or a divalent group as obtained by replacing with a single bond any hydrogen atom of a group selected from among an acyloxy group, an alkylsulfonyl group, an acyl group, and an alkoxycarbonyl group.

In the case where $R^{1a}$ to $R^{13a}$ represent a substituent containing an alcoholic hydroxyl group, the number of carbon atoms contained in each of the substituents is preferably from 2 to 10, more preferably from 2 to 6 and particularly preferably from 2 to 4.

The substituents containing an alcoholic hydroxyl group as $R^{1a}$ to $R^{13a}$ may have two or more alcoholic hydroxyl groups. The number of alcoholic hydroxyl groups contained in each of the substituents containing an alcoholic hydroxyl group as $R^{1a}$ to $R^{13a}$ is from 1 to 6, preferably from 1 to 3, and more preferably 1.

The number of the alcoholic hydroxyl groups contained in the compound represented by the general formula (ZA-1A) as the total of those of $R^{1a}$ to $R^{13a}$ is preferably from 1 to 10, more preferably from 1 to 6, and still more preferably from 1 to 3.

In the case where $R^{1a}$ to $R^{13a}$ do not contain an alcoholic hydroxyl group, $R^{1a}$ to $R^{13a}$ are preferably a hydrogen atom, a halogen atom, an alkyl group, a monovalent aliphatic hydrocarbon ring group, an alkenyl group (including a cycloalkenyl group and a bicycloalkenyl group), an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or arylsulfonylamino group, an alkylthio group, an arylthio group, a sulfamoyl group, an alkyl- or arylsulfonyl group, an aryloxycarbonyl group, an alkoxycarbonyl group, a carbamoyl group, an imido group, a silyl group, or a ureido group.

In the case where $R^{1a}$ to $R^{13a}$ do not contain an alcoholic hydroxyl group, $R^{1a}$ to $R^{13a}$ are more preferably a hydrogen atom, a halogen atom, an alkyl group, a monovalent aliphatic hydrocarbon ring group, a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group, or a carbamoyl group.

Furthermore, in the case where $R^{1a}$ to $R^{13a}$ do not contain an alcoholic hydroxyl group, $R^{1a}$ to $R^{13a}$ are particularly preferably a hydrogen atom, any of alkyl groups, a monovalent aliphatic hydrocarbon ring group, a halogen atom, or an alkoxy group.

Moreover, any two adjacent to each other of $R^{1a}$ to $R^{13a}$ may be combined with each other to form a ring (an aromatic or non-aromatic cyclohydrocarbon or heterocycle which can form a condensed polycycle through further combination, and examples thereof include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring).

In the general formula (ZA-1-1A), preferably, at least one of $R^{1a}$ to $R^{13a}$ contains an alcoholic hydroxyl group. More preferably, at least one of $R^{9a}$ to $R^{13a}$ contains an alcoholic hydroxyl group.

Za represents a single bond or a linking group. Examples of the divalent linking group include an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, $-CH=CH-$, $-C\equiv C-$, an aminocarbonylamino group, an aminosulfonylamino group, and the like, and the divalent linking group may have a substituent. The substituent may be the same as mentioned above with respect to $R^{1a}$ to $R^{13a}$. Za is preferably a single bond or a substituent exhibiting no electron withdrawing properties, such as an alkylene group, an arylene group, an ether group, a thioether group, an amino group, $-CH=CH-$, $-CH=CH-$, an aminocarbonylamino group, an aminosulfonylamino group, and the like, more preferably a single bond, an ether group, or a thioether group, and particularly preferably a single bond.

Next, the general formula (ZA-1-1B) will be described.

In the general formula (ZA-1-1B), each of two $R_{15}$'s independently represents an alkyl group, a monovalent aliphatic hydrocarbon ring group, or a naphthyl group, in which two $R_{15}$'s may be bonded to each other to form a ring.

$X_2$ represents any of $-CR_{21}=CR_{22}-$, $-NR_{23}-$, $-S-$, and $-O-$, in which each of $R_{21}$ and $R_{22}$ independently represents a hydrogen atom, an alkyl group, a monovalent aliphatic hydrocarbon ring group, or an aryl group, and $R_{23}$ represents a hydrogen atom, an alkyl group, a monovalent aliphatic hydrocarbon ring group, an aryl group, or an acyl group.

In the case where a plurality of R's are present, each of the R's independently represents a substituent. Examples of the substituent of R include the corresponding groups of the general formulae (ZI-1) to (ZI-3) to be described below as preferred forms of the general formula (ZA-1-1B).

n represents an integer of 0 to 3.

n1 represents an integer of 0 to 11.

The alkyl group in each of $R_{15}$ and $R_{21}$ to $R_{23}$ may have a substituent, and is preferably a linear or branched alkyl group having 1 to 20 carbon atoms. An oxygen atom, a sulfur atom, or a nitrogen atom may be introduced in the alkyl chain.

Further, examples of the alkyl group having a substituent particularly include a linear or branched alkyl group substituted with a monovalent aliphatic hydrocarbon ring group (for example, an adamantylmethyl group, an adamantylethyl group, a cyclohexylethyl group, a camphor residue, and the like).

The monovalent aliphatic hydrocarbon ring group in each of $R_{15}$ and $R_{21}$ to $R_{23}$ may have a substituent, and is preferably a cycloalkyl group having 3 to 20 carbon atoms. An oxygen atom may be introduced in the ring.

The aryl group in each of $R_{15}$ and $R_{21}$ to $R_{23}$ may have a substituent, and is preferably an aryl group having 6 to 14 carbon atoms.

Examples of the substituent that each group may have include a halogen atom, a hydroxyl group, a nitro group, a cyano group, a carboxyl group, a carbonyl group, an alkyl group (preferably having 1 to 10 carbon atoms), a monovalent aliphatic hydrocarbon ring group (preferably having 3 to 10 carbon atoms), an aryl group (preferably having 6 to 14 carbon atoms), an alkoxy group (preferably having 1 to 10 carbon atoms), an aryloxy group (preferably having 6 to 14 carbon atoms), an acyl group (preferably having 2 to 20 carbon atoms), an acyloxy group (preferably having 2 to 10 carbon atoms), an alkoxycarbonyl group (preferably having 2 to 20 carbon atoms), an aminoacyl group (preferably having 2 to 20 carbon atoms), an alkylthio, group (preferably having 1 to 10 carbon atoms), an arylthio group (preferably having 6 to 14 carbon atoms), and the like. In the cyclic structure of the aryl group, a monovalent aliphatic hydrocarbon ring group, or the like and in the aminoacyl group, an alkyl group (preferably having 1 to 20 carbon atoms) may further be introduced as a substituent.

The ring that may be formed by the mutual bonding of two $R_{15}$'s is preferably a ring structure formed in combination with —S.sup.+ shown in formula (ZA-1-1B), in particular, a 5-membered ring containing one sulfur atom or a condensed ring containing the same. The condensed ring is preferably one containing one sulfur atom and 18 or less carbon atoms, and more preferably any of the ring structures of the following general formulae (IV-1) to (IV-3).

In the formulae, * represents a bonding hand. R represents an arbitrary substituent, and examples thereof include any of the same substituents that may be introduced in each, of the groups in $R_{15}$ and $R_{21}$ to $R_{23}$. n represents an integer of 0 to 4, and $n_2$ represents an integer of 0 to 3.

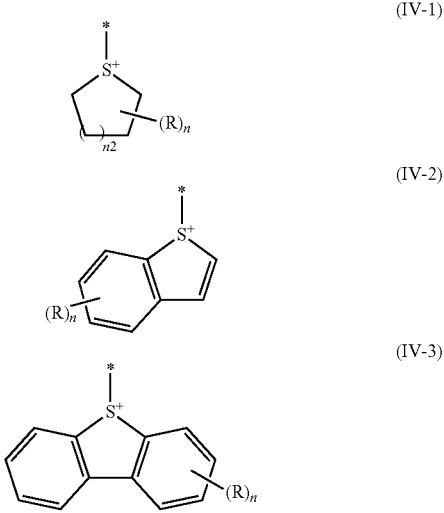

Among the compounds represented by the general formula (ZA-1-1B), preferred cation structures include the following cation structures (ZI-1) to (ZI-3).

The cation structure (ZI-1) refers to a structure represented by the following general formula (ZI-1) below

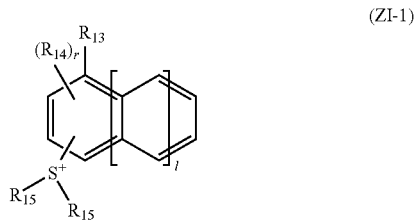

In the general formula (ZI-1), $R_{13}$ represents a hydrogen atom, a fluorine atom, a hydroxyl group, an alkyl group, a monovalent aliphatic hydrocarbon ring group, an alkoxy group, an alkoxycarbonyl group, or a group having a monocyclic or polycyclic cycloalkyl skeleton.

In the case where a plurality of $R_{14}$'s are present, each of the $R_{14}$'s independently represents an alkyl group, a monovalent aliphatic hydrocarbon ring group, an alkoxy group, an alkylsulfonyl group, a cycloalkylsulfonyl group, a hydroxyl group, or a group having a monocyclic or polycyclic cycloalkyl skeleton.

Each of $R_{15}$'s independently represents an alkyl group, a monovalent aliphatic hydrocarbon ring group, or a naphthyl group, in which two $R_{15}$'s may be bonded to each other to form a ring.

l represents an integer of 0 to 2.

r represents an integer of 0 to 8.

In the general formula (ZI-1), the alkyl group in each of $R_{13}$, $R_{14}$, and $R_{15}$ may be linear or branched, and preferably has 1 to 10 carbon atoms. Examples thereof include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group, and the like. Among these alkyl groups, a methyl group, an ethyl group, an n-butyl group, a t-butyl group, and the like are more preferred.

The monovalent aliphatic hydrocarbon ring group of each of $R_{13}$, $R_{14}$, and $R_{15}$ may be a monocyclic or polycyclic structure, and preferably has 3 to 12 carbon atoms. Examples thereof include a cyclopropyl, cyclobutyl, cyclopentyl, cyclohexyl, cycloheptyl, cyclooctyl, cyclododecanyl, cyclopentenyl, cyclohexenyl, cyclooctadienyl, bicycloheptyl(norbornyl), adamantyl, and the like, and cyclopropyl, cyclopentyl, cyclohexyl, and cyclooctyl are more preferred.

The alkoxy group of each of $R_{13}$ and $R_{14}$ may be linear or branched, and preferably has 1 to 10 carbon atoms. Examples thereof include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, and the like. Among these alkoxy groups, a methoxy group, an ethoxy group, an n-propoxy group, an n-butoxy group, and the like are preferred.

The alkoxycarbonyl group of $R_{13}$ may be linear or branched and preferably has 2 to 11 carbon atoms. Examples thereof include one in which alkyl groups in $R_{13}$, $R_{14}$, and $R_{15}$ are substituted with carbonyl groups. Examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Among these alkoxycarbonyl groups, a methoxycarbonyl group, an ethoxycarbonyl group, an n-butoxycarbonyl group, and the like are more preferred.

Examples of the groups having the monocyclic or polycyclic cycloalkyl skeletons of $R_{13}$ and $R_{14}$ include a monocyclic or polycyclic cycloalkyloxy group and a monocyclic or polycyclic alkoxy group. These groups may further have substituents.

With respect to each of the monocyclic or polycyclic cycloalkyloxy groups of $R_{13}$ and $R_{14}$, the sum of carbon atoms thereof is preferably 7 or more, and more preferably from 7 to 15. Further, it preferably has a monocyclic cycloalkyl skeleton. The monocyclic cycloalkyloxy group of which the sum of carbon atoms is 7 or more is one having a cycloalkyloxy group, such as a cyclopropyloxy group, a cyclobutyloxy group, a cyclopentyloxy group, a cyclohexyloxy group, a cycloheptyloxy group, a cyclooctyloxy group, a cyclododecanyloxy group, and the like, optionally having a substituent selected from among an alkyl group such a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, an iso-amyl group, and the like, a hydroxyl group, a halogen atom (fluorine, chlorine, bromine, or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, in which the sum of carbon atoms thereof, including those of any optional substituent introduced in the cycloalkyl group, is 7 or more.

Furthermore, examples of the polycyclic cycloalkyloxy group of which the sum of carbon atoms is 7 or more include a norbornyloxy group, a tricyclodecanyloxy group, a tetracyclodecanyloxy group, an adamantyloxy group, and the like.

With respect to each of the monocyclic or polycyclic alkoxy groups of $R_{13}$ and $R_{14}$, the sum of carbon atoms thereof is preferably 7 or more, more preferably in the range of 7 to 15. Further, the alkoxy group having a monocyclic cycloalkyl skeleton is preferred. The alkoxy group having a monocyclic cycloalkyl skeleton of which the sum of carbon atoms is 7 or more is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, iso-amyloxy, and the like, which are substituted with the above monocyclic cycloalkyl group which may be substituted, in which the sum of carbon atoms thereof, including those of the substituents, is 7 or more. Examples thereof include a cyclohexylmethoxy group, a cyclopentylethoxy group, a cyclohexylethoxy group, and the like. A cyclohexylmethoxy group is preferred.

Furthermore, examples of the alkoxy group having a polycyclic cycloalkyl skeleton of which the sum of carbon atoms is 7 or more include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group, and the like, and a norbornylmethoxy group, a norbornylethoxy group, and the like are preferred.

The alkylsulfonyl group and the cycloalkylsulfonyl group of $R_{14}$ may be linear, branched, or cyclic, and preferably have 1 to 10 carbon atoms. Examples thereof include any of sulfonyl groups substituted with any of the alkyl groups in $R_{13}$, $R_{14}$, and $R_{15}$. Examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group, and the like. Among these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group, and the like are preferred.

l is preferably 0 or 1, and more preferably 1.

r is preferably 0 to 2.

Each of the groups of $R_{13}$, $R_{14}$, and $R_{15}$ may have a substituent, and examples of the substituent include those including an alkyl group (a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, an iso-amyl group, and the like), a monovalent aliphatic hydrocarbon ring group (may be monocyclic or polycyclic, preferably having 3 to 20 carbon atoms, and more preferably 5 to 8 carbon atoms), a hydroxyl group, a halogen atom (fluorine, chlorine, bromine, or iodine), a nitro group, a cyano group, an amido group, a sulfonamido group, an alkoxy group, an alkoxyalkyl group, an alkoxycarbonyl group, an alkoxycarbonyloxy group, an acyl group (a formyl group, an acetyl group, a benzoyl group, and the like), an acyloxy group (an acetoxy group, a butyryloxy group, and the like), a carboxyl group, and the like.

Examples of the alkoxy group include a linear, branched, or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, a cyclohexyloxy group, and the like; etc.

Examples of the alkoxyalkyl group include a linear, branched, or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group, a 2-ethoxyethyl group, and the like; etc.

Examples of the alkoxycarbonyl group include a linear, branched, or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, a cyclohexyloxycarbonyl group, and the like; etc.

Examples of the alkoxycarbonyloxy group include a linear, branched, or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, a cyclohexyloxycarbonyloxy group, and the like; etc.

The cyclic structure that may be formed by the bonding of the two $R_{15}$'s to each other is preferably a 5- or 6-membered ring, and particularly preferably a 5-membered ring (that is, a tetrahydrothiophene ring) formed by two divalent $R_{15}$'s in combination with the sulfur atom of the general formula (ZI-1). The cyclic structure may condense with an aryl group or an aliphatic hydrocarbon ring group. The divalent substituent may have a substituent and examples of the substituent include an alkyl group, a hydroxyl group, a carboxyl group, a cyano group, a nitro group, an alkoxy group, an alkoxyalkyl group, an alkoxycarbonyl group, an alkoxycarbonyloxy group, and the like; etc. as mentioned above.

$R_{15}$ in the general formula (ZI-1) is preferably a methyl group, an ethyl group, a divalent group which allows two $R_{15}$'s to be bonded to each other to form a tetrahydrothiophene ring structure in combination with the sulfur atom of the general formula (ZI-1), and the like.

As mentioned above, the alkyl group, the monovalent aliphatic hydrocarbon ring group, the alkoxy group, and the alkoxycarbonyl group of $R_{13}$ and the alkyl group, the monovalent aliphatic hydrocarbon, ring group, the alkoxy group, the alkylsulfonyl group, and the cycloalkylsulfonyl group of $R_{14}$ may be substituted, and preferred examples of the substituent include a hydroxyl group, an alkoxy group, an alkoxycarbonyl group, and a halogen atom (particularly a fluorine atom).

Preferred specific examples of the cation structures represented by the general formula (ZI-1) will be shown, below.

-continued

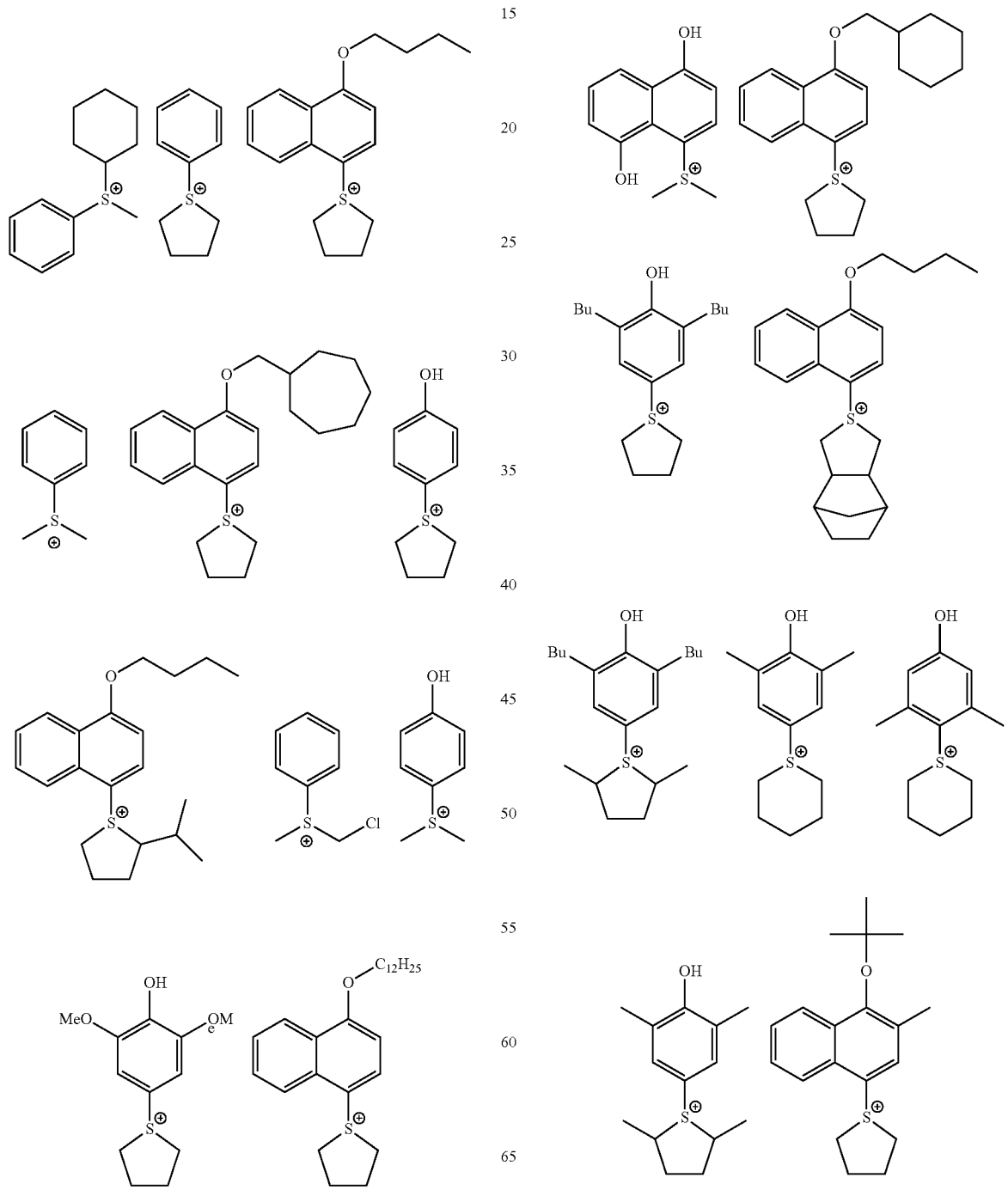

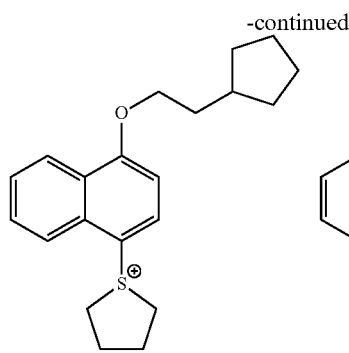

The cation structure (ZI-2) refers to a structure represented by the following general formula (ZI-2).

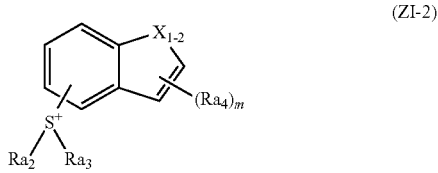

In the general formula (ZI-2), $X_{1-2}$ represents an oxygen atom, a sulfur atom, or a —$NRa_1$- group, in which $Ra_1$ represents a hydrogen atom, an alkyl group, a monovalent aliphatic hydrocarbon ring group, an aryl group, or an acyl group.

Each of $Ra_2$ and $Ra_3$ independently represents an alkyl group, a monovalent aliphatic hydrocarbon ring group, an aryl group, or a naphthyl group, in which $Ra_2$ and $Ra_3$ may be bonded to each other to form a ring.

In the case where a plurality of $Ra_4$'s are present, each of the $Ra_4$'s independently represents a monovalent group.

m represents an integer of 0 to 3.

Each of the alkyl group of $Ra_1$ to $Ra_3$ is preferably a linear or branched alkyl group having 1 to 20 carbon atoms. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, and the like.

Each of the monovalent aliphatic hydrocarbon ring groups of $Ra_1$ to $Ra_3$ is preferably a monovalent aliphatic hydrocarbon ring group having 3 to 20 carbon atoms. Examples thereof include a cyclopropyl group, a cyclobutyl group, a cyclopentyl group, a cyclohexyl group, a cyclooctyl group, an adamantyl group, a norbornyl group, an isobornyl group, a camphonyl group, a dicyclopentyl group, an α-pinel group, a tricyclodecanyl group, a tetracyclododecyl group, an androstanyl group, and the like.

Each of the aryl groups of $Ra_1$ to $Ra_3$ is preferably an aryl group having 6 to 10 carbon atoms. Examples thereof include a phenyl group, a naphthyl group, and the like.

The acyl group of $Ra_1$ is preferably an acyl group having 2 to 20 carbon atoms. Examples thereof include a formyl group, an acetyl group, a propanoyl group, a butanoyl group, a pivaloyl group, a benzoyl group, and the like.

The ring structure that may be formed by the mutual bonding of $Ra_2$ and $Ra_3$ is preferably a group forming a 5- or 6-membered ring, particularly preferably a 5-membered ring (for example, a tetrahydrothiophene ring) in combination with the sulfur atom of the general formula (ZI-2), in which an oxygen atom may be contained. Examples thereof include the same ring as may be formed by the mutual linkage of $R_{15}$'s of the general formula (ZI-1).

Examples of the monovalent group of $Ra_4$ include an alkyl group (preferably having 1 to 20 carbon atoms), a monovalent aliphatic hydrocarbon ring group (preferably having 3 to 20 carbon atoms), an aryl group (preferably having 6 to 10 carbon atoms), an alkoxy group (preferably having 1 to 20 carbon atoms), an acyl group (preferably having 2 to 20 carbon atoms), an acyloxy group (preferably having 2 to 20 carbon atoms), a fluorine atom, a chlorine atom, a bromine atom, an iodine atom, a hydroxyl group, a carboxyl group, a nitro group, a cyano group, an alkoxycarbonyl group, an alkylsulfonyl group, an arylsulfonyl group, an arylcarbonyl group, an alkylcarbonyl group, an alkenylcarbonyl group, and the like.

$Ra_1$ is preferably an alkyl group, and more preferably an alkyl group having 1 to 4 carbon atoms.

More preferably, $Ra_2$ and $Ra_3$ are linked, to each other to form a 5- or 6-membered ring.

Each group in $Ra_1$ to $Ra_4$ may further have a substituent, and examples of the substituent include those mentioned above, which may be introduced in each of the groups of $R_{13}$ to $R_{15}$ in the general formula (ZI-1).

Preferred specific examples of the cation contained in the compound represented by the general formula (ZI-2) will be shown below.

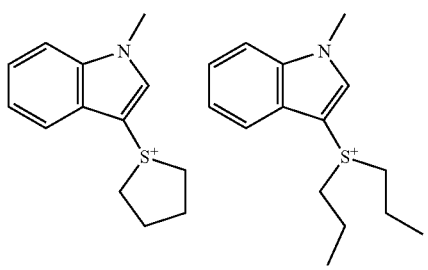

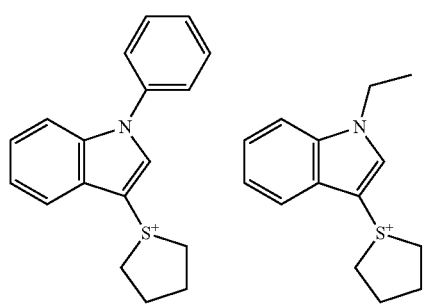

-continued

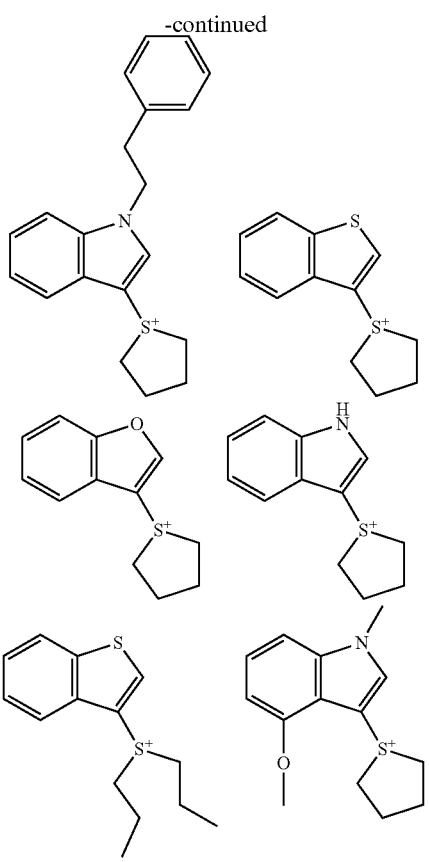

The cation structure (ZI-3) refers to a structure represented the following general formula (ZI-3).

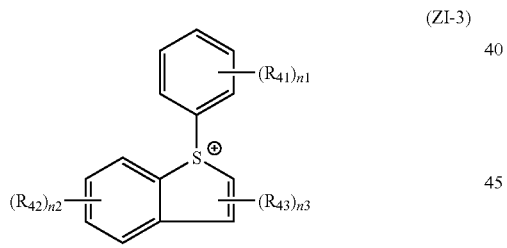

In the general formula (ZI-3), each of $R_{41}$ to $R_{43}$ independently represents an alkyl group, an acetyl group, an alkoxy group, a carboxyl group, a halogen atom, a hydroxyl group, or a hydroxyalkyl group.

Examples of the alkyl group and the alkoxy group as $R_{41}$ to $R_{43}$ include those mentioned above with respect to $R_{13}$ to $R_{15}$ in the general formula (ZI-1).

The hydroxyalkyl group is preferably the above alkyl group having one or a plurality of hydrogen atoms thereof substituted with a hydroxyl group, and examples thereof include a hydroxymethyl group, a hydroxyethyl group, a hydroxypropyl group, and the like.

n1 is an integer of 0 to 3, preferably 1 or 2, and more preferably 1.

n2 is an integer of 0 to 3, preferably 0 or 1, and more preferably 0.

n3 is an integer of 0 to 2, preferably 0 or 1, and more preferably 1.

Each of the groups of $R_{41}$ to $R_{43}$ may further have a substituent. Examples of the substituent include those mentioned above, which may be introduced in each of the groups of $R_{13}$ to $R_{15}$ in the general formula (ZI-1).

Preferred specific examples of the cation contained in the compound represented by the general formula (ZI-3) will be shown below.

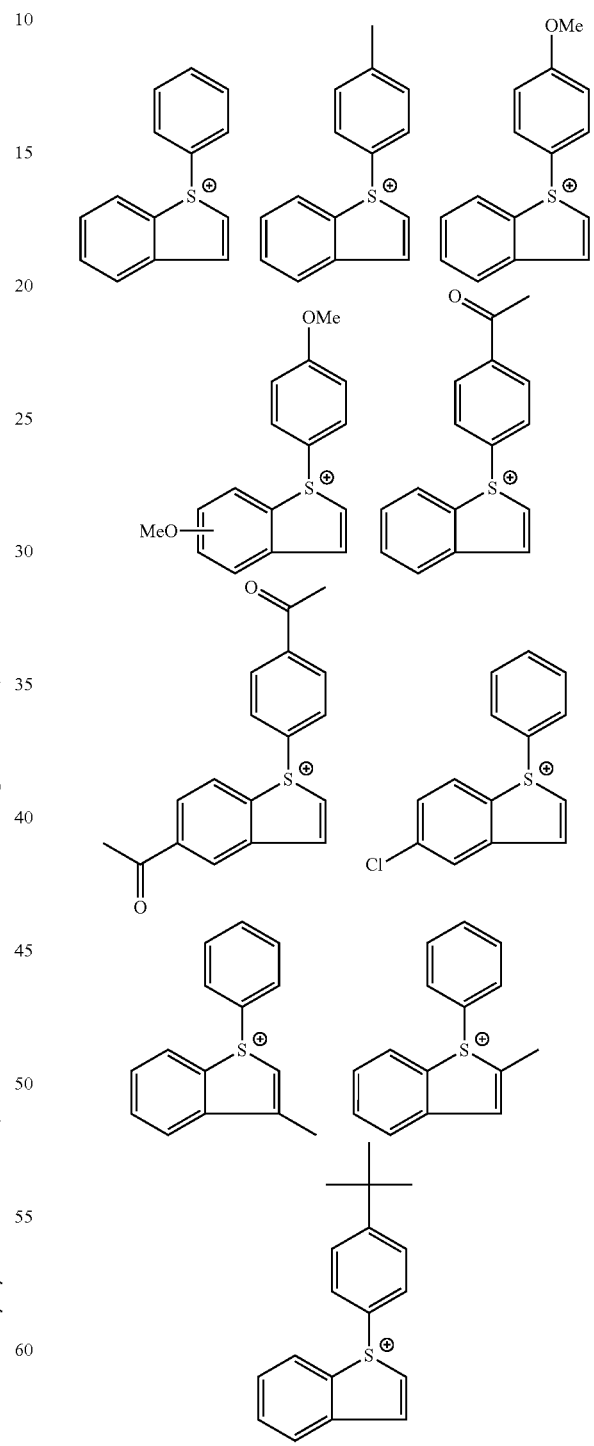

Among the cation structures represented by the general formulae (ZI-1) to (ZI-3), the structures of the general formulae (ZI-1) and (ZI-2) are, preferred. The structure of the general formula (ZI-1) is more preferred.

Next, the group (ZA-1-2) will be described below.

The group (ZA-1-2) refers to a group of the general formula (ZA-1), in which each of $R_{201}$ to $R_{203}$ independently represents an organic group containing no aromatic ring. Herein, the aromatic ring also includes one, containing a heteroatom.

The organic groups containing no aromatic ring of $R_{201}$ to $R_{203}$ generally have 1 to 30 carbon atoms, and preferably 1 to 20 carbon atoms.

Each of $R_{201}$ to $R_{203}$ are independently an alkyl group, a monovalent aliphatic hydrocarbon ring group, an allyl group, or a vinyl, group, and more preferably a linear or branched 2-oxoalkyl group, a 2-oxo aliphatic hydrocarbon ring group, or an alkoxycarbonylmethyl group, and particularly preferably a linear or branched 2-oxo aliphatic hydrocarbon ring group.

Preferred examples of the alkyl groups and the aliphatic hydrocarbon ring groups of $R_{201}$ to $R_{203}$ include a linear or branched alkyl group having 1 to 10 carbon atoms (for example, a methyl group, an ethyl group, a propyl group, a butyl group, and a pentyl group), and an aliphatic hydrocarbon ring group having 3 to 10 carbon atoms (for example, a cyclopentyl group, a cyclohexyl group, and a norbornyl group). More preferred examples of the alkyl group include a 2-oxoalkyl group and an alkoxycarbonylmethyl group. Still preferred examples of the aliphatic hydrocarbon ring group include a 2-oxo aliphatic hydrocarbon ring group.

The 2-oxoalkyl group may be linear or branched, and preferred examples thereof include the alkyl group as described above, in which >C=O is introduced in the 2-position thereof.

The 2-oxo aliphatic hydrocarbon ring group is preferably the aliphatic hydrocarbon ring group as described above, in which >C=O is introduced in the 2-position thereof.

Preferred examples of the alkoxy group in the alkoxycarbonylmethyl group include an alkoxy group having 1 to 5-carbon atoms (a methoxy group, an ethoxy group, a propoxy group, a butoxy group, and a pentoxy group).

$R_{201}$ to $R_{203}$ may be further substituted with a substituent such as a halogen atom, an alkoxy group (for example, one having 1 to 5 carbon atoms), a hydroxyl group, a cyano group, a nitro group, and the like.

Next, the group (ZA-1-3) will be described below

The group (ZA-1-3) is a group represented by the following general formula (ZA-1-3), which has a phenacylsulfonium salt structure.

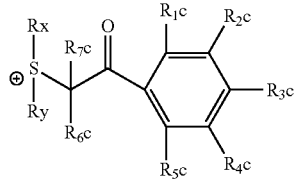

(ZA-1-3)

In the general formula (ZA-1-3), each of $R_{1c}$ to $R_{5c}$ independently represents a hydrogen atom, an alkyl group, a monovalent aliphatic hydrocarbon ring group, an alkoxy group, a phenylthio group, a halogen atom.

Each of $R_{6c}$ and $R_{7c}$ independently represents a hydrogen atom an alkyl group, or a monovalent aliphatic hydrocarbon ring group.

Each of $R_x$ and $R_y$ independently represents an alkyl group, a monovalent aliphatic hydrocarbon ring group, an allyl group, or a vinyl group.

Any two or more of $R_{1c}$ to $R_{5c}$, and $R_{6c}$ and $R_{7c}$, and $R_x$ and $R_y$ may be bonded to each other to form a ring structure. This ring structure may contain an oxygen atom, a sulfur atom, an ester bond or an amido bond. Examples of the group formed by the mutual bonding of any two or more of $R_{1c}$ to $R_{5c}$, and $R_{6c}$ and $R_{7c}$, and $R_x$ and $R_y$ include a butylene group, a pentylene group, and the like.

The alkyl groups as $R_{1c}$ to $R_{7c}$ may be linear or branched. Examples thereof include an alkyl group having 1 to 20 carbon atoms, and preferably a linear or branched alkyl group having 1 to 12 carbon atoms (for example, a methyl group, an ethyl group, a linear or branched propyl group, a linear or branched butyl group, and a linear or branched pentyl group).

Furthermore, the monovalent aliphatic hydrocarbon ring groups as $R_{1c}$ to $R_{7c}$ may be monocyclic or polycyclic, and examples thereof include a monovalent aliphatic hydrocarbon ring group having 3 to 8 carbon atoms (for example, a cyclopentyl group and a cyclohexyl group).

The alkoxy group as $R_{1c}$ to $R_{5c}$ may be linear, or branched, or cyclic. Examples thereof include an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group, and a linear or branched pentoxy group), and a cycloalkoxy group having 3 to 8 carbon atoms (for example, a cyclopentyloxy group and a cyclohexyloxy group).

Preferably, any one of $R_{1c}$ to $R_{5c}$ is a linear or branched alkyl group, a monovalent aliphatic hydrocarbon ring group, or a linear, branched, or cyclic alkoxy group. More preferably, the sum of carbon atoms of $R_{1c}$ to $R_{5c}$ is from 2 to 15. Accordingly, an enhancement of solvent solubility of the composition of the present invention and inhibition of particle generation during storage can be attained.

Examples of the alkyl groups and the monovalent aliphatic hydrocarbon ring groups as $R_x$ and $R_y$ include the same alkyl groups and monovalent aliphatic hydrocarbon ring groups as mentioned with respect to $R_{1c}$ to $R_{7c}$, and a 2-oxoalkyl group, a 2-oxo aliphatic hydrocarbon ring group, and an alkoxycarbonylmethyl group are more preferred.

Examples of the 2-oxoalkyl group and the 2-oxo aliphatic hydrocarbon ring group include groups having >C=O at the 2-position of the alkyl group and the aliphatic hydrocarbon ring group as $R_{1c}$ to $R_{7c}$.

Examples of the alkoxy group of the alkoxycarbonylmethyl group include the same alkoxy groups as mentioned with respect to $R_{1c}$ to $R_{5c}$.

Each of $R_x$ and $R_y$ is preferably an alkyl group or a monovalent aliphatic hydrocarbon ring group having preferably 4 or more carbon atoms. It is more preferably an alkyl group or monovalent aliphatic hydrocarbon ring group having 6 or more carbon atoms, and still more preferably 8 or more carbon atoms.

Furthermore, examples of the ring structure that may be formed by the mutual bonding of $R_x$ and $R_y$ include a 5- or 6-membered ring, particularly preferably a 5-membered ring (namely, a tetrahydrothiophene ring), formed by divalent $R_x$ and $R_y$ (for example, a methylene group, an ethylene group, a propylene group, and the like) in combination with the sulfur atom in the general formula (ZA-1-3).

Next, the general formula (ZA-2) will be described below.

In the general formula (ZA-2), each of $R_{204}$ and $R_{205}$ independently represents an aryl group, an alkyl group, or a monovalent aliphatic hydrocarbon ring group.

The aryl group of each of $R_{204}$ and $R_{205}$ is preferably a phenyl group or a naphthyl group, and more preferably a phenyl group. The aryl group of each of $R_{204}$ and $R_{205}$ may be an aryl group having a heterocyclic structure containing an oxygen atom, a nitrogen atom, a sulfur atom, and the like. Examples of the aryl group with a heterocyclic structure include a pyrrole residue (group formed by the loss of one hydrogen atom from pyrrole), a furan residue (group formed by the loss of one hydrogen atom from furan), a thiophene residue (group formed by the loss of one hydrogen atom from thiophene), an indole residue (group formed by the loss of one hydrogen atom from indole), a benzofuran residue (group formed by the loss of one hydrogen atom from benzofuran), a benzothiophene residue (group formed by the loss of one hydrogen atom from benzothiophene), and the like.

Preferred examples of the alkyl groups and the monovalent aliphatic hydrocarbon ring groups in $R_{204}$ and $R_{205}$ include a linear or branched alkyl group having 1 to 10 carbon atoms (for example, a methyl group, an ethyl group, a propyl group, a butyl group, and a pentyl group) and a monovalent aliphatic hydrocarbon ring group having 3 to 10 carbon atoms (for example, a cyclopentyl group, a cyclohexyl group, and a norbornyl group).

The aryl group, the alkyl group, and the monovalent aliphatic hydrocarbon ring group of each of $R_{204}$ and $R_{205}$ may have a substituent. Examples of the substituents that may be introduced in the aryl group, the alkyl group, and the monovalent aliphatic hydrocarbon ring group of each of $R_{204}$ and $R_{205}$ include an alkyl group (for example, having 1 to 15 carbon atoms), a monovalent aliphatic hydrocarbon ring group (for example, having 3 to 15 carbon atoms), an aryl group (for example, having 6 to 15 carbon atoms), an alkoxy group (for example, having 1 to 15 carbon atoms), a halogen atom, a hydroxyl group, a phenylthio group, and the like.

Examples of the specific structure of the cation constituting an onium salt which is suitable as $Z_1$ in the general formula (I) will be shown hereinafter.

With respect to the polymerizable monomer units corresponding to the repeating units of the general formula (I), examples thereof will be shown below as sulfonate, imidate and methide units formed by the cleavage of a cation by irradiation with active light ray or radioactive ray.

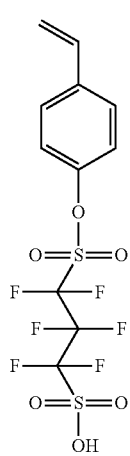

(I-1)

-continued

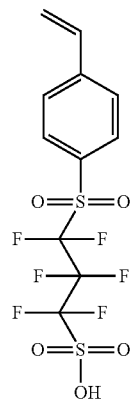

(I-2)

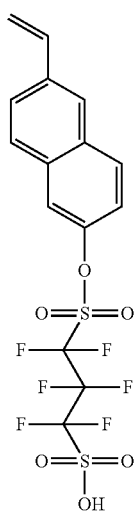

(I-3)

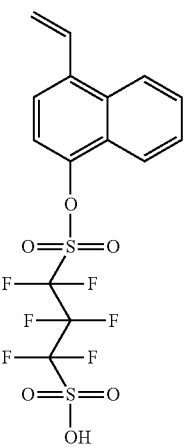

(I-4)

(I-5)
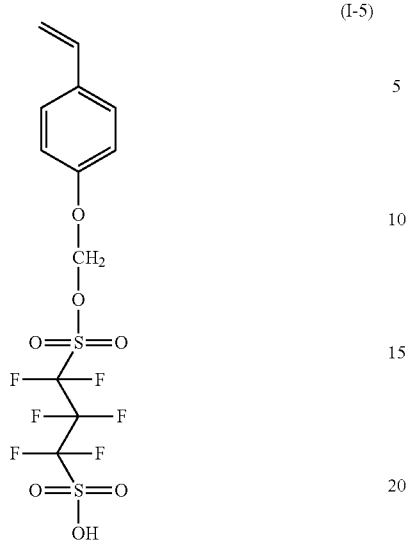
(I-6)
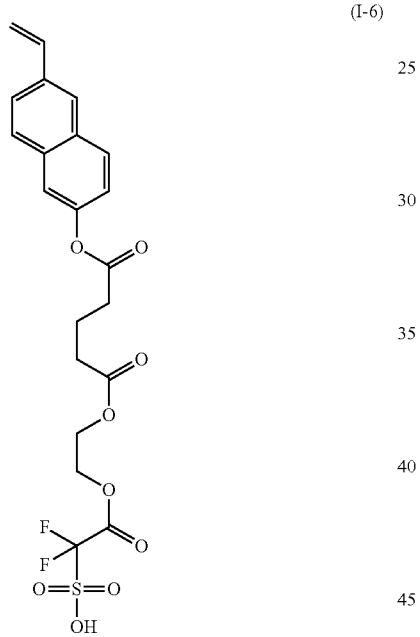
(I-7)
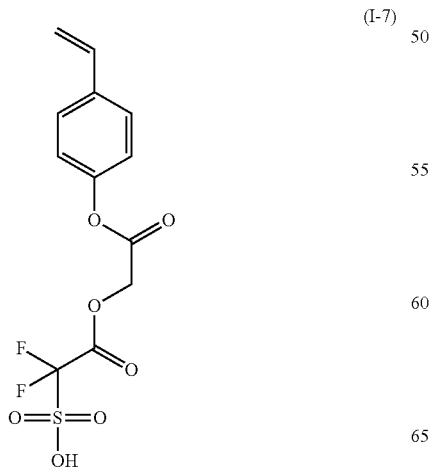
(I-8)
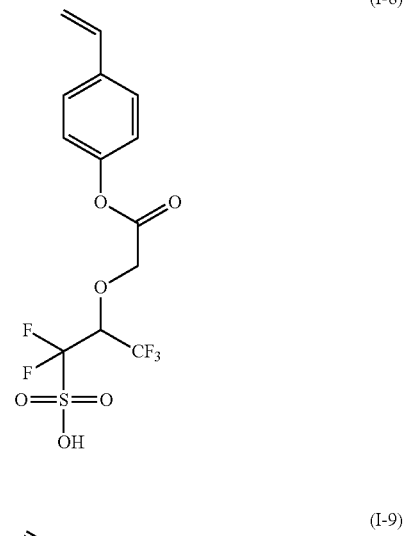
(I-9)
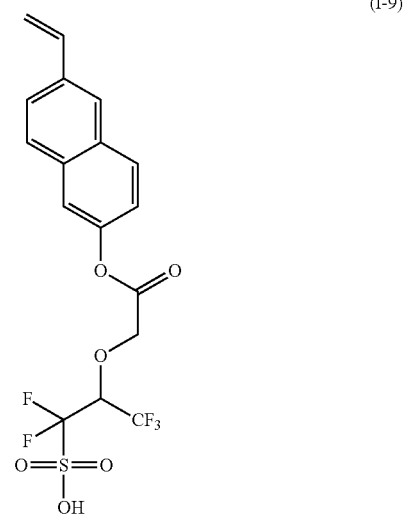
(I-10)
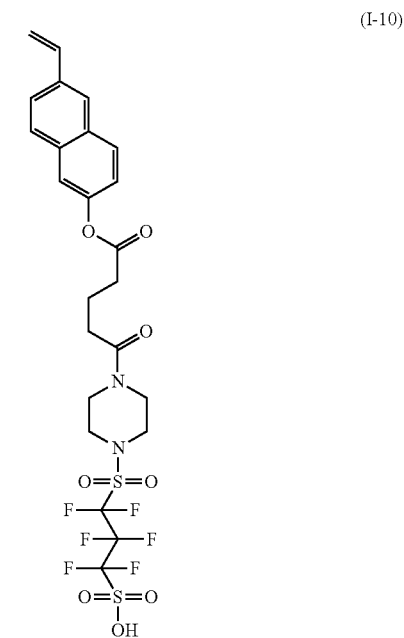

(I-11)
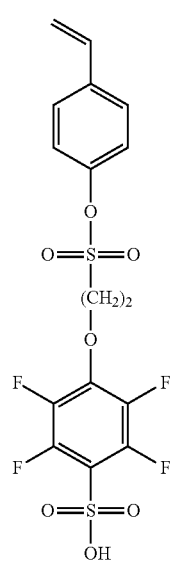
(I-12)
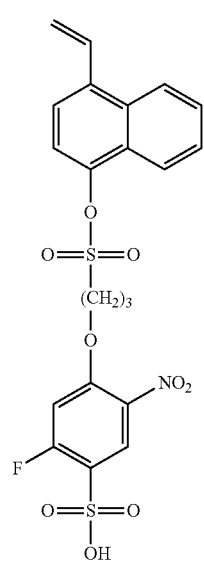
(I-13)
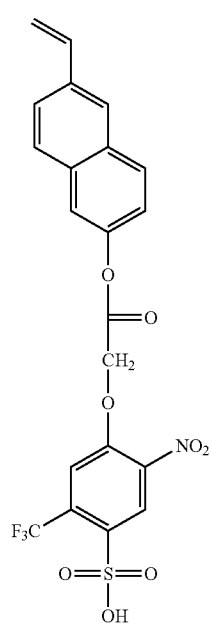
(I-14)
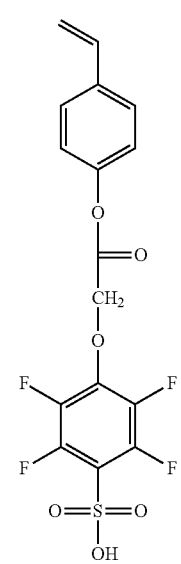

(I-15)
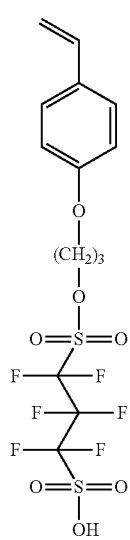
(I-16)
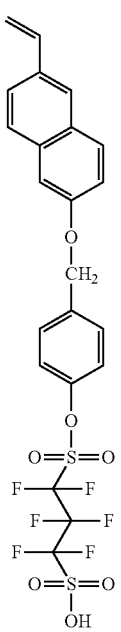
(I-17)
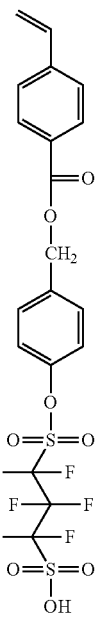
(I-18)
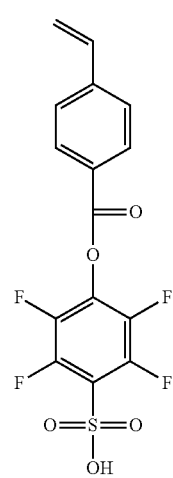
(I-19)
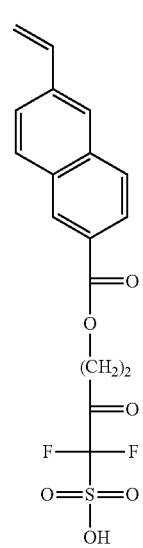

(I-20)
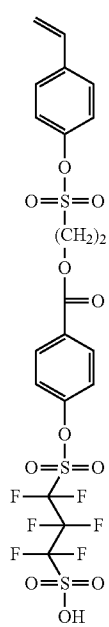
(I-21)
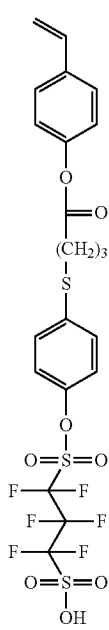
(I-22)
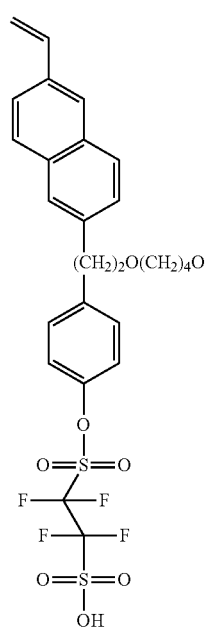
(I-23)
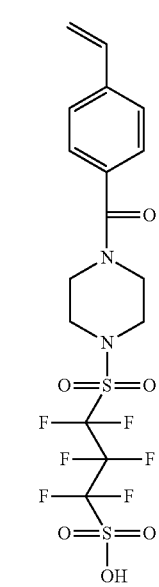

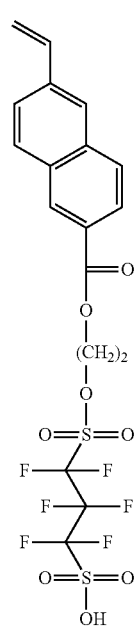 (I-24)
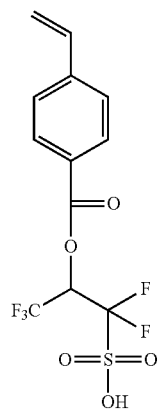 (I-25)
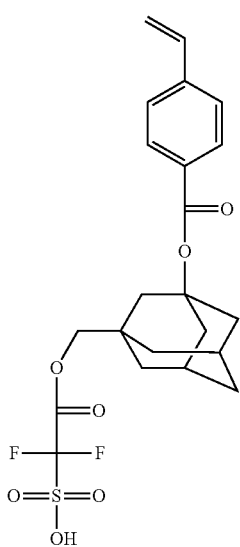 (I-26)
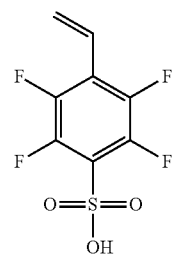 (I-27)
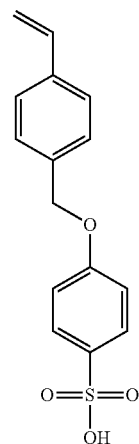 (I-28)
(I-29)
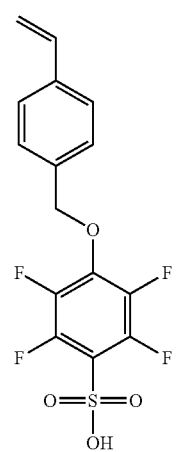 (I-30)

(I-31)
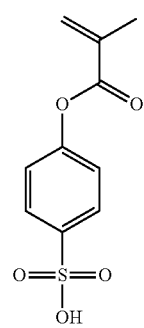
(I-32)
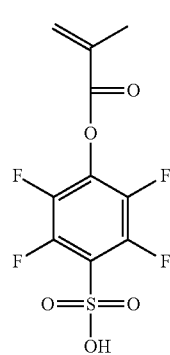
(I-33)
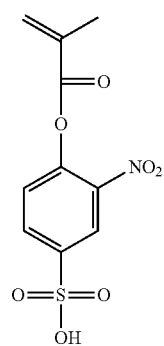
(I-34)
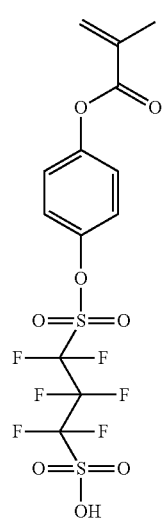
(I-35)
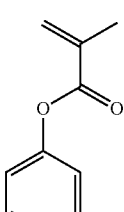
(I-36)
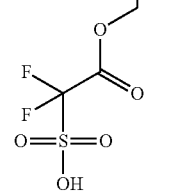
(I-37)
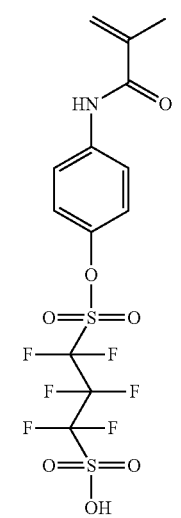

(I-38)
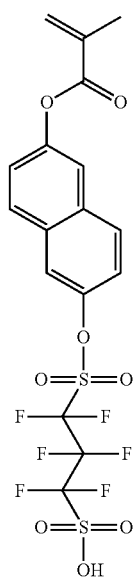
(I-39)
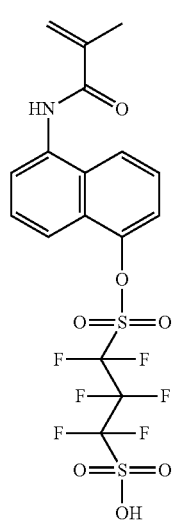
(I-40)
(I-41)
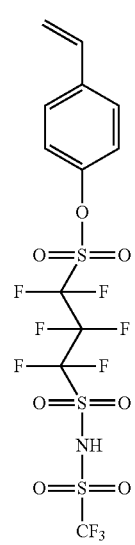
(I-42)
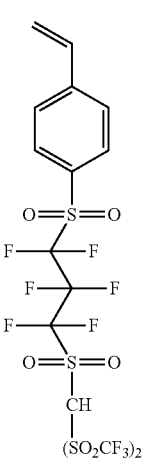
(I-43)
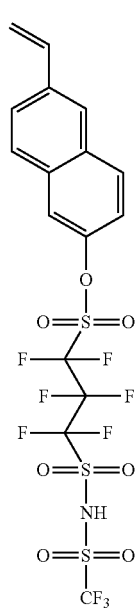

(I-44)
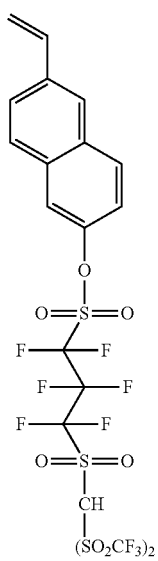
(I-45)
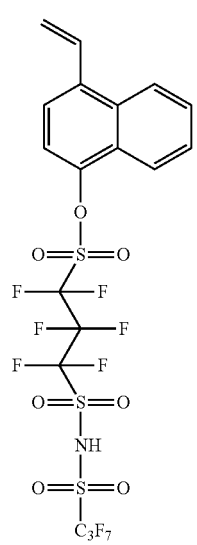
(I-46)
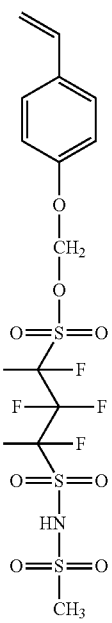
(I-47)
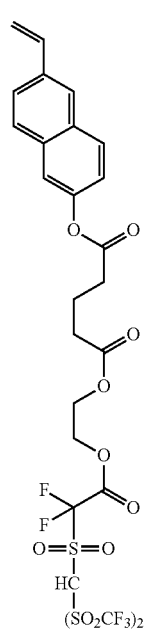

(I-48)
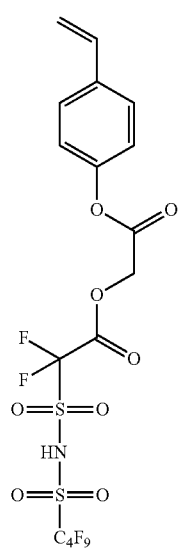
(I-49)
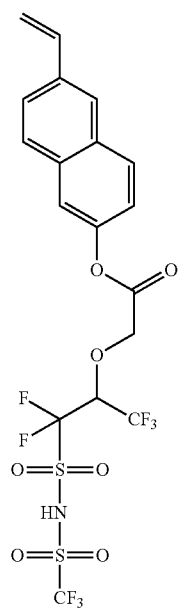
(I-50)
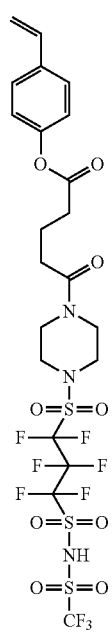
(I-51)
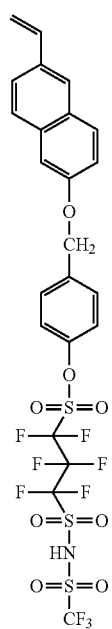

(I-52)
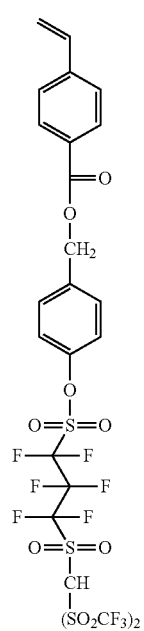
(I-53)
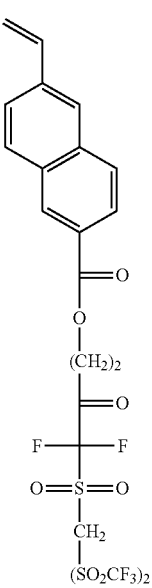
(I-54)
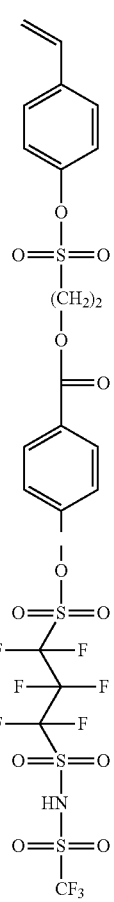
(I-55)
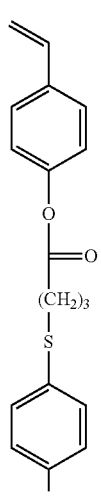

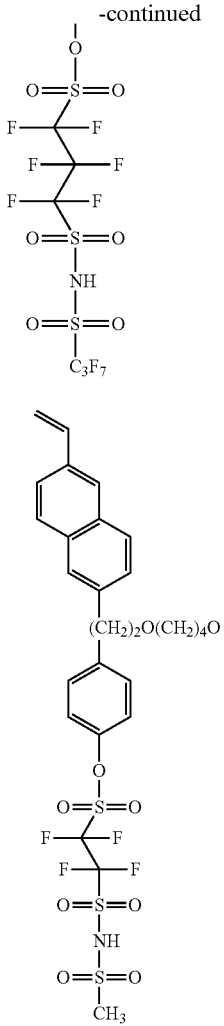
(I-56)
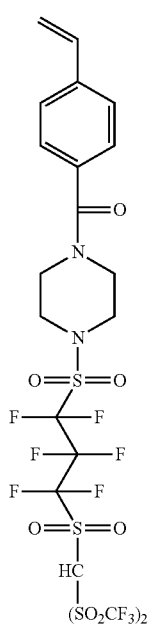
(I-57)
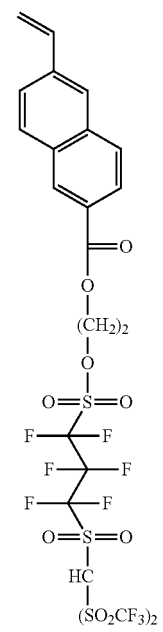
(I-58)
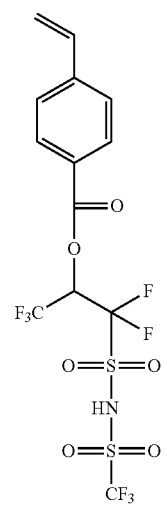
(I-59)

(I-60)
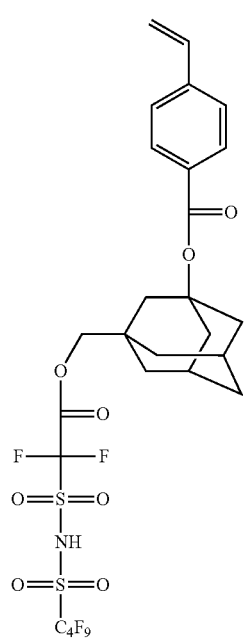
(I-61)
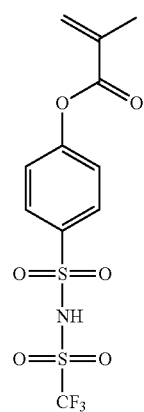
(I-62)
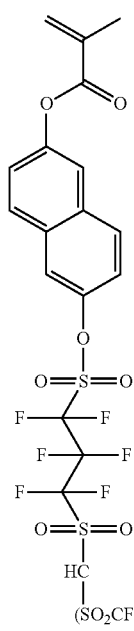
(I-63)
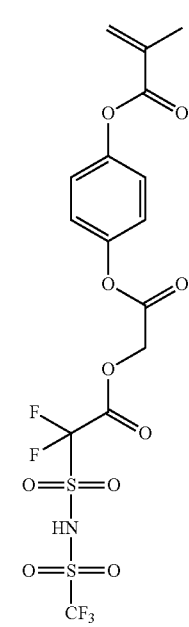
(I-64)
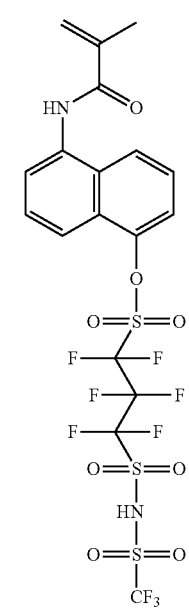

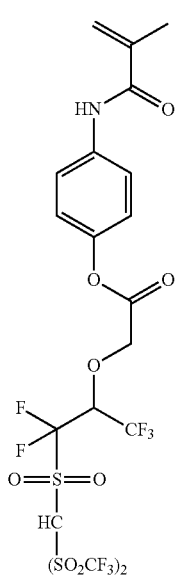

(I-65)

Next, the general formula (II) will be described.

In the general formula (II), each of $R_{21}$, $R_{22}$, and $R_{23}$ independently represents a hydrogen atom, an alkyl group, a monovalent aliphatic hydrocarbon ring group, a halogen atom, a cyano group, or an alkoxycarbonyl group.

The alkyl group is a linear or branched alkyl group which may be substituted, and preferably an alkyl group having 20 or less carbon atoms, which may be substituted, such as a methyl group, an ethyl group, a propyl group, an isopropyl group, an n-butyl group, a sec-butyl group, a hexyl group, a 2-ethylhexyl group, an octyl group, and a dodecyl group, more preferably an alkyl group having 8 or less carbon atoms, and particularly preferably an alkyl group having 3 or less carbon atoms.

The alkyl group contained in the alkoxycarbonyl group is preferably the same as the alkyl group mentioned above with respect to $R_{21}$, $R_{22}$, and $R_{23}$.

Examples of the monovalent aliphatic hydrocarbon ring group include a monocyclic or polycycloalkyl group which may have a substituent, and preferably a monocyclic monovalent aliphatic hydrocarbon ring group having 3 to 8 carbon atoms, which may have a substituent, such as a cyclopropyl group, a cyclopentyl group, and a cyclohexyl group.

Examples of the halogen atom include a fluorine atom, a chlorine atom, a bromine atom, and an iodine atom, and a fluorine atom is particularly preferred.

Examples of the preferred substituents that can be introduced in each of the groups include a hydroxyl group, a halogen atom (fluorine, chlorine, bromine, and iodine), a nitro group, a cyano group, an amido group, a sulfonamido group, the alkyl groups mentioned above with respect to $R_{21}$ to $R_{23}$, an alkoxy group (a methoxy group, an ethoxy group, a hydroxyethoxy group, a propoxy group, a hydroxypropoxy group, a butoxy group, and the like), an alkoxycarbonyl group (a methoxycarbonyl group, an ethoxycarbonyl group, and the like), an acyl group (a formyl group, an acetyl group, a benzoyl group, and the like), an acyloxy group (an acetoxy group, a butyryloxy group, and the like), and a carboxyl group. A hydroxyl group and a halogen atom are particularly preferred.

In the formula (II), each of $R_{21}$, $R_{22}$, and $R_{23}$ is preferably a hydrogen atom, an alkyl group, or a halogen atom, and particularly preferably a hydrogen atom, a methyl group, an ethyl group, a trifluoromethyl group (—$CF_3$), a hydroxymethyl group (—$CH_2$—OH), a chloromethyl group (—$CH_2$—Cl), or a fluorine atom (—F).

$X_{21}$ represents —O—, —S—, —CO—, —$SO_2$—, —NR— (wherein R represents a hydrogen atom or an alkyl group), a divalent nitrogen-containing non-aromatic heterocyclic group, or a group formed by combination thereof.

In —NR—, the alkyl group represented by R is a linear or branched alkyl group which may have a substituent. Specific examples of the alkyl group include the same as mentioned above with respect to the alkyl groups in $R_{21}$, $R_{22}$, and $R_{23}$. R is particularly preferably a hydrogen atom, a methyl group, or an ethyl group.

Furthermore, the divalent nitrogen-containing non-aromatic heterocyclic group refers to a non-aromatic heterocyclic group, preferably 3- to 8-membered, containing at least one nitrogen atom. Examples thereof include the structures mentioned above as examples with respect to $X_{11}$ to $X_{13}$ in the general formula (I).

$X_{21}$ is preferably —O—, —CO—, or —NR— (wherein R represents a hydrogen atom or an alkyl group) or a group formed by combination thereof, and particularly preferably —COO— or —CONR— (wherein R represents a hydrogen atom or an alkyl group).

$L_{21}$ represents an alkylene group, an alkenylene group, a divalent aliphatic hydrocarbon ring group, or a group formed by combination of two or more thereof. In the group formed by combination, two or more groups combined together may be the same as or different from each other and may be linked to each other through, as a linking group, —O—, —S—, —CO—, —$SO_2$—, —NR— (wherein R represents a hydrogen atom or an alkyl group), a divalent nitrogen-containing non-aromatic heterocyclic group, a divalent aromatic ring group, or a group formed by combination thereof.

The alkylene group in $L_{21}$ may be linear or branched, and preferred examples thereof include an alkylene group having 1 to 8 carbon atoms, such as a methylene group, an ethylene group, a propylene group, a butylene group, a hexylene group, and an octylene group. An alkylene group having 1 to 6 carbon atoms is more preferred, and an alkylene group having 1 to 4 carbon atoms is particularly preferred.

Examples of the alkenylene group include a group formed by introduction of a double bond in any position of the alkylene group described above with respect to $L_{21}$.

The divalent aliphatic hydrocarbon ring group may be monocyclic or polycyclic, and preferred examples thereof include a divalent aliphatic hydrocarbon ring group having 3 to 17 carbon atoms, such as a cyclobutylene group, a cyclopentylene group, a cyclohexylene group, a norbornanylene group, an adamantylene group, a diamantanylene group, and the like. A divalent aliphatic hydrocarbon ring group having 5 to 12 carbon atoms is more preferred, and a divalent aliphatic hydrocarbon ring group having 6 to 10 carbon atoms is particularly preferred.

Examples of the divalent aromatic ring group of the linking group include an arylene group having 6 to 14 carbon atoms, which may be substituted (a phenylene group, a tolylene group, a naphthylene group, and the like), and a divalent aromatic ring group containing a heteroring, which may be substituted (thiophene, furan, pyrrole, benzothiophene, benzofuran, benzopyrrole, triazine, imidazole, benzimidazole, triazole, thiadiazole, thiazole, and the like).

Furthermore, specific examples of each of the —NR— and the divalent nitrogen-containing non-aromatic heterocyclic group are the same as mentioned above with respect to $X_{21}$. Preferred examples are also the same.

$L_{21}$ is particularly preferably an alkylene group, a divalent aliphatic hydrocarbon ring group, or a group formed by combination of an alkylene group and a divalent aliphatic hydrocarbon ring group through —COO—, —O—, or —CONH— as a linking group (for example, -alkylene group-O-alkylene group-, -alkylene group-OCO-alkylene group-, -divalent aliphatic hydrocarbon ring group-O-alkylene group-, -alkylene group-CONH-alkylene group-, and the like).

Each of $X_{22}$ and $X_{23}$ independently represents a single bond, —O—, —S—, —CO—, —SO$_2$—, —NR— (wherein R represents a hydrogen atom or an alkyl group), a divalent nitrogen-containing non-aromatic heterocyclic group, or a group formed by combination thereof.

Specific examples of each of the —NR— and the divalent nitrogen-containing non-aromatic heterocyclic group in $X_{22}$ and $X_{23}$ are the same as mentioned above with respect to $X_{21}$. Preferred examples are also the same.

$X_{22}$ is preferably a single bond, —S—, —O—, —CO—, —SO$_2$—, or a group formed by combination thereof, and particularly preferably a single bond, —S—, —OCO—, or —OSO$_2$—.

$X_{23}$ is preferably —O—, —CO—, —SO$_2$—, or a group formed by combination thereof, and particularly preferably —OSO$_2$—.

$Ar_2$ represents a divalent aromatic ring group, or a group formed by combination of a divalent aromatic ring group and an alkylene group.

The divalent aromatic ring group may have a substituent. Preferred examples of the divalent aromatic ring group include an arylene group having 6 to 18 carbon atoms, such as a phenylene group, a tolylene group, a naphthylene group, and the like, and a divalent aromatic ring group containing a heteroring, such as thiophene, furan, pyrrole, benzothiophene, benzofuran, benzopyrrole, triazine, imidazole, benzimidazole, triazole, thiadiazole, triazole, and the like.

Examples of the preferred substituents that can be introduced in the above groups include the alkyl group mentioned with respect to $R_{21}$ to $R_{23}$, an alkoxy group such as a methoxy group, an ethoxy group, a hydroxyethoxy group, a propoxy group, a hydroxypropoxy group, a butoxy group, and the like, and an aryl group such as a phenyl group and the like.

Preferred example of the group formed by combination of a divalent aromatic ring group and an alkylene group include an aralkylene group formed by combination of any of the divalent aromatic ring groups as described above, and for example, an alkylene group having 1 to 8 carbon atoms (which may be linear or branched), such as a methylene group, an ethylene group, a propylene group, a butylene group, a hexylene group, an octylene group, and the like.

$Ar_2$ is preferably an aralkylene group formed by combination of an arylene groups having 6 to 18 carbon atoms, may have a substituent, an arylene groups having 6 to 18 carbon atoms, and an alkylene group having 1 to 4 carbon atoms, and particularly preferably a phenylene group, a naphthylene group, a biphenylene group, or a phenylene group substituted with a phenyl group.

$L_{22}$ represents an alkylene group, an alkenylene group, a divalent aliphatic hydrocarbon ring group, a divalent aromatic ring group, or a group formed by combination of two or more thereof, in which the hydrogen atoms of these groups are partially or entirely substituted with a substituent selected from among a fluorine atom, a fluoroalkyl group, a nitro group, and a cyano group. In the group formed by combination, two or more groups combined together may be the same as or different from each other and may be linked to each other through, as a linking group, —O—, —S—, —CO—, —SO$_2$—, —NR— (wherein R represents a hydrogen atom or an alkyl group), a divalent nitrogen-containing non-aromatic heterocyclic group, or a group formed by combination thereof.

$L_{22}$ is preferably an alkylene group, a divalent aromatic ring group, or a group formed by combination thereof whose hydrogen atoms are partially or entirely substituted with a fluorine atom or a fluoroalkyl group (more preferably a perfluoroalkyl group), particularly preferably an alkylene group and a divalent aromatic ring group at least partially or entirely substituted with a fluorine atom, and most preferably an alkylene group or a divalent aromatic ring group, whose 30 to 100% of the hydrogen atoms are substituted with a fluorine atom.

The alkylene group in $L_{22}$ may be linear or branched, and preferred examples thereof include an alkylene group having 1 to 8 carbon atoms, such as a methylene group, an ethylene group, a propylene group, a butylene group, a hexylene group, an octylene group, and the like. An alkylene group having 1 to 6 carbon atoms is more preferred, and an alkylene group having 1 to 4 carbon atoms is particularly preferred.

Examples of the alkenylene group include a group formed by introduction of a double bond in any position of the above alkylene group.

The divalent aliphatic hydrocarbon ring group may be monocyclic or polycyclic, and preferred examples thereof include a divalent aliphatic hydrocarbon ring group having 3 to 17 carbon atoms, such as a cyclobutylene group, a cyclopentylene group, a cyclohexylene group, a norbornanylene group, an adamantylene group, a diadamantanylene group, and the like.

Specific examples of the divalent aromatic ring group are the same as mentioned with respect to the divalent aromatic ring group as a linking group in $L_{21}$ as described above.

Furthermore, specific examples of the —NR— and divalent nitrogen-containing non-aromatic heterocyclic group as the linking group in $L_{22}$ are the same as mentioned above with respect to $X_{21}$. Preferred examples are also the same.

Preferred specific examples of the structures of $L_{22}$ include those mentioned above with respect to $L_{12}$ in the general formula (I).

$Z_2$ represents a moiety that becomes a sulfonate group, an imidate group, or a methide group by irradiation with active light ray or radioactive ray. The meaning of $Z_2$ is the same as that of $Z_1$ in the general formula (I). The above description regarding $Z_1$ also applies to $Z_2$.

Examples of specific structures of the cations for constituting onium salts which are suitable as $Z_2$ in the general formula (II) will be shown hereinafter.

With respect to the polymerizable monomer unit corresponding to the repeating unit of the general formula (II), examples thereof will be shown below as sulfonate, imidate and methide units formed by the cleavage of a cation by irradiation with active light ray or radioactive ray.

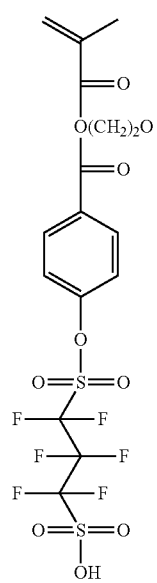
(II-1)
(II-2)
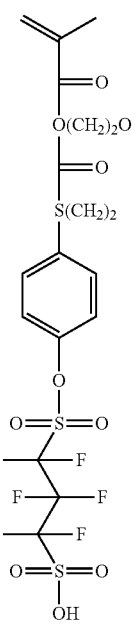
(II-3)
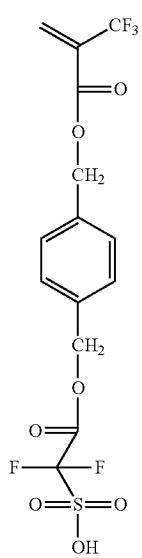
(II-4)

(II-5) 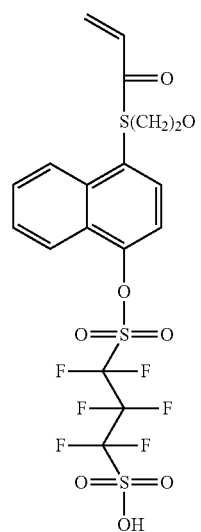
(II-6) 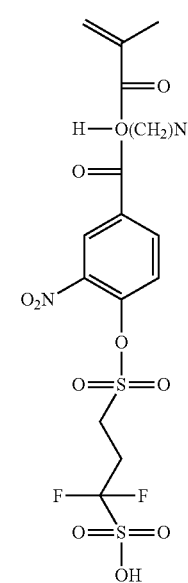
(II-7) 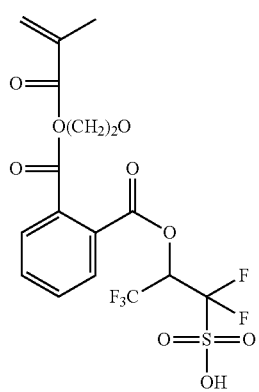
(II-8) 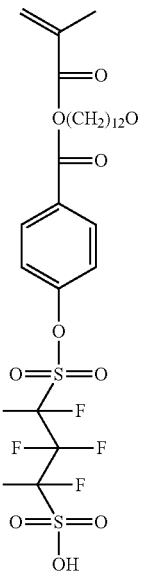
(II-9) 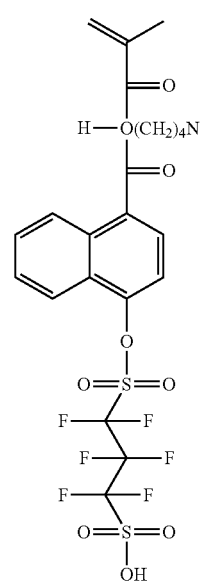
(II-10) 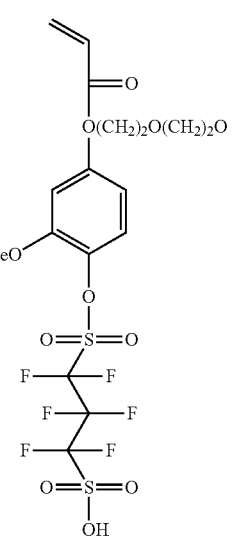

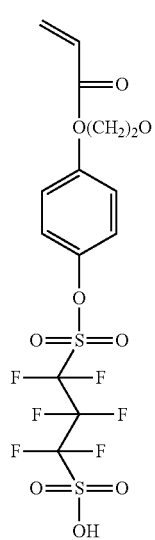
(II-11)
(II-12)
(II-13)
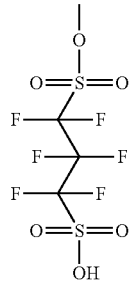
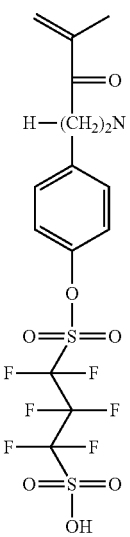
(II-14)
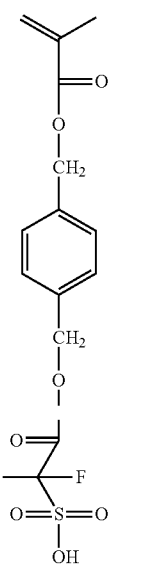
(II-15)

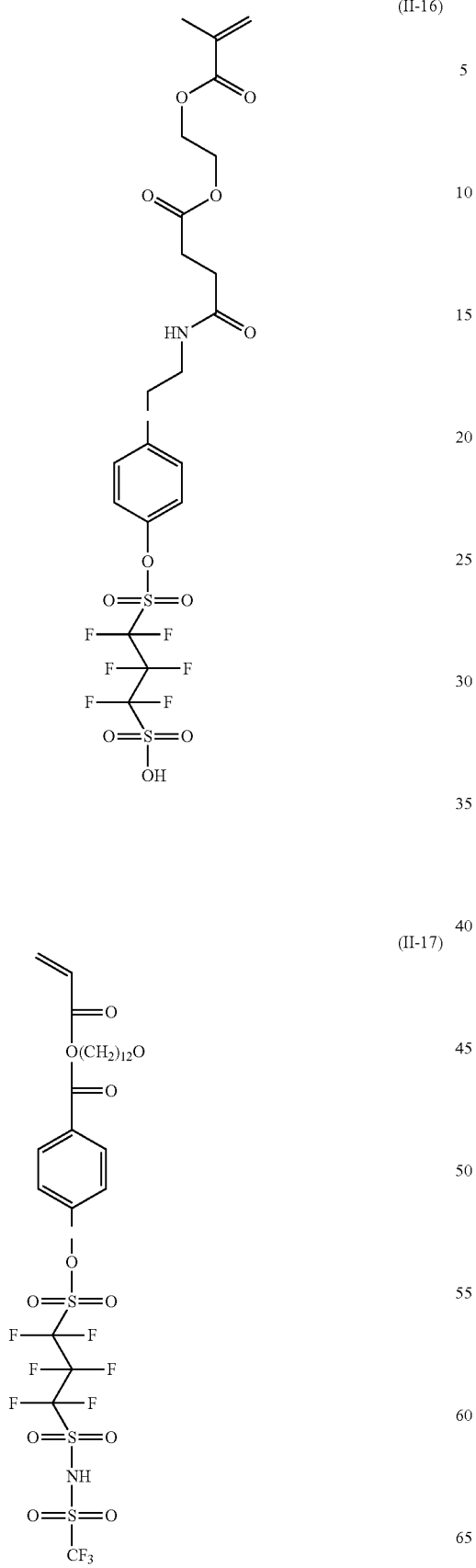
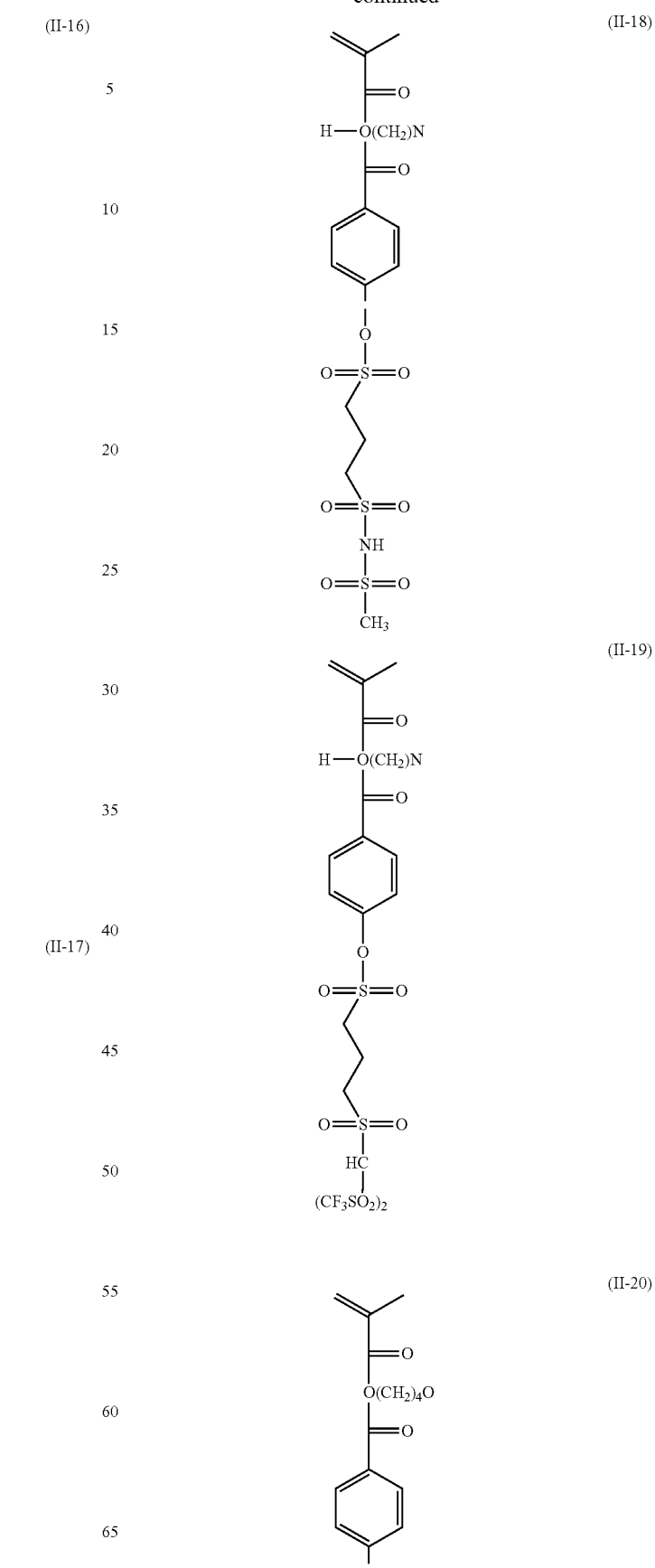

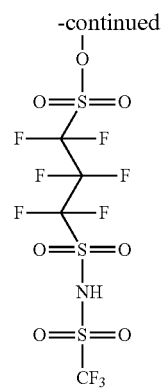
(II-21)
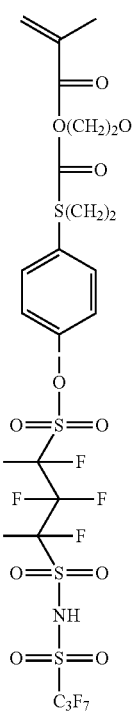
(II-22)
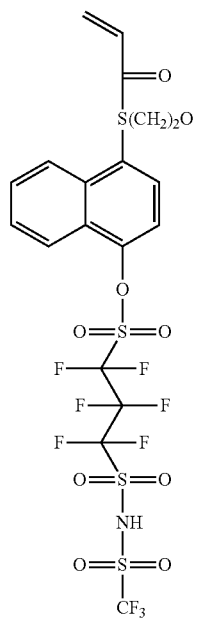
(II-23)
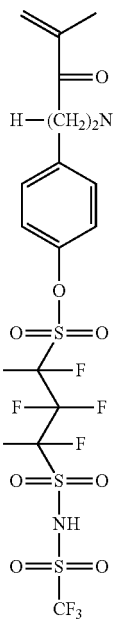
(II-24)
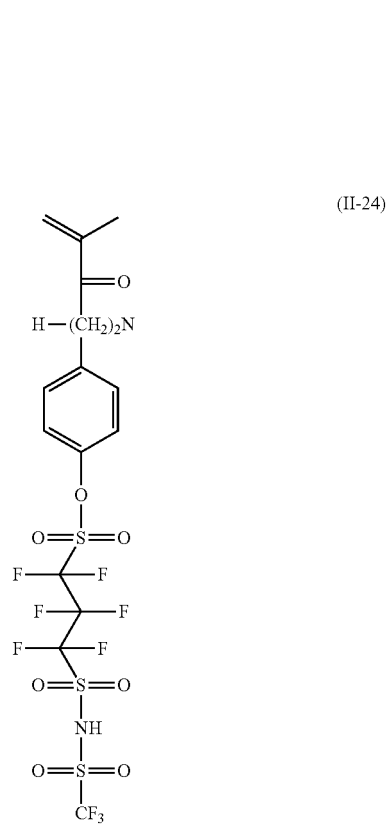

(II-25)

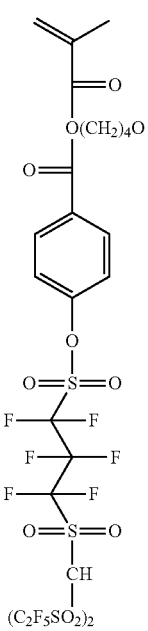

(II-26)

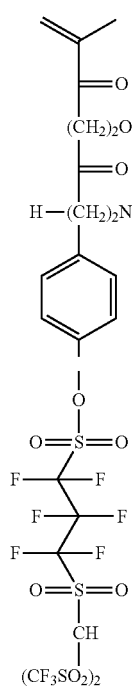

(II-27)

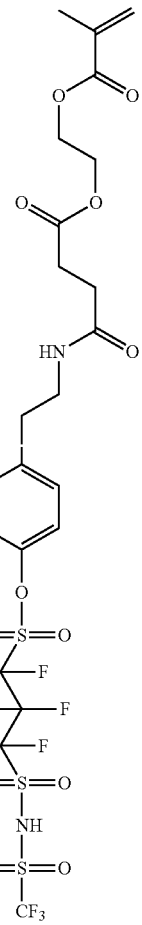

Moreover, the repeating unit (A) in its other form may be any of repeating units wherein an aromatic ring is contained in the side chain excluding the countercation to the acid anion, represented by the formulae other than the general formula (I) or (II).

With respect to the polymerizable monomer unit corresponding to this repeating unit (A), examples thereof will be shown below as sulfonate, imidate and methide units formed by the cleavage of a cation by irradiation with active light ray or radioactive ray.

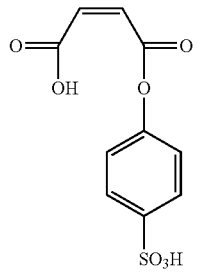 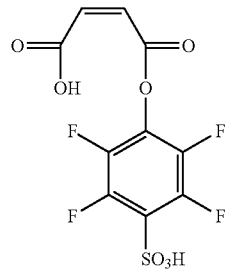

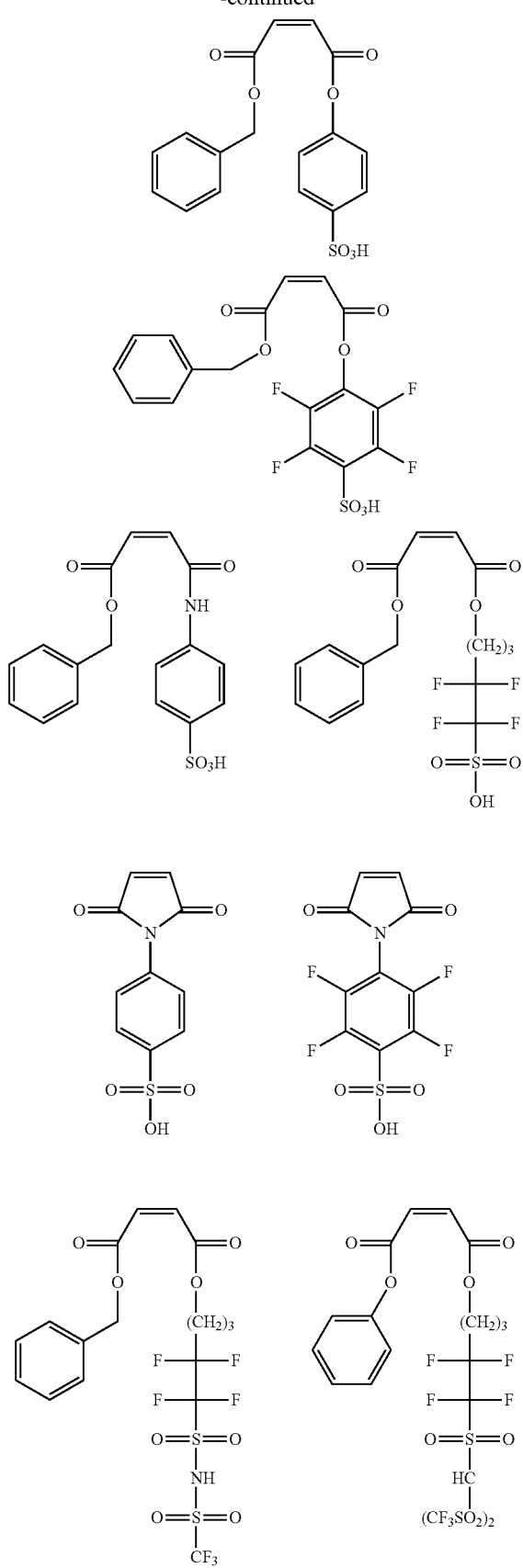

The repeating units represented by the general formula (III) below are also preferred as the repeating unit (A).

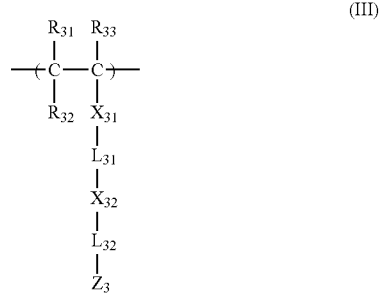

In the general formula (III), each of $R_{31}$, $R_{32}$, and $R_{33}$ independently represents a hydrogen atom, an alkyl group a monovalent aliphatic hydrocarbon ring group a halogen atom, a cyano group, or an alkoxycarbonyl group.

The alkyl group is a linear or branched alkyl group which may have a substituent, preferably an alkyl group having 20 or less carbon atoms, which may be substituted, such as a methyl group, an ethyl group, a propyl group, an isopropyl group, an n-butyl group, a sec-butyl group, a hexyl group, a 2-ethylhexyl group, an octyl group, or a dodecyl group, more preferably an alkyl group having 8 or less carbon atoms, and particularly preferably an alkyl group having 3 or less carbon atoms.

The alkyl group contained in the alkoxycarbonyl group is preferably the same as the alkyl group mentioned above with respect to $R_{31}$, $R_{32}$, and $R_{33}$.

Examples of the monovalent aliphatic hydrocarbon ring group include a monocyclic or polycyclic aliphatic hydrocarbon ring group which may have a substituent, and preferably a monocyclic monovalent aliphatic hydrocarbon ring group having 3 to 8 carbon atoms, which may have a substituent, such as a cyclopropyl group, a cyclopentyl group, and a cyclohexyl group.

Examples of the halogen atom include a fluorine atom, a chlorine atom, a bromine atom, and an iodine atom, and a fluorine atom is particularly preferred.

Examples of preferred substituents that can be introduced in each of these groups include a hydroxyl group; a halogen atom (fluorine, chlorine, bromine, and iodine); a nitro group; a cyano group; an amido group; a sulfonamido group; any of the alkyl groups mentioned above with respect to $R_{21}$ to $R_{23}$, an alkoxy group (a methoxy group, an ethoxy group, a hydroxyethoxy group, a propoxy group, a hydroxypropoxy group, a butoxy group, and the like), an alkoxycarbonyl group (a methoxycarbonyl group, an ethoxycarbonyl group, and the like), an acyl group (a formyl group, an acetyl group, a benzoyl group, and the like), an acyloxy group (an acetoxy group, a butyryloxy group, and the like), and a carboxyl group. A hydroxyl group and a halogen atom are particularly preferred.

In the formula (III), each of $R_{31}$, $R_{32}$, and $R_{33}$ preferably represent a hydrogen atom, an alkyl group, or a halogen atom, and particularly preferably a hydrogen atom, a methyl group, an ethyl group, a trifluoromethyl group (—$CF_3$), a hydroxymethyl group (—$CH_2$—OH), a chloromethyl group (—$CH_2$—Cl), or a fluorine atom (—F).

Each of $X_{31}$ and $X_{32}$ independently represents a single bond, —O—, —S—, —CO—, —$SO_2$—, —NR— (wherein R represents a hydrogen atom or an alkyl group), a divalent nitrogen-containing non-aromatic heterocyclic group, or a group formed by combination thereof.

In —NR—, the alkyl group represented by R is a linear or branched alkyl group, which may be substituted. Specific examples of such alkyl groups are the same as mentioned above with respect to the alkyl groups in $R_{31}$, $R_{32}$ and $R_{33}$. R is particularly preferably a hydrogen atom, a methyl group, or an ethyl group.

Furthermore, the divalent nitrogen-containing non-aromatic heterocyclic group refers to a non-aromatic heterocyclic group, preferably 3- to 8-membered, containing at least one nitrogen atom. Examples thereof include the structures mentioned above as examples with respect to $X_{11}$ to $X_{13}$ in the general formula (I).

$X_{31}$ is more preferably a single bond, —O—, —CO—, or —NR— (wherein R represents a hydrogen atom or an alkyl group), or a group formed by combination thereof, and particularly preferably —COO— or —CONR— (wherein R represents a hydrogen atom or an alkyl group).

$X_{32}$ is more preferably a single bond, —O—, —CO—, —SO$_2$—, or a divalent nitrogen-containing non-aromatic heterocyclic group, or a group formed by combination thereof, and particularly preferably —COO—, —OSO$_2$—, or a group formed by combination of a divalent nitrogen-containing non-aromatic heterocyclic group and —SO$_2$—.

$L_{31}$ represents a single bond, an alkylene group, an alkenylene group, a divalent aliphatic hydrocarbon ring group, or a group formed by combination of two or more thereof. In the group formed by combination, two or more groups combined together may be the same as or different from each other and may be linked to each other through, as a linking group, —O—, —S—, —CO—, —SO$_2$—, —NR— (wherein R represents a hydrogen atom or an alkyl group), a divalent nitrogen-containing non-aromatic heterocyclic group, or a group formed by combination thereof.

The alkylene group in $L_{31}$ may be linear or branched, and preferred examples thereof include alkylene groups having 1 to 8 carbon atoms, such as a methylene group, an ethylene group, a propylene group, a butylene group, a hexylene group, an octylene group, and the like. An alkylene group having 1 to 6 carbon atoms is more preferred, and an alkylene group having 1 to 4 carbon atoms is particularly preferred.

Examples of the alkenylene group include a group formed by introduction of a double bond in any position of the alkylene group described above with respect to $L_{31}$.

The divalent aliphatic hydrocarbon ring group may be monocyclic or polycyclic, and preferred examples thereof include a divalent aliphatic hydrocarbon ring group having 3 to 17 carbon atoms, such as a cyclobutylene group, a cyclopentylene group, a cyclohexylene group, a norbornanylene group, an adamantylene group, a diamantanylene group, and the like. A divalent aliphatic hydrocarbon ring group having 5 to 12 carbon atoms is more preferred. A divalent aliphatic hydrocarbon ring group having 6 to 10 carbon atoms is particularly preferred.

Furthermore, specific examples of each of the —NR— and the divalent nitrogen-containing non-aromatic heterocyclic group are the same as mentioned above with respect to $X_{31}$. Preferred examples are also the same.

$L_{31}$ is particularly preferably a single bond, an alkylene group, a divalent aliphatic hydrocarbon ring group, or a group formed by combination of an alkylene group and a divalent aliphatic hydrocarbon ring group through —OCO—, —O—, or —CONH— as a linking group (for example, -alkylene group-O-alkylene group-, -alkylene group-OCO-alkylene group-, -divalent aliphatic hydrocarbon ring group-O-alkylene group-, -alkylene group-CONH-alkylene group-, and the like).

$L_{32}$ represents an alkylene group, an alkenylene group, a divalent aliphatic hydrocarbon ring group, or a group formed by combination of two or more thereof, in which the hydrogen atoms of these groups are partially or entirely substituted with a substituent selected from among a fluorine atom, a fluoroalkyl group, a nitro group, and a cyano group. In the group formed by combination, two or more groups combined together may be the same as or different from each other and may be linked to each other through, as a linking group, —O—, —S—, —CO—, —SO$_2$—, —NR— (wherein R represents a hydrogen atom or an alkyl group), a divalent nitrogen-containing non-aromatic heterocyclic group, or a group formed by combination thereof.

$L_{32}$ is more preferably an alkylene group whose hydrogen atoms are partially or entirely substituted with a fluorine atom or a fluoroalkyl group (more preferably a perfluoroalkyl group), particularly preferably an alkylene group at least partially or entirely substituted with a fluorine atom, and most preferably an alkylene group, in which 30 to 100% of the hydrogen atoms are substituted with a fluorine atom.

The alkylene group in $L_{32}$ may be linear or branched, and preferred examples thereof include an alkylene group having 1 to 8 carbon atoms, such as a methylene group, an ethylene group, a propylene group, a butylene group, a hexylene group, an octylene group, and the like. An alkylene group having 1 to 6 carbon atoms is more preferred, and an alkylene group having 1 to 4 carbon atoms is particularly preferred.

Examples of the alkenylene group include a group formed by introduction of a double bond in any position of the above alkylene group.

The divalent aliphatic hydrocarbon ring group may be monocyclic or polycyclic, and preferred examples thereof include a divalent aliphatic hydrocarbon ring group having 3 to 17 carbon atoms, such as a cyclobutylene group, a cyclopentylene group, a cyclohexylene group, a norbornanylene group, an adamantylene group, a diadamantanylene group, and the like.

Furthermore, specific examples of the —NR— and divalent nitrogen-containing non-aromatic heterocyclic group as the linking group in $L_{32}$ are the same as mentioned above with respect to $X_{31}$. Preferred examples are also the same.

Preferred specific examples of the structures in $L_{32}$ include those mentioned above with respect to $L_{12}$ in the general formula (I).

$Z_3$ represents a moiety that becomes a sulfonate group, an imidate group, or a methide group by irradiation with active light ray or radioactive ray. The meaning of $Z_3$ is the same as that of $Z_1$ in the general formula (I). The above description regarding $Z_1$ also applies to $Z_3$.

Examples of particular structures of the cations for constituting onium salts suitable as $Z_3$ in the general formula (III) will be shown hereinafter.

With respect to the polymerizable monomer unit corresponding to the repeating unit of the general formula (III), examples thereof will be shown below as sulfonate, imidate and methide units formed by the cleavage of a cation by irradiation with active light ray or radioactive ray.

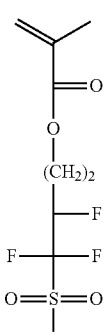 (III-1)
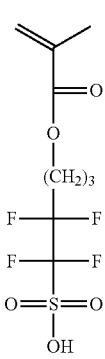 (III-2)
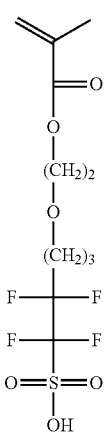 (III-3)
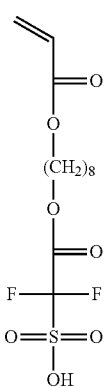 (III-4)
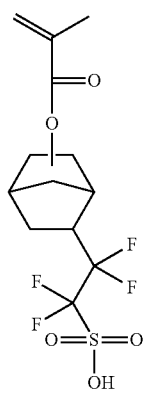 (III-5)
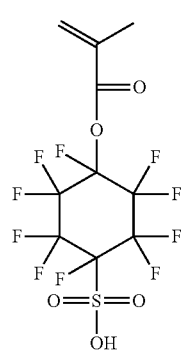 (III-6)
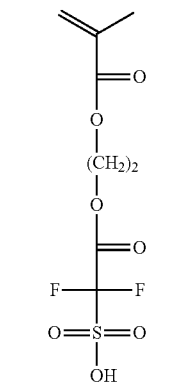 (III-7)
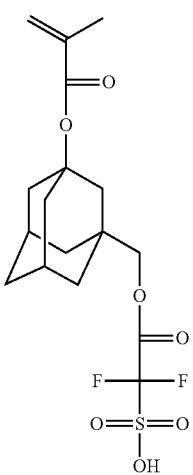 (III-8)

(III-9)
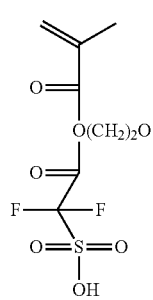
(III-10)
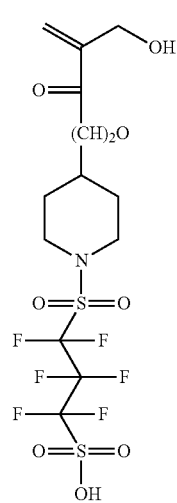
(III-11)
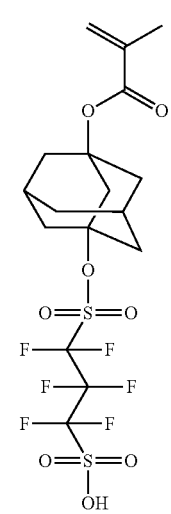
(III-12)
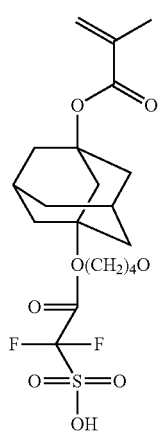
(III-13)
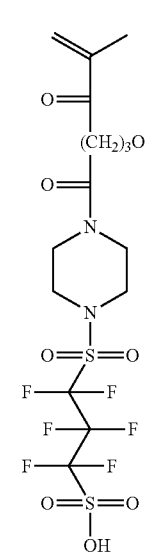
(III-14)
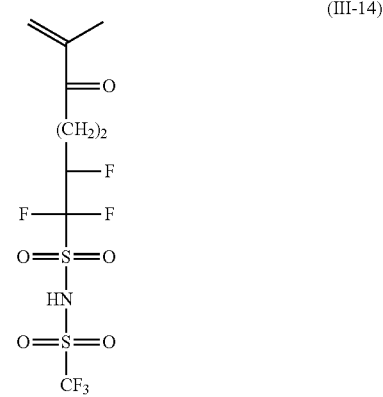

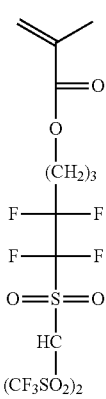
(III-15)
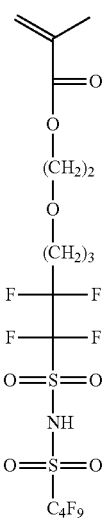
(III-16)
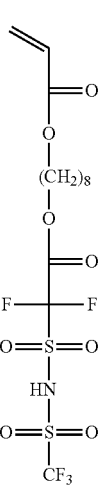
(III-17)
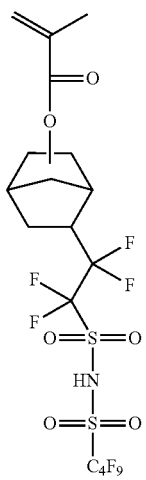
(III-18)
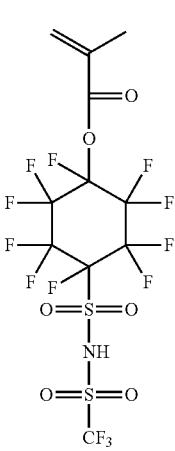
(III-19)
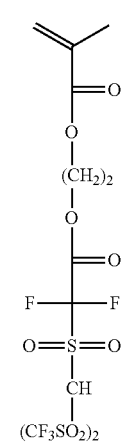
(III-20)

(III-21) 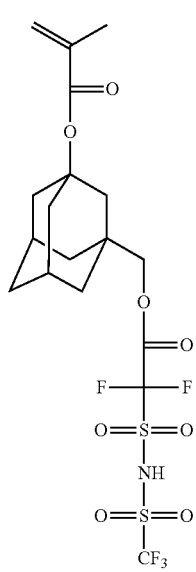
(III-22) 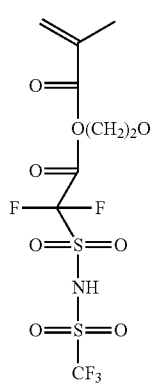
(III-23) 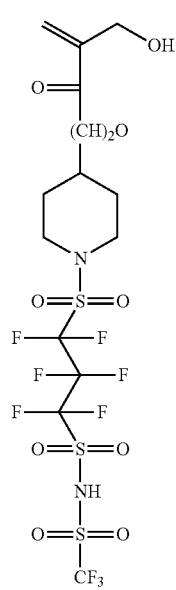
(III-24) 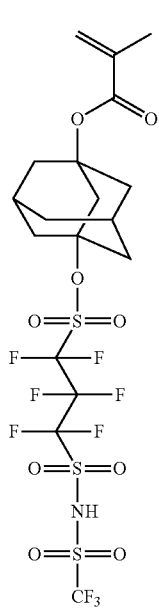
(III-25) 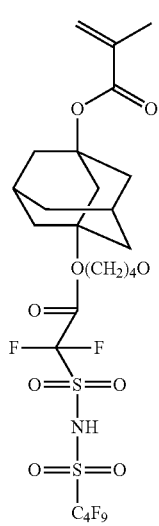

(III-26)
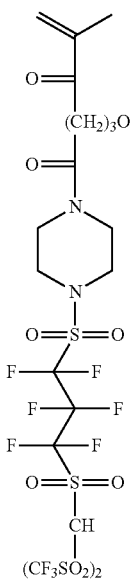
(III-27)
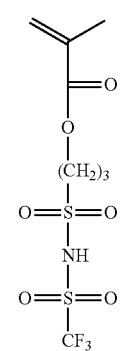
(III-28)
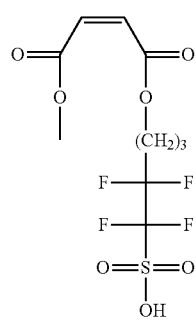
(III-29)
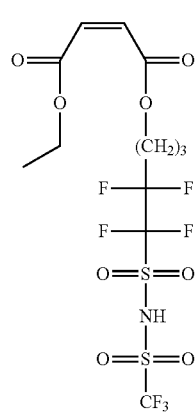
(III-30)
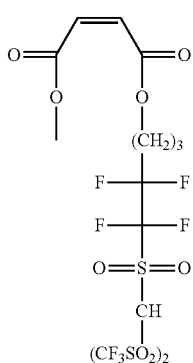
(III-31)
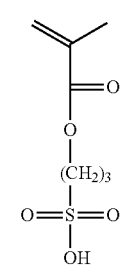
(III-32)
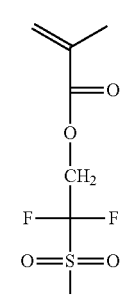
(III-33)
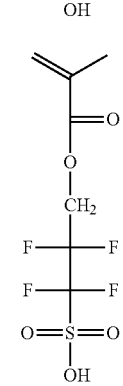
(III-34)
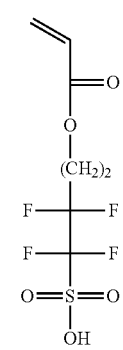

(III-35) 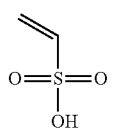

(III-36) 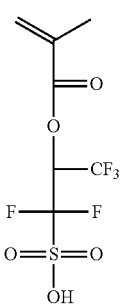

(III-37) 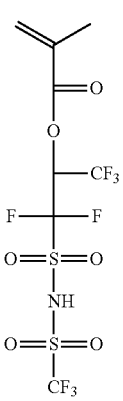

(III-38) 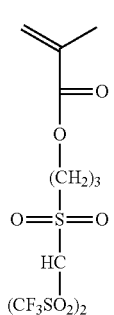

(III-39) 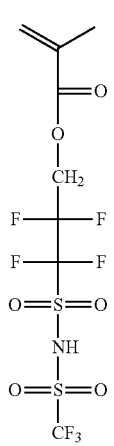

(III-40) 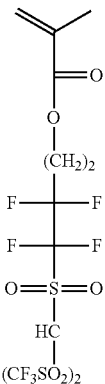

The polymerizable compounds corresponding to the repeating units (A) can be synthesized through a general sulfonating reaction or sulfonamidating reaction. For example, the polymerizable compounds can be obtained by either a method in which one of the sulfonyl halide moieties of a bis-sulfonyl halide compound is selectively reacted with an amine, an alcohol, or the like to form a sulfonamide bond or a sulfonic ester bond, and thereafter the other sulfonyl halide moiety is hydrolyzed, or a method in which the ring of a cyclic sulfonic anhydride is opened by an amine or an alcohol. Further, the polymerizable compounds can be easily synthesized through the methods described in U.S. Pat. No. 5,554,664A, J. Fluorine Chem. 105 (2000) 129-136, and J. Fluorine Chem. 116 (2002) 45-48.

The polymerizable compounds corresponding to the repeating units (A) can be easily synthesized from a lithium, sodium or potassium salt of an organic acid synthesized above, a hydroxide, bromide or chloride of iodonium or sulfonium, etc. through the salt exchange method described in Japanese PCT National Publication No. 11-501909 or JP2003-246786A, or the salt exchange method described in JP1998-232490A (JP10-232490A), JP4025039A, or the like.

With respect to the repeating unit (A), specific examples of the countercations to the acid anions generated in the side chains of the resin by the decomposition by irradiation with active light ray or radioactive ray will be shown below.

(Z-1) 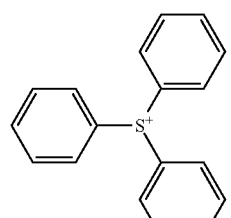

(Z-2) 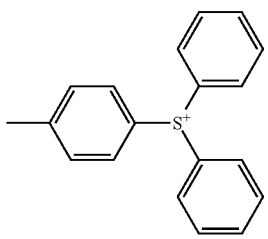

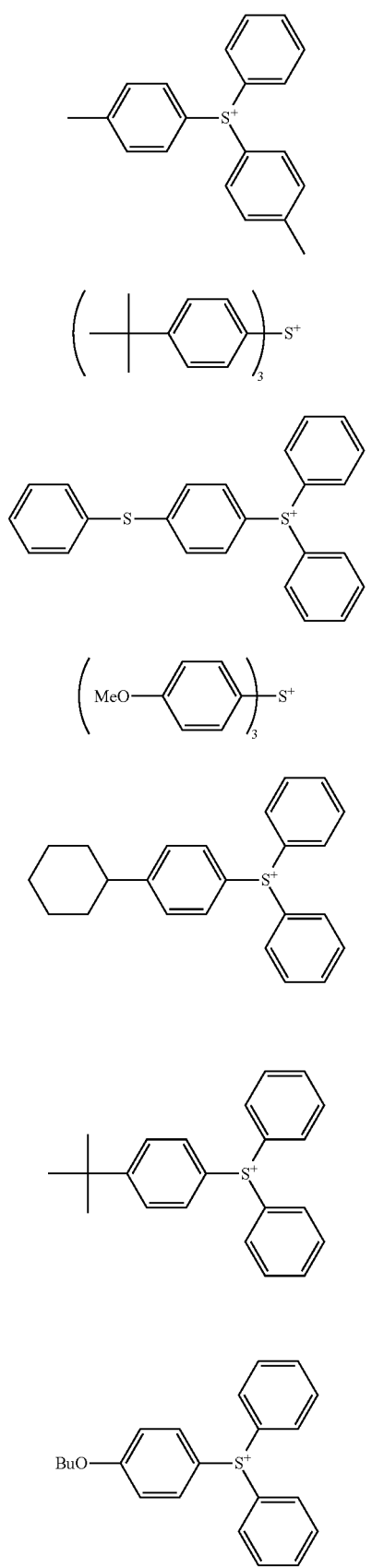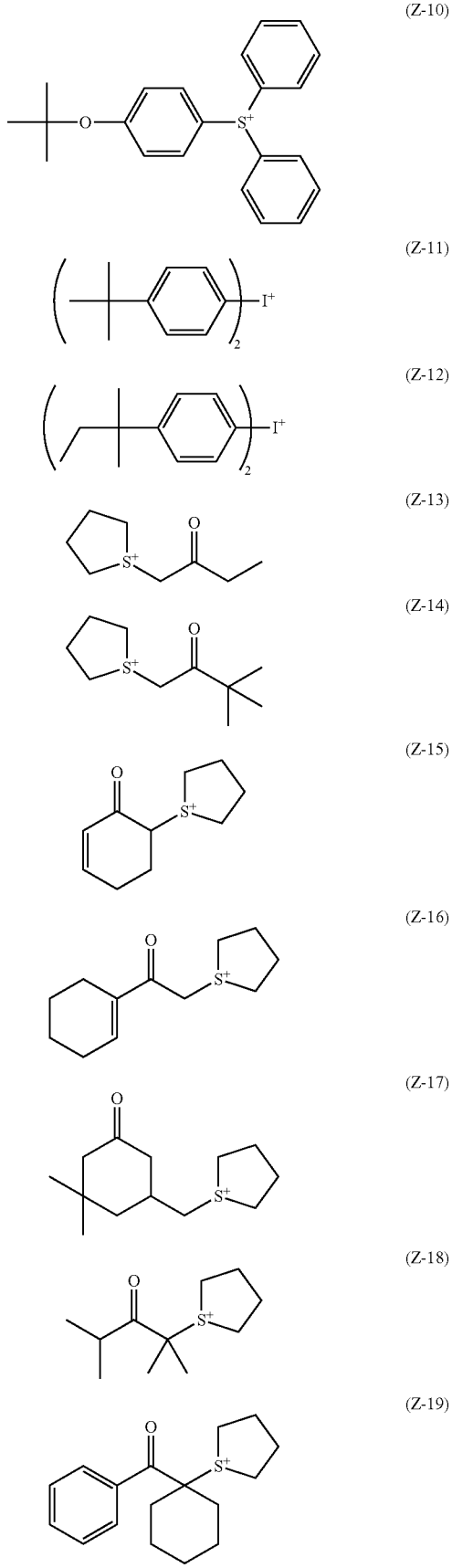

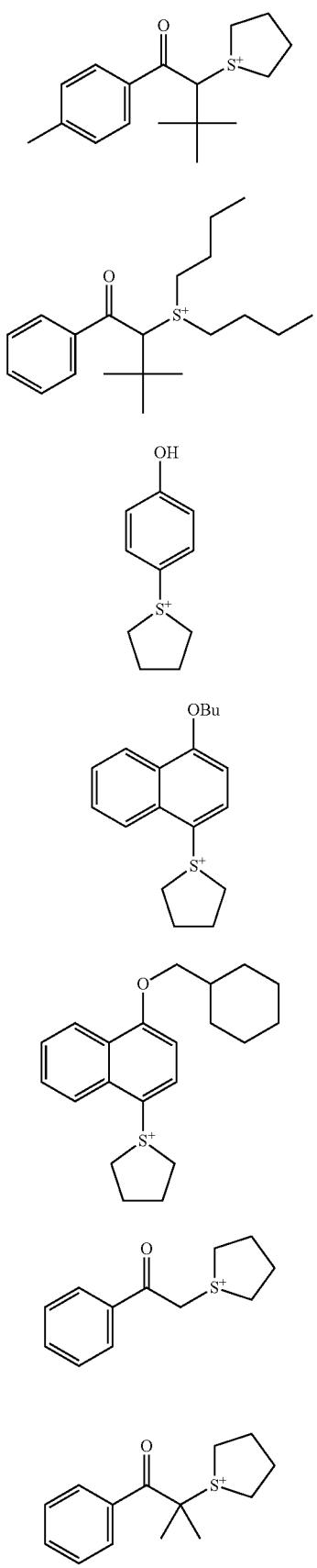
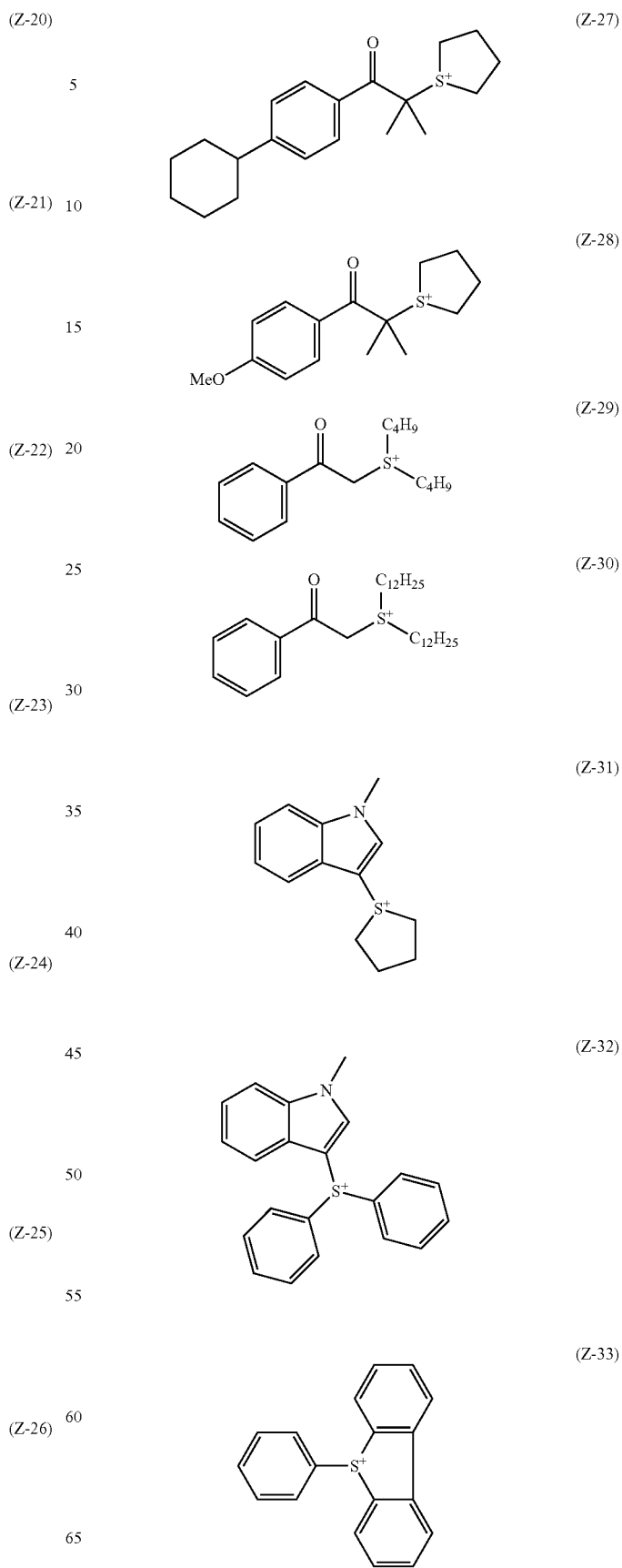

(Z-34) 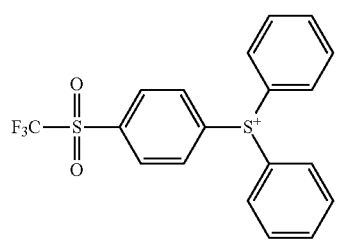
(Z-35) 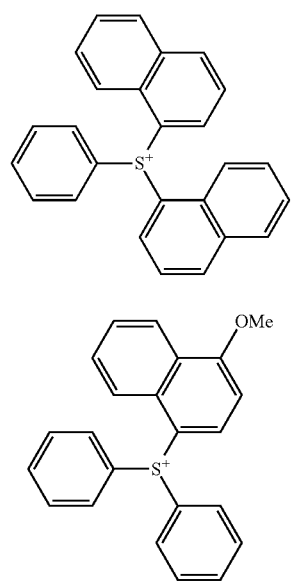
(Z-36) 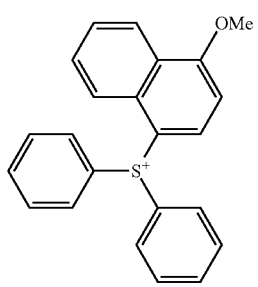
(Z-37) 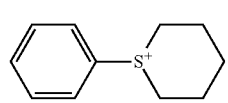
(Z-38) 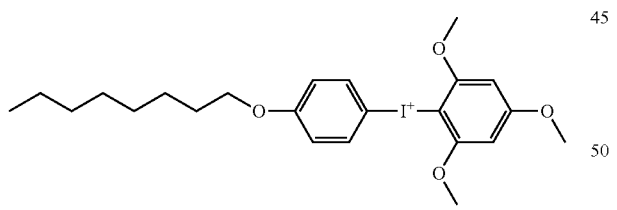
(Z-39) 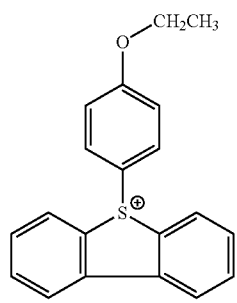
(Z-40) 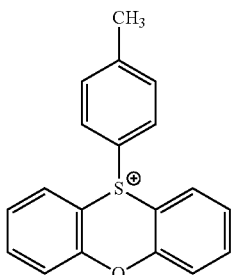
(Z-41) 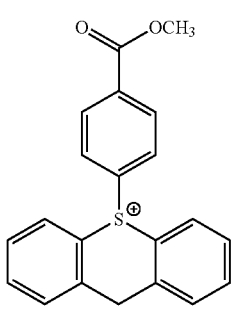
(Z-42) 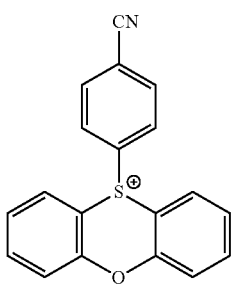
(Z-43) 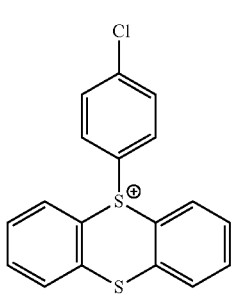
(Z-44) 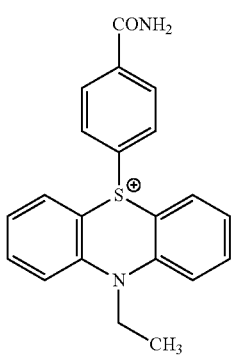

-continued
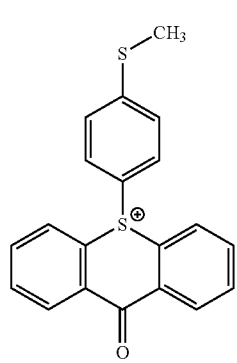 (Z-45)
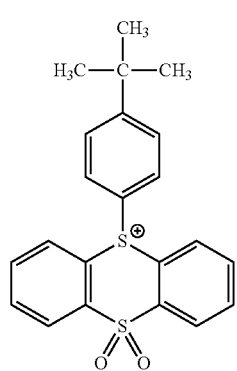 (Z-46)
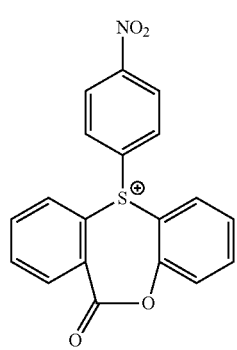 (Z-47)
(Z-48)
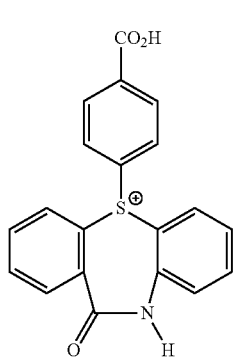 (Z-49)
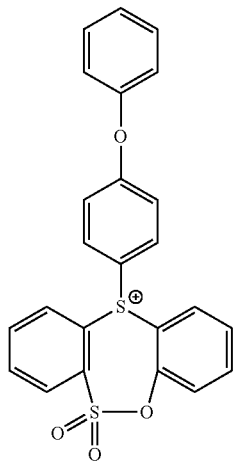 (Z-50)
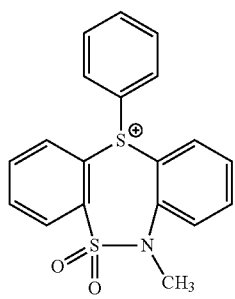 (Z-51)
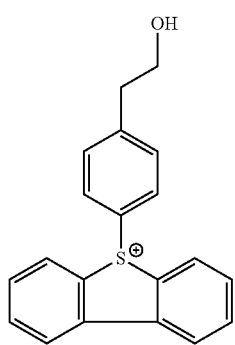 (Z-52)

-continued (Z-53)
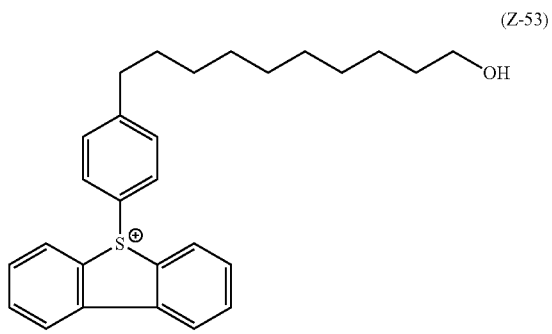

(Z-54)
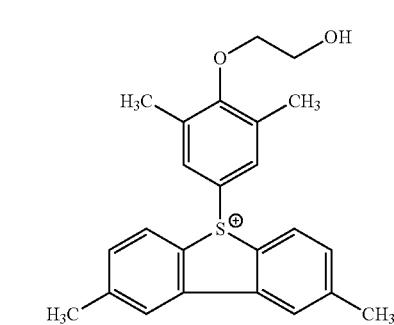

(Z-55)
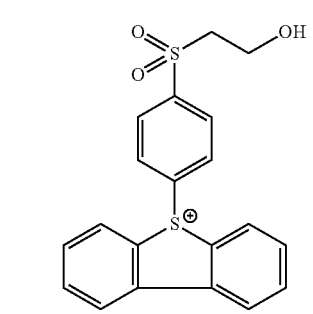

(Z-56)
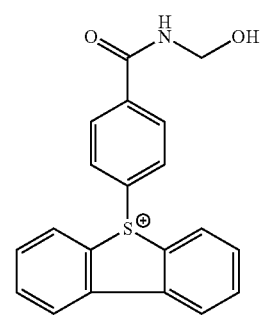

(Z-57)
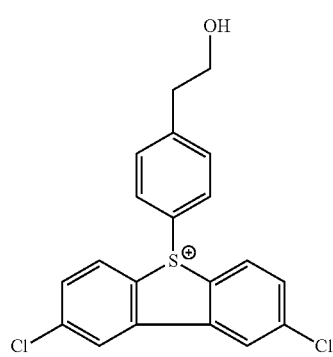

-continued (Z-58)
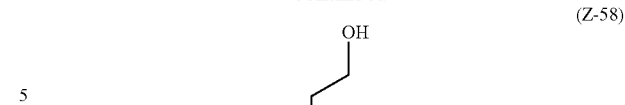

(Z-59)
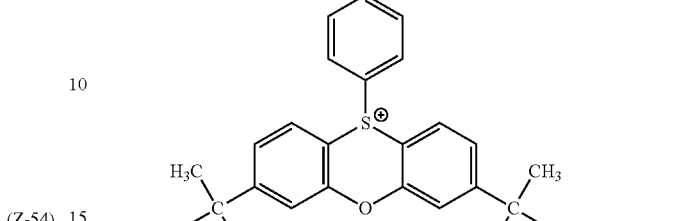

(Z-60)
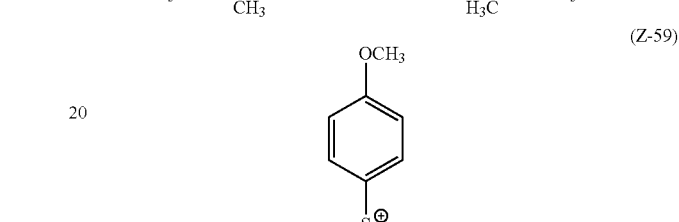

Specific examples of the polymerizable compounds (M) corresponding to the repeating units (A) are shown in Table 1 below, as combinations of cation structure (examples (Z-1) to (Z-60) as mentioned above) and anion, structure (anions formed by removal of a hydrogen atom from organic acid examples (I-1) to (I-65), (II-1) to (II-27), and (III-1) to (III-40) as mentioned above).

TABLE 1

| Polymerizable compound (M) | Cation structure | Anion structure |
|---|---|---|
| M-I-1 | Z-1 | I-1 |
| M-I-2 | Z-6 | I-2 |
| M-I-3 | Z-14 | I-3 |
| M-I-4 | Z-10 | I-4 |
| M-I-5 | Z-2 | I-5 |
| M-I-6 | Z-3 | I-6 |
| M-I-7 | Z-1 | I-7 |
| M-I-8 | Z-4 | I-8 |
| M-I-9 | Z-5 | I-9 |
| M-I-10 | Z-9 | I-10 |
| M-I-11 | Z-8 | I-11 |
| M-I-12 | Z-7 | I-12 |
| M-I-13 | Z-11 | I-13 |
| M-I-14 | Z-1 | I-14 |
| M-I-15 | Z-5 | I-15 |
| M-I-16 | Z-9 | I-16 |
| M-I-17 | Z-1 | I-17 |
| M-I-18 | Z-13 | I-18 |
| M-I-19 | Z-2 | I-19 |

TABLE 1-continued

| Polymerizable compound (M) | Cation structure | Anion structure |
|---|---|---|
| M-I-20 | Z-15 | I-20 |
| M-I-21 | Z-4 | I-21 |
| M-I-22 | Z-3 | I-22 |
| M-I-23 | Z-2 | I-23 |
| M-I-24 | Z-16 | I-24 |
| M-I-25 | Z-1 | I-25 |
| M-I-26 | Z-20 | I-26 |
| M-I-27 | Z-2 | I-27 |
| M-I-28 | Z-9 | I-28 |
| M-I-29 | Z-5 | I-29 |
| M-I-30 | Z-10 | I-30 |
| M-I-31 | Z-7 | I-31 |
| M-I-32 | Z-4 | I-32 |
| M-I-33 | Z-1 | I-33 |
| M-I-34 | Z-16 | I-34 |
| M-I-35 | Z-2 | I-35 |
| M-I-36 | Z-5 | I-36 |
| M-I-37 | Z-6 | I-37 |
| M-I-38 | Z-8 | I-38 |
| M-I-39 | Z-3 | I-39 |
| M-I-40 | Z-16 | I-40 |
| M-I-41 | Z-1 | I-41 |
| M-I-42 | Z-1 | I-42 |
| M-I-43 | Z-1 | I-43 |
| M-I-44 | Z-3 | I-44 |
| M-I-45 | Z-4 | I-45 |
| M-I-46 | Z-5 | I-46 |
| M-I-47 | Z-7 | I-47 |
| M-I-48 | Z-16 | I-48 |
| M-I-49 | Z-16 | I-49 |
| M-I-50 | Z-24 | I-50 |
| M-I-51 | Z-23 | I-51 |
| M-I-52 | Z-13 | I-52 |
| M-I-53 | Z-9 | I-53 |
| M-I-54 | Z-16 | I-54 |
| M-I-55 | Z-22 | I-55 |
| M-I-56 | Z-16 | I-56 |
| M-I-57 | Z-25 | I-57 |
| M-I-58 | Z-13 | I-58 |
| M-I-59 | Z-16 | I-59 |
| M-I-60 | Z-1 | I-60 |
| M-I-61 | Z-1 | I-61 |
| M-I-62 | Z-12 | I-62 |
| M-I-63 | Z-16 | I-63 |
| M-I-64 | Z-22 | I-64 |
| M-I-65 | Z-19 | I-65 |
| M-I-66 | Z-2 | I-1 |
| M-I-67 | Z-14 | I-1 |
| M-I-68 | Z-16 | I-1 |
| M-I-69 | Z-22 | I-1 |
| M-I-70 | Z-17 | I-2 |
| M-I-71 | Z-16 | I-3 |
| M-I-72 | Z-17 | I-7 |
| M-I-73 | Z-19 | I-8 |
| M-I-74 | Z-14 | I-9 |
| M-I-75 | Z-24 | I-10 |
| M-I-76 | Z-20 | I-11 |
| M-I-77 | Z-16 | I-14 |
| M-I-78 | Z-26 | I-15 |
| M-I-79 | Z-19 | I-16 |
| M-I-80 | Z-22 | I-17 |
| M-I-81 | Z-18 | I-18 |
| M-I-82 | Z-23 | I-20 |
| M-I-83 | Z-19 | I-23 |
| M-I-84 | Z-16 | I-25 |
| M-I-85 | Z-25 | I-27 |
| M-I-86 | Z-19 | I-28 |
| M-I-87 | Z-8 | I-32 |
| M-I-88 | Z-21 | I-34 |
| M-I-89 | Z-17 | I-35 |
| M-I-90 | Z-11 | I-36 |
| M-I-91 | Z-16 | I-38 |
| M-I-92 | Z-2 | I-41 |
| M-I-93 | Z-16 | I-41 |
| M-I-94 | Z-22 | I-41 |
| M-I-95 | Z-16 | I-42 |
| M-I-96 | Z-16 | I-43 |
| M-I-97 | Z-22 | I-43 |
| M-I-98 | Z-22 | I-48 |
| M-I-99 | Z-20 | I-59 |
| M-I-100 | Z-16 | I-61 |
| M-II-1 | Z-60 | II-1 |
| M-II-2 | Z-1 | II-2 |
| M-II-3 | Z-2 | II-3 |
| M-II-4 | Z-6 | II-4 |
| M-II-5 | Z-16 | II-5 |
| M-II-6 | Z-15 | II-6 |
| M-II-7 | Z-5 | II-7 |
| M-II-8 | Z-2 | II-8 |
| M-II-9 | Z-3 | II-9 |
| M-II-10 | Z-8 | II-10 |
| M-II-11 | Z-16 | II-11 |
| M-II-12 | Z-2 | II-12 |
| M-II-13 | Z-25 | II-13 |
| M-II-14 | Z-6 | II-14 |
| M-II-15 | Z-1 | II-15 |
| M-II-16 | Z-16 | II-16 |
| M-II-17 | Z-18 | II-17 |
| M-II-18 | Z-20 | II-18 |
| M-II-19 | Z-2 | II-19 |
| M-II-20 | Z-1 | II-20 |
| M-II-21 | Z-16 | II-21 |
| M-II-22 | Z-9 | II-22 |
| M-II-23 | Z-3 | II-23 |
| M-II-24 | Z-16 | II-24 |
| M-II-25 | Z-14 | II-25 |
| M-II-26 | Z-13 | II-26 |
| M-II-27 | Z-16 | II-27 |
| M-II-28 | Z-1 | II-1 |
| M-II-29 | Z-2 | II-1 |
| M-II-30 | Z-6 | II-1 |
| M-II-31 | Z-22 | II-1 |
| M-II-32 | Z-22 | II-2 |
| M-II-33 | Z-8 | II-4 |
| M-II-34 | Z-19 | II-5 |
| M-II-35 | Z-16 | II-7 |
| M-II-36 | Z-21 | II-8 |
| M-II-37 | Z-16 | II-10 |
| M-II-38 | Z-22 | II-11 |
| M-II-39 | Z-16 | II-12 |
| M-II-40 | Z-16 | II-14 |
| M-II-41 | Z-22 | II-15 |
| M-II-42 | Z-22 | II-17 |
| M-II-43 | Z-22 | II-18 |
| M-II-44 | Z-16 | II-19 |
| M-II-45 | Z-16 | II-20 |
| M-II-46 | Z-5 | II-20 |
| M-II-47 | Z-22 | II-21 |
| M-II-48 | Z-16 | II-23 |
| M-II-49 | Z-19 | II-25 |
| M-II-50 | Z-23 | II-27 |
| M-III-1 | Z-16 | III-1 |
| M-III-2 | Z-22 | III-2 |
| M-III-3 | Z-1 | III-3 |
| M-III-4 | Z-2 | III-4 |
| M-III-5 | Z-16 | III-5 |
| M-III-6 | Z-4 | III-6 |
| M-III-7 | Z-1 | III-7 |
| M-III-8 | Z-3 | III-8 |
| M-III-9 | Z-10 | III-9 |
| M-III-10 | Z-1 | III-10 |
| M-III-11 | Z-9 | III-11 |
| M-III-12 | Z-7 | III-12 |
| M-III-13 | Z-16 | III-13 |
| M-III-14 | Z-14 | III-14 |
| M-III-15 | Z-22 | III-15 |
| M-III-16 | Z-1 | III-16 |
| M-III-17 | Z-13 | III-17 |
| M-III-18 | Z-11 | III-18 |
| M-III-19 | Z-16 | III-19 |
| M-III-20 | Z-6 | III-20 |
| M-III-21 | Z-1 | III-21 |
| M-III-22 | Z-3 | III-22 |
| M-III-23 | Z-16 | III-23 |

TABLE 1-continued

| Polymerizable compound (M) | Cation structure | Anion structure |
|---|---|---|
| M-III-24 | Z-8 | III-24 |
| M-III-25 | Z-12 | III-25 |
| M-III-26 | Z-16 | III-26 |
| M-III-27 | Z-22 | III-27 |
| M-III-28 | Z-10 | III-28 |
| M-III-29 | Z-2 | III-29 |
| M-III-30 | Z-21 | III-30 |
| M-III-31 | Z-18 | III-31 |
| M-III-32 | Z-1 | III-32 |
| M-III-33 | Z-2 | III-33 |
| M-III-34 | Z-16 | III-34 |
| M-III-35 | Z-18 | III-35 |
| M-III-36 | Z-59 | III-36 |
| M-III-37 | Z-6 | III-37 |
| M-III-38 | Z-16 | III-38 |
| M-III-39 | Z-22 | III-39 |
| M-III-40 | Z-16 | III-40 |
| M-III-41 | Z-22 | III-1 |
| M-III-42 | Z-16 | III-7 |
| M-III-43 | Z-22 | III-9 |
| M-III-44 | Z-16 | III-10 |
| M-III-45 | Z-17 | III-11 |
| M-III-46 | Z-25 | III-14 |
| M-III-47 | Z-16 | III-21 |
| M-III-48 | Z-16 | III-22 |
| M-III-49 | Z-16 | III-32 |
| M-III-50 | Z-16 | III-36 |

The content of the repeating unit (A) in the resin (P) is preferably in the range of 0.5 to 80% by mole, more preferably 1 to 60% by mole, and even more preferably 3 to 40% by mole, based on all the repeating units.

[Repeating Unit (B)]

The resin (P) preferably contains, in addition to the above repeating unit (A) and the repeating unit (C) as described later, a repeating unit (B) which decomposes by the action of an acid to generate an alkali-soluble group (which may be sometimes hereinafter referred to as a "repeating unit having an acid-decomposable group").

Examples of the alkali-soluble group include a phenolic hydroxyl group, a carboxyl group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group, and the like.

Examples of the preferable alkali-soluble group include a phenolic hydroxyl group, a carboxyl group, a fluoroalcohol group (preferably hexafluoroisopropanol), and a sulfonate group.

The acid-decomposable group is preferably a group as obtained by substituting the hydrogen atom of the alkali-soluble group with an acid-eliminable group.

Examples of the acid-eliminable group include —C($R_{36}$)($R_{37}$)($R_{38}$), —C($R_{01}$)($R_{02}$)(O$R_{39}$), —C(=O)—O—C($R_{36}$)($R_{37}$)($R_{38}$), —C($R_{01}$)($R_{02}$)—C(=O)—O—C($R_{36}$)($R_{37}$)($R_{38}$), —CH($R_{36}$)(Ar), and the like.

In the formulae, each of $R_{36}$ to $R_{39}$ independently represents an alkyl group, a monovalent aliphatic hydrocarbon ring group, a monovalent aromatic ring group, a combination of an alkylene group and a monovalent aromatic ring group or an alkenyl group. $R_{36}$ and $R_{37}$ may be bonded to each other to form a ring structure.

Each of $R_{01}$ to $R_{02}$ independently represents a hydrogen atom, an alkyl group, a monovalent aliphatic hydrocarbon ring group, a monovalent aromatic ring group, a combination of an alkylene group and a monovalent aromatic ring group, or an alkenyl group.

Ar represents a monovalent aromatic ring group.

The alkyl group of each of $R_{36}$ to $R_{39}$, $R_{01}$, and $R_{02}$ preferably has 1 to 8 carbon atoms, and examples thereof include a methyl group, an ethyl group, a propyl group, an n-butyl group, a sec-butyl group, a hexyl group, an octyl group, and the like.

The monovalent aliphatic hydrocarbon ring groups of $R_{36}$ to $R_{39}$, $R_{01}$, and $R_{02}$ may be monocyclic or polycyclic. The monocyclic aliphatic hydrocarbon ring groups are preferably aliphatic hydrocarbon ring groups each having 3 to 8 carbon atoms. Examples thereof include a cyclopropyl group, a cyclobutyl group, a cyclopentyl group, a cyclohexyl group, a cyclooctyl group, and the like. The polycyclic aliphatic hydrocarbon ring groups are preferably aliphatic hydrocarbon ring groups each having 6 to 20 carbon atoms. Examples thereof include an adamantyl group, a norbornyl group, an isobornyl group, a camphonyl group, a dicyclopentyl group, an α-pinel group, a tricyclodecanyl group, a tetracyclododecyl group, an androstanyl group, and the like. With respect to these aliphatic hydrocarbon ring groups, the carbon atoms of each thereof may be partially substituted with a heteroatom, such as an oxygen atom, and the like.

The monovalent aromatic ring group of each of $R_{36}$ to $R_{39}$, $R_{01}$, $R_{02}$, and Ar preferably has 6 to 10 carbon atoms. Examples thereof include an aryl group, such as a phenyl group, a naphthyl group, an anthryl group, and the like, and a monovalent aromatic ring group containing a heterocycle, such as thiophene, furan, pyrrole, benzothiophene, benzofuran, benzopyrrole, triazine, imidazole, benzimidazole, triazole, thiadiazole, thiazole, and the like.

The group formed by combination of any of alkylene groups represented by $R_{36}$ to $R_{39}$, $R_{01}$, and $R_{02}$ and a monovalent aromatic ring group is preferably an aralkyl group having 7 to 12 carbon atoms, and examples thereof include a benzyl group, a phenethyl group, a naphthylmethyl group, and the like.

The alkenyl groups of each of $R_{36}$ to $R_{39}$, $R_{01}$ and $R_{02}$ preferably have 2 to 8 carbon atoms, and examples thereof include a vinyl group, an allyl group, a butenyl group, cyclohexenyl group, and the like.

The ring formed by the mutual bonding of $R_{36}$ and $R_{37}$ may be monocyclic or polycyclic. The monocyclic structure is preferably an aliphatic hydrocarbon ring structure having 3 to 8 carbon atoms. Examples thereof include a cyclopropane structure, a cyclobutane structure, a cyclopentane structure, a cyclohexane structure, a cycloheptane structure, a cyclooctane structure, and the like. The polycyclic structure is preferably an aliphatic hydrocarbon ring structure having 6 to 20 carbon atoms. Examples thereof include an adamantane structure, a norbornane structure, a dicyclopentane structure, a tricyclodecane structure, a tetracyclododecane structure, and the like. With respect to these, the carbon atoms of each of the aliphatic hydrocarbon ring structures may be partially substituted with a heteroatom, such as an oxygen atom and the like.

Each of the groups of $R_{36}$ to $R_{39}$, $R_{01}$, $R_{02}$, and Ar may have a substituent, and examples of the substituent include an alkyl group, a monovalent aliphatic hydrocarbon ring group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group, and the like. Substituents having 8 or less carbon atoms, are preferred.

The repeating unit (B) is more preferably a repeating unit represented by the following general formula (V) or (VI).

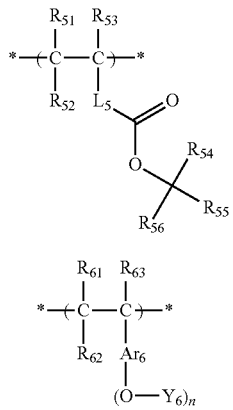

In the general formula (V),
each of $R_{51}$, $R_{52}$, and $R_{53}$ independently represents a hydrogen atom, an alkyl group, a monovalent aliphatic hydrocarbon ring group, a halogen atom, a cyano group, or an alkoxycarbonyl group. $R_{52}$ may be combined with $L_5$ to form a ring, and in this case, $R_{52}$ represents an alkylene group.

$R_{54}$ represents an alkyl group, and each of $R_{55}$ and $R_{56}$ independently represents a hydrogen atom, an alkyl group, a monovalent aliphatic hydrocarbon ring group, or a monovalent aromatic ring, group. $R_{55}$ and $R_{56}$ may be bonded to each other to form a ring, and in this case, $R_{55}$ and $R_{56}$ are not hydrogen atoms at the same time.

$L_5$ represents a single bond or a linking group.

In the general formula (VI),
each of $R_{61}$, $R_{62}$ and $R_{63}$ independently represents a hydrogen atom, an alkyl group, a monovalent aliphatic hydrocarbon ring group, a halogen atom, a cyano group, or an alkoxycarbonyl group. $R_{62}$ may be combined with $Ar_6$ to form a ring, and in this case, $R_{62}$ represents an alkylene group.

$Ar_6$ represents an aromatic ring group.

In the case of $n \geq 2$, each of $Y_6$'s independently represents a hydrogen atom or a group that is cleaved by the action of an acid, provided that at least one of the $Y_6$'s represents a group that is cleaved by the action of an acid.

n represents an integer of 1 to 4.

The general formula (V) will be described in more detail below.

Examples of the preferred alkyl groups of $R_{51}$ to $R_{53}$ in the general formula (V) include an alkyl group having 20 or less carbon atoms, which may be substituted, such as a methyl group, an ethyl group, a propyl group, an isopropyl group, an n-butyl group, a sec-butyl group, a hexyl group, a 2-ethylhexyl group, an octyl group, a dodecyl group, and the like. An alkyl group having 8 or less carbon atoms is more preferred, and an alkyl group having 3 or less carbon atoms is particularly preferred.

The alkyl group contained in the alkoxycarbonyl group is preferably the same as that in $R_{51}$ to $R_{53}$ above.

Examples of the monovalent aliphatic hydrocarbon ring group include a monovalent aliphatic hydrocarbon ring groups which may be monocyclic or polycyclic, and preferably a monocyclic monovalent aliphatic hydrocarbon ring group having 3 to 8 carbon atoms, which may be substituted, such as a cyclopropyl group, a cyclopentyl group, and a cyclohexyl group.

Examples of the halogen atom include a fluorine atom, a chlorine atom, a bromine atom, and an iodine atom, and a fluorine atom is particularly preferred.

Examples of the preferred substituents that can be introduced in these groups include an alkyl group, a monovalent aliphatic hydrocarbon ring group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group, and the like, and substituents having 8 or less carbon atoms are preferred.

Furthermore, in the case where $R_{52}$ represents an alkylene group, the alkylene group is preferably an alkylene group having 1 to 8 carbon atoms, such as a methylene group, an ethylene group, a propylene group, a butylene group, a hexylene group, an octylene group, and the like. An alkylene group having 1 to 4 carbon atoms is more preferred, and an alkylene group having 1 to 2 carbon atoms is particularly preferred.

In the formula (V), each of $R_{51}$ and $R_{53}$ is more preferably a hydrogen atom, an alkyl group, or a halogen atom, and particularly preferably a hydrogen atom, a methyl group, an ethyl group, a trifluoromethyl group (—$CF_3$), a chloromethyl group (—$CH_2$—Cl), or a fluorine atom (—F).

$R_{52}$ is more preferably a hydrogen atom, an alkyl group, a halogen atom, or an alkylene group (forming a ring in cooperation with $L_5$), and particularly preferably a hydrogen atom, a methyl group, an ethyl group, a trifluoromethyl group (—$CF_3$), a chloromethyl group (—$CH_2$—Cl), a fluorine atom (—F), a methylene group (forming a ring in cooperation with $L_5$), or an ethylene group (forming a ring in cooperation with $L_5$).

Examples of the linking group represented by $L_5$ include an alkylene group, an aromatic ring group, —COO-$L_1$-, —O-$L_1$-, -$L_1$-O—, a group formed by combination of two or more thereof, and the like, in which $L_1$ may be further substituted with a substituent such as an alkylene group, an aliphatic hydrocarbon ring group, an aromatic ring group, a group formed by combination of an alkylene group and an aromatic ring group, and the like.

$L_5$ is preferably a single bond, —OCO-$L_1$- (wherein $L_1$ is preferably an alkylene group having 1 to 5 carbon atoms, and more preferably a methylene group or a propylene group) or an aromatic ring group.

The alkyl group of each of $R_{54}$ to $R_{56}$ is preferably an alkyl group having 1 to 20 carbon atoms, and more preferably 1 to 10 carbon atoms. An alkyl group having 1 to 4 carbon atoms, such as a methyl group, an ethyl group, an n-propyl group, an isopropyl group, an n-butyl group, an isobutyl group, a t-butyl group, and the like, is particularly preferred.

The monovalent aliphatic hydrocarbon ring group represented by each of $R_{55}$ and $R_{56}$ preferably has 3 to 20 carbon atoms. It may be a monocyclic monovalent aliphatic hydrocarbon ring group, such as a cyclopentyl group or a cyclohexyl group, or a polycyclic monovalent aliphatic hydrocarbon ring group, such as a norbornyl group, an adamantyl group, a tetracyclodecanyl group, a tetracyclododecanyl group, and the like.

Furthermore, the ring formed by the mutual bonding of $R_{55}$ and $R_{56}$ preferably has 3 to 20 carbon atoms. The ring may be a monocyclic one, such as a cyclopentyl group or a cyclohexyl group, or a polycyclic one, such as a norbornyl group, an adamantyl group, a tetracyclodecanyl group, a tetracyclododecanyl group, and the like. When a ring is formed by the mutual bonding of $R_{55}$ and $R_{56}$, $R_{54}$ is preferably an alkyl group having 1 to 3 carbon atoms, and more preferably a methyl group or an ethyl group.

The monovalent aromatic ring group represented by each of $R_{55}$ and $R_{56}$ preferably has 6 to 20 carbon atoms. Examples thereof include a phenyl group, a naphthyl group, and the like. In the case where either $R_{55}$ or $R_{56}$ is a hydrogen atom, the other is preferably a monovalent aromatic ring group.

As a method for synthesizing the monomers corresponding to the repeating units represented by the general formula (V), any of general methods of synthesizing, an ester containing a polymerizable group can be used, and, the synthetic method is not particularly limited.

Specific examples of the repeating units represented by the general formula (V) will be shown below, but the present invention is not limited thereto.

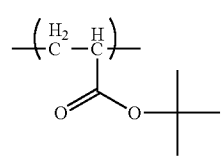
(V-1)

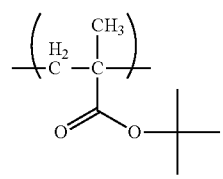
(V-2)

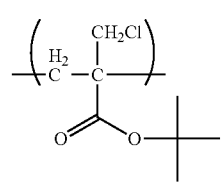
(V-3)

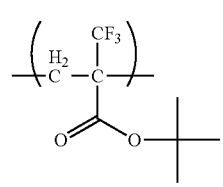
(V-4)

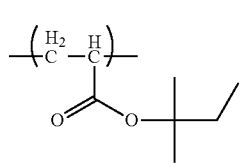
(V-5)

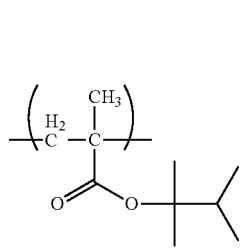
(V-6)

-continued

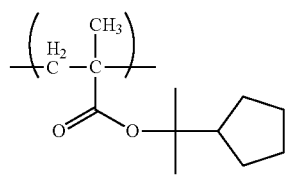
(V-7)

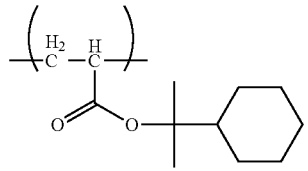
(V-8)

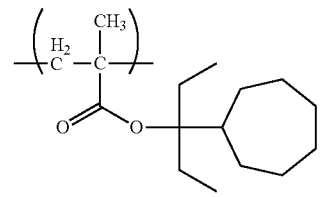
(V-9)

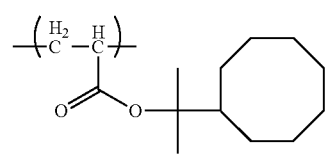
(V-10)

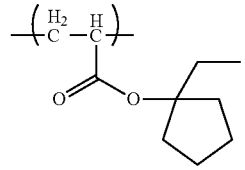
(V-11)

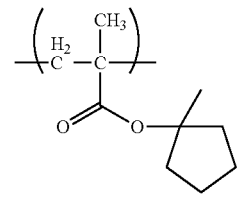
(V-12)

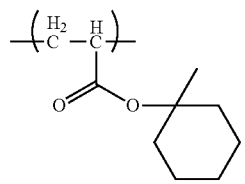
(V-13)

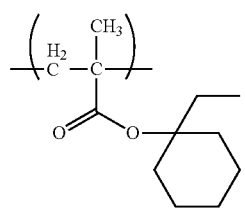
(V-14)

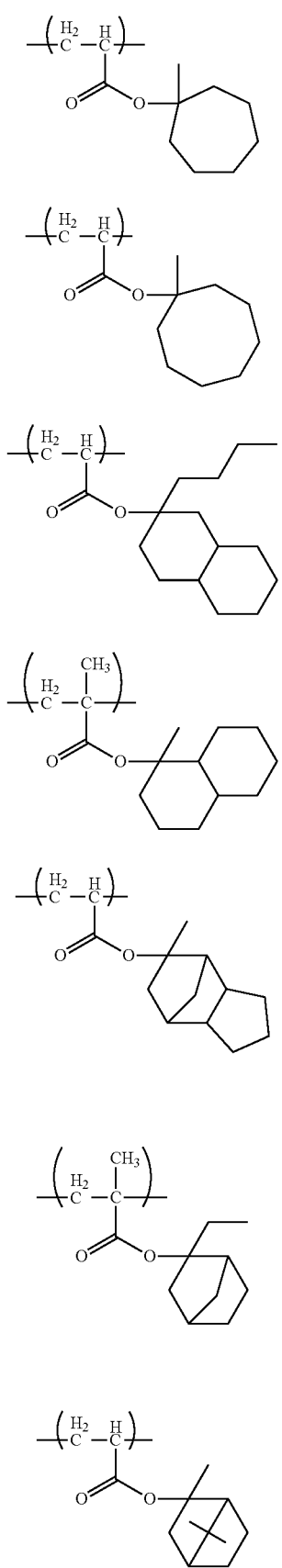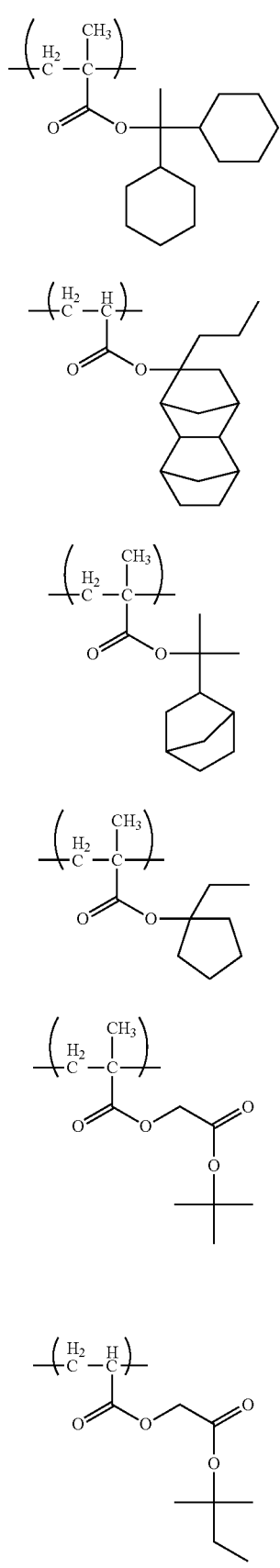

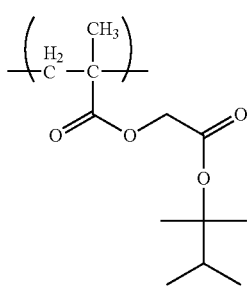
(V-28)
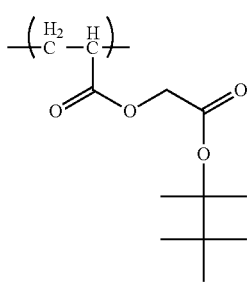
(V-29)
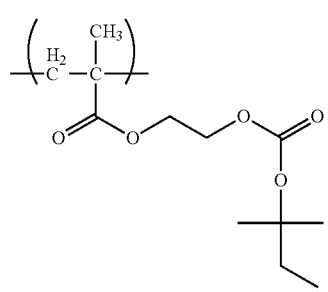
(V-30)
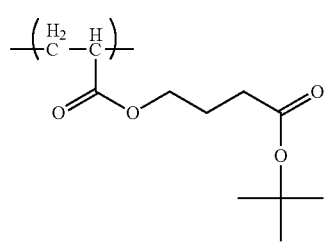
(V-31)
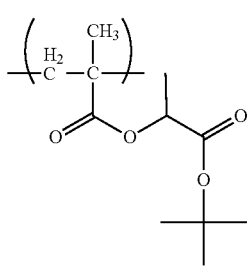
(V-32)
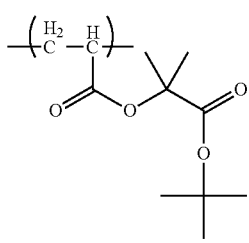
(V-33)
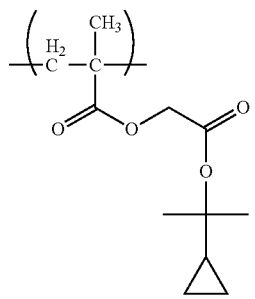
(V-34)
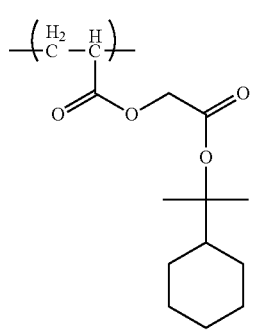
(V-35)
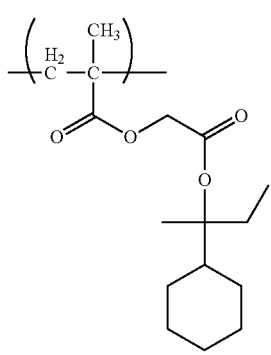
(V-36)
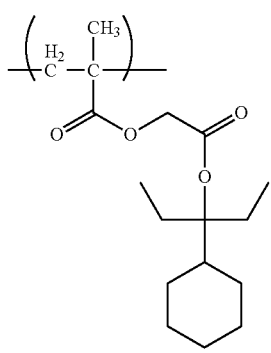
(V-37)
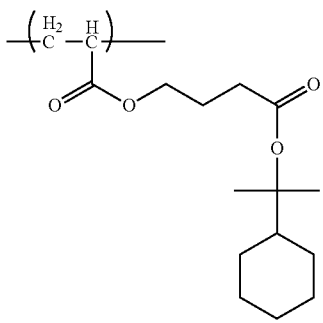
(V-38)

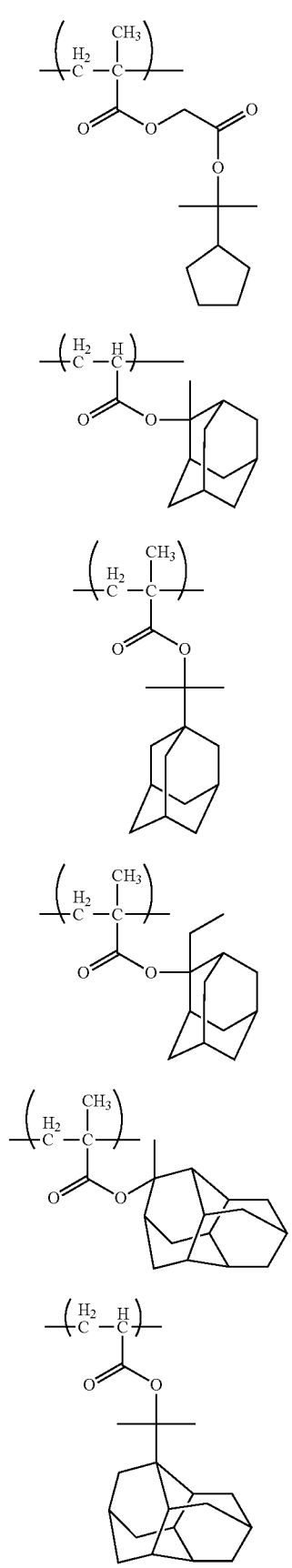
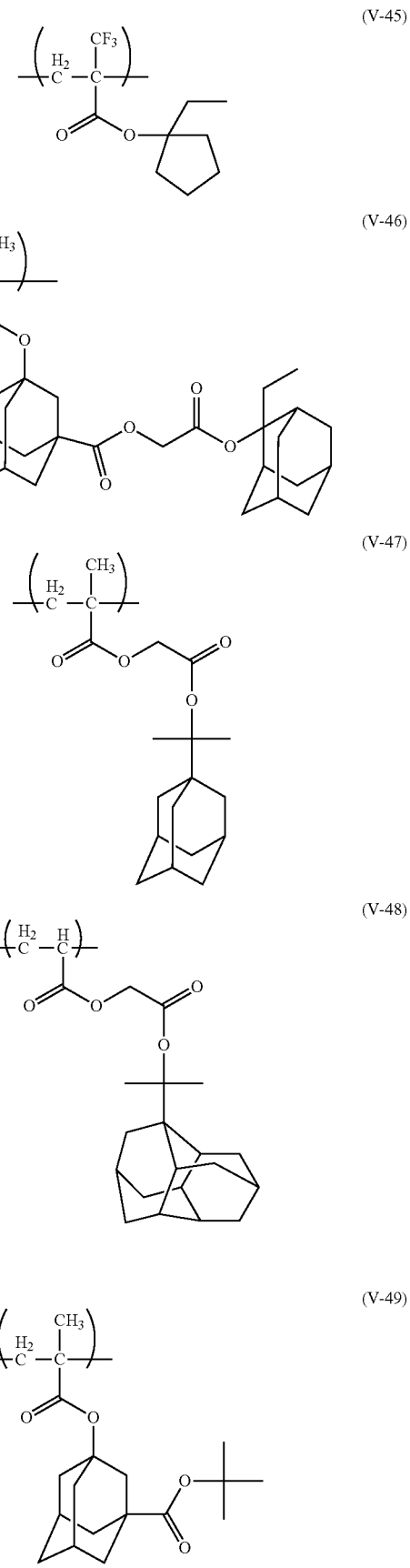

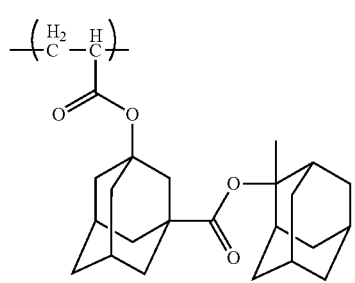
(V-50)
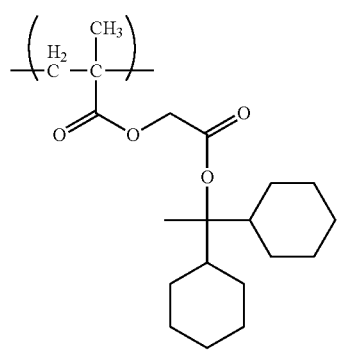
(V-51)
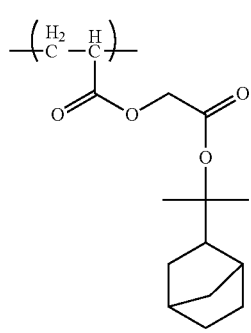
(V-52)
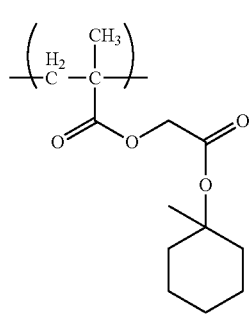
(V-53)
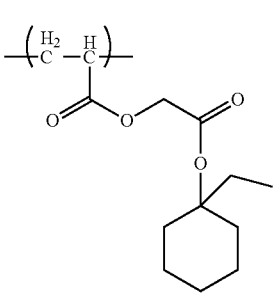
(V-54)
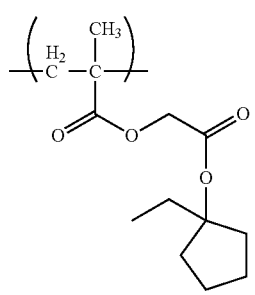
(V-55)
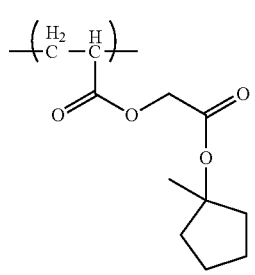
(V-56)
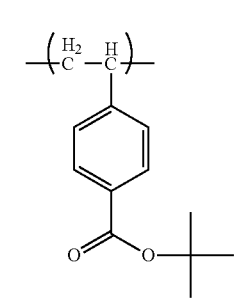
(V-57)
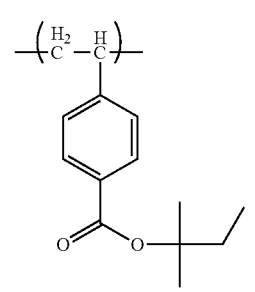
(V-58)
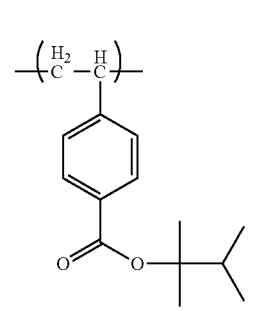
(V-59)

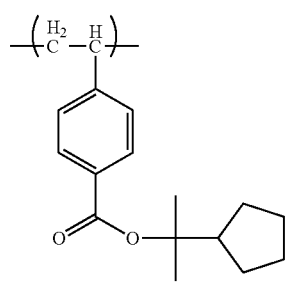 (V-60)
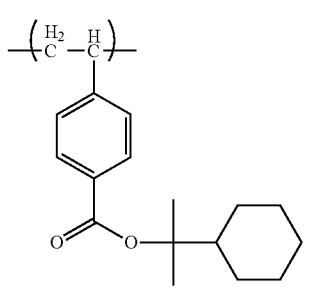 (V-61)
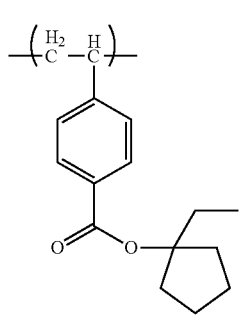 (V-62)
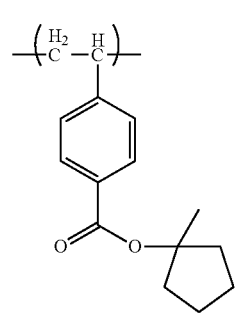 (V-63)
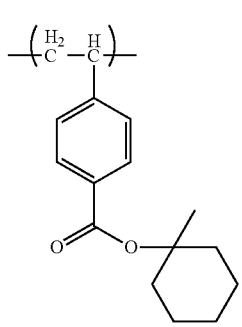 (V-64)
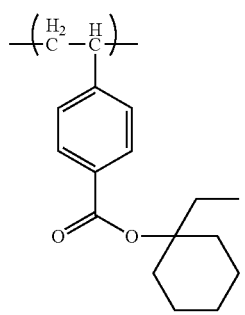 (V-65)
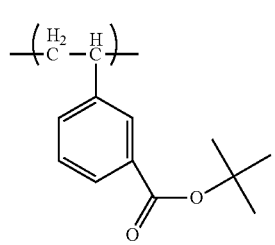 (V-66)
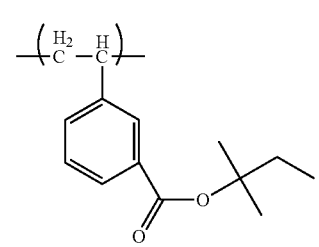 (V-67)
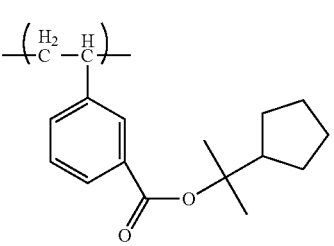 (V-68)
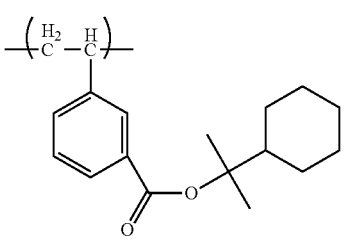 (V-69)
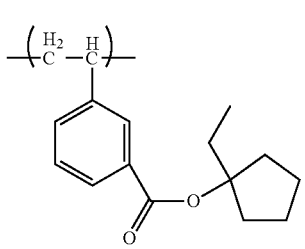 (V-70)

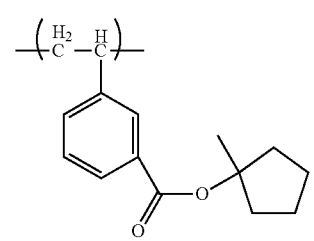
(V-71)
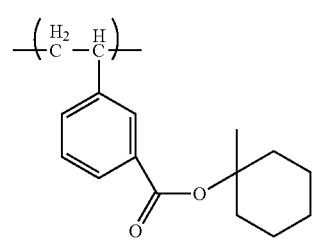
(V-72)
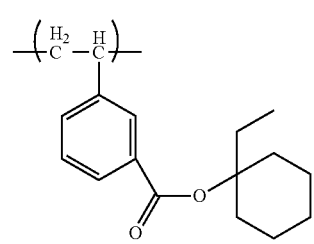
(V-73)
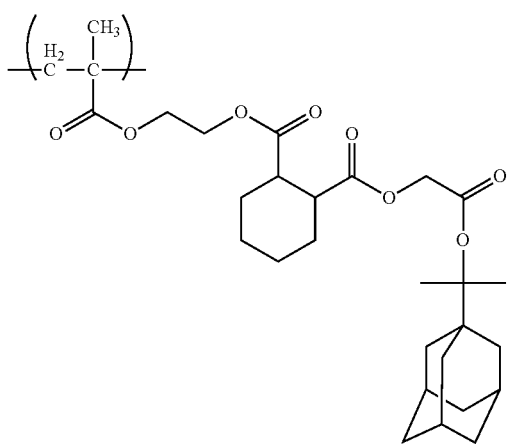
(V-74)
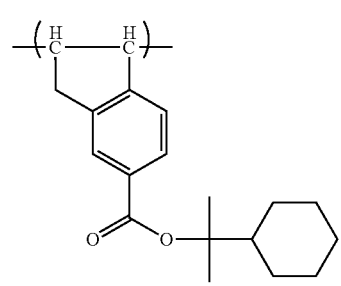
(V-75)
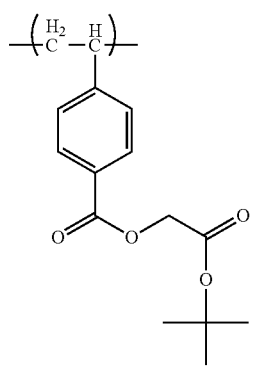
(V-76)
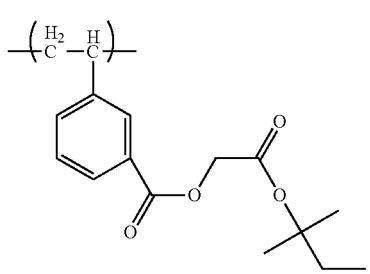
(V-77)
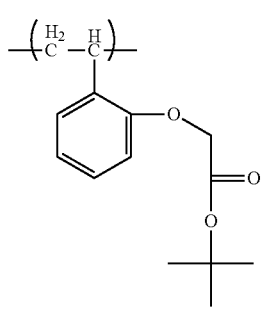
(V-78)
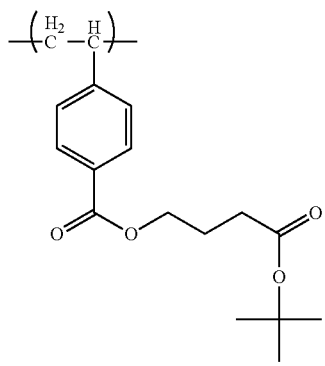
(V-79)
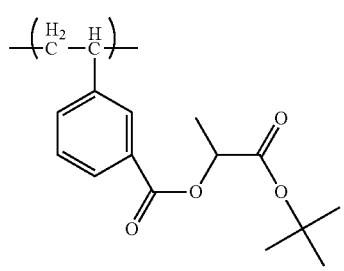
(V-80)

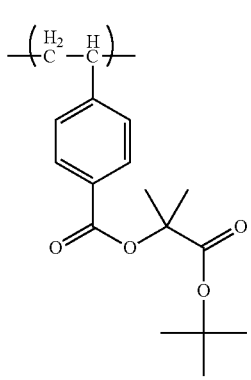 (V-81)
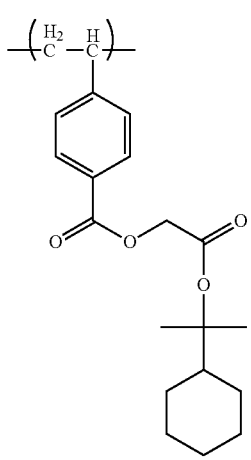 (V-82)
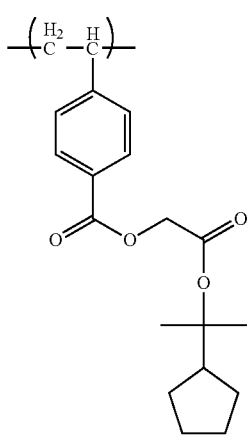 (V-83)
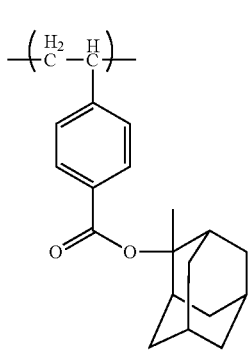 (V-84)
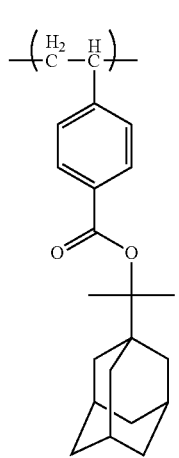 (V-85)
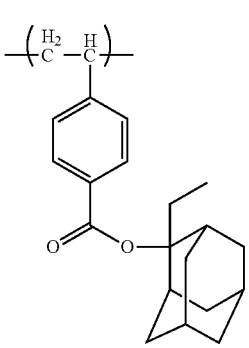 (V-86)
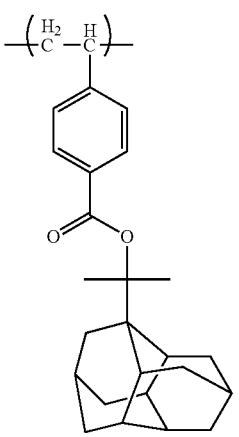 (V-87)

-continued
(V-88)
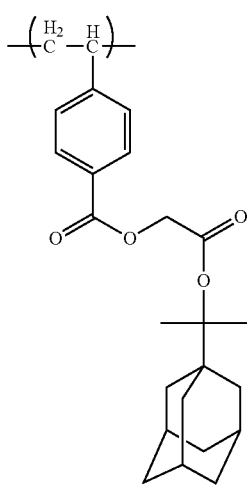
(V-89)
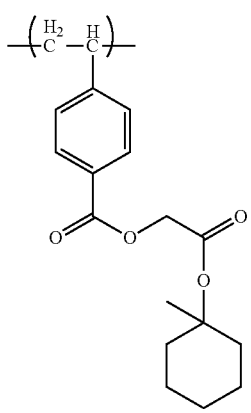
(V-90)
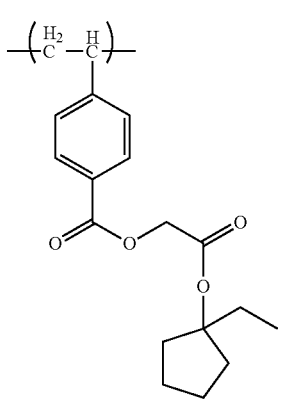
(V-91)
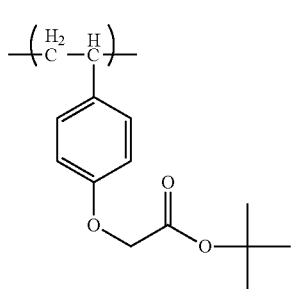
(V-92)
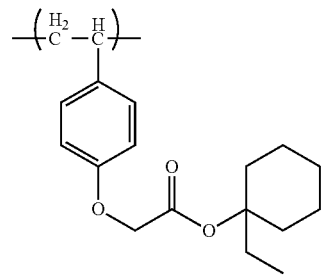
(V-93)
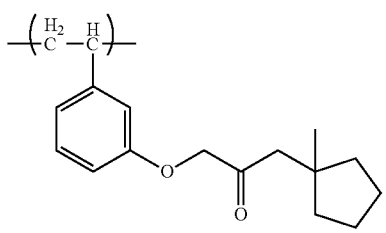
(V-94)
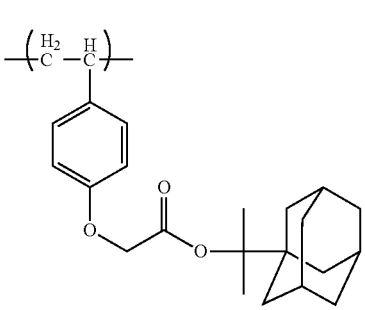
(V-95)
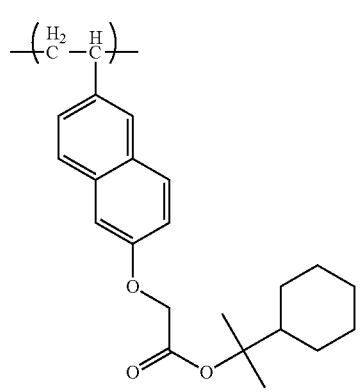
(V-96)
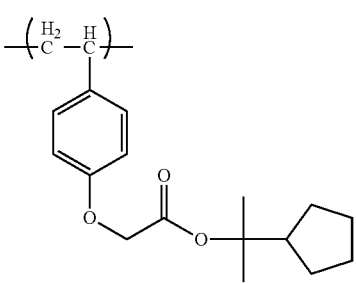

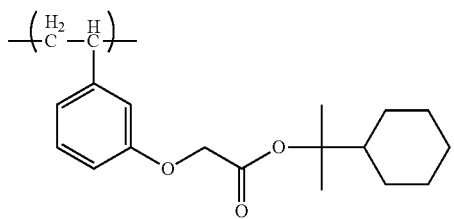

(V-97)

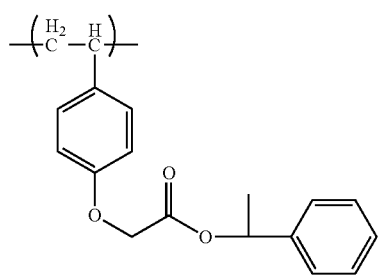

(V-98)

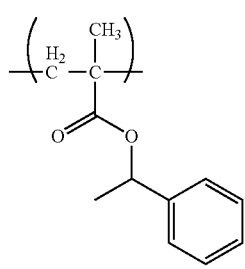

(V-99)

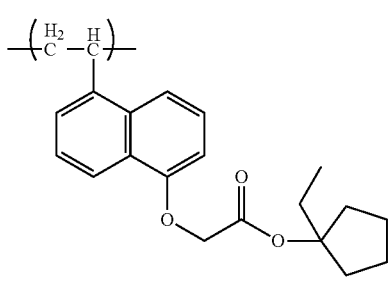

(V-100)

The general formula (VI) will be described in more detail below

Preferable examples, of the alkyl group represented by each of $R_{61}$ to $R_{63}$ in the general formula (VI) include an alkyl group having 20 or less carbon atoms, which may be substituted, such as a methyl group, an ethyl group, a propyl group, an isopropyl group, an n-butyl group, a sec-butyl group, a hexyl group, a 2-ethylhexyl group, an octyl group, a dodecyl group, and the like. An alkyl group having 8 or less carbon atoms is more preferred.

The alkyl group contained in the alkoxycarbonyl group is preferably the same as the alkyl group mentioned above with respect to $R_{61}$ to $R_{63}$.

The monovalent aliphatic hydrocarbon ring group may be monocyclic or polycyclic, and preferable examples thereof include a monocyclic monovalent aliphatic hydrocarbon ring group having 3 to 8 carbon atoms, which may be substituted, such as a cyclopropyl group, a cyclopentyl group, and a cyclohexyl group.

Examples of the halogen atom include a fluorine atom, a chlorine atom, a bromine atom, and an iodine atom, and a fluorine atom is preferred.

In the case where $R_{62}$ represents an alkylene group, preferable examples of the alkylene group include an alkylene group having 1 to 8 carbon atoms, which may be substituted, such as a methylene group, an ethylene group, a propylene group, a butylene group, a hexylene group, an octylene group, and the like.

$Ar_6$ represents an aromatic ring group. The aromatic ring, group may have a substituent. Preferred examples thereof include an arylene group having 6 to 18 carbon atoms, such as a phenylene group, a tolylene group, a naphthylene group, and the like, and a divalent aromatic ring group containing a heteroring, such as thiophene, furan, pyrrole, benzothiophene, benzofuran, benzopyrrole, triazine, imidazole, benzimidazole, triazole, thiadiazole, thiazole, and the like.

Specific examples of the substituents that can be introduced in the alkyl group, the monovalent aliphatic hydrocarbon ring group, the alkoxycarbonyl group, the alkylene group, and the aromatic ring group as described above are the same as the substituents that can be introduced in the group represented by $R_{51}$ to $R_{53}$ of the general formula (V) as described above.

n is preferably 1 or 2, and more preferably 1.

Each of n $Y_6$'s independently represents a hydrogen atom, or a group that is cleaved by the action of an acid, provided that at least one of n $Y_6$'s is a group that is cleaved by the action of an acid.

Examples of the group that is cleaved by the action of an acid, $Y_6$ include those set forth above by way of example, namely, $-C(R_{36})(R_{37})(R_{38})$, $-C(=O)-O-C(R_{36})(R_{37})(R_{38})$, $-C(R_{01})(R_{02})(OR_{39})$, $-C(R_{01})(R_{02})-C(=O)-O-C(R_{36})(R_{37})(R_{38})$, $-CH(R_{36})(Ar)$, and the like. In these formulae, $R_{36}$ to $R_{39}$, $R_{01}$, and $R_{02}$ are similarly defined with respect to the groups above.

The group that is cleaved by the action of an acid, $Y_6$, is more preferably a structure represented by the following general formula (VI-A).

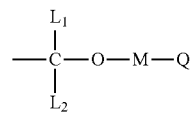

(VI-A)

In the formula, each of $L_1$ and $L_2$ independently represents a hydrogen atom, an alkyl group, a monovalent aliphatic hydrocarbon ring group, a monovalent aromatic ring group, or a group formed by combination of an alkylene group and a monovalent aromatic ring group.

M represents a single bond or a linking group.

Q represents an alkyl group, a monovalent aliphatic hydrocarbon ring group which may contain a heteroatom, a monovalent aromatic ring group which may contain a heteroatom, an amino group, an ammonium group, a mercapto group, a cyano group, or an aldehyde group.

At least two of Q, M, and $L_1$ may be bonded to each other to form a ring (preferably, a 5- or 6-membered ring).

The alkyl groups as $L_1$ and $L_2$ are, for example, alkyl groups having 1 to 8 carbon atoms. Preferred examples thereof include a methyl group, an ethyl group, a propyl group, an n-butyl group, a sec-butyl group, a hexyl group, and an octyl group.

The monovalent aliphatic hydrocarbon ring groups as $L_1$ and $L_2$ are, for example, aliphatic hydrocarbon ring groups each having 3 to 15 carbon atoms. Preferred examples thereof include a cyclopentyl group, a cyclohexyl group, a norbornyl group, an adamantyl group, and the like.

The monovalent aromatic ring groups as $L_1$ and $L_2$ are, for example, aryl groups having 6 to 15 carbon atoms. Preferred examples thereof include a phenyl group, a tolyl group, a naphthyl group, an anthryl group, and the like.

The groups formed by combination of an alkylene group and a monovalent aromatic ring group as $L_1$ and $L_2$ are, for example, those having 6 to 20 carbon atoms. Examples thereof include aralkyl groups, such as a benzyl group, a phenethyl group, and the like.

The divalent linking group as M is, for example, an alkylene group (for example, a methylene group, an ethylene group, a propylene group, a butylene group, a hexylene group, an octylene group, and the like), a divalent aliphatic hydrocarbon ring group (for example, a cyclopentylene group, a cyclohexylene group, an adamantylene group, and the like), an alkenylene group (for example, an ethylene group, a propenylene group, a butenylene group, and the like), a divalent aromatic ring group (for example, a phenylene group, a tolylene group, a naphthylene group, and the like), —S—, —O—, —CO—, —SO$_2$—, —N(R$_0$)—, or a divalent linking group formed by combination of these groups. $R_0$ represents a hydrogen atom or an alkyl group (for example, an alkyl group having 1 to 8 carbon atoms, in particular, a methyl group, an ethyl group, a propyl group, an n-butyl group, a sec-butyl group, a hexyl group, an octyl group, and the like).

The alkyl group as Q is the same as each of the groups mentioned above with respect to $L_1$ and $L_2$.

Examples of the aliphatic hydrocarbon ring group containing no heteroatom and the monovalent aromatic ring group containing no heteroatom respectively contained in the monovalent aliphatic hydrocarbon ring group which may contain a heteroatom and a monovalent aromatic ring group which may contain a heteroatom both as Q include the monovalent aliphatic hydrocarbon ring group and monovalent aromatic ring group mentioned above as $L_1$ and $L_2$, and each has preferably 3 to 15 carbon atoms.

The monovalent aliphatic hydrocarbon ring group containing a heteroatom and the monovalent aromatic ring group containing a heteroatom are not limited to these as long as they have a structure generally known as a heteroring (a ring formed by carbon and a heteroatom or a ring formed by heteroatoms). Examples thereof include groups having a heterocyclic structure, such as thiirane, thiorane, thiophene, furan, pyrrole, benzothiophene, benzofuran, benzopyrrole, triazine, imidazole, benzimidazole, triazole, thiadiazole, thiazole, pyrrolidone, and the like.

Examples of the ring that may be formed by the mutual bonding of at least two of Q, M, and $L_1$ include one formed by mutual bonding of at least two of Q, M, and $L_1$ so as to form, for example, a propylene group or a butylene group and the subsequent formation of a 5- or 6-membered ring containing an oxygen atom.

In the general formula (VI-A), each of the groups represented by $L_1$, $L_2$, M, and Q may have a substituent. Examples of the substituent include those mentioned above as the substituent which $R_{36}$ to $R_{39}$, $R_{01}$, $R_{02}$, and Ar may have, and substituents having 8 or less carbon atoms are preferred.

The group represented by -M-Q is preferably a group having 1 to 30 carbon atoms, and more preferably a group having 5 to 20 carbon atoms.

Preferred specific examples of the repeating units represented by the general formula (VI) will be shown below, but the present invention is not limited thereto.

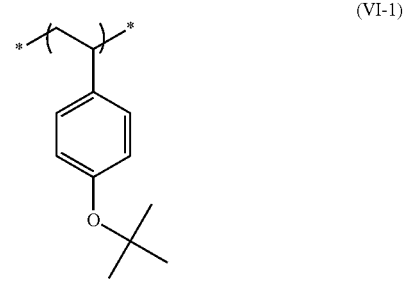

(VI-1)

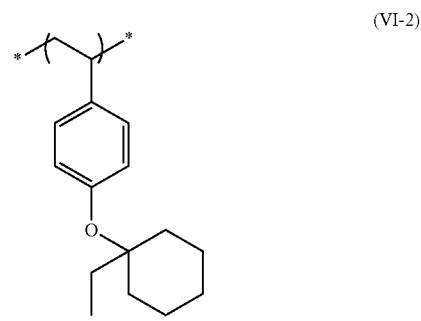

(VI-2)

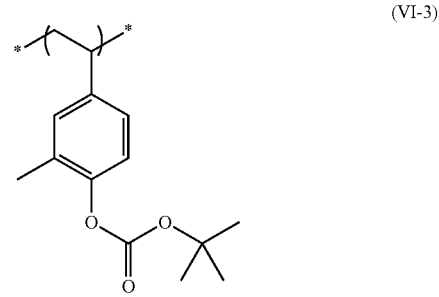

(VI-3)

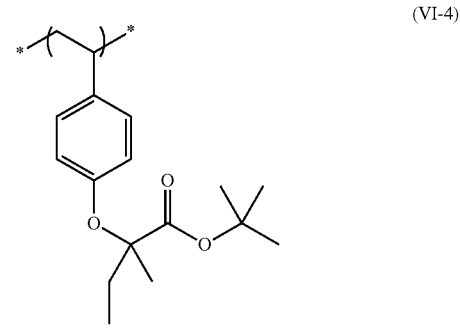

(VI-4)

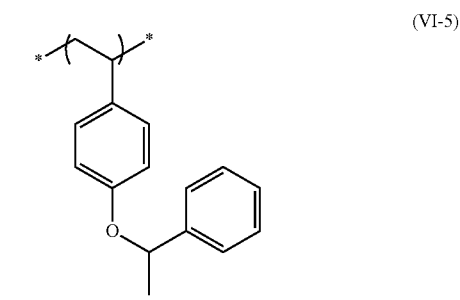

(VI-5)

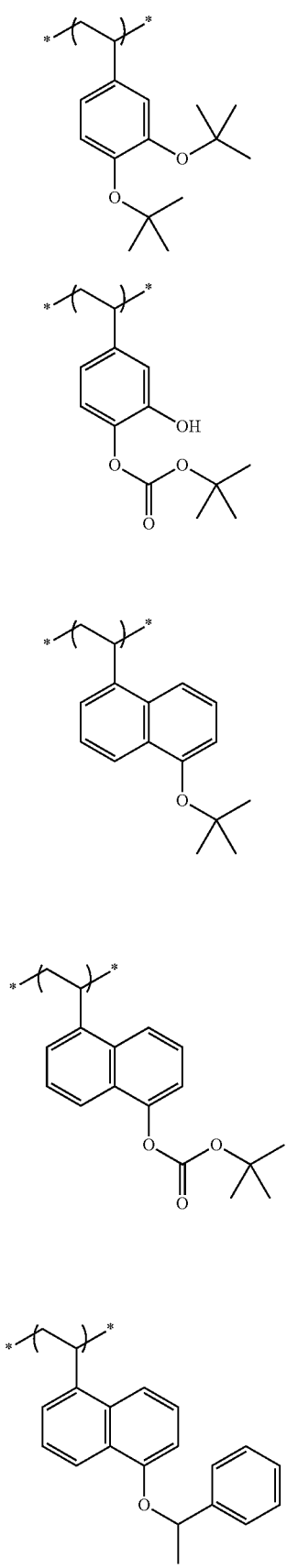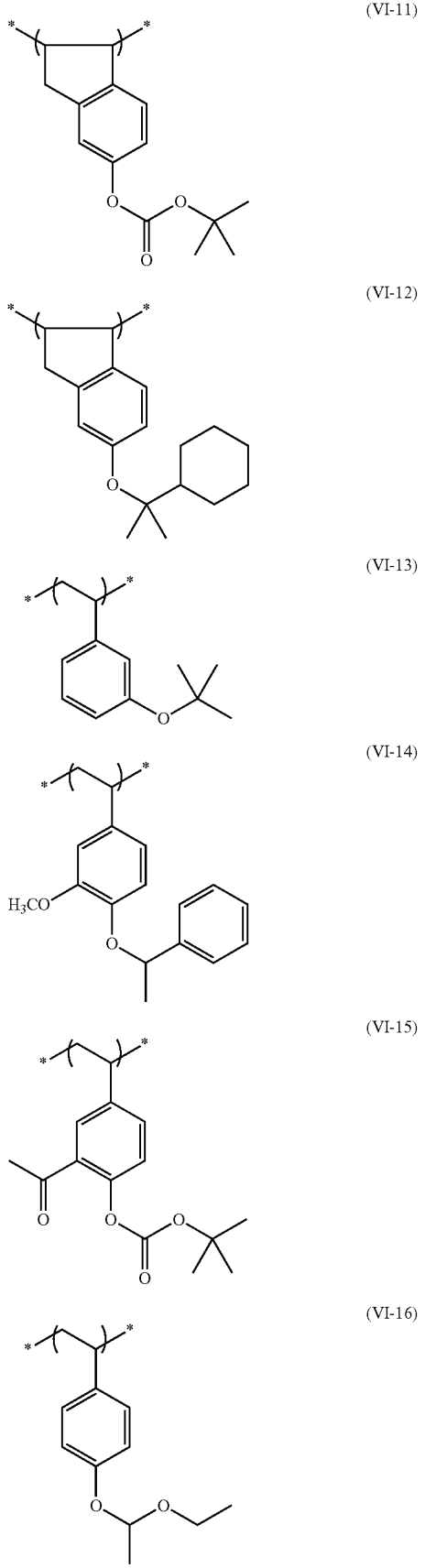

(VI-17) 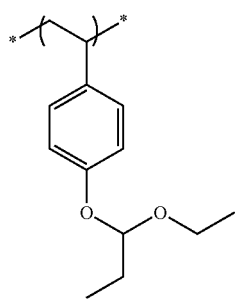
(VI-18) 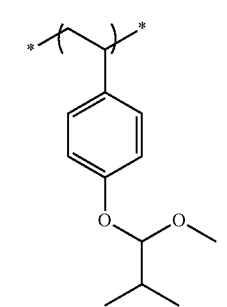
(VI-19) 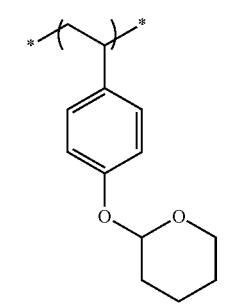
(VI-20) 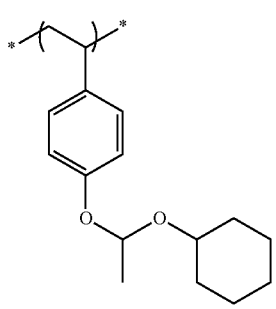
(VI-21) 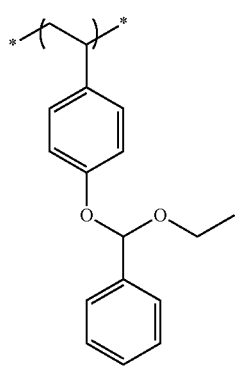
(VI-22) 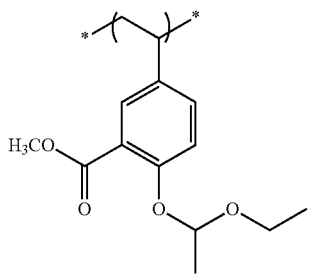
(VI-23) 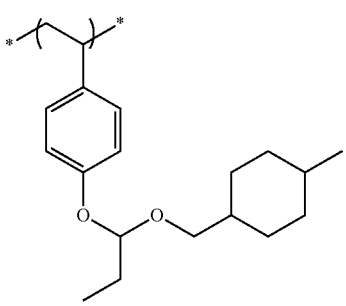
(VI-24) 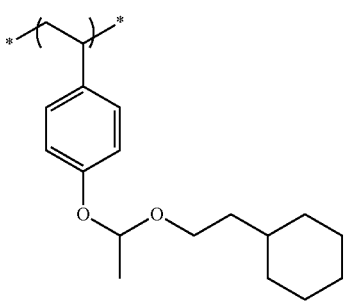
(VI-25) 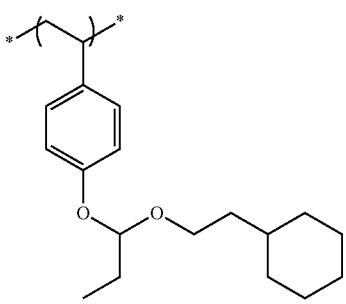
(VI-26) 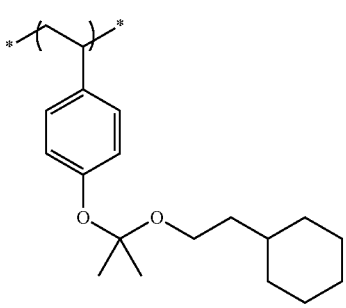

(VI-27)
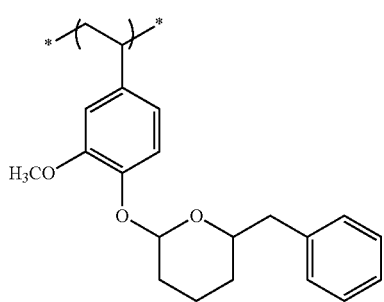
(VI-28)
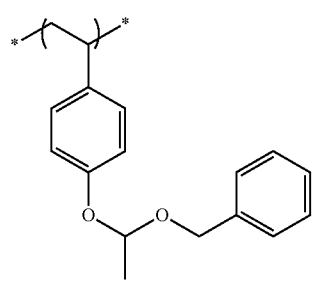
(VI-29)
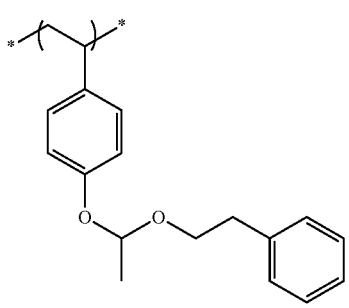
(VI-30)
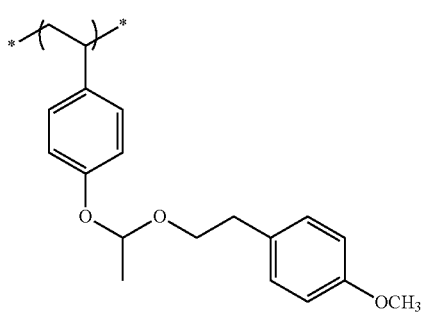
(VI-31)
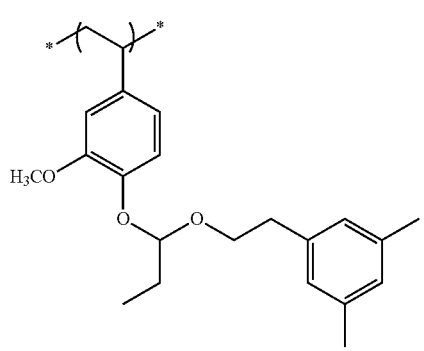
(VI-32)
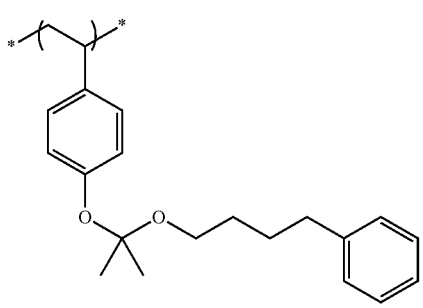
(VI-33)
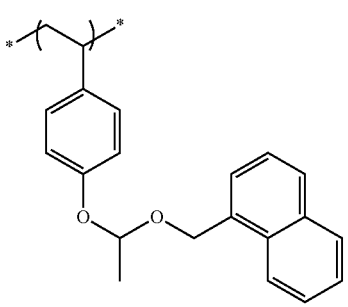
(VI-34)
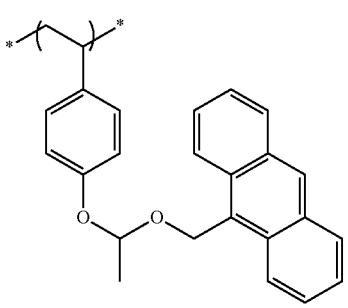
(VI-35)
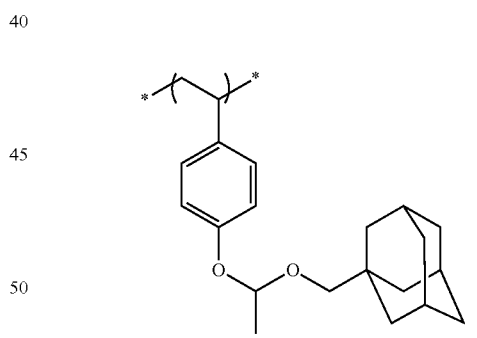
(VI-36)
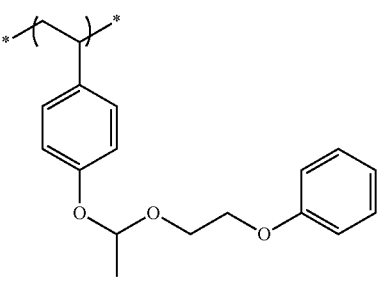

(VI-37) 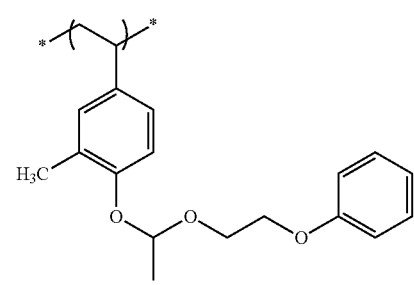
(VI-38) 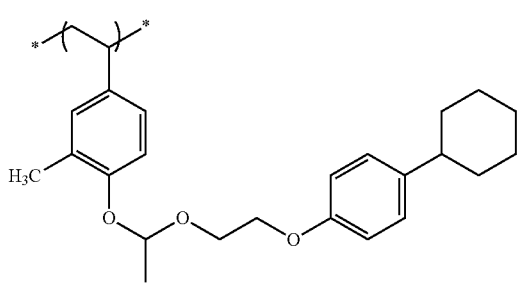
(VI-39) 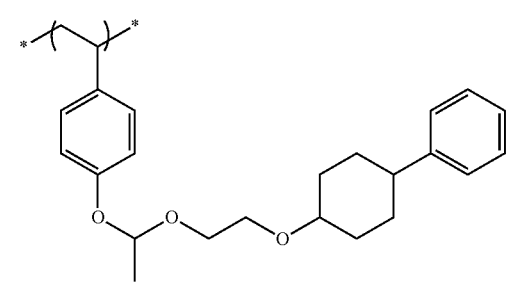
(VI-40) 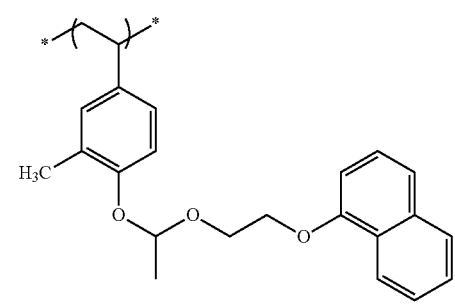
(VI-41) 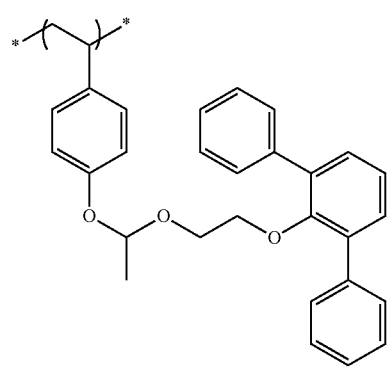
(VI-42) 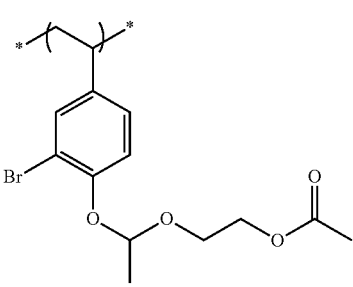
(VI-43) 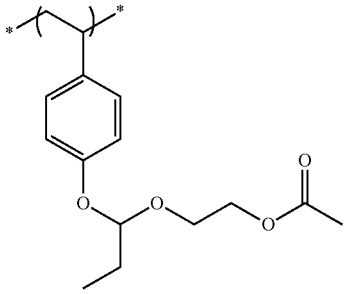
(VI-44) 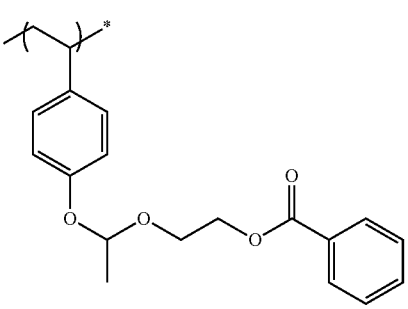
(VI-45) 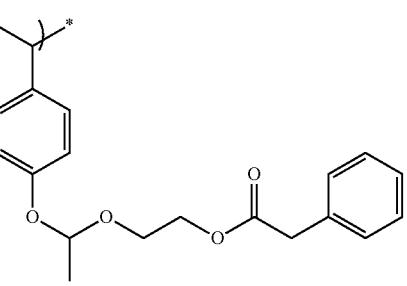
(VI-46) 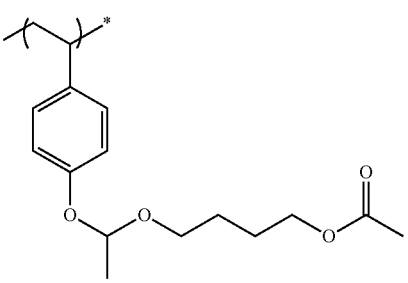

(VI-47) 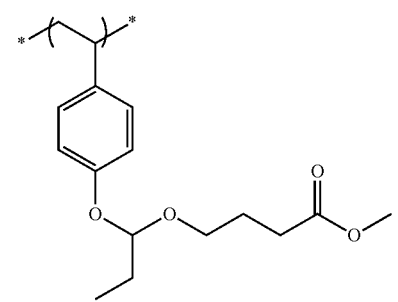
(VI-48) 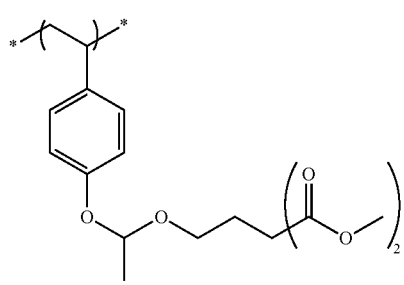
(VI-49) 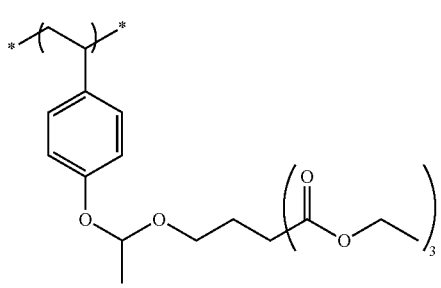
(VI-50) 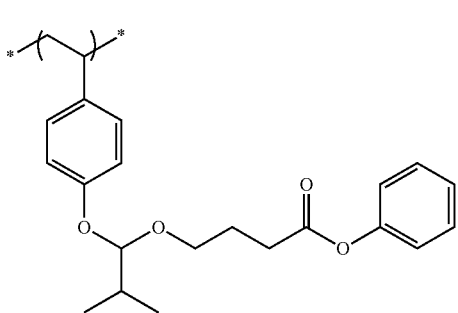
(VI-51) 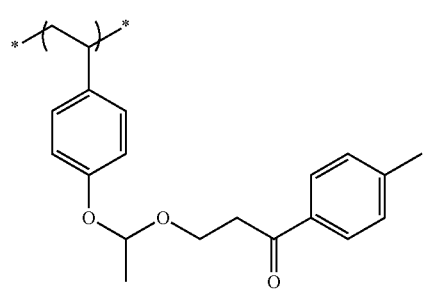
(VI-52) 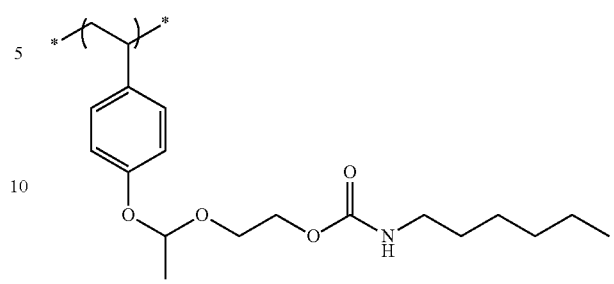
(VI-53) 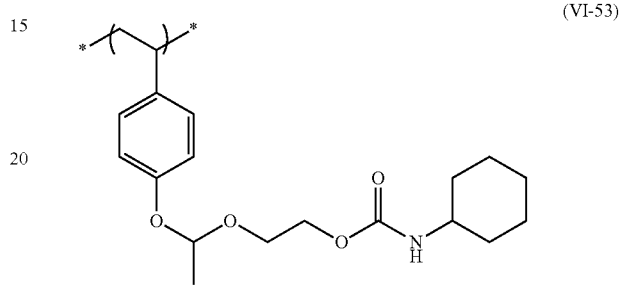
(VI-54) 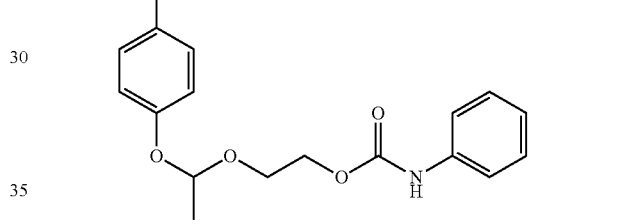
(VI-55) 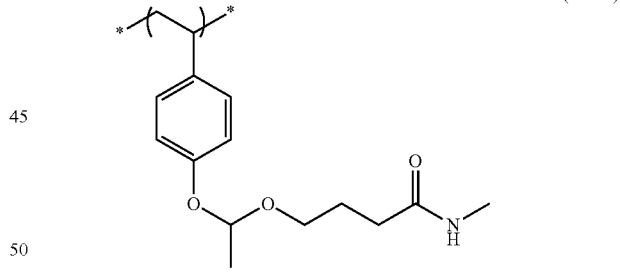
(VI-56) 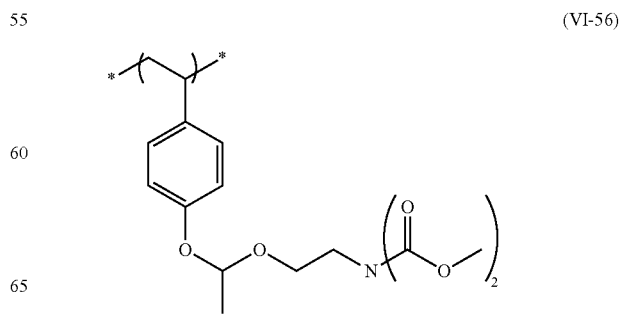

(VI-57) 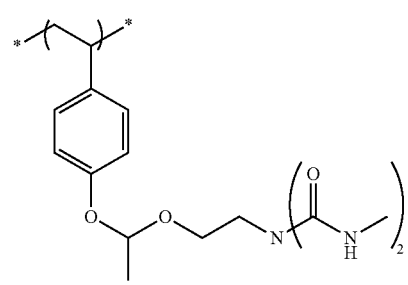
(VI-58) 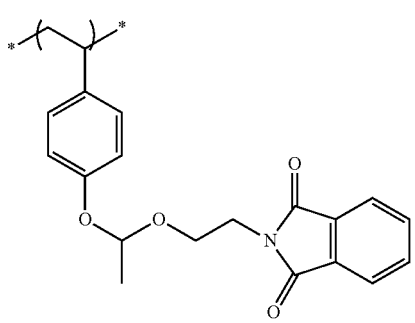
(VI-59) 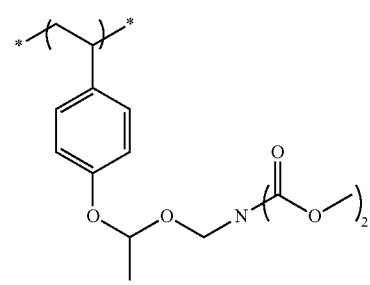
(VI-60) 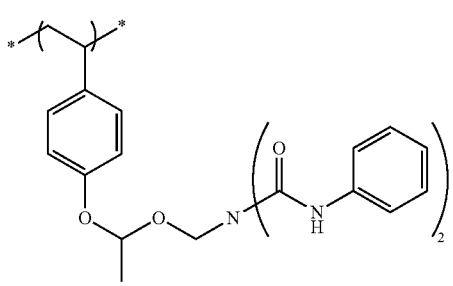
(VI-61) 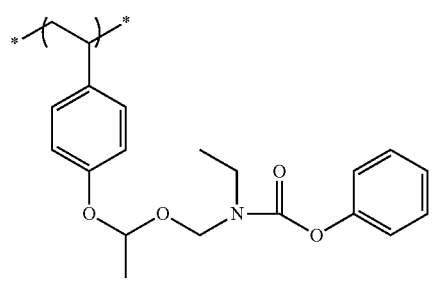
(VI-62) 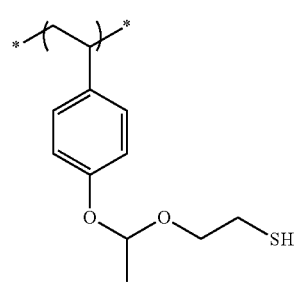
(VI-63) 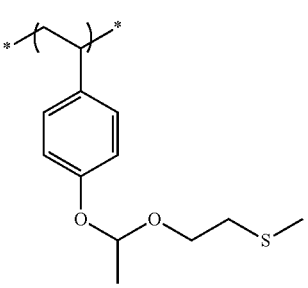
(VI-64) 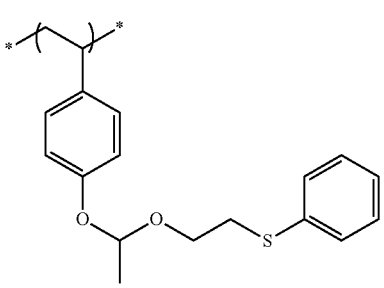
(VI-65) 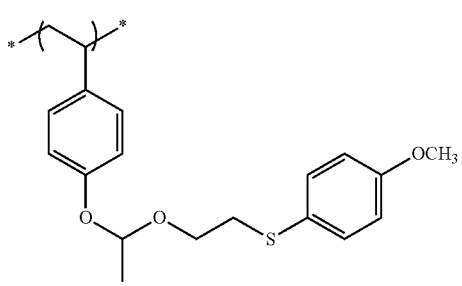
(VI-66) 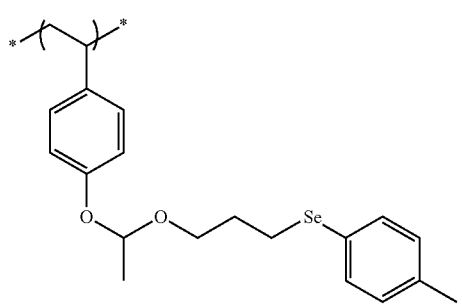

(VI-67)
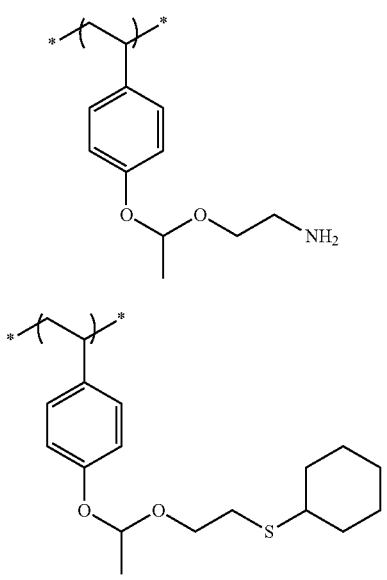
(VI-68)
(VI-69)
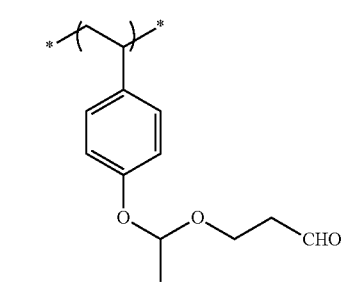
(VI-70)
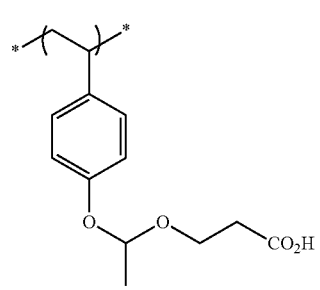
(VI-71)
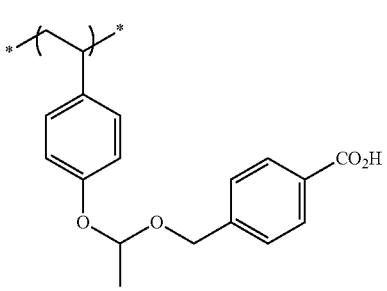
(VI-72)
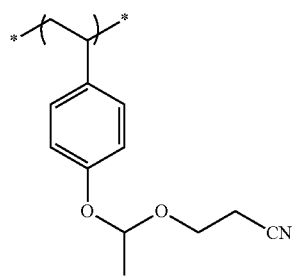
(VI-73)
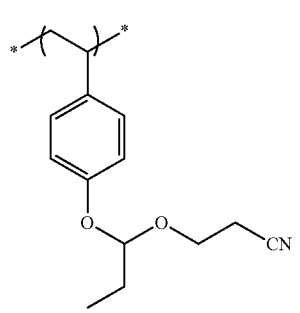
(VI-74)
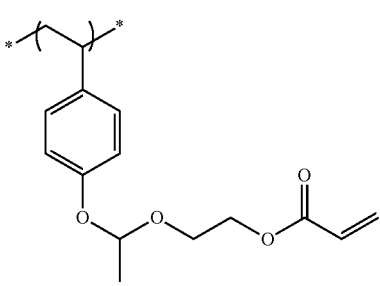
(VI-75)
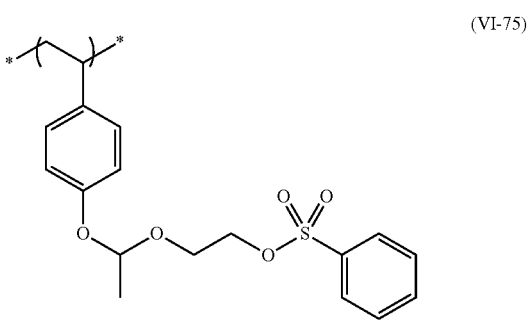
(VI-76)
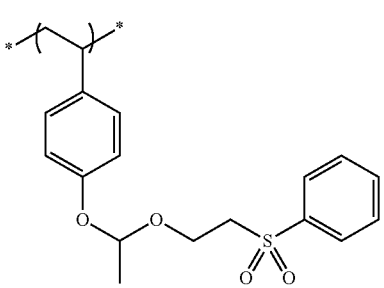

(VI-77)
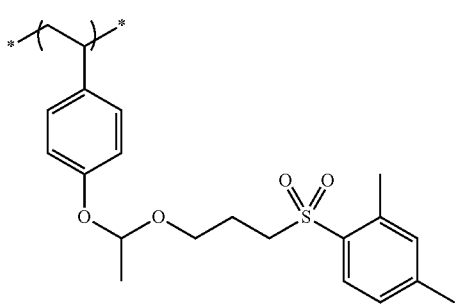
(VI-78)
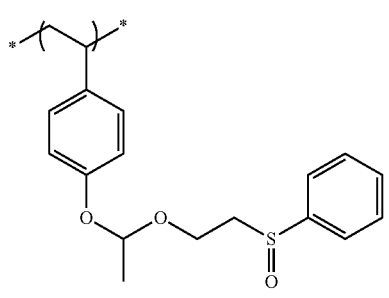
(VI-79)
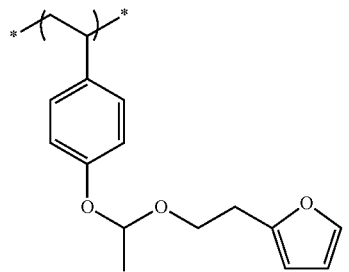
(VI-80)
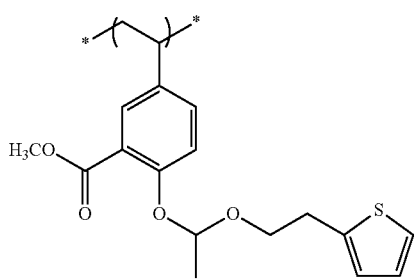
(VI-81)
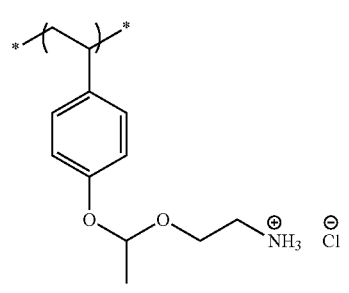
(VI-82)
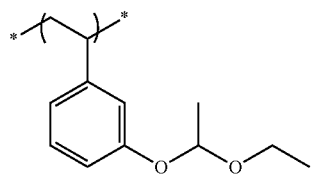
(VI-83)
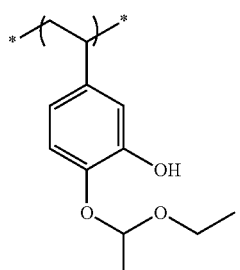
(VI-84)
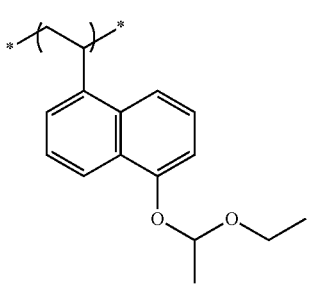
(VI-85)
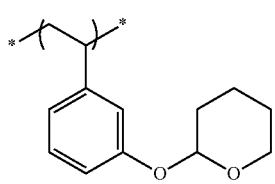
(VI-86)
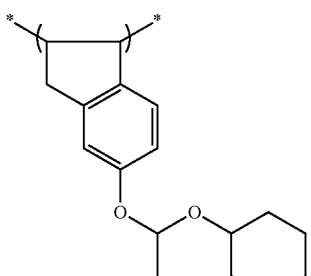
(VI-87)
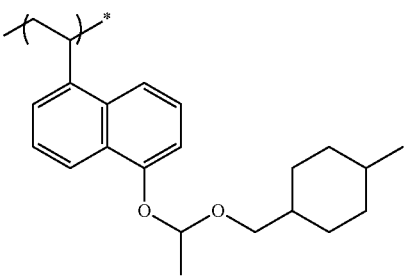
(VI-88)
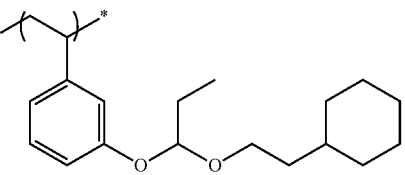

(VI-89)
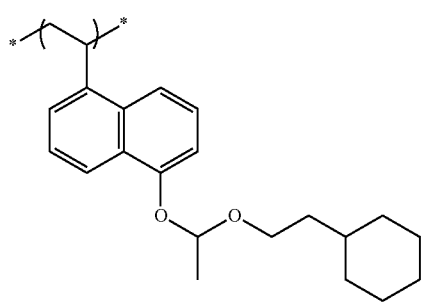
(VI-90)
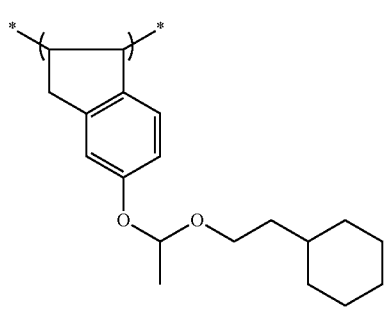
(VI-91)
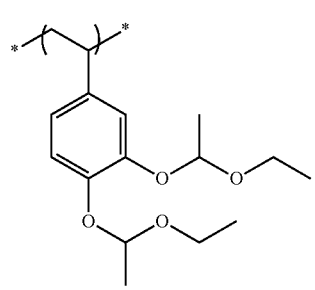
(VI-92)
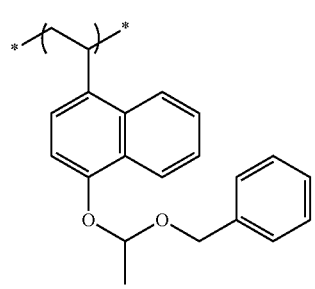
(VI-93)
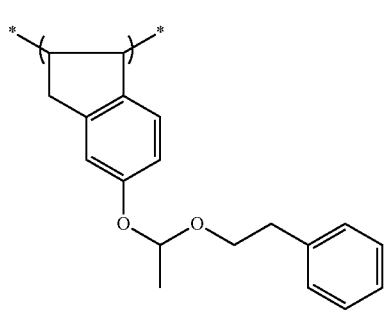
(VI-94)
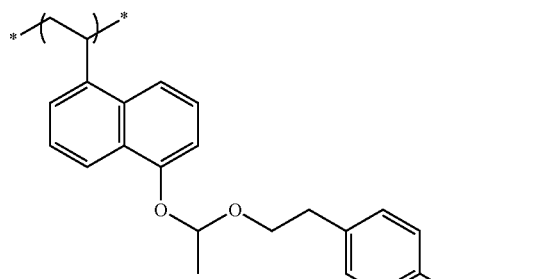
(VI-95)
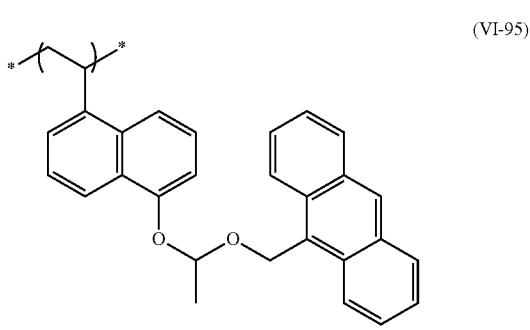
(VI-96)
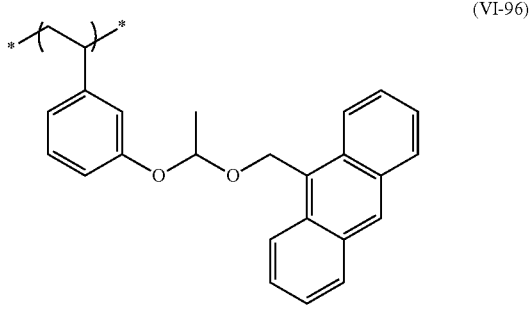
(VI-97)
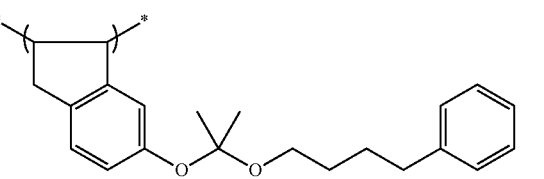
(VI-98)
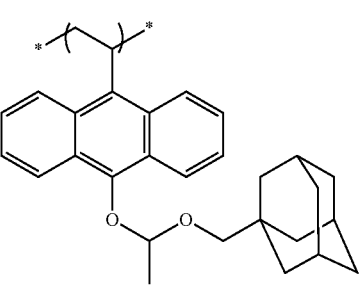

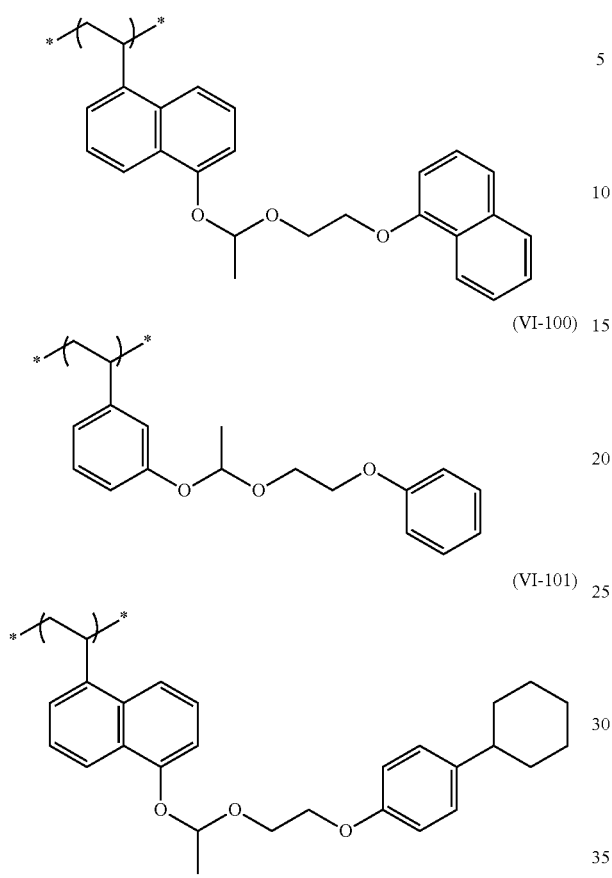
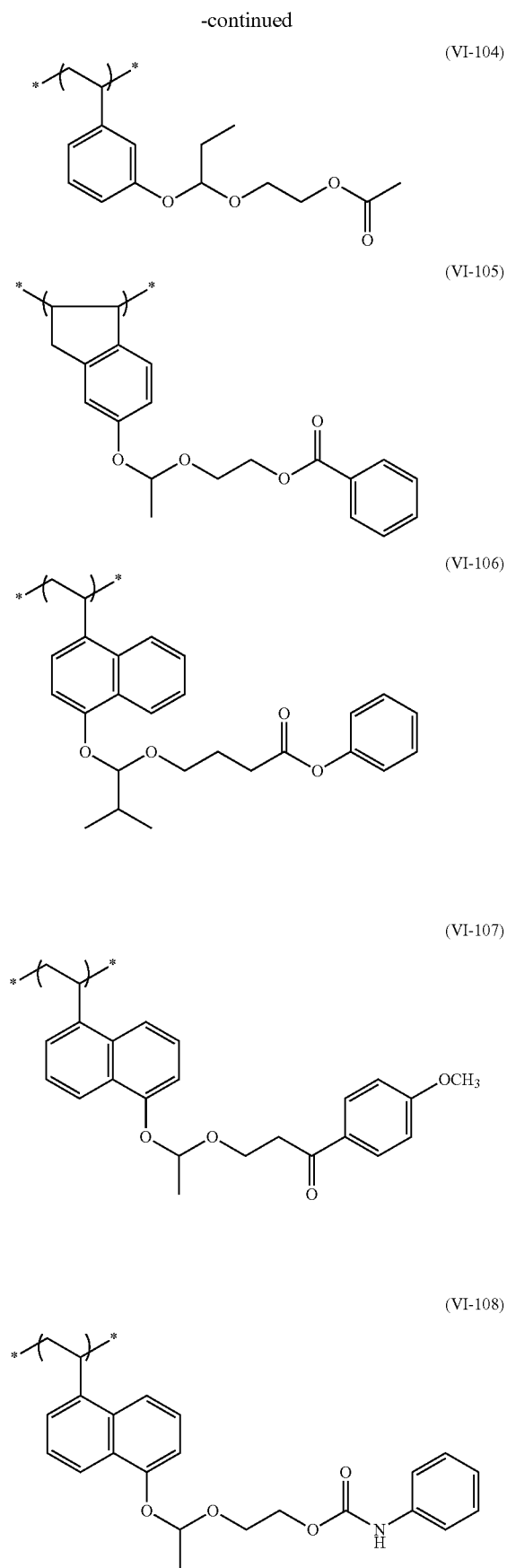

-continued

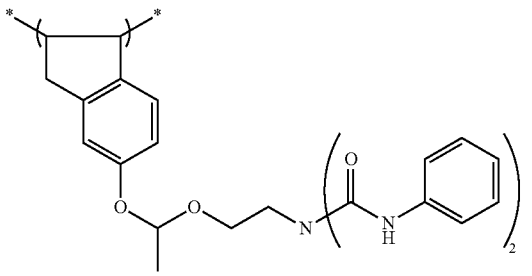
(VI-109)

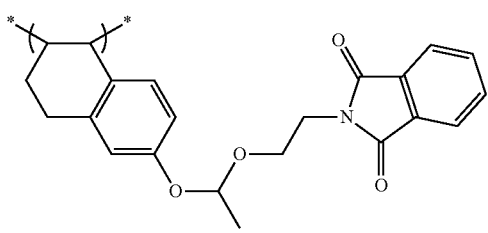
(VI-110)

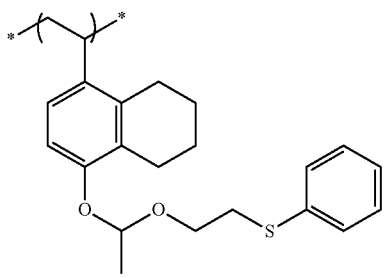
(VI-111)

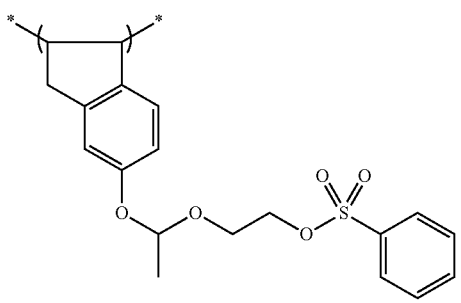
(VI-112)

In the case where the resin according to the present invention contains a repeating unit (B), the content of the repeating unit (B) in the resin (P) is preferably in the range of 3 to 90% by mole, more preferably 5 to 80% by mole, and particularly preferably 7 to 70% by mole, based on all the repeating units.

[Repeating Unit (C)]

The resin (P) according to the present invention includes, in addition to the repeating unit (A), a repeating unit (C) containing a primary or secondary hydroxyl group. By employing such a constitution, the generation efficiency of the acid generated by the repeating unit (A) can be increased. Accordingly by employing such a constitution, the sensitivity can be improved. This effect is particularly apparent in the case where exposure with an electron beam, X-rays, or EUV light is carried out.

The repeating unit (C) is preferably a repeating unit represented by the following general formula (IV).

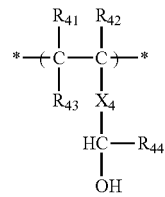
(IV)

In the formula, each of $R_{41}$, $R_{42}$, and $R_{43}$ independently represents a hydrogen atom, an alkyl group, a monovalent aliphatic hydrocarbon ring group, a halogen atom, a cyano group, or an alkoxycarbonyl group. $R_{43}$ may be combined with $X_4$ to form a ring, and in this case, $R_{43}$ represents an alkylene group.

$R_{44}$ represents a hydrogen atom or a monovalent substituent. $R_{44}$ may be combined with $X_4$ to form a ring, and in this case, $R_{44}$ represents an alkylene group.

$X_4$ represent a linking group.

The general formula (IV) will be described in more detail.

In the general formula (IV), preferred examples of the alkyl groups of $R_{41}$, $R_{42}$, and $R_{43}$ include an alkyl group having 20 or less carbon, atoms, such as a methyl group, an ethyl group, a propyl group, an isopropyl group, an n-butyl group, a sec-butyl group, a hexyl group, a 2-ethylhexyl group, an octyl group, a dodecyl group, and the like, each of which may have a substituent, more preferably an alkyl group having 8 or less carbon atoms, and particularly preferably an alkyl group having 3 or less carbon atoms.

Examples of the monovalent aliphatic hydrocarbon ring group include a monovalent aliphatic hydrocarbon ring group which may be monocyclic or polycyclic. Preferred examples thereof include a monocyclic monovalent aliphatic hydrocarbon ring group having 3 to 8 carbon atoms, such as a cyclopropyl group, a cyclopentyl group, and a cyclohexyl group, each of which may have a substituent.

Examples of the halogen atom include a fluorine atom, a chlorine atom, a bromine atom, and an iodine atom, and a fluorine atom is particularly preferred.

The alkyl group contained in the alkoxycarbonyl group is preferably the same as the alkyl group with respect to $R_{41}$ to $R_{43}$ above.

Examples of the preferred substituent of each of the groups include an alkyl group, a monovalent aliphatic hydrocarbon ring group, an aryl group, an amino group, an amide group, a ureido group, a urethane group, a hydroxyl group, a carboxylic group, a halogen atom, an alkoxy group, thioether group, an acyl group, an acyloxy group, an alkoxycarbonyl group, a cyano group, a nitro group, and the like. Substituents having 8 or less carbon atoms are preferred.

Furthermore, in the case where $R_{43}$ represents an alkylene group, preferred examples of the alkylene group include an alkylene group having 1 to 8 carbon atoms, such as a methylene group, an ethylene group, a propylene group, a butylene group, a hexylene group, an octylene group, and the like. An alkylene group having 1 to 4 carbon atoms is more preferred, and an alkylene group having 1 to 2 carbon atoms is particularly preferred.

Each of $R_{41}$ and $R_{42}$ in the formula (IV) is more preferably a hydrogen atom, an alkyl group, or a halogen atom, and particularly preferably a hydrogen atom, a methyl group, an ethyl group, a trifluoromethyl group (—CF$_3$), a chloromethyl group (—CH$_2$—Cl), or a fluorine atom (—F).

R$_{43}$ is more preferably a hydrogen atom, an alkyl group, a halogen atom, or an alkylene group (forming a ring in combination with X$_4$), and particularly preferably a hydrogen atom, a methyl group, an ethyl group, a trifluoromethyl group (—CF$_3$), a chloromethyl group (—CH$_2$—Cl), a fluorine atom (—F), a methylene group (forming a ring in combination with X$_4$), or an ethylene group (forming a ring in combination with X$_4$).

Examples of the monovalent substituent of R$_{44}$ include an alkyl group, a monovalent aliphatic hydrocarbon ring group, a monovalent aromatic ring group, a halogen group, a cyano group, and an alkoxycarbonyl group. R$_{44}$ is preferably an alkyl group, a monovalent aliphatic hydrocarbon ring group, a monovalent aromatic ring group, or a halogen group, and more preferably an alkyl group or a monovalent aromatic ring group.

Preferred examples of the alkyl group represented by R$_{44}$ include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, a dodecyl group, and the like, each of which may have a substituent, more preferably an alkyl group having 8 or less carbon atoms, and particularly preferably an alkyl group having 3 or less carbon atoms.

The monovalent aliphatic hydrocarbon ring group represented by R$_{44}$ may be monocyclic or polycyclic. Preferred examples thereof include a monocyclic monovalent aliphatic hydrocarbon ring group having 3 to 8 carbon atoms, such as a cyclopropyl group, a cyclopentyl group, and a cyclohexyl group, each of which may have a substituent.

The monovalent aromatic ring group represented by R$_{44}$ is preferably a monovalent aromatic ring group having 6 to 14 carbon atoms, which may have a substituent, and specific examples thereof include a benzene ring group, a toluene ring group, a naphthalene ring group, and the like.

Examples of the halogen group represented by R$_{44}$ include a fluorine atom, a chlorine atom, a bromine atom, and an iodine atom, and a fluorine atom is particularly preferred.

The alkyl group contained in the alkoxycarbonyl group represented by R$_{44}$ is preferably the same alkyl group with respect to R$_{41}$ to R$_{43}$ above.

Furthermore, in the case where R$_{44}$ represents an alkylene group, preferred examples of the alkylene group include an alkylene group having 1 to 8 carbon atoms, such as a methylene group, an ethylene group, a propylene group, a butylene group, a hexylene group, an octylene group, and the like. An alkylene group having 1 to 4 carbon atoms is more preferred, and an alkylene group having 1 to 2 carbon atoms is particularly preferred.

Examples of the linking group represented by X$_4$ include an alkylene group, a cycloalkylene group, an alkenylene group, an aromatic ring group, —COO—, —CO—, —OCO—, —O—, —S—, —SO—, —SO$_2$—, —CONH—, —NR— (wherein R is a hydrogen atom or an alkyl group), a group formed by combination of two or more thereof, and the like, which may further be substituted with a substituent such as a fluorine atom and the like.

X$_4$ is preferably an alkylene group, an aromatic ring group, —COO—, —CO—, or —CONH—, and more preferably an aromatic ring group or —COO—.

Specific examples of the monomer corresponding to the repeating unit represented by the general formula (IV) are shown below, but the present invention is not limited thereto.

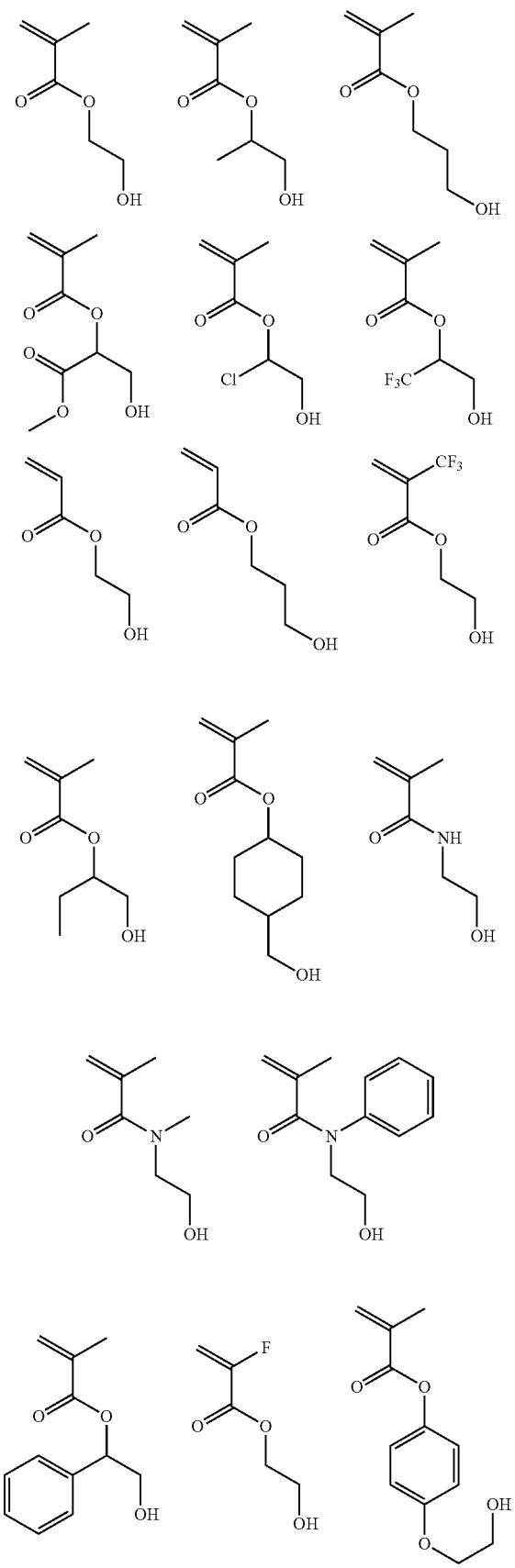

147
-continued
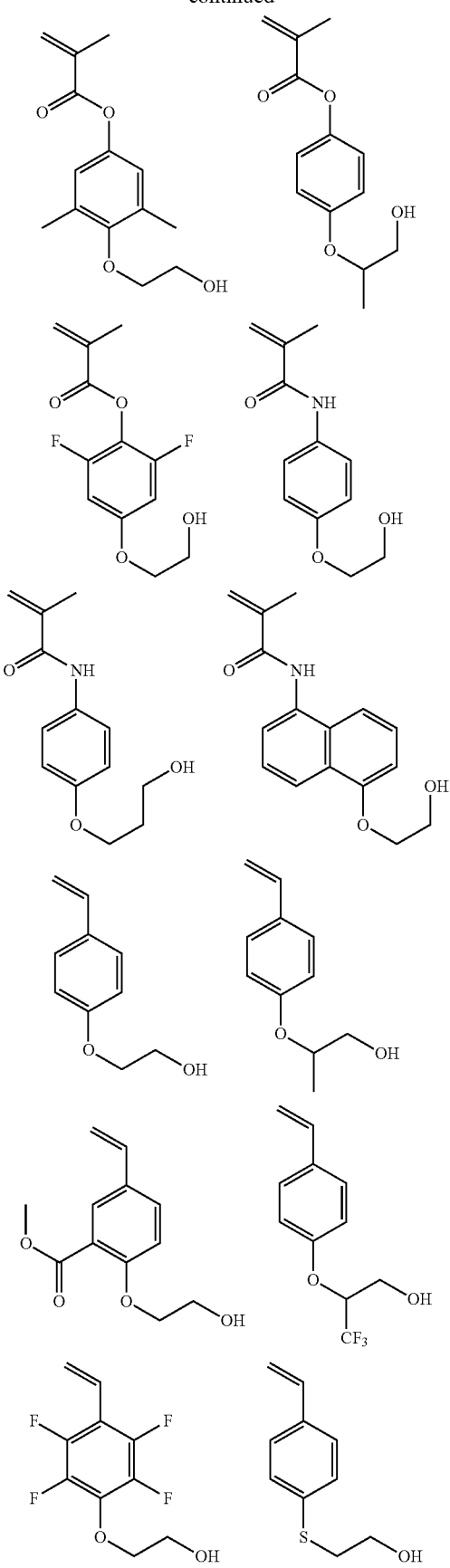
148
-continued
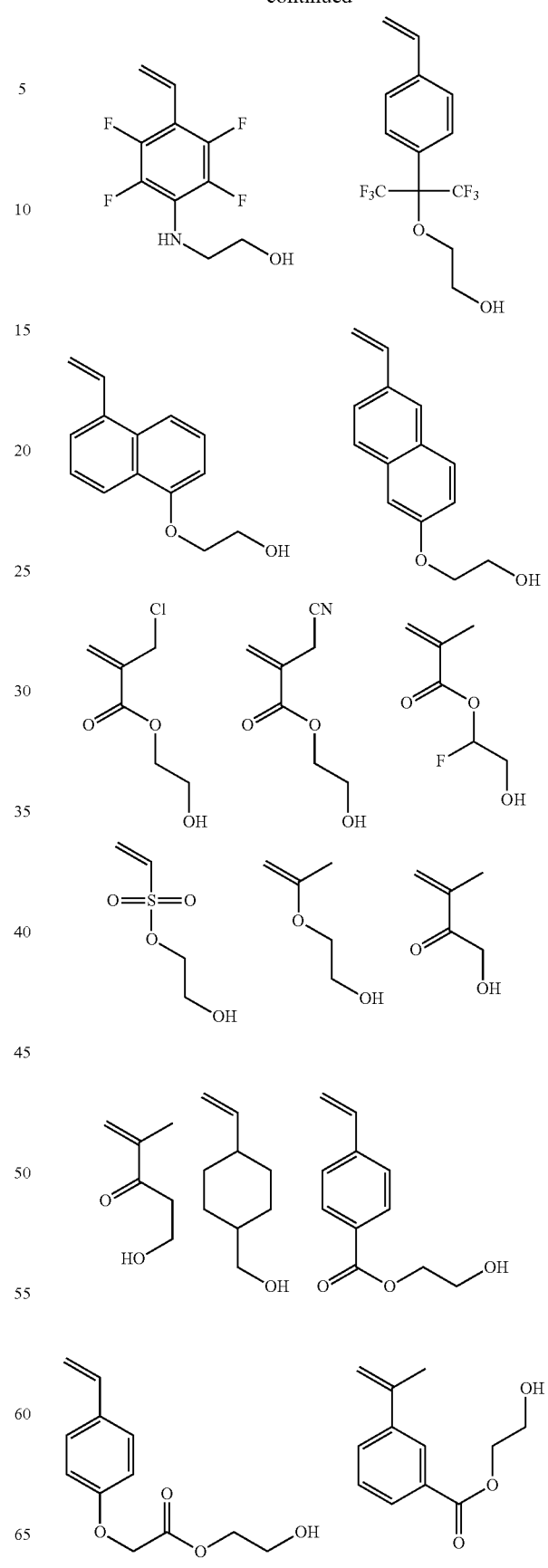

-continued
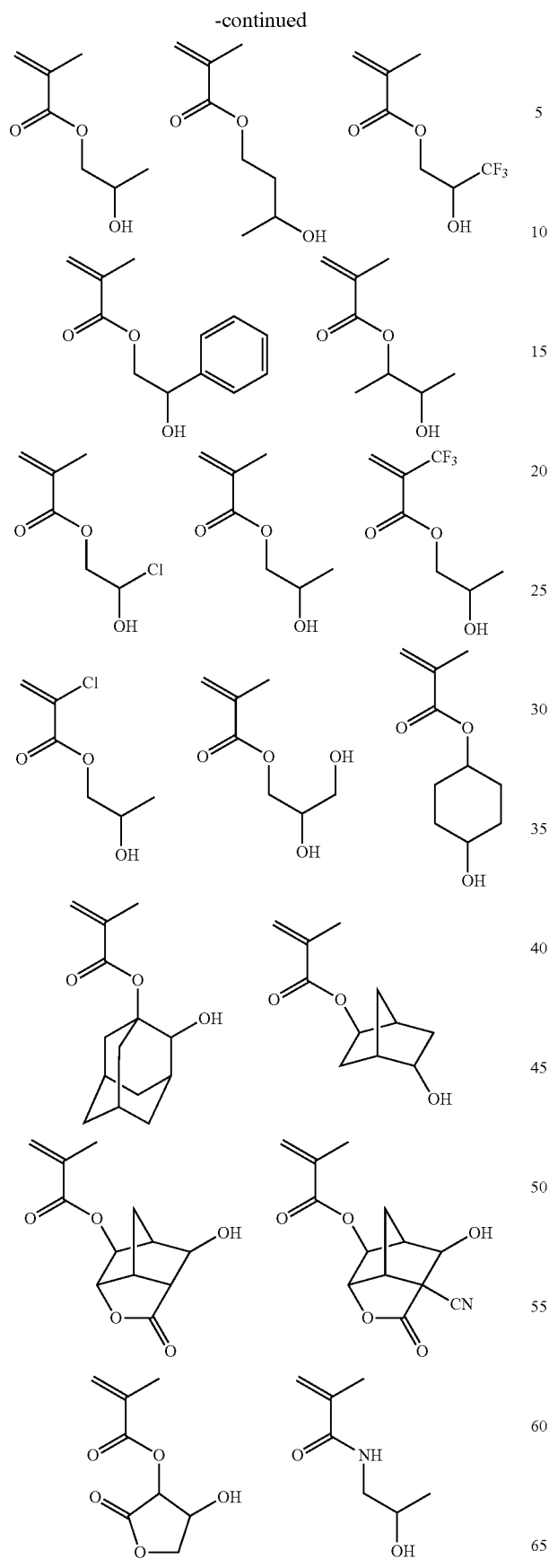
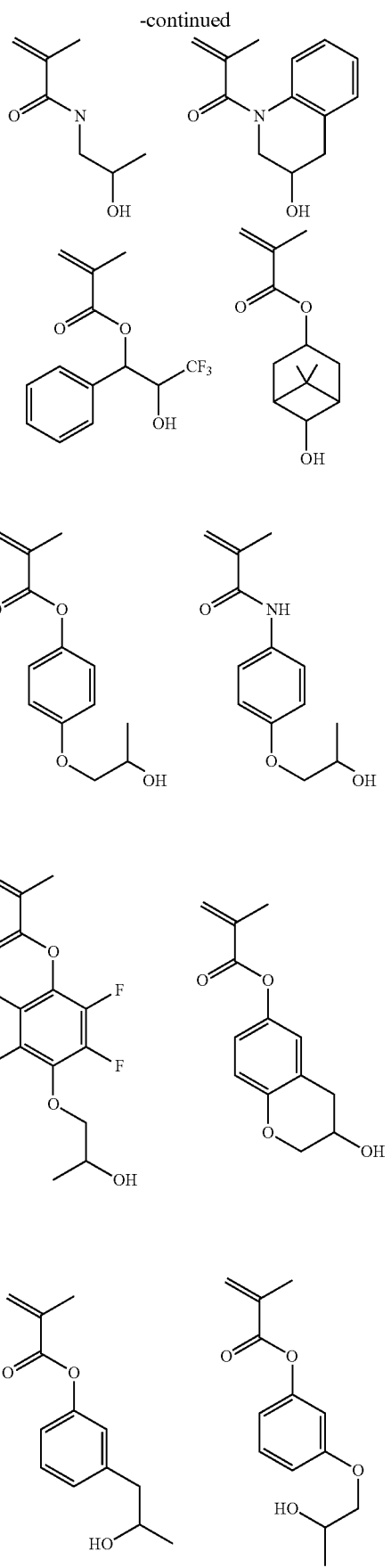

-continued
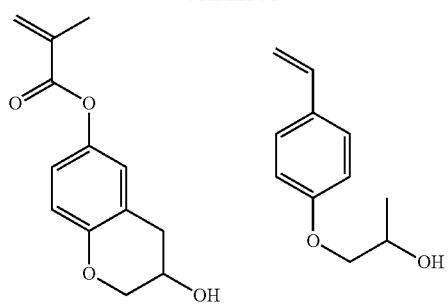
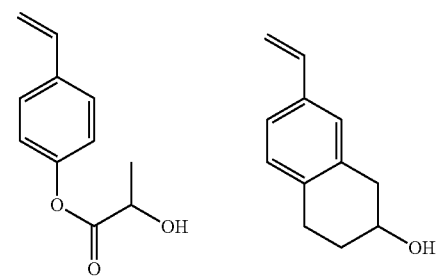
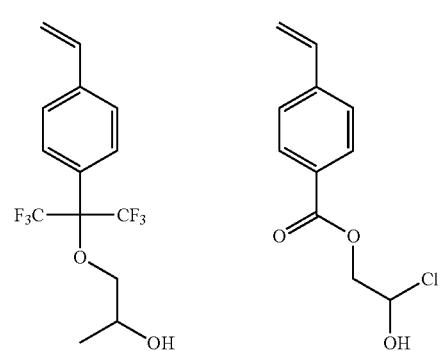
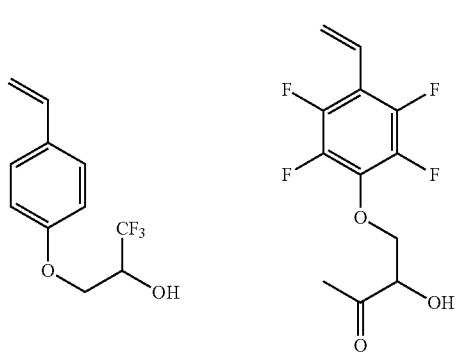
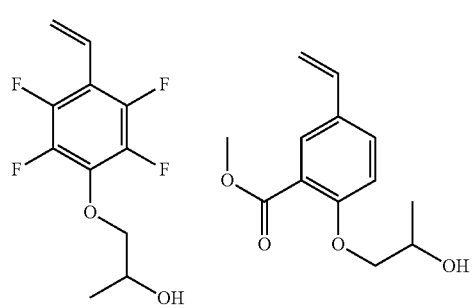
-continued
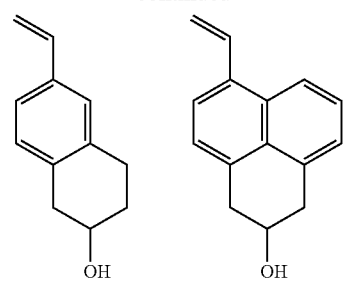
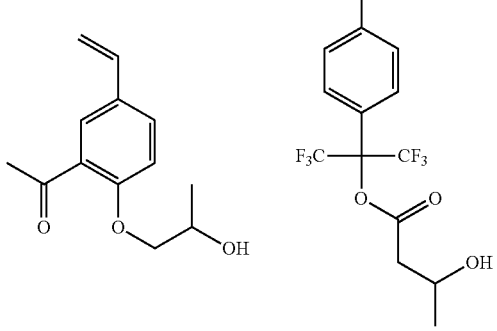
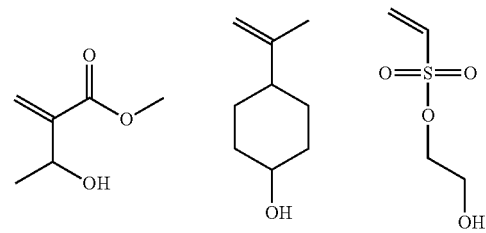
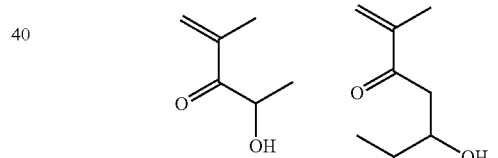
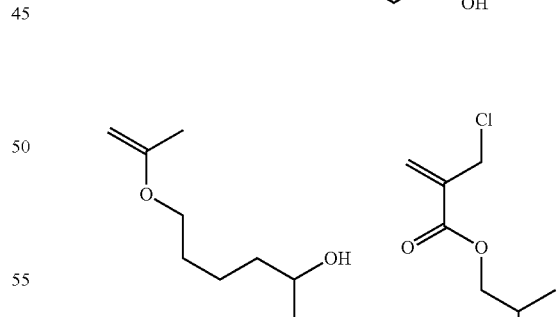
The repeating unit (C) is preferably a repeating unit represented by the following general formula (VII). In this case, the generation efficiency of the acid generated by the repeating unit (A) can be increased.

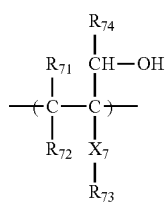

(VII)

In the formula, each of $R_{71}$ and $R_{72}$ independently represents a hydrogen atom, an alkyl group, a monovalent aliphatic hydrocarbon ring group, a halogen atom, a cyano group, or an alkoxycarbonyl group. $R_{72}$ may be combined with $X_7$ to form a ring, and in this case, $R_{72}$ represents an alkylene group.

Each of $R_{73}$ and $R_{74}$ independently represents a hydrogen atom or a monovalent substituent. Further, $R_{73}$ may be a group which decomposes by the action of an acid.

$X_7$ represents a linking group.

The general formula (VII) will be described in more detail.

In the general formula (VII), preferred examples of the alkyl group of each of $R_{71}$ and $R_{72}$ include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, a dodecyl group, and the like, each of which may have a substituent, more preferably an alkyl group having 8 or less carbon atoms, and particularly preferably an alkyl group having 3 or less carbon atoms.

The monovalent aliphatic hydrocarbon ring group represented by $R_{44}$ may be monocyclic or polycyclic. Preferred examples thereof include a monocyclic monovalent aliphatic hydrocarbon ring group having 3 to 8 carbon atoms, such as a cyclopropyl group, a cyclopentyl group, and a cyclohexyl group, each of which may have a substituent.

Examples of the halogen atom include a fluorine atom, a chlorine atom, a bromine atom, and an iodine atom, and a fluorine atom is particularly preferred.

The alkyl group contained in the alkoxycarbonyl group is preferably the same as alkyl group with respect to $R_{41}$ to $R_{43}$.

Examples of the preferable substituent in each of the groups include an alkyl group, a monovalent aliphatic hydrocarbon ring group, an aryl group, an amino group, an amide group, a ureido group, a urethane group, a hydroxyl group, a carboxylic group, a halogen atom, an alkoxy group, thioether group, an acyl group, an acyloxy group, an alkoxycarbonyl group, a cyano group, a nitro group, and the like, and substituents having 8 or less carbon atoms are preferred.

Furthermore, in the case where $R_{72}$ represents an alkylene group, preferred examples of the alkylene group include an alkylene group having 1 to 8 carbon atoms, such as a methylene group, an ethylene group, a propylene group, a butylene group, a hexylene group, an octylene group, and the like. An alkylene group having 1 to 4 carbon atoms is more preferred, and an alkylene group having 1 to 2 carbon atoms is particularly preferred.

In the general formula (VII), $R_{71}$ is more preferably a hydrogen atom, an alkyl group, or a halogen atom, and particularly preferably a hydrogen atom, a methyl group, an ethyl group, a trifluoromethyl group (—$CF_3$), a hydroxymethyl group (—$CH_2$—OH), a chloromethyl group (—$CH_2$—Cl), or a fluorine atom (—F).

$R_{72}$ is more preferably a hydrogen atom, an alkyl group, a halogen atom, or an alkylene group (forming a ring in combination with $L_7$), and particularly preferably a hydrogen atom, a methyl group, an ethyl group, a trifluoromethyl group (—$CF_3$), hydroxymethyl group (—$CH_2$—OH), a chloromethyl group (—$CH_2$—Cl), a fluorine atom (—F), a methylene group (forming a ring in combination with $L_7$), or an ethylene group (forming a ring in combination with $L_7$).

Examples of the linking group represented by $X_7$ include the same as described above with respect to $X_4$ in the general formula (IV). $X_7$ is preferably an alkylene group, an aromatic ring group, —COO—, —CO—, or —CONH—, and more preferably —COO—.

Examples of the monovalent substituent of $R_{73}$ and $R_{74}$ include an alkyl group, a monovalent aliphatic hydrocarbon ring group, a monovalent aromatic ring group, a halogen group, a cyano group, and an alkoxycarbonyl group.

$R_{73}$ is preferably an alkyl group, a monovalent aliphatic hydrocarbon ring group, or a monovalent aromatic ring group, and more preferably an alkyl group. $R_{74}$ is preferably an alkyl group, a monovalent aliphatic hydrocarbon ring group, a monovalent aromatic ring group, or a halogen group, and an alkyl group or a monovalent aromatic ring group is more preferable.

Furthermore, as described above, $R_{73}$ may be a group which decomposes by the action of an acid. Examples of such a group include those described above as an acid-decomposable group which can be contained in the repeating unit (B).

Preferred embodiments of each group represented by $R_{73}$ or $R_{74}$ include the same as described above with respect to $R_{44}$ the general formula (IV).

Preferred specific examples of the monomer corresponding to the repeating unit represented by the general formula (IV) will be shown below, but the present invention is not limited thereto.

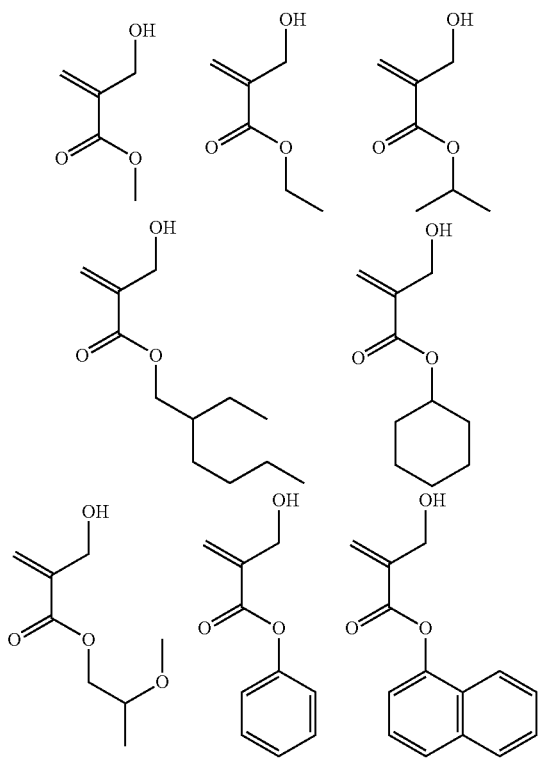

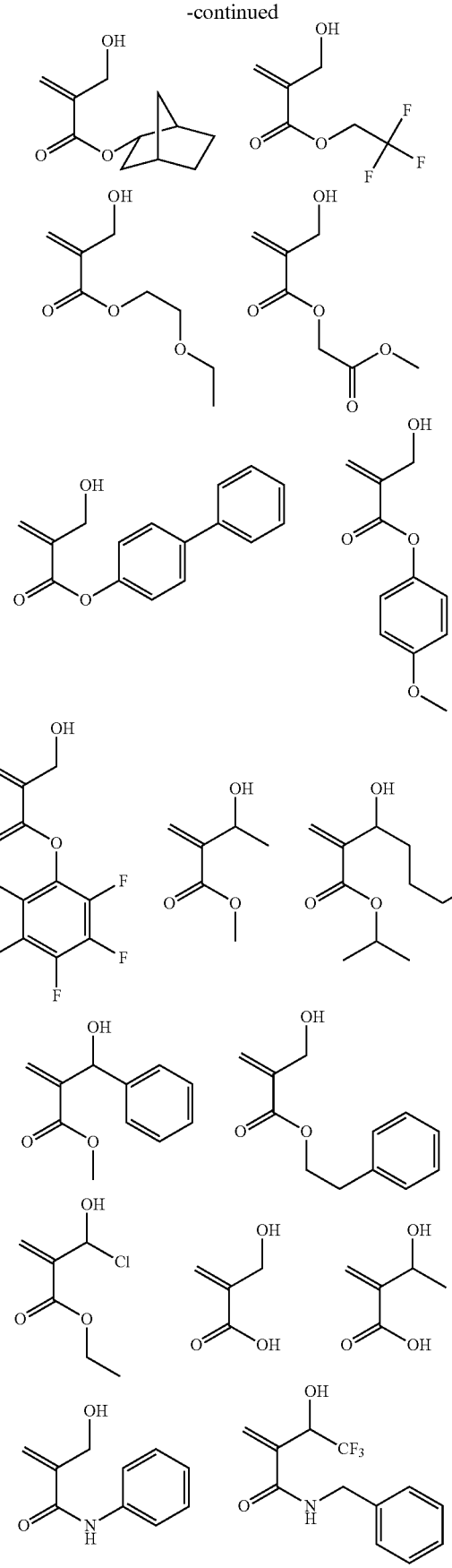
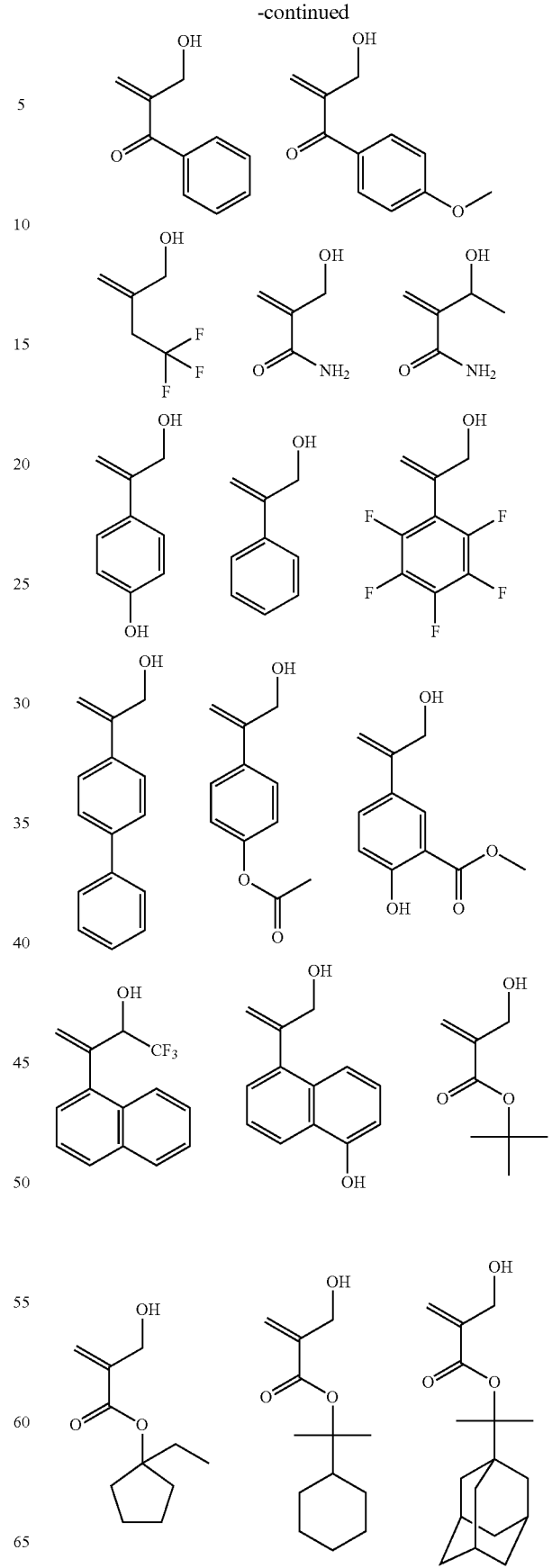

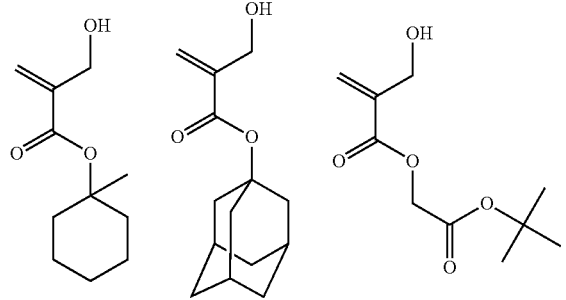
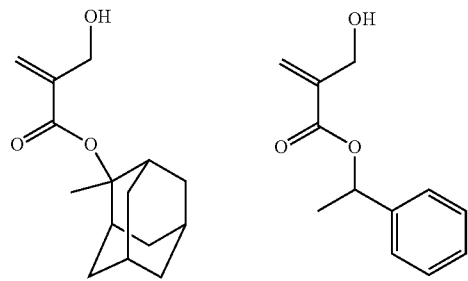
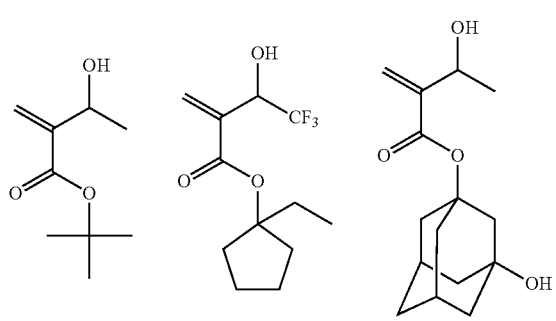
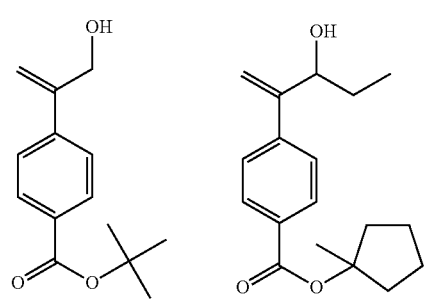
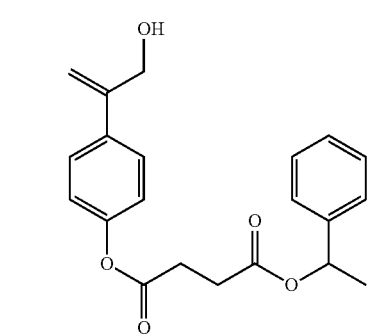
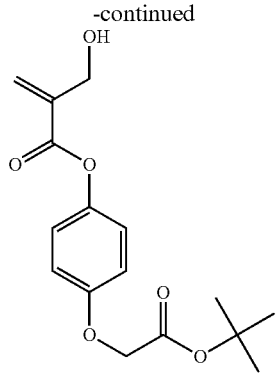
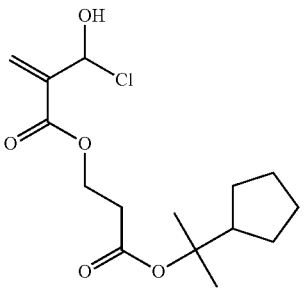
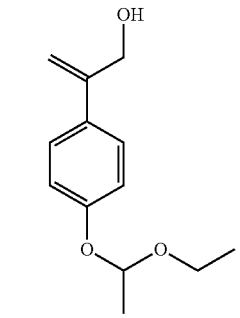
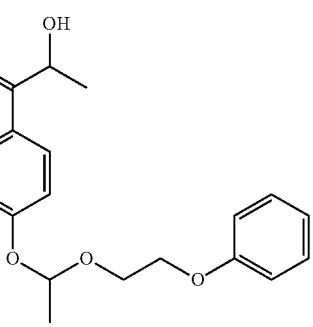
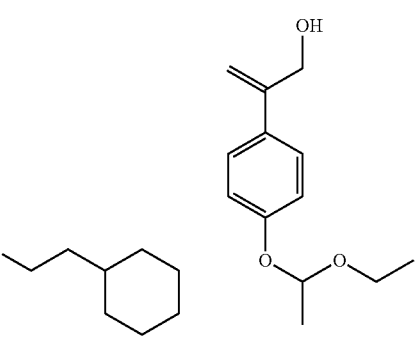

-continued

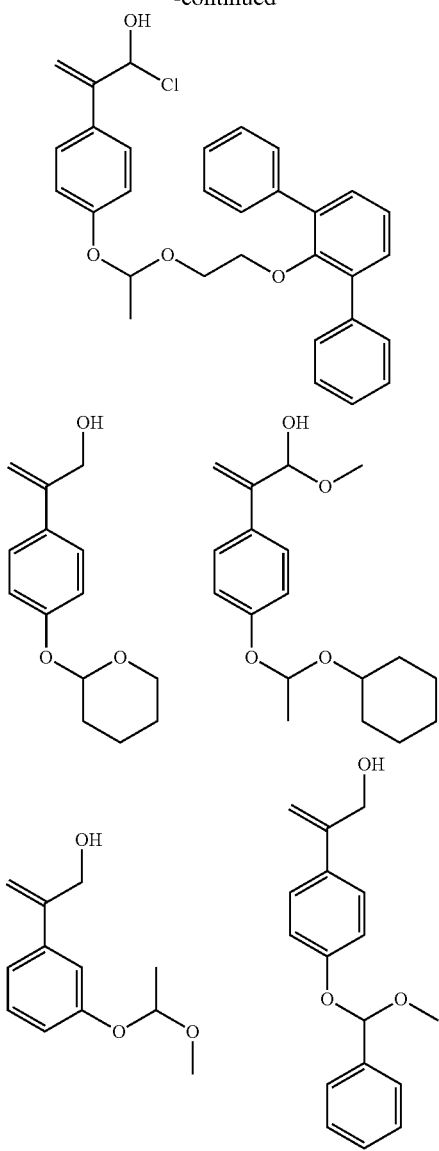

The content of repeating unit (C) in the resin (P) of the present invention is preferably in the range of 3 to 90% by mole, more preferably 5 to 80% by mole, and particularly preferably 7 to 70% by mole, based on all the repeating units.

Furthermore, in the case where $R_{73}$ of the repeating unit (C) is an acid-decomposable group that can be contained in the repeating unit (B) (namely, in the case where the repeating unit (C) is the repeating unit (B)), the total content of the repeating unit (B) in the resin (P) is preferably in the range of 3 to 90% by mole, more preferably 5 to 80% by mole, and particularly preferably 7 to 70% by mole, based on all the repeating units.

[Repeating Unit (D)]

Preferably, the resin (P) may further include a repeating unit (D) containing a group which decomposes to increase the dissolution rate in a developing liquid by the action of the developing liquid.

Examples of the developing liquid include a lactone structure, a phenylester structure, and the like.

The repeating unit (D) is more preferably a repeating unit represented by the following general formula (AII).

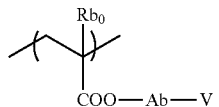

(AII)

In the general formula (AII), $Rb_0$ represents a hydrogen atom, a halogen atom, or an alkyl group (preferably having 1 to 4 carbon atoms), which may be substituted.

Examples of the substituent which may be contained in the alkyl group of $Rb_0$ include a hydroxyl group and a halogen atom. Examples of the halogen atom represented by $Rb_0$ include a fluorine atom, a chlorine atom, a bromine atom, and an iodine atom, $Rb_0$ is preferably a hydrogen atom, a methyl group, a hydroxymethyl group, or a trifluoromethyl group, and particularly preferably a hydrogen atom and a methyl group.

Ab represents a single bond, an alkylene group, a divalent linking group having a monocyclic or polycyclic alicyclic hydrocarbon structure, an ether group, an ester group, a carbonyl group, or a divalent linking group formed by combination thereof. Ab is preferably a single bond or a divalent linking group represented by -$Ab_1$-$CO_2$—.

$Ab_1$ is a linear or branched alkylene group or a monocyclic or polycyclic cycloalkylene group, and preferably a methylene group, an ethylene group, a cyclohexylene group, an adamantylene group, or a norbornylene group.

V is a group which decomposes by the action of an alkali developing liquid to increase the dissolution rate in the alkali developing liquid, preferably a group having an ester bond, and more preferably a group having a lactone structure.

Any group having a lactone structure can be employed as long as it has a lactone structure. However, lactone structures of a 5- to 7-membered ring are preferred, and in particular, those formed by condensation of lactone structures of a 5- to 7-membered ring with other cyclic structures effected in a fashion to form a bicyclo structure or spiro structure are preferred. It is more preferable to have the repeating units having a lactone structure represented by any of the following general formulae (LC1-1) to (LC1-17). The lactone structures may be directly bonded to the principal chain of the resin. Preferred lactone structures are (LC1-1), (LC1-4), (LC1-5), (LC1-6), (LC1-13), (LC1-14), and (LC1-17).

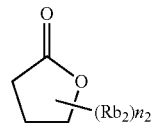

LC1-1

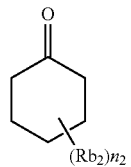

LC1-2

LC1-3 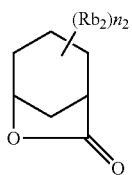

LC1-4 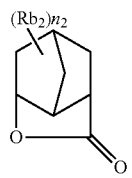

LC1-5 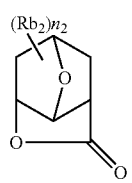

LC1-6 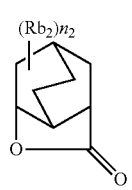

LC1-7 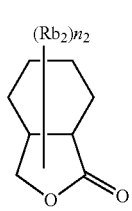

LC1-8 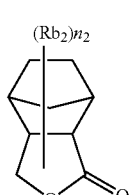

LC1-9 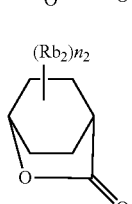

LC1-10 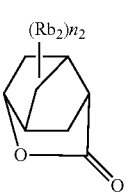

LC1-11 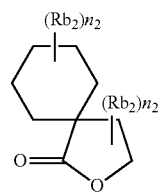

LC1-12 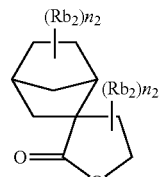

LC1-13 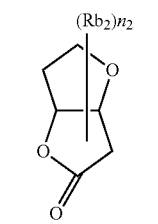

LC1-14 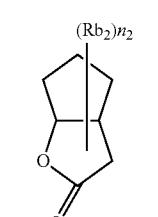

LC1-15 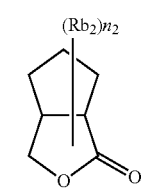

LC1-16 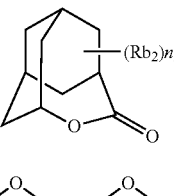

LC1-17 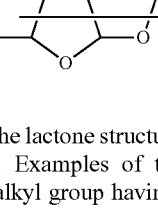

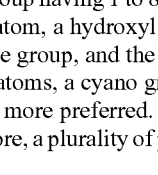

The portion of the lactone structure may or may not have a substituent ($Rb_2$). Examples of the preferred substituent ($Rb_2$) include an alkyl group having 1 to 8 carbon atoms, a monovalent aliphatic hydrocarbon ring group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group, and the like. An alkyl group having 1 to 4 carbon atoms, a cyano group, and an acid-decomposable group are more preferred. $n_2$ is an integer of 0 to 4. When $n_2$ is 2 or more, a plurality of present substituents ($Rb_2$)

may be the same as or different from each other. Further, the plurality of present substituents (Rb₂) may be bonded to each other to form a ring.

Furthermore, the repeating unit having a lactone group is generally present in the form of optical isomers. Any of the optical isomers may be used. Further, it is both appropriate to use a single type of optical isomer alone and to use a plurality of optical isomers in the form of a mixture. In the case where a single type of optical isomer is mainly used, the optical purity (ee) thereof is preferably 90% ee or more, and more preferably 95% ee or more.

In the case where the resin (P) includes a repeating unit (D), the content of the repeating unit (D) is preferably in the range of 0.5 to 80% by mole, more preferably 1 to 60% by mole, and still more preferably 2 to 40% by mole, based on all the repeating units in the resin (P). The repeating unit (D) can be used singly or, in combination thereof. By using a specific lactone structure, the line edge roughness and development defect are improved.

Preferred specific examples of the repeating units (D) of the resin (P) will be shown below, but the present invention is not limited thereto. In the formulae, Rx represents H, CH₃, or CF₃.

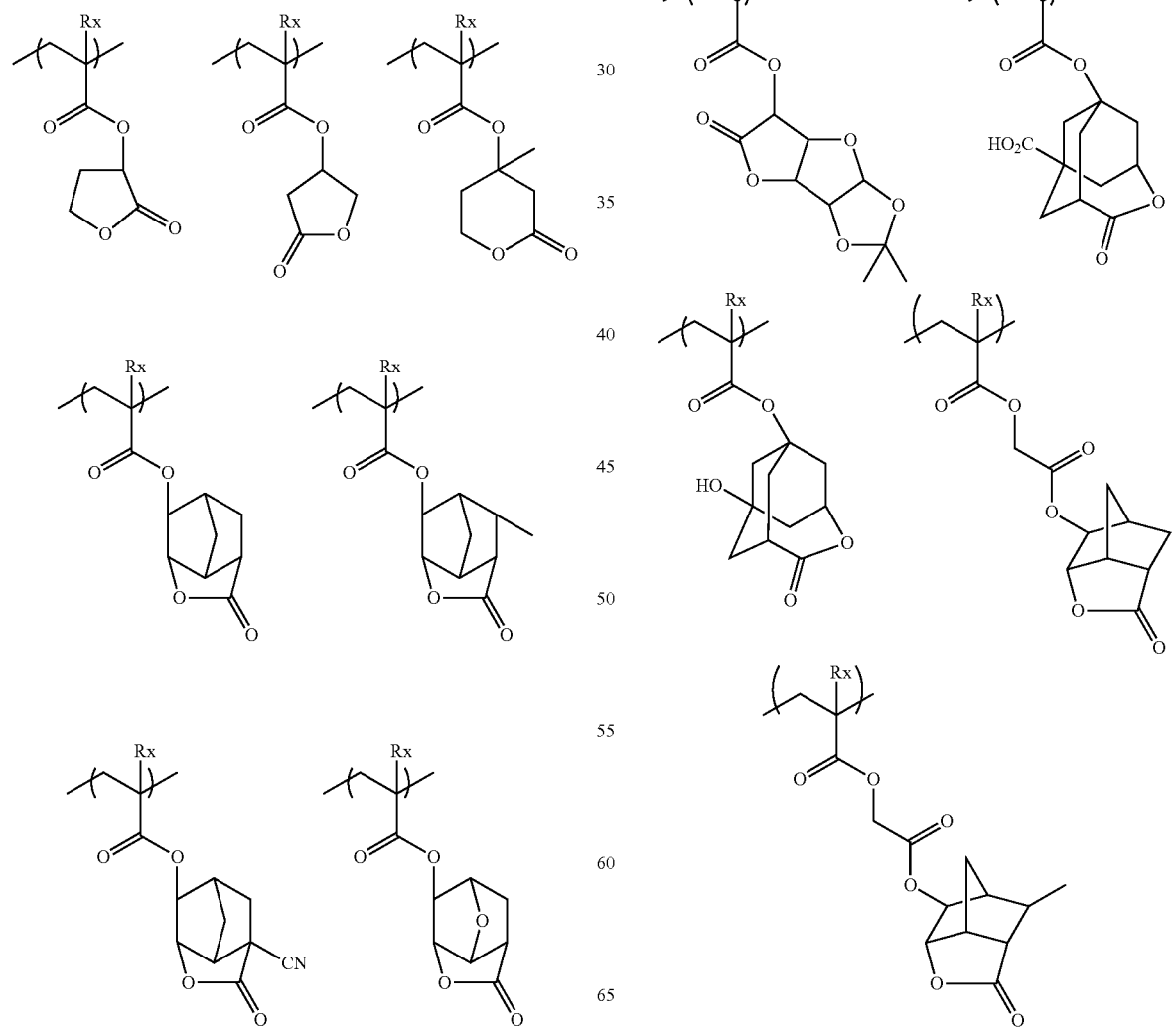

165
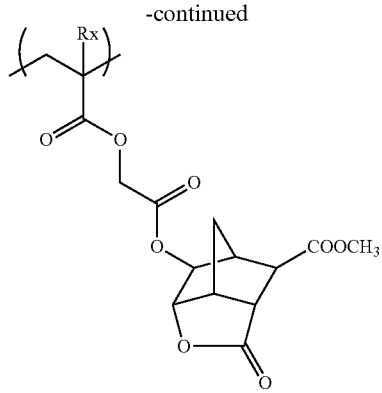
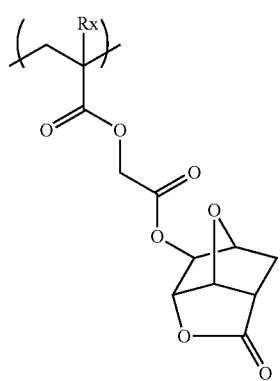
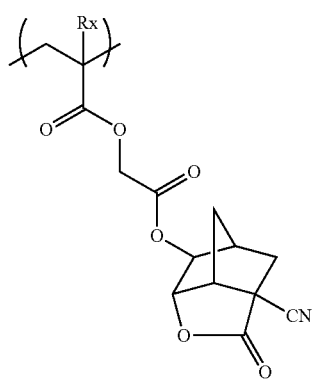
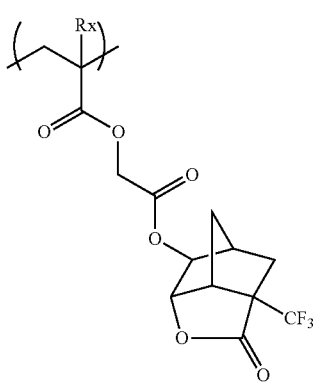
166
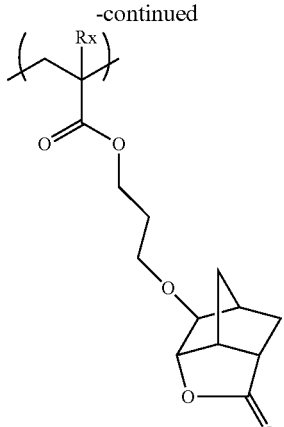
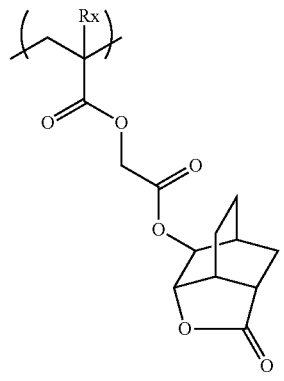
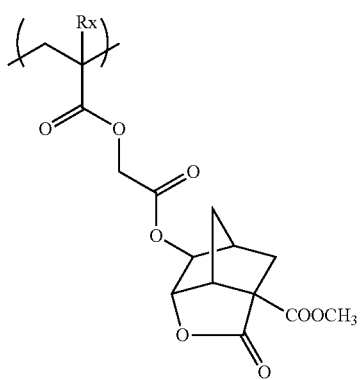
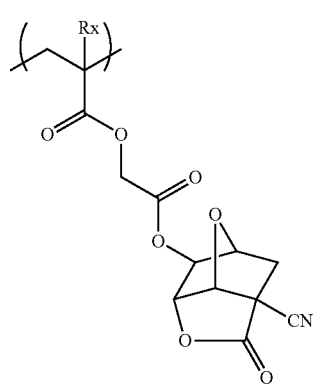

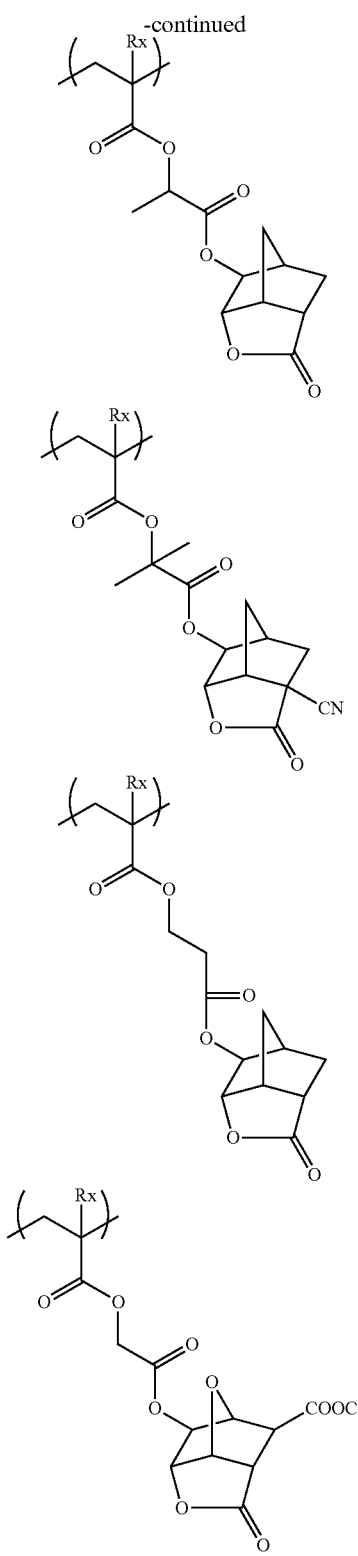

[Other Repeating Units]

The resin (P) may further contain a repeating unit having a polar group, as a repeating unit other than the repeating units as described above. Examples of the polar group include a hydroxyl group, a cyano group, a carboxylic group, a sulfonylimide group, a bis-sulfonylimide group, an alcoholic hydroxyl group substituted at its α-position with an electron withdrawing group (for example, a hexafluoroisopropanol group: —C(CF$_3$)$_2$OH), and the like. When the resin (P) includes a repeating unit, substrate adhesion and developing liquid affinity can be further improved. The other repeating unit is preferably a repeating unit having a tertiary hydroxyl group or a cyano group, more preferably a repeating unit having an aliphatic hydrocarbon structure substituted with a tertiary hydroxyl group or a cyano group, and even more preferably one having no acid-decomposable group. In the aliphatic hydrocarbon structure substituted with a tertiary hydroxyl group or a cyano group, the aliphatic hydrocarbon structure is preferably an adamantyl group, a diamantyl group, or a norborane group. The aliphatic hydrocarbon structure substituted with a tertiary hydroxyl group or a cyano group is preferably represented by any of the following general formulae (VIIa) to (VIId).

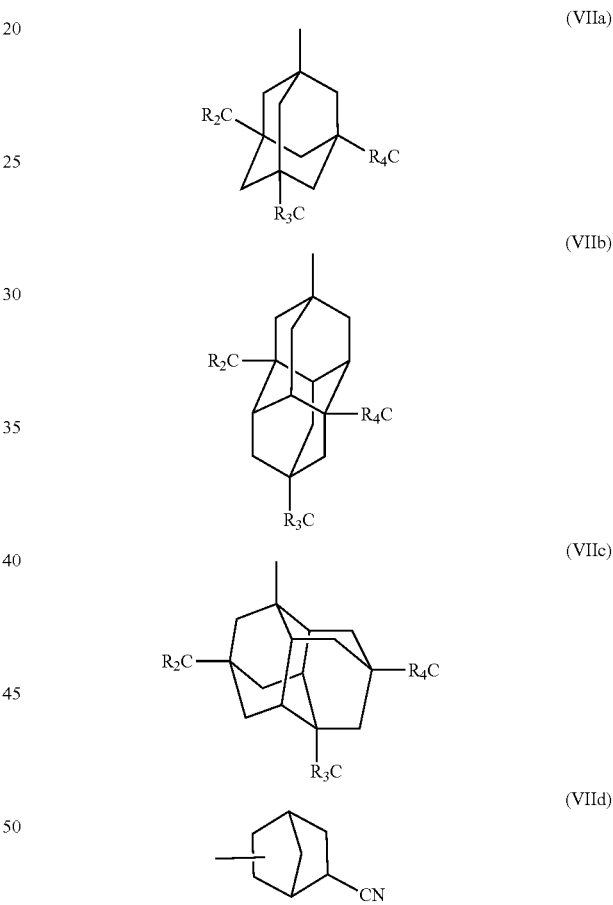

In the general formulae (VIIa) to (VIIc), each of $R_{2c}$ to $R_4c$ independently represents a hydrogen atom, a tertiary hydroxyl group, or a cyano group, in which at least one of the $R_{2c}$ to $R_4c$ represents a tertiary hydroxyl group or a cyano group. Preferably, one or two of the $R_{2c}$ to $R_4c$ are tertiary hydroxyl groups and the remainder are hydrogen atoms. In the general formula (VIIa), more preferably, two of the $R_{2c}$ to $R_4c$ are tertiary hydroxyl groups and the remainder are hydrogen atoms.

Examples of the repeating units having the structures of the general formulae (VIIa) to (VIId) include repeating units represented by the following general formulae (AIIa) to (AIId).

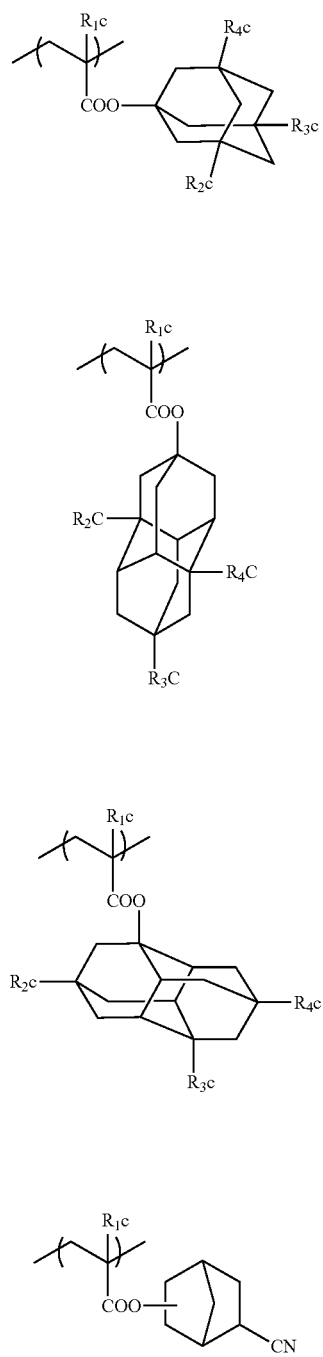

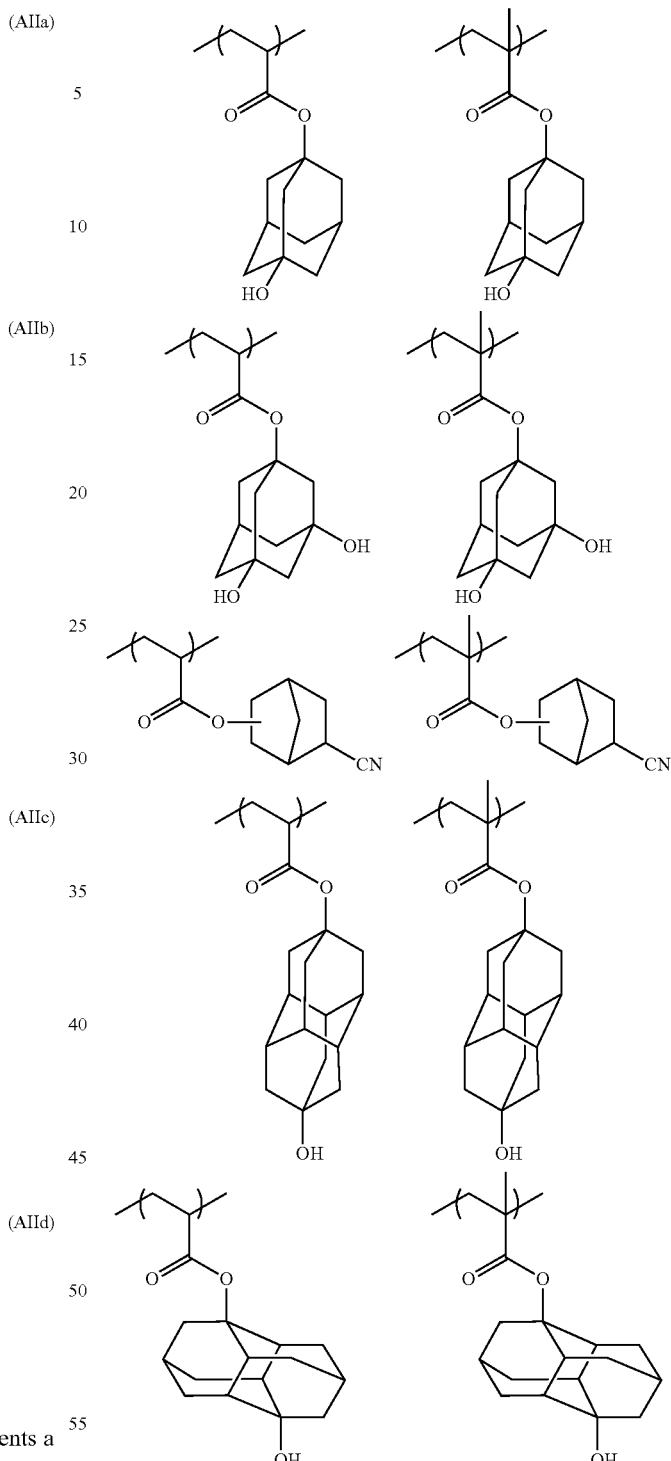

In the general formulae (AIIa) to (AIId), $R_{1c}$ represents a hydrogen atom, a methyl group, or a trifluoromethyl group.

$R_{2c}$ to $R_4c$ have the same meaning as $R_{2c}$ to $R_4c$ of the general formulae (VIIa) to (VIIc).

In the case where the resin (P) includes a repeating unit containing a polar group (other repeating units), the content is preferably 1 to 60% by mole, and more preferably 5 to 50% by mole, based on all the repeating units in the resin (P).

Specific examples, of the repeating units containing a polar group will be shown below, but the present invention is not limited thereto.

The resin (P) of the present invention may further include a repeating unit containing no polar group, having a cyclic hydrocarbon structure, and exhibiting no acid decomposability. Examples of such as repeating unit include the repeating units represented by the general formula (IX).

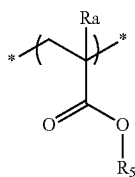
(IX)

In the general formula (IX), $R_5$ represents a hydrocarbon group having at least one cyclic hydrocarbon structure, which does not contain a polar group (a hydroxyl group, a cyano group, and the like).

Ra represents a hydrogen atom, an alkyl group or a —$CH_2$—O—$Ra_2$ group, in which $Ra_2$ represents a hydrogen atom, an alkyl group, or an acyl group. Ra preferably represents a hydrogen atom, a methyl group, a trifluoromethyl group, a hydroxymethyl group, or the like, and particularly preferably a hydrogen atom or a methyl group.

The cyclic hydrocarbon structures contained in $R_5$ include a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group, a cyclooctyl group, and the like, a cycloalkenyl group having 3 to 12 carbon atoms, such as a cyclohexenyl group and the like, a phenyl group, and the like. Preferably, the monocyclic hydrocarbon group is a monocyclic hydrocarbon group having 3 to 7 carbon atoms, and more preferably a cyclopentyl group or a cyclohexyl group.

Examples of the polycyclic hydrocarbon group include a ring-assembly hydrocarbon group and a crosslinked-ring hydrocarbon group. Examples of the ring-assembly hydrocarbon group include a bicyclohexyl group, a perhydronaphthalene group, and the like. Examples of the crosslinked-ring hydrocarbon ring include a bicyclic hydrocarbon ring, such as a pinane ring, a bornane ring, a norpinane ring, a norbornane ring, a bicyclooctane ring (for example, a bicyclo[2.2.2]octane ring, a bicyclo[3.2.1]octane ring, and the like), etc.; a tricyclic hydrocarbon ring such as a homoblendane ring, an adamantane ring, a tricyclo[5.2.1.0$^{2,6}$]decane ring, a tricyclo[4.3.1.1$^{2,5}$]undecane ring, and the like; and a tetracyclic hydrocarbon ring such as a tetracyclo[4.4.0.1$^{2,5}$.1$^{7,10}$]dodecane ring, a perhydro-1,4-methano-5,8-methanonaphthalene ring, and the like. Further, the crosslinked-ring hydrocarbon rings include a condensed-ring hydrocarbon ring, for example, a condensed rings formed by condensation of a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring, a perhydrophenarene ring, and the like.

Examples of the preferred crosslinked-ring hydrocarbon ring include a norbornyl group, an adamantyl group, a bicyclooctanyl group, a tricyclo[5,2,1,0$^{2,6}$]decanyl group, and the like. Examples of the more preferred crosslinked-ring hydrocarbon ring include a norbornyl group and an adamantyl group.

These cyclic hydrocarbon groups may have a substituent. Examples of the preferred substituent include a halogen atom, an alkyl group, a hydroxyl group substituted with a hydrogen atom, an amino group substituted with a hydrogen atom, and the like. Preferred examples of the halogen atom include a bromine atom, a chlorine atom, and a fluorine atom, and preferred examples of the alkyl group include a methyl group, an ethyl group, a butyl group, and a t-butyl group. The alkyl group may further have a substituent. Examples of the substituent include a halogen atom, an alkyl group, a hydroxyl group substituted with a hydrogen atom, and an amino group substituted with a hydrogen atom.

Examples of the substituent that substitutes the hydrogen atom include an alkyl group a monovalent aliphatic hydrocarbon ring group, an aralkyl group, a substituted methyl group, a substituted ethyl group, an acyl group, an alkoxycarbonyl group, and an aralkyloxycarbonyl group. Preferred examples of the alkyl group include an alkyl group having 1 to 4 carbon atoms; preferred examples of the monovalent aliphatic hydrocarbon ring group include monocyclic or polycyclic monovalent aliphatic hydrocarbon ring group having 5 to 10 carbon atoms; preferred examples of the aralkyl group include an aralkyl group formed by the bonding of an, alkylene group having 1 to 8 carbon atoms and an aryl group having 6 to 10 carbon atoms; preferred examples of the substituted methyl group include a methoxymethyl group, a methoxythiomethyl group, a benzyloxymethyl group, a t-butoxymethyl group, and a 2-methoxyethoxymethyl group; preferred examples of the substituted ethyl group include a 1-ethoxyethyl group and a 1-methyl-1-methoxyethyl group; preferred examples of the acyl group include an aliphatic acyl group having 1 to 6 carbon, atoms, such as a formyl group, an acetyl group, a propionyl group, a butyryl group, an isobutyryl group, a valeryl group, a pivaloyl group, and the like; and preferred examples of the alkoxycarbonyl group include an alkoxycarbonyl group having 1 to 4 carbon atoms, and the like.

In the case where the resin (P) includes a repeating unit that has a cyclic hydrocarbon structure containing no polar group, and exhibits no acid decomposability, the content of the repeating unit is preferably in the range of 1 to 40% by mole, and more preferably 5 to 20% by mole, based on all the repeating units in the resin (P).

Specific examples of the repeating unit that has a cyclic hydrocarbon structure containing no, polar group, and exhibits no acid decomposability will be shown below, but the present invention is not limited thereto. In the formulae, Ra represents H, $CH_3$, or $CF_3$.

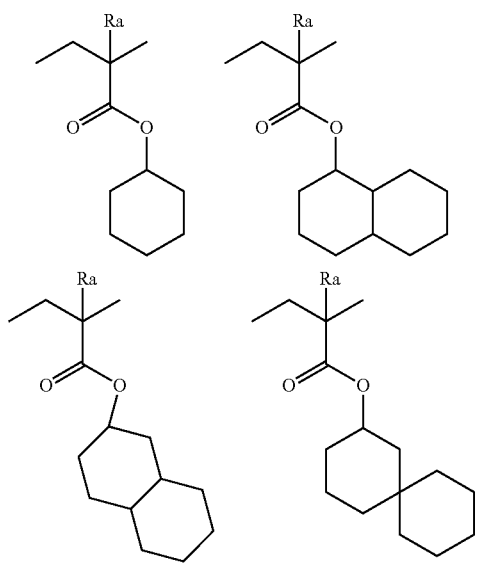

173
-continued
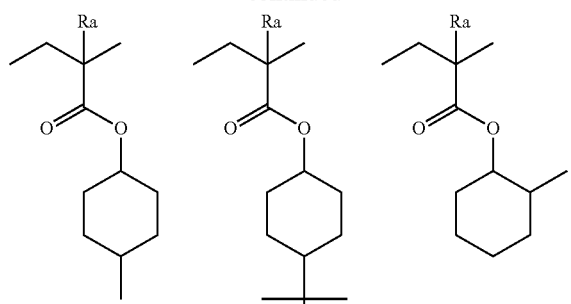
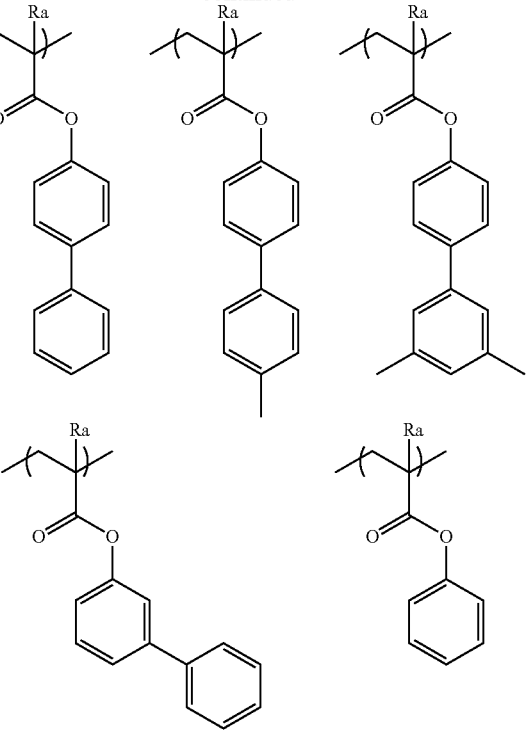
174
-continued
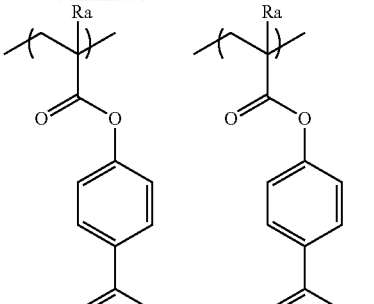
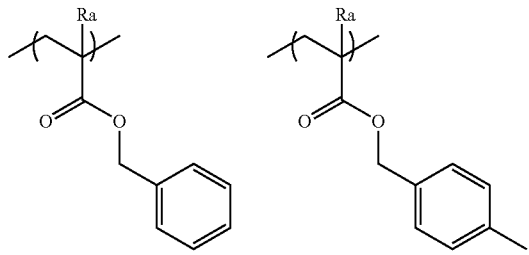
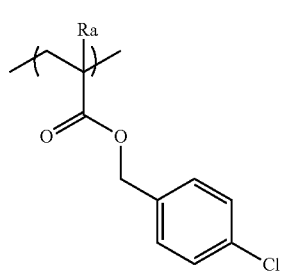
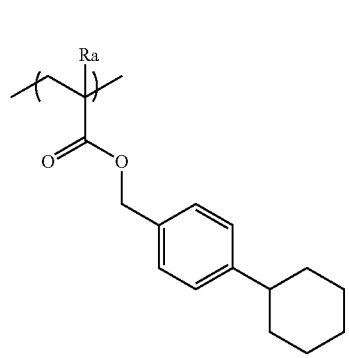

-continued

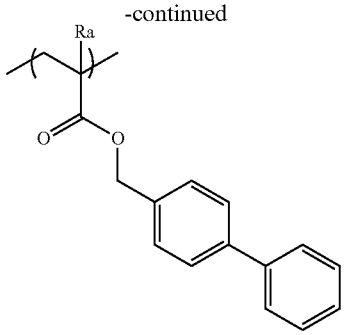

The resin (P) according to the present invention may further include a repeating unit containing an alkali-soluble group. This repeating unit is preferably an alkali-soluble group containing an aromatic ring group, and more preferably a structure represented by the following general formula (C-I).

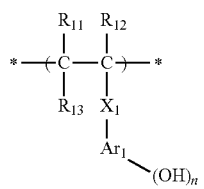

(C-1)

In the formula, each of $R_{11}$, $R_{12}$, and $R_{13}$ independently represents a hydrogen atom, an alkyl group, a cycloalkyl group, a halogen atom, a cyano group, or an alkoxycarbonyl group, and $R_{13}$ may be combined with $Ar_1$ to form a ring (preferably a 5- or 6-membered ring, and in this case, $R_{13}$ represents an alkylene group.

$X_1$ represents a single bond or a linking group.

$Ar_1$ represents a divalent aromatic ring group, and in the case where it is combined with $R_{13}$ to form a ring, it represents a trivalent aromatic ring group.

n represents an integer of 1 to 4.

Examples of $R_{11}$, $R_{12}$, and $R_{13}$ include the same as described above with respect to $R_{41}$, $R_{42}$, and $R_{43}$ in the general formula (IV).

Examples of the linking group represented by $X_1$ include —COO—, —CONH—, —OCO—, —CO—, —O—, —S—, —SO—, —SO$_2$—, —NH—, an alkylene group, a cycloalkylene group, and an alkenylene group. Among these, —COO—, —CONH—, —OCO—, —CO—, —S—, —SO—, or —SO$_2$— is preferred, and —COO—, —CONH—, —SO$_2$—, or —SO$_3$— is more preferred.

$Ar_1$ represents a divalent aromatic ring group. The divalent aromatic ring group may have a substituent, and preferred examples thereof include an arylene group having 6 to 18 carbon atoms, such, as a phenylene group, a tolylene group, a naphthylene group, an anthracenylene group, and the like; and a divalent aromatic ring, group containing a heteroring, such as thiophene, furan, pyrrole, benzothiophene, benzofuran, benzopyrrole, triazine, imidazole, benzoimidazole, triazole, thiadiazole, thiazole, and the like.

Examples of the preferred substituent in each of these groups include an alkyl group, an alkoxy group such as a methoxy group, an ethoxy group, a hydroxyethoxy group, a propoxy group, a hydroxypropoxy group, a butoxy group, and the like, and an aryl group such as a phenyl group and the like.

$Ar_1$ is more preferably an arylene group having 6 to 18 carbon atoms, which may have a substituent, and particularly preferably a phenylene group, a naphthylene group, or a biphenylene group.

The content of the repeating unit containing an alkali-soluble group, represented by the general formula (C-I) is preferably in the range of 3 to 90% by mole, more preferably 5 to 80% by mole, and particularly preferably 7 to 70% by mole, based on all the repeating units in the resin (P).

Preferred specific examples of the repeating unit containing an alkali-soluble group, represented by the general formula (C-I) will be shown below, but the present invention is not limited thereto. In the formula, a represents an integer of 0 to 2.

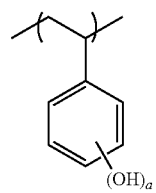

(B-1)

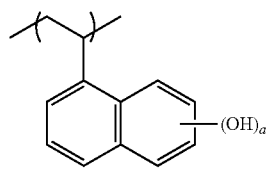

(B-2)

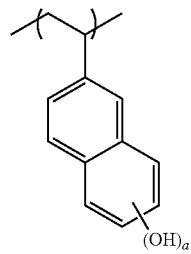

(B-3)

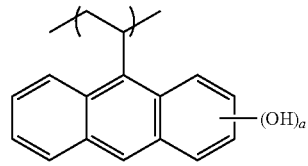

(B-4)

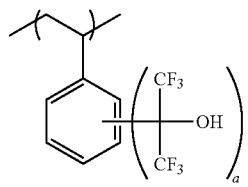

(B-5)

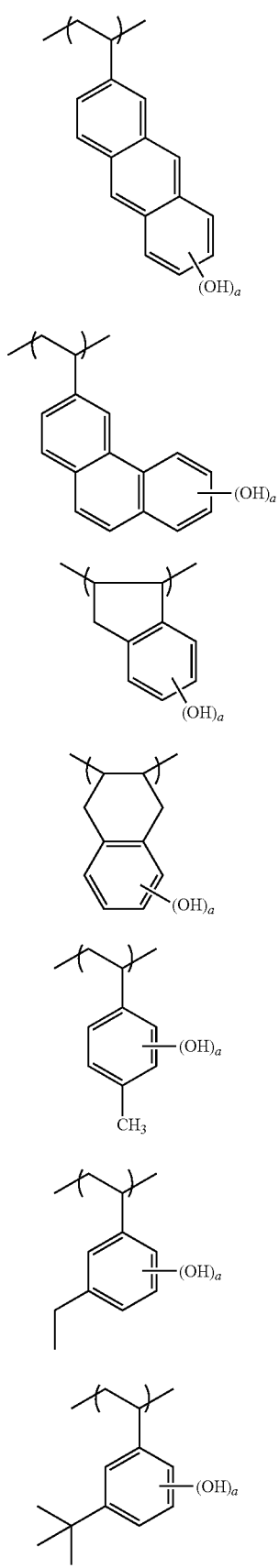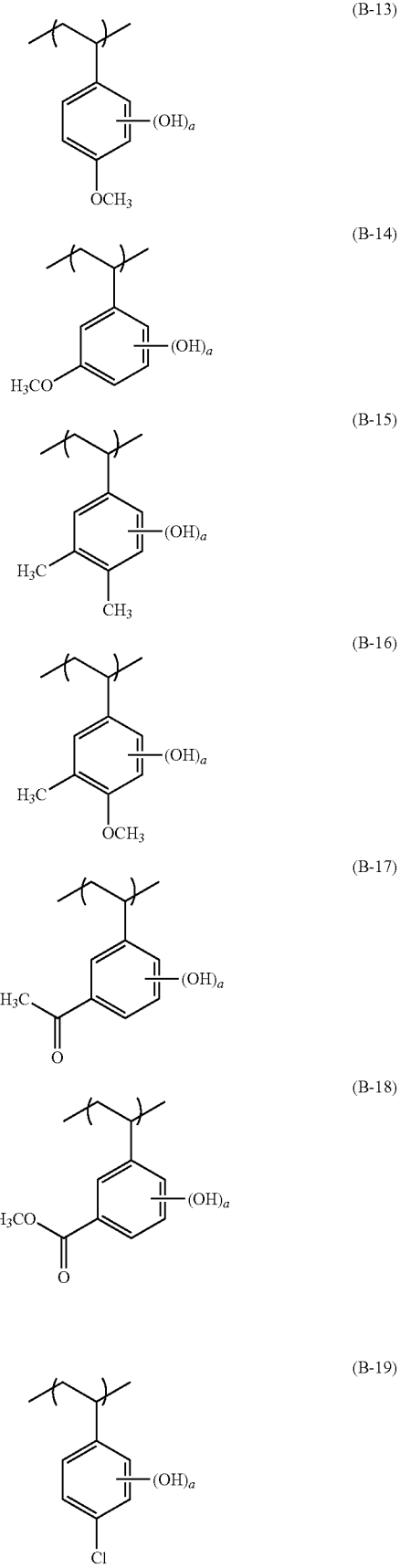

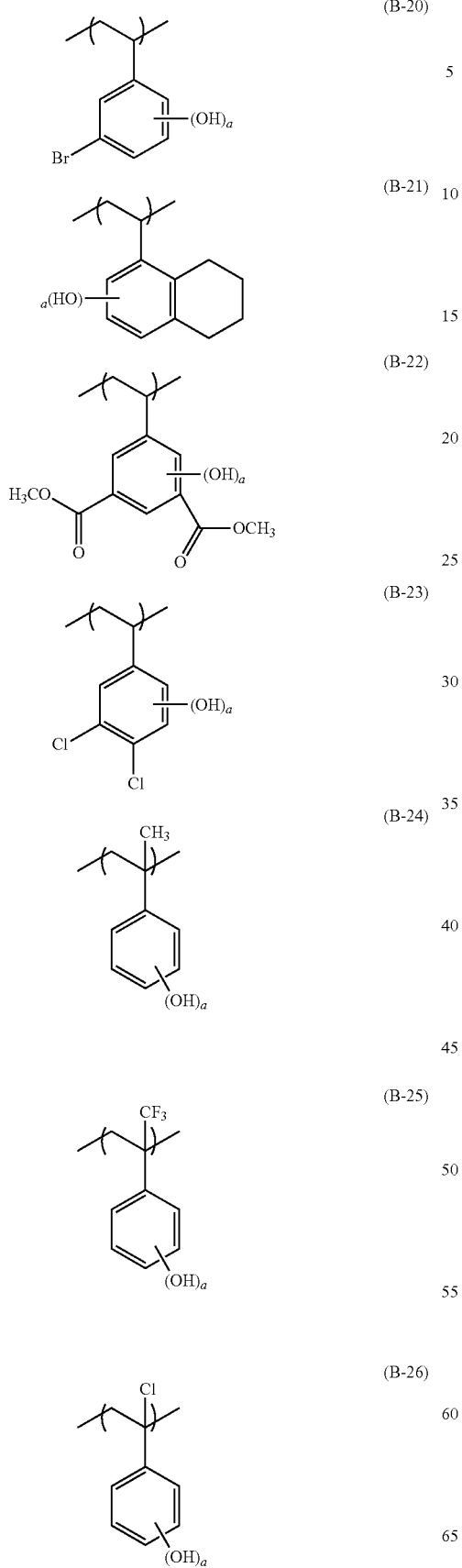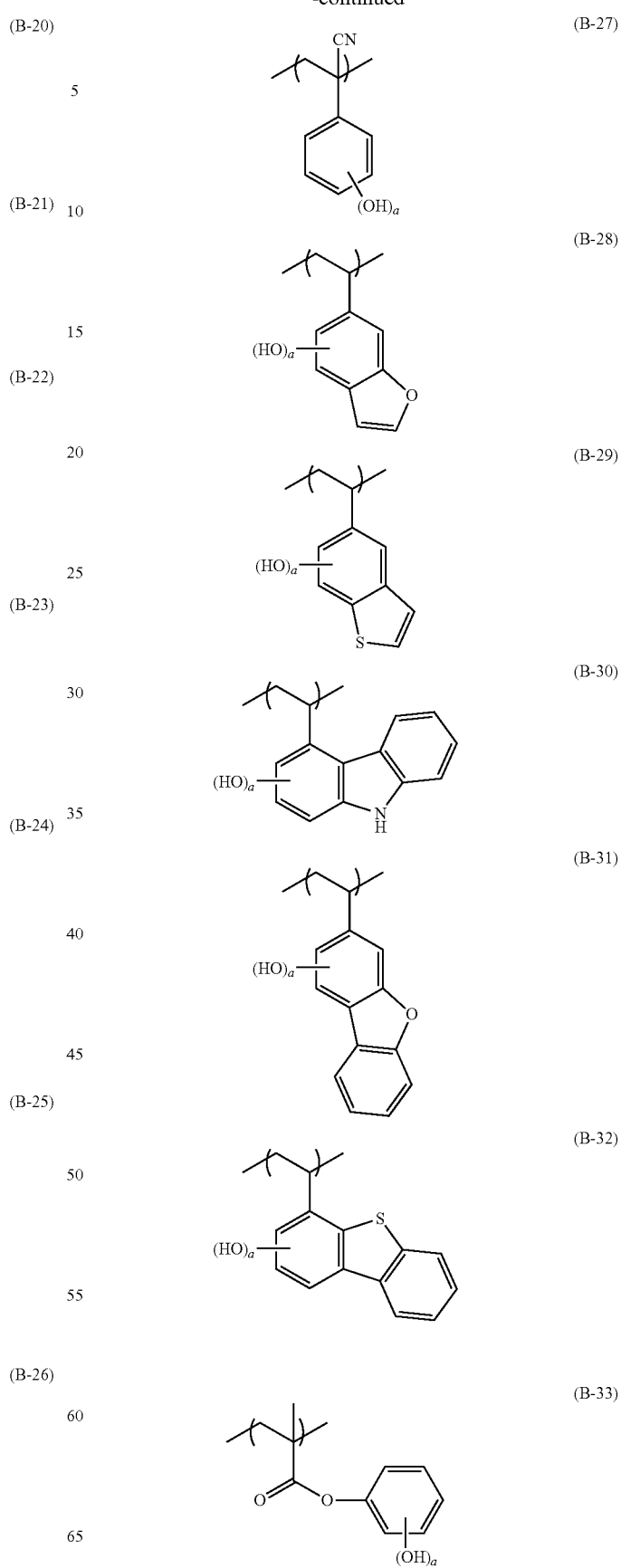

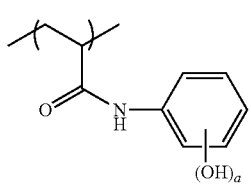
(B-34)

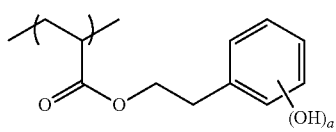
(B-35)

The resin (P) of the present invention may have, in addition to the foregoing repeating structural units, various repeating structural units for the purpose of regulating the dry etching resistance, standard developing liquid adaptability, substrate adhesion, resist profile, and generally required properties of the resist such as resolution power, heat resistance, sensitivity, and the like.

Examples of such a repeating structural unit include the repeating structural units corresponding to the following monomers, which however are nonlimiting.

The use of such a repeating structural unit would enable fine regulation of the required performance of the resin used in the composition of the present invention, in particular, (1) solubility in applied solvents, (2) ease of film-forming (glass transition point), (3) alkali developability, (4) film thinning (selection of hydrophilicity/hydrophobicity and alkali-soluble groups), (5) adhesion of an unexposed area to a substrate, (6) dry etching resistance, and the like.

Examples of the monomer include a compound having an unsaturated bond, capable of addition polymerization, selected from among acrylic esters, methacrylic esters, acrylamides, methacrylamides, allyl compounds, vinyl ethers, vinyl esters, styrenes, crotonic esters, and the like; etc. Besides the above, maleic anhydride, maleimide, acrylonitrile, methacrylonitrile, and maleilonitrile can also be included.

In addition, any unsaturated compound capable of addition polymerization that is copolymerizable with monomers corresponding to the above various repeating structural units may be copolymerized therewith.

Preferable specific examples of the repeating unit derived from such other polymerizable monomers are shown below, which however is nonlimiting.

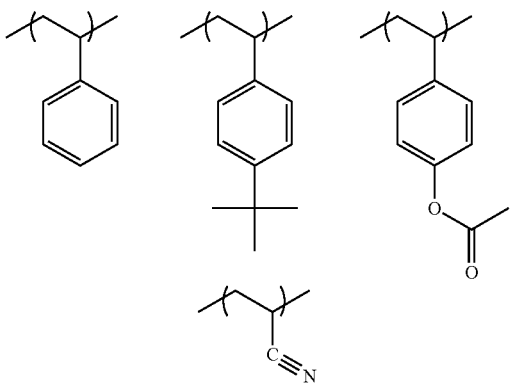

The molar ratios of the respective repeating structural units in the resin (P) used in the composition of the present invention are appropriately determined from the viewpoint of regulation of not only the dry etching resistance of the resist but also the standard developing liquid adaptability, substrate adhesion, resist profile, and generally required performances of the resist, such as the resolution power, heat resistance, sensitivity, and the like.

It is ensured that the contents of the respective repeating structural unit used in the present invention is no more than 100% by mole in total.

The resin (P) of the present invention may have any of the random, block, comb, and star configurations.

The resin (P) can be synthesized by, for example, the radical, cation, or anion polymerization of unsaturated monomers corresponding to the respective structures. Further, a desired resin can be obtained by first polymerizing the unsaturated monomers corresponding to the precursors of the respective structures, and then carrying out a polymer reaction.

For example, examples of a general synthesis method include a batch polymerization method in which an unsaturated monomer and a polymerization initiator are dissolved in a solvent, and heated so as to accomplish polymerization, a dropping polymerization method in which a solution of unsaturated monomer and polymerization initiator is dropped into a heated solvent over a period of 1 to 10 hours, and the like. The dropping polymerization method is preferred.

Examples of the solvent for use in polymerization include those employable in the preparation of the active light ray sensitive or radioactive ray sensitive resin composition as described hereinafter, and the like. It is preferable to perform the polymerization with the use of the same solvent for use in the composition of the present invention. This inhibits any particle generation during storage.

The polymerization reaction is preferably carried out in an atmosphere of inert gas, such as nitrogen or argon. The polymerization is initiated by the use of a commercially available radical initiator (an azo initiator, peroxide, and the like) as a polymerization initiator. Among the radical initiators, an azo initiator is preferred. An azo initiator having an ester group, a cyano group or a carboxyl group is particularly preferred. Examples of the preferred initiators include azobisisobutyronitrile, azobisdimethylvaleronitrile, dimethyl 2,2'-azobis (2-methylpropionate), and the like. According to necessity, the polymerization may be carried out in the presence of a chain transfer agent (for example, alkyl mercaptan and the like).

The concentration during the reaction is generally in the range of 5 to 70% by mass, and preferably 10 to 50% by mass. The reaction temperature is generally in the range of 10° C. to 150° C., preferably 30° C. to 120° C., and more preferably 40° C. to 100° C.

The reaction time is generally in the range of 1 to 48 hours, preferably 1 to 24 hours, and even more preferably 1 to 12 hours.

After the completion of the reaction, the mixture is allowed to stand to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration and the like capable of removal by extraction of only components of a given molecular weight or below, a re-precipitation method in which a resin solution is dropped into a poor solvent to coagulate the resin in the poor solvent and thus remove residual monomers, and the like, and a method of purification in solid form such as washing of a resin slurry separated by filtration with the use of a poor solvent. For example, the reaction solution is brought into contact with a solvent, wherein the resin is poorly soluble or insoluble (poor solvent) amounting to 10 times or less, preferably 10 to 5 times the volume of the reaction solution to precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents and the like. Among these, it is preferred to employ a solvent containing at least an alcohol (particularly, methanol and the like) or water as the precipitation or re-precipitation solvent.

The amount of precipitation or re-precipitation solvent used is generally in the range of 100 to 10000 parts by mass, preferably 200 to 2000 parts by mass and more preferably 300 to 1000 parts by mass, based on 100 parts by mass of the polymer solution, according to intended efficiency, yield, and the like.

The temperature at which the precipitation or re-precipitation is carried out is generally in the range of about 0 to 50° C., preferably about room temperature (for example, about 20 to 35° C.), according to efficiency and ease of operation. The operation of precipitation or re-precipitation can be carried out by a publicly known method, such as a batch method, a continuous method, and the like with the use of a common mixing vessel such as an agitation vessel and the like.

The polymer obtained by the precipitation or re-precipitation is generally subjected to common solid/liquid separation, such as filtration, centrifugal separation, and the like, and dried before use. The filtration is carried out with the use of a filter medium ensuring solvent resistance, preferably under pressure. The drying is performed at about 30 to 100° C., and preferably about 30 to 50° C. at ordinary pressure or reduced pressure (preferably reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to precipitate a resin (step a), separating the resin from the solution (step b), re-dissolving the resin in a solvent to obtain a resin solution A (step c), thereafter bringing the resin solution A into contact with a solvent wherein the resin is poorly soluble or insoluble amounting to less than 10 times (preferably 5 times or less) the volume of the resin solution A to precipitate a resin solid (step d), and separating the precipitated resin (step e).

The molecular weight of the resin (P) according to the present invention is not particularly limited. Preferably, the weight average molecular weight thereof is in the range of 1000 to 100000. It is more preferably in the range of 1500 to 60000, most preferably 2000 to 30000. The regulation of the weight average molecular weight to 1000 to 100000 would prevent deterioration of heat resistance and dry etching resistance and also prevent deterioration of developability and increase of viscosity leading to poor film-forming property. Herein, the weight average molecular weight of the resin refers to the molecular weight in terms of polystyrene molecular weight as measured by means of GPC (carrier: THF or N-methyl-2-pyrrolidone (NMP)).

Moreover, the molecular weight dispersity (Mw/Mn) of the resin is preferably in the range of 1.00 to 5.00, more preferably 1.03 to 3.50, and even more preferably 1.05 to 2.50. With a lower molecular weight distribution, a composition having a more excellent resolving power and resist profile and a smoother side wall of the resist pattern to attain excellence in roughness can be obtained.

The resin (P) of the present invention can be used singly or in combination of two or more kinds thereof. The content of the resin (P) is preferably in the range of 30 to 100% by mass, more preferably 50.0 to 99.9% by mass, and particularly preferably 70.0 to 99.9% by mass, based on the total solids in the composition according to the present invention.

More preferred specific examples of the resin (P) will be shown below, but the present invention is not limited thereto.

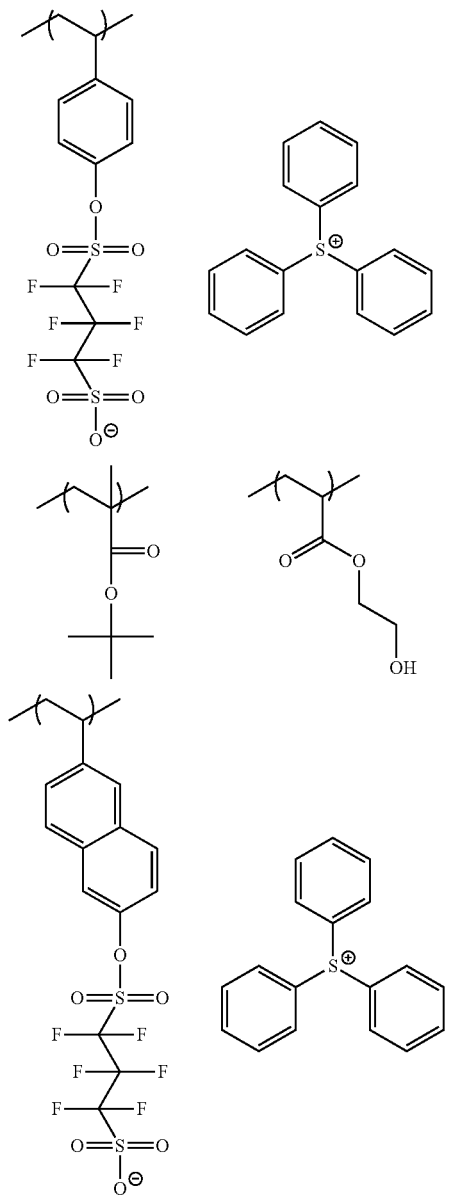

185
-continued
186
-continued
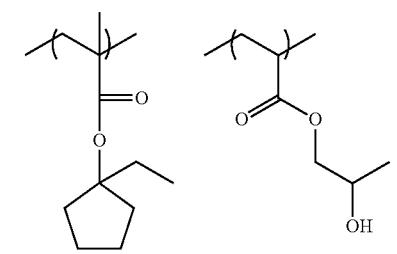
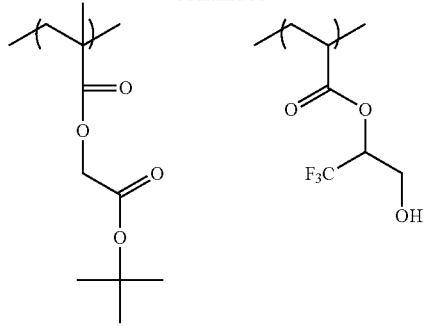
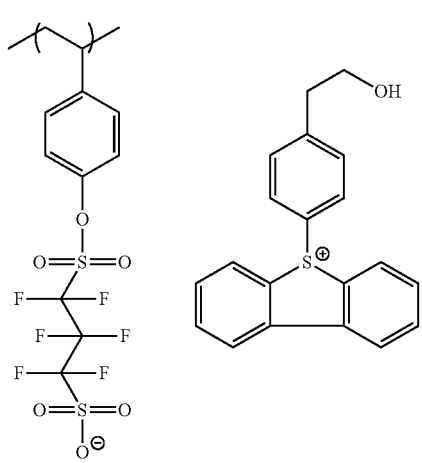
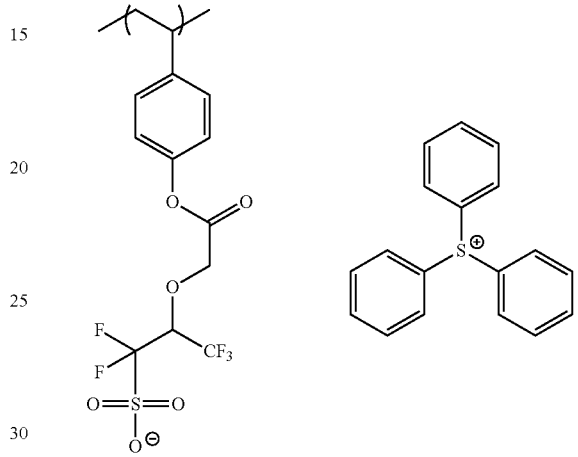
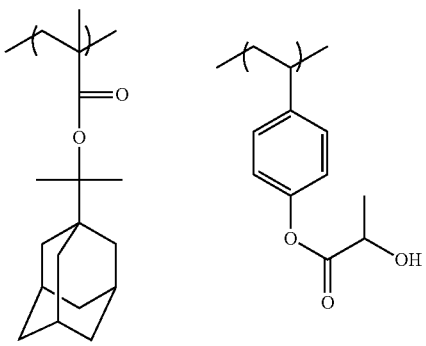
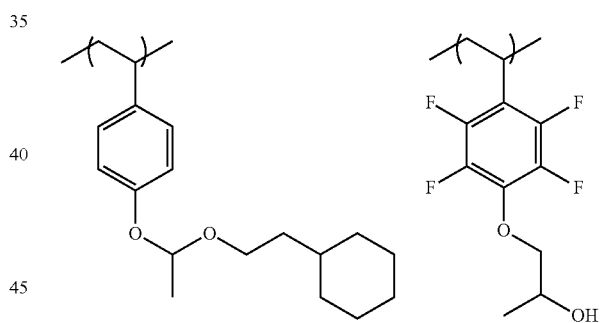
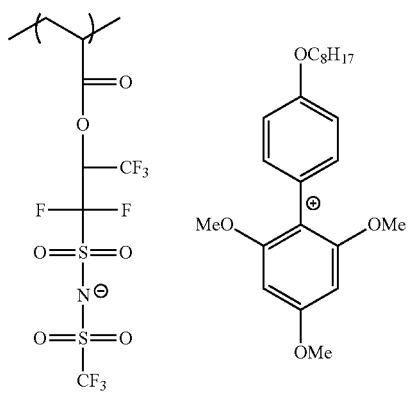
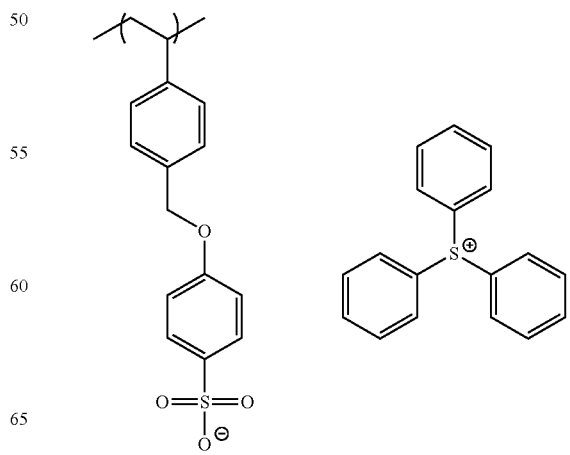

187
-continued
188
-continued
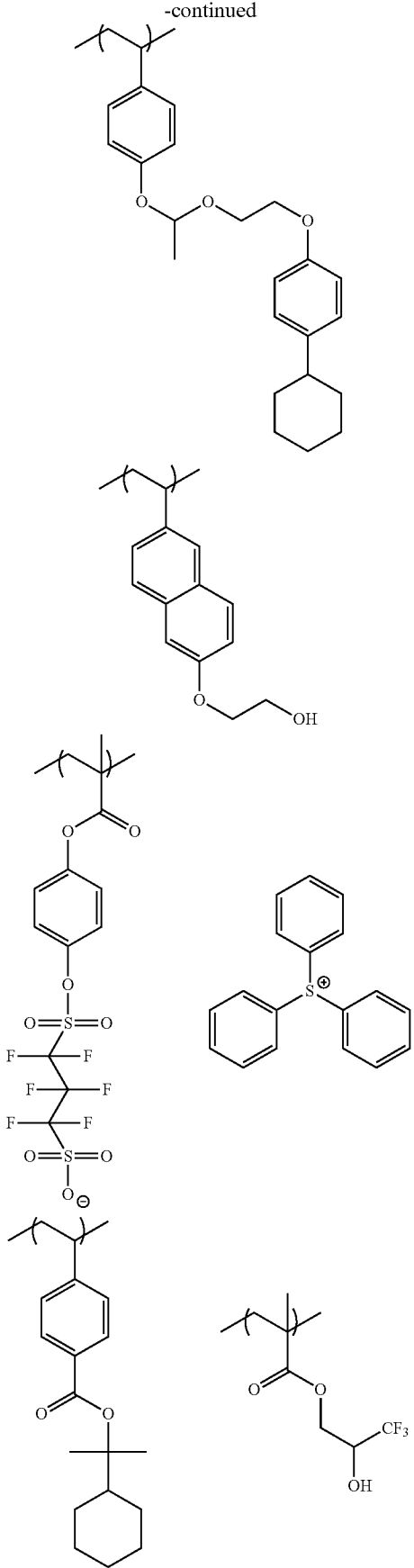
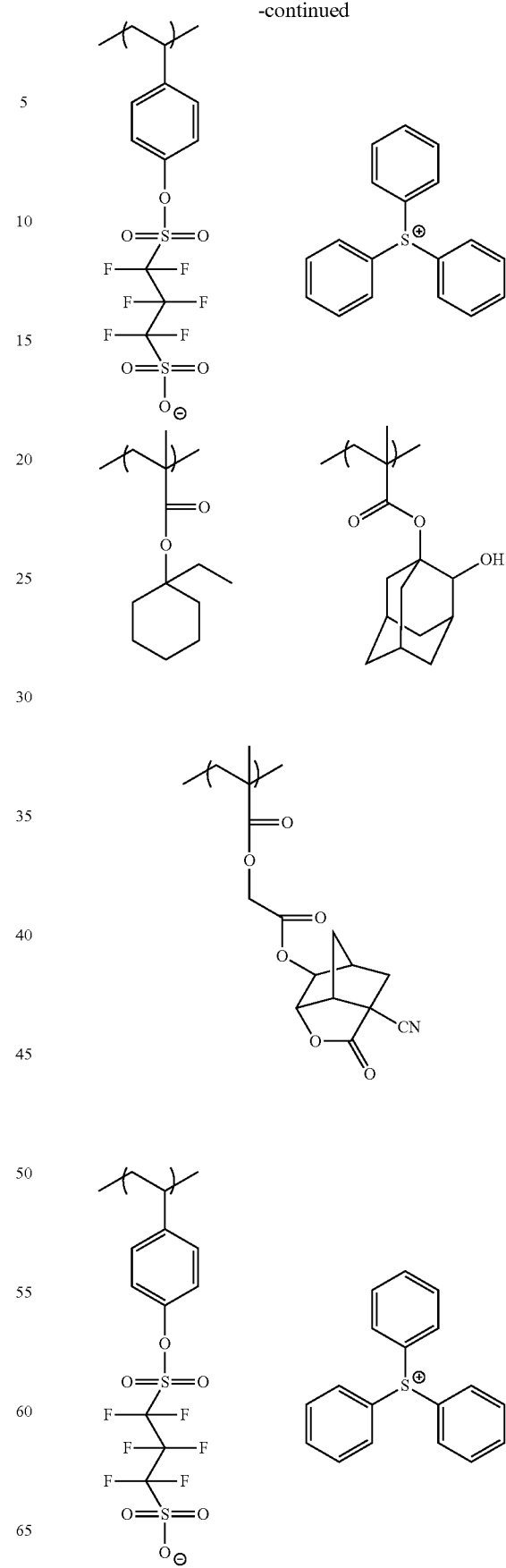

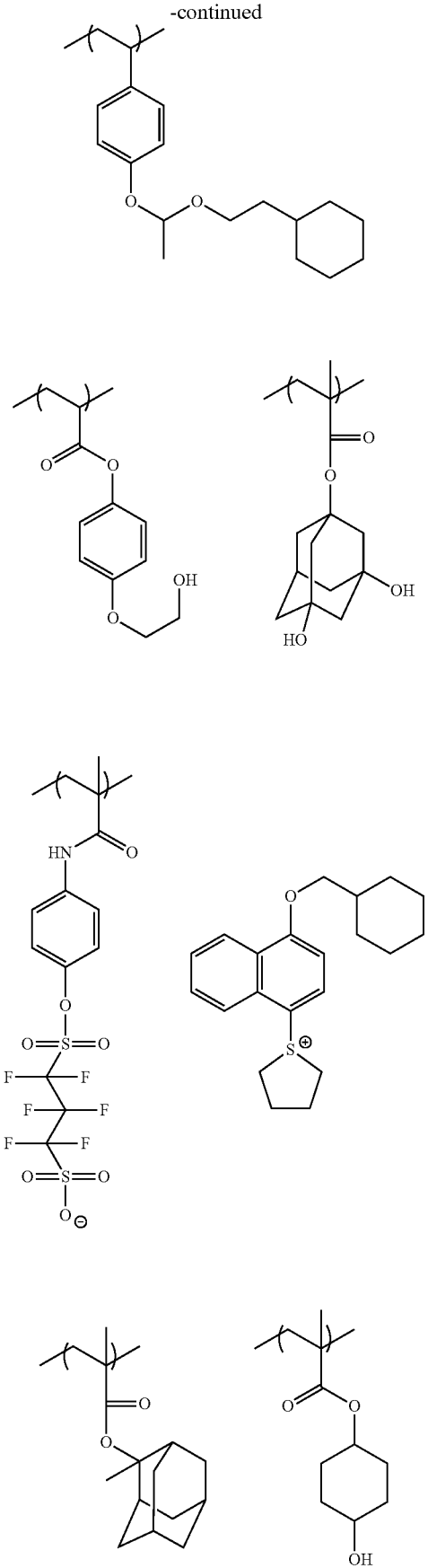
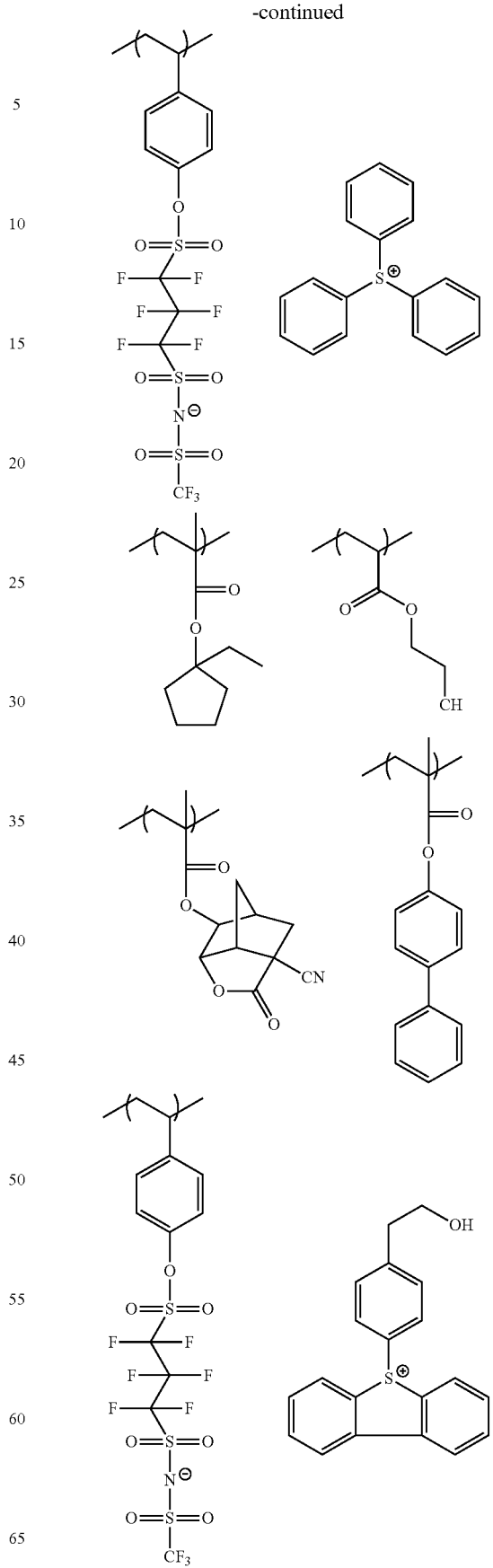

191
-continued
192
-continued
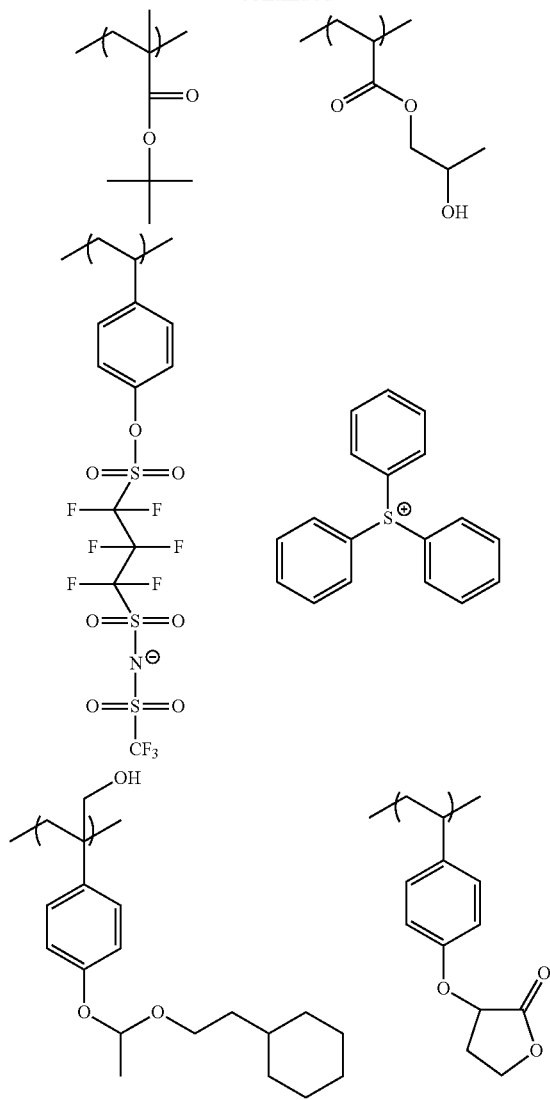
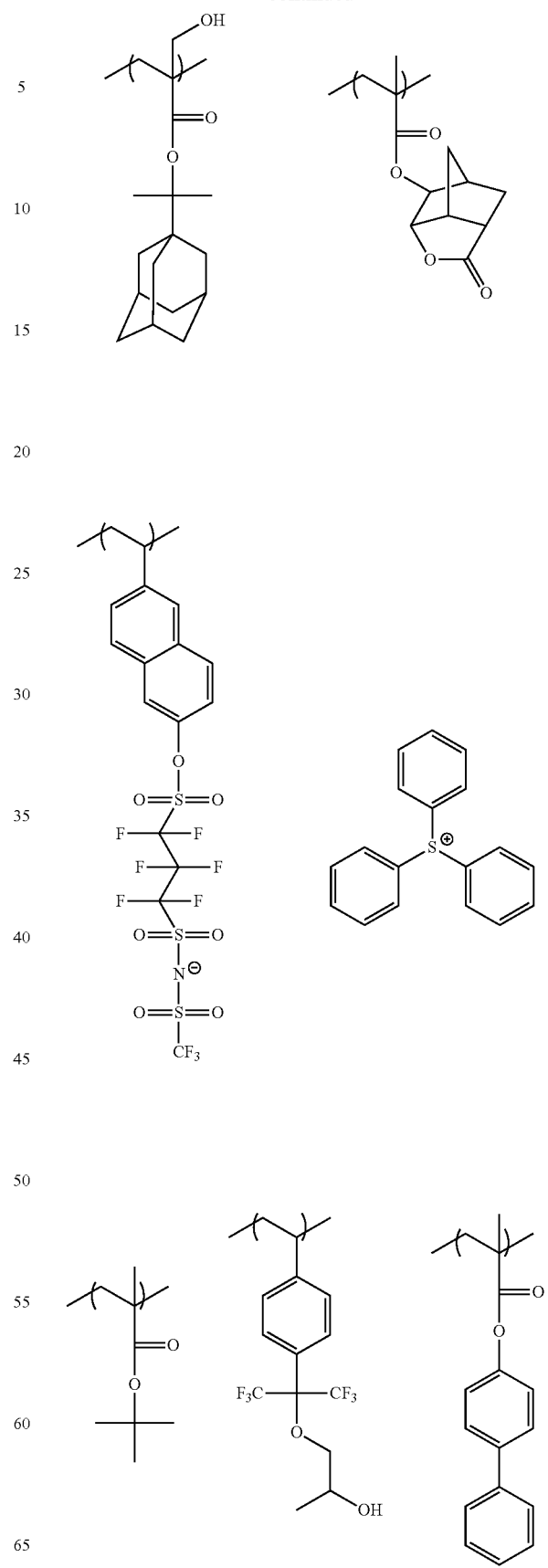

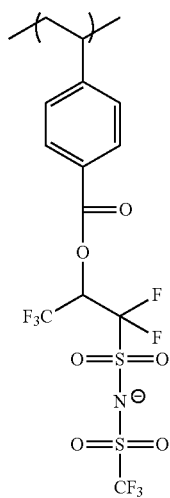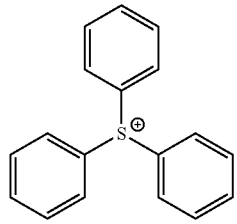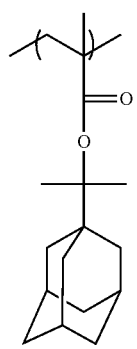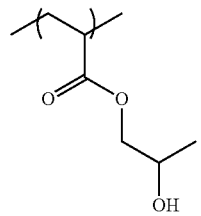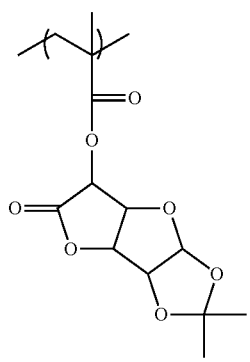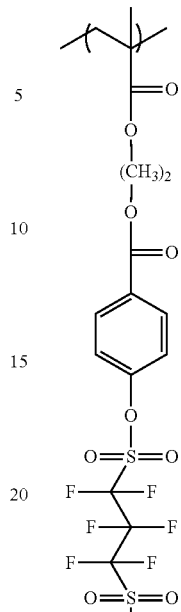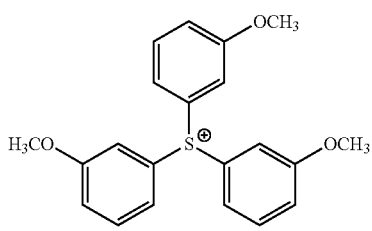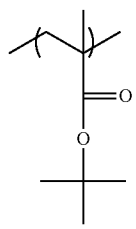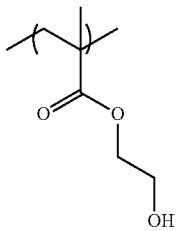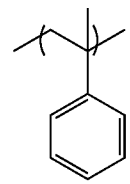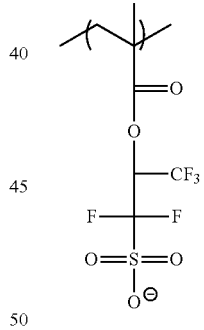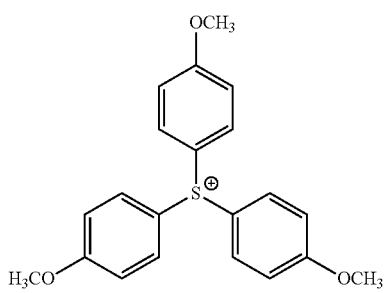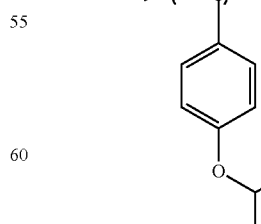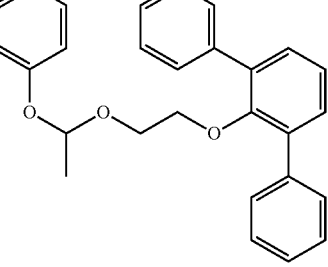

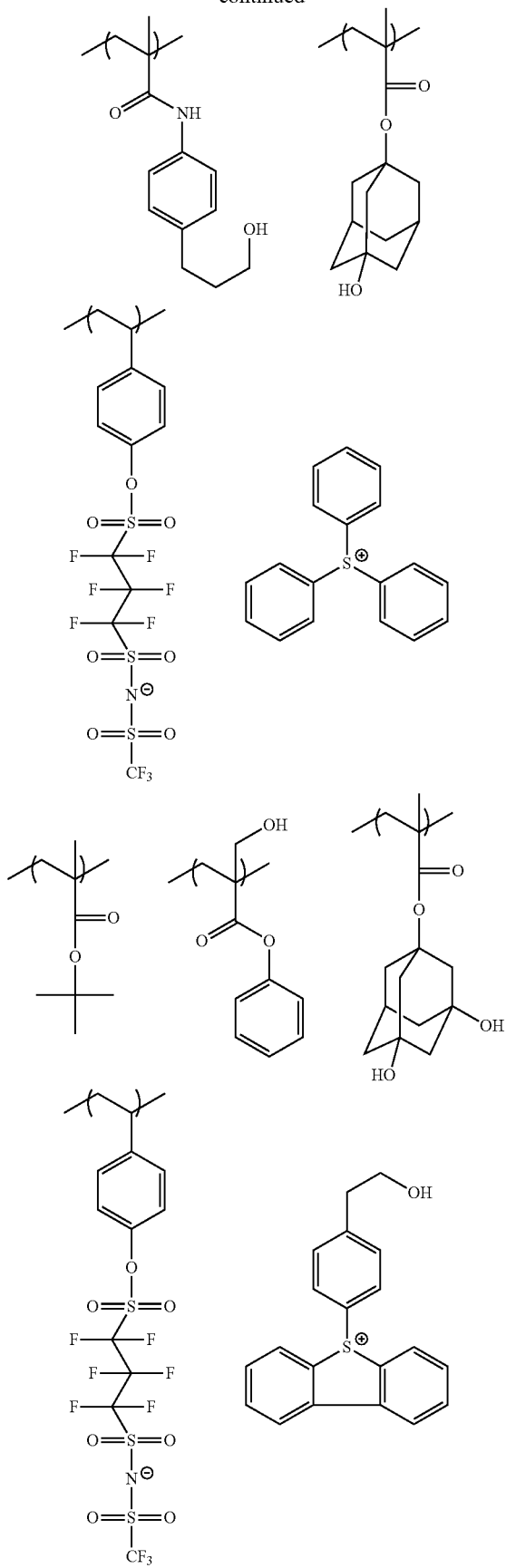
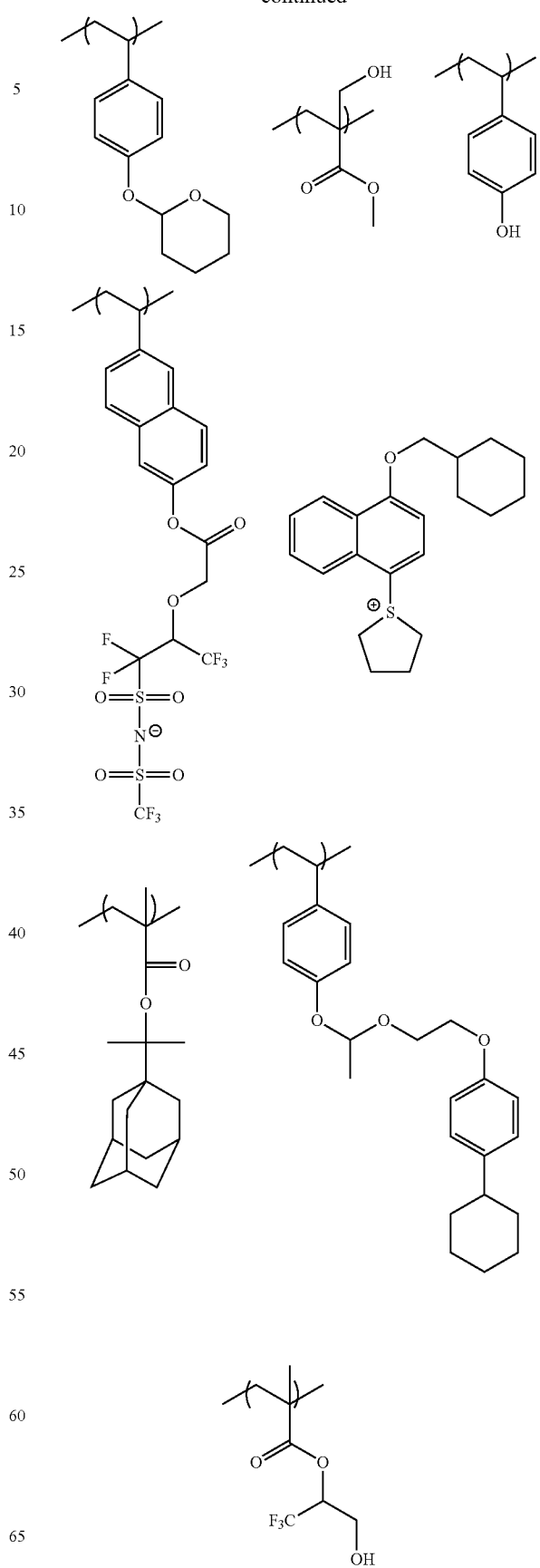

197
-continued
198
-continued
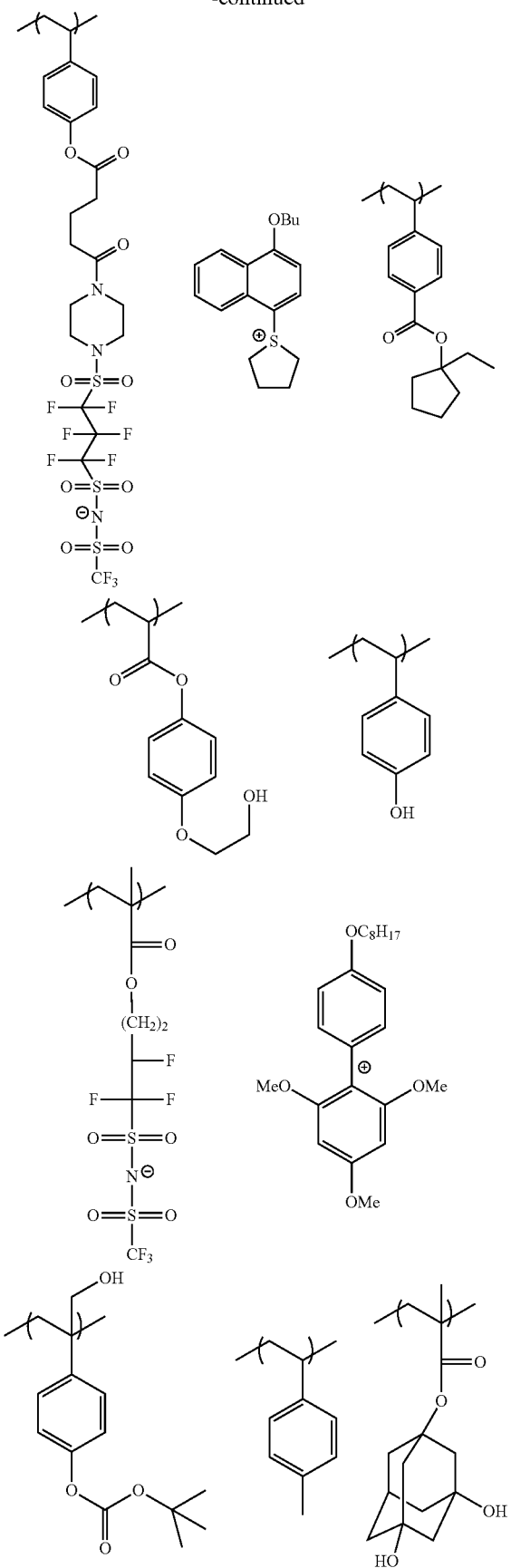
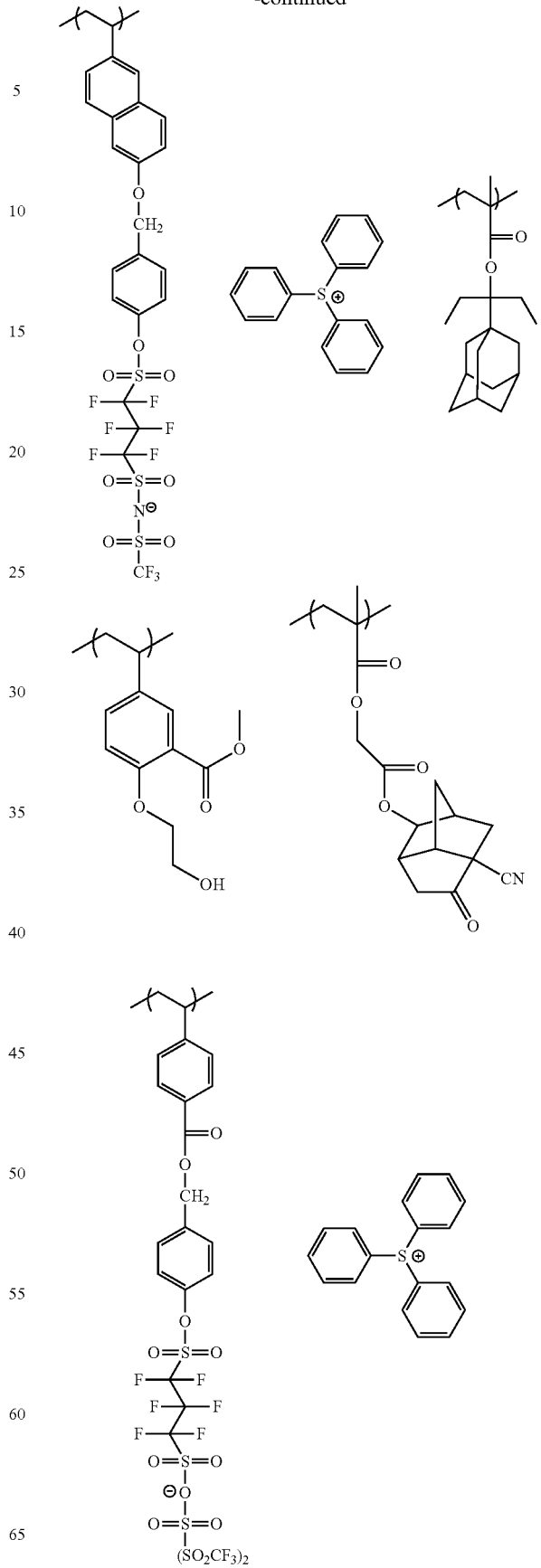

-continued
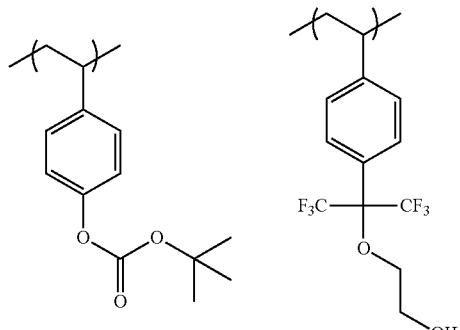
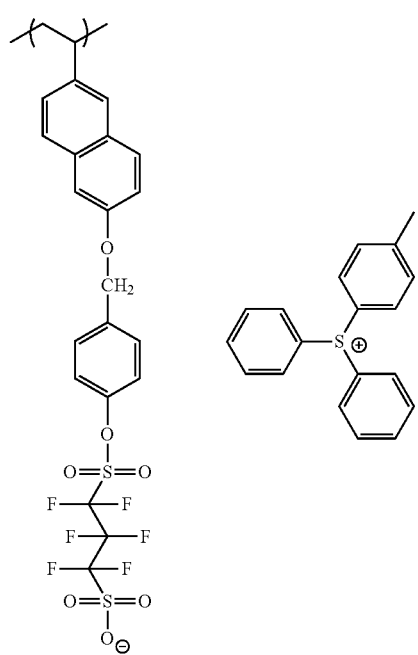
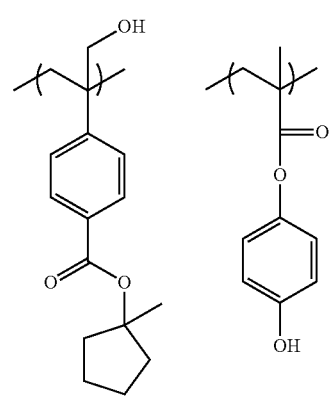
-continued
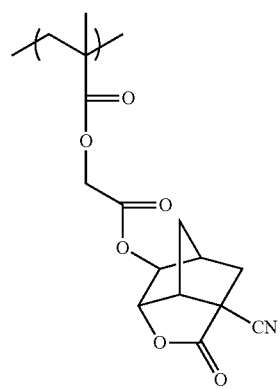
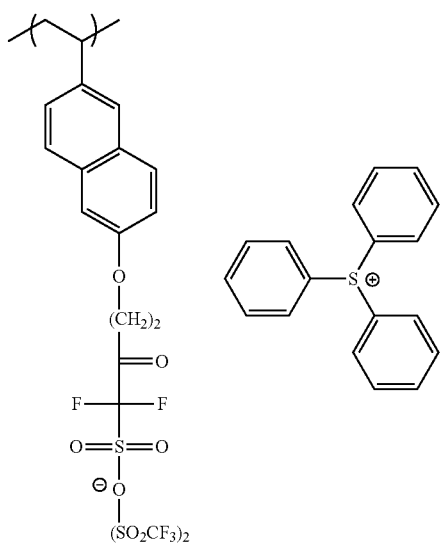
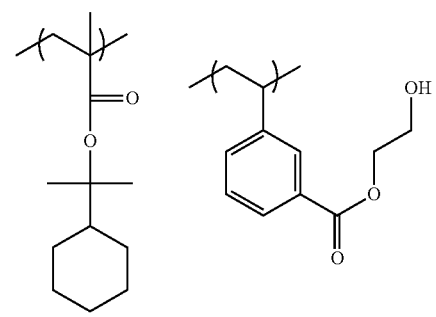
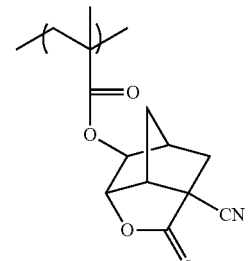

201
-continued
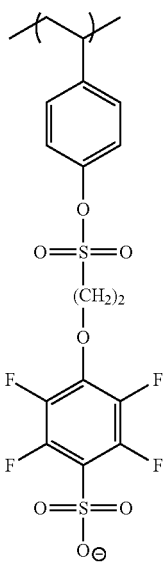
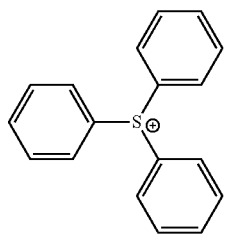
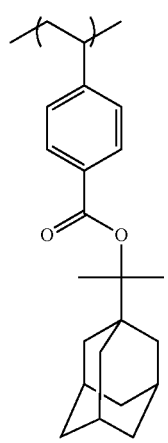
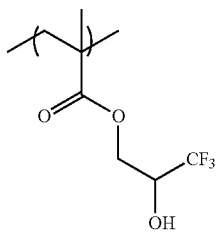
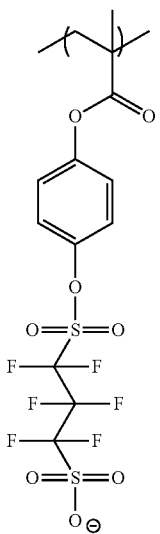
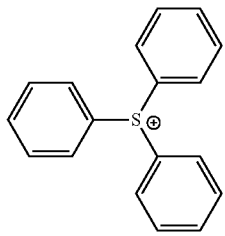
202
-continued
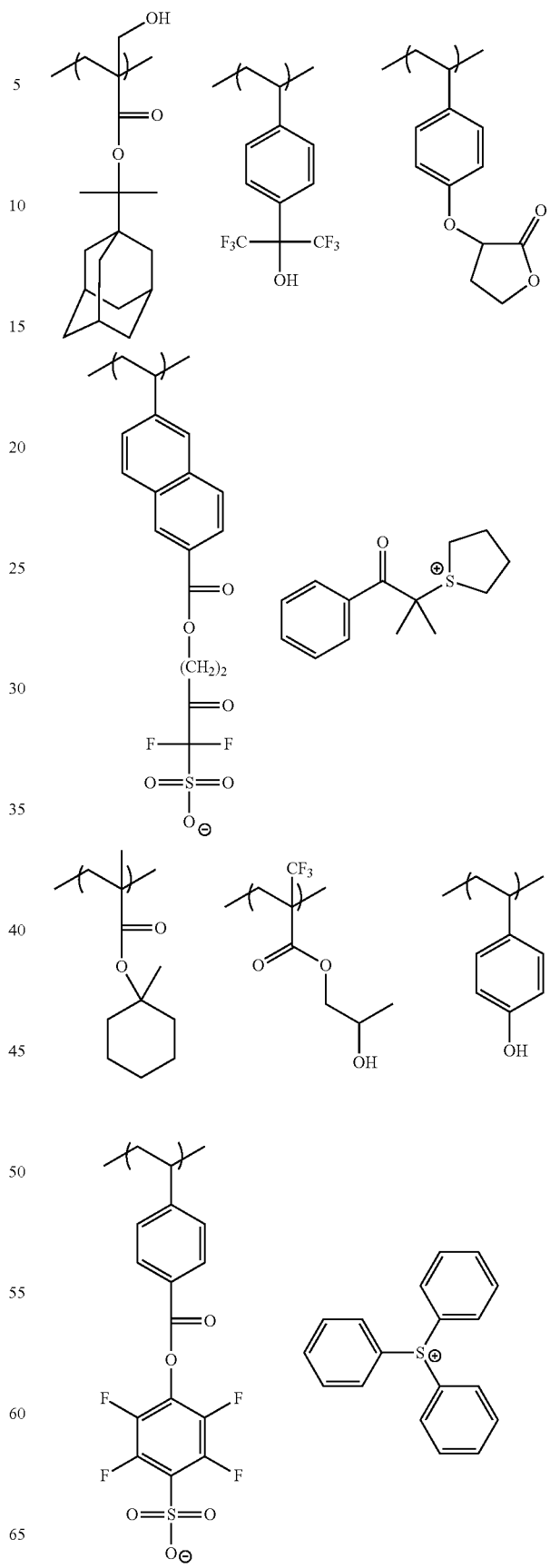

203
-continued
204
-continued
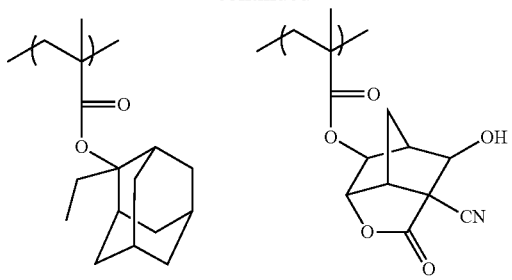
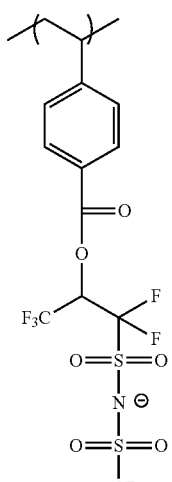
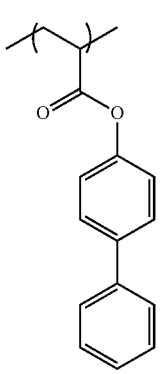
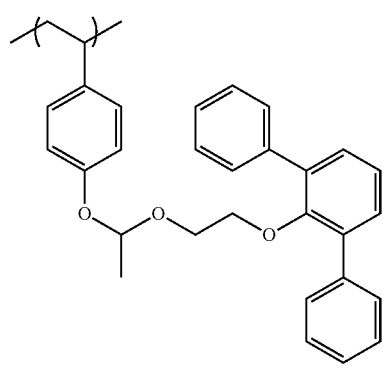
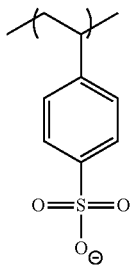
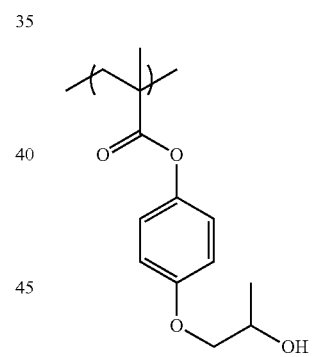
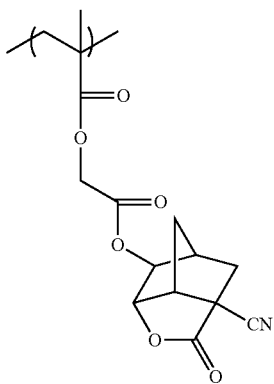
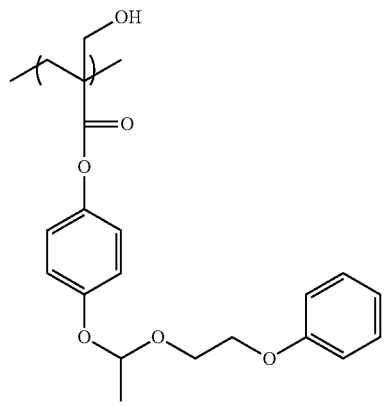
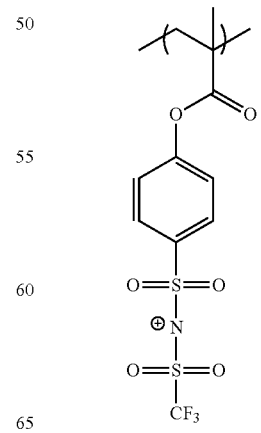

-continued

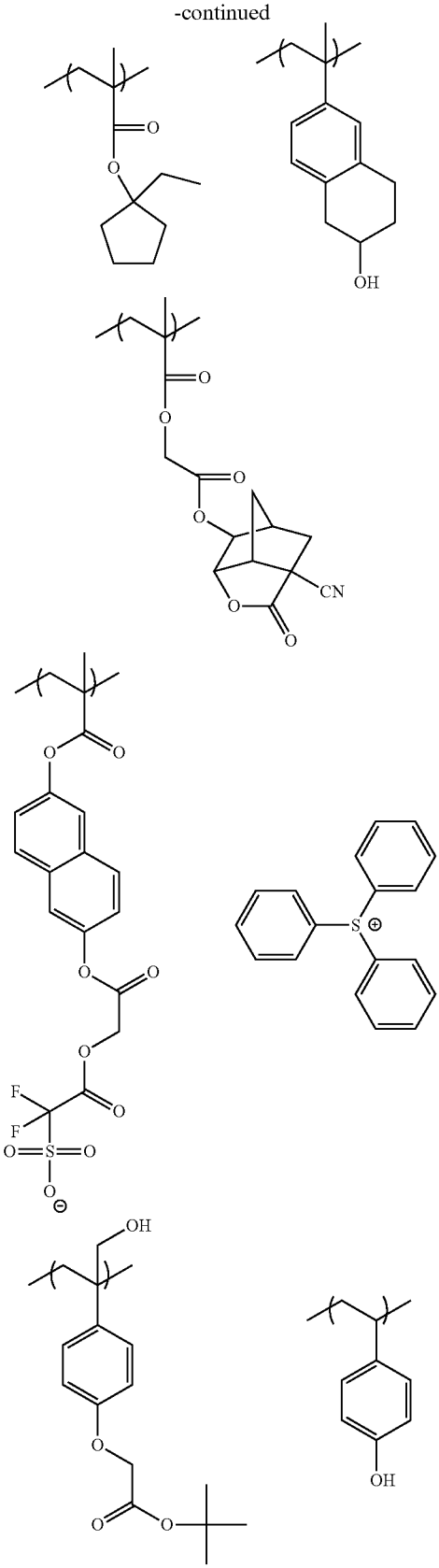

Furthermore, as necessary, the composition according to the present invention can include a resin which decomposes by the action of an acid to generate an alkali-soluble group, a compound that generates an acid by irradiation with active light ray or radioactive ray (low-molecular-weight photoacid generator (conventional)), a basic compound, a low-molecular-weight compound containing a group that is cleaved by the action of an acid, a surfactant, a substance which decomposes by the action of an acid to generate an acid stronger than carboxylic acid, and the like.

[2] Resin which Decomposes by Action of Acid to Generate Alkali-Soluble Group

The composition according to the present invention may include, in addition to the resin (P), a resin which decomposes by the action of an acid to generate an alkali-soluble group (which is also referred to as an "acid-decomposable resin").

The acid-decomposable resin is a resin having a group which decomposes by the action of an acid to generate an alkali-soluble group (acid-decomposable group) at its main chain or side chain, or both thereof. Among these, the resin having an acid-decomposable group at its side chain is more preferred.

The acid-decomposable resin can be obtained by either reacting a precursor of an acid-decomposable group with an alkali-soluble resin, or copolymerizing an alkali-soluble resin monomer having an acid-decomposable group bonded thereto with any of various monomers, as described in, for example, European Patent No. 254853, JP2-25850A, JP3-223860A, JP4-251259A, and the like.

The acid-decomposable group is preferably a group obtained by substituting the hydrogen atom of the alkali-soluble group with a group that is cleaved by the action of an acid in a resin having an alkali-soluble group such as a —COOH group, an —OH group, and the like.

Preferred specific examples of the acid-decomposable groups are the same as mentioned with respect to the resin (P) of the present invention (for example, the acid-decomposable group described with respect to the repeating unit (B) in the resin (P)).

The resin having an alkali-soluble group is not particularly limited, but examples thereof include poly(o-hydroxystyrene), poly(m-hydroxystyrene), poly(p-hydroxystyrene), copolymers thereof, a hydrogenated poly(hydroxystyrene), poly(hydroxystyrene) polymers having substituents of the structures shown below, a resin having phenolic hydroxyl, a styrene-hydroxystyrene copolymer, an α-methylstyrene-hydroxystyrene copolymer, an alkali-soluble resin having a hydroxystyrene structure unit such as a hydrogenated novolak resin and the like, and an alkali-soluble resin comprising a repeating unit containing a carboxyl group such as (meth)acrylic acid, norbornene carboxylic acid, and the like.

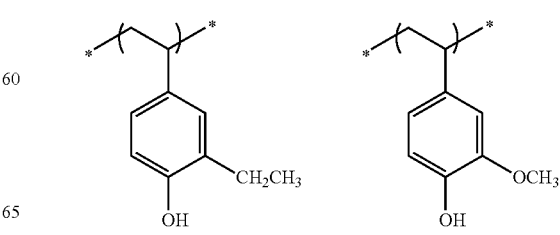

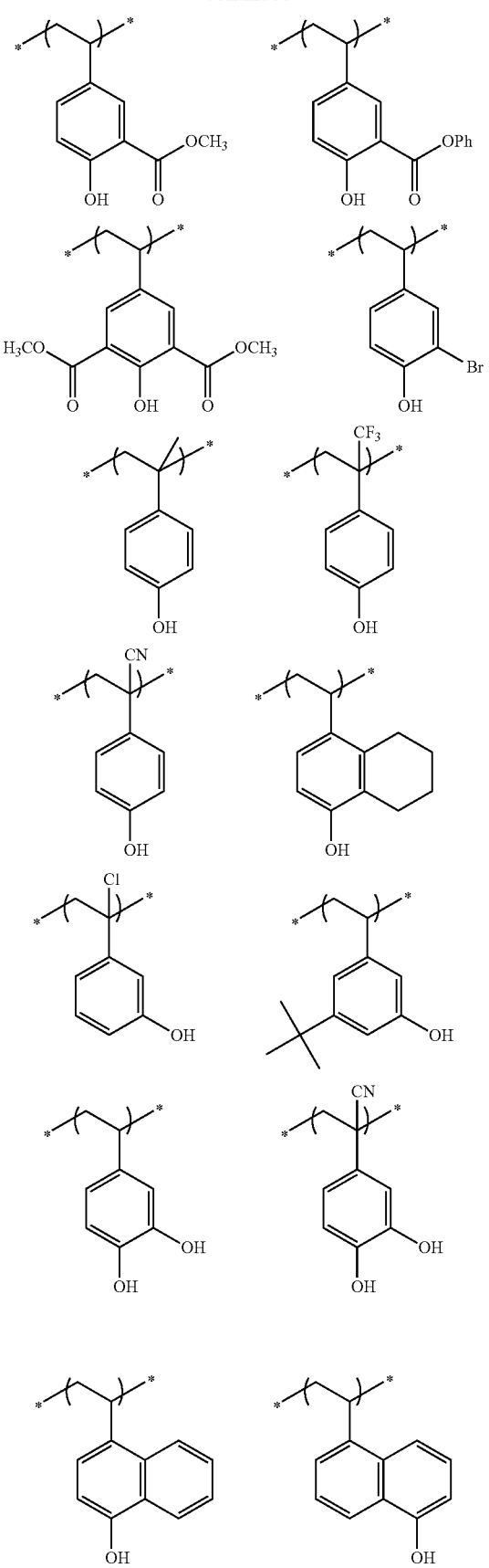

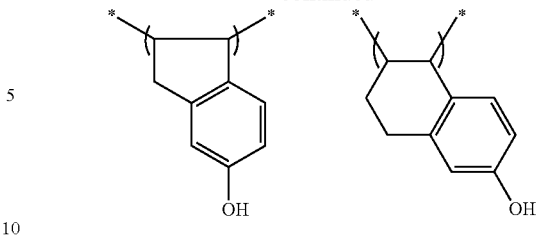

The alkali dissolution rate of these alkali-soluble resins as measured in a 2.38% by mass tetramethylammonium hydroxide (TMAH) solution (23° C.) is preferably 17 nm/sec or more, and particularly preferably 33 nm/sec or more.

The content of acid-decomposable groups, can be expressed as the quotient of the formula X/(X+Y), in which X is the number of repeating units containing groups decomposable by an acid in the resin and Y is the number of repeating units containing alkali-soluble groups not protected by any acid-cleavable group in the resin. The content is preferably in the range of 0.01 to 0.7, more preferably 0.05 to 0.50, and even more preferably 0.05 to 0.40.

The preferred ranges of the molecular weight and the dispersity of the acid-decomposable resin are the same as those of the resin (P).

The acid-decomposable resins may be used in combination of two or more kinds thereof.

The amount of the acid-decomposable resins, except the resin (P), contained in the composition according to the present invention is preferably in the range of 0.1 to 70% by mass, more preferably 0.1 to 50% by mass, and even more preferably 0.1 to 30% by mass, based on the total solids of the composition.

[3] Compound that Generates Acid by Irradiation with Active Light Ray or Radioactive Ray (Low-Molecular-Weight Photoacid Generator)

The composition according to the present invention, contains the resin with a photoacid-generating structure (P), but except the resin (P), a low-molecular-weight compound that generates an acid by irradiation with active light ray or radioactive ray (which is hereinafter also referred to as an "acid generator" or a "photoacid generator") may be contained in the composition.

Such a low-molecular-weight acid generator has a molecular weight of preferably 3000 or less, and more preferably 2000 or less. The lower limit of the molecular weight of the low-molecular-weight acid generator is generally 200.

As such an acid generator, one is appropriately selected from a photoinitiator for photocationic polymerization, a photoinitiator for photoradical polymerization, photo-achromatic agent and photo-discoloring agent for dyes, any of generally known compounds that generate an acid by irradiation with active light ray or radioactive ray, employed in microresists, and the like, and a mixture thereof, and then used.

Examples of the acid generator include a diazonium salt, a phosphonium salt, a sulfonium salt, an iodonium salt, an imide sulfonate, an oxime sulfonate, diazosulfone, disulfone, and o-nitrobenzyl sulfonate. Specific examples thereof include those as described in [0164] to [0248] of US2008/0241737A1.

When an acid generator, except the resin having a photoacid-generating structure (P), is used in the composition according to the present invention, the acid generator can be used singly or in combination of two or more kinds thereof. The content of the acid generator in the composition is preferably in the range of 0 to 20% by mass, more preferably 0 to 10% by mass, and even more preferably 0 to 7% by mass, based on the total solids of the composition of the present invention. Although these acid generators are not essential components in the present invention, they are generally used in an amount of 0.01% by mass or more in order to attain the effect of the addition thereof.

[4] Basic Compound

The active light ray sensitive or radioactive ray sensitive resin composition of the present invention preferably contains a basic compound.

The basic compound is preferably a nitrogen-containing organic compound.

Useful basic compounds are not particularly limited. However, for example, the compounds classified into the categories (1) to (5) below are preferably used.

(1) Compounds Represented by General Formula (BS-1) Below

(BS-1)

In the general formula (BS-1), each of three R's independently represents any of a hydrogen atom, an alkyl group (linear or branched), a monovalent aliphatic hydrocarbon ring group (monocyclic or polycyclic), an aryl group, and an aralkyl group, provided that all the three R's are not hydrogen atoms.

The number of carbon atoms of the alkyl group represented by R is not particularly limited. However, it is generally in the range of 1 to 20, and preferably 1 to 12.

The number of carbon atoms of the monovalent aliphatic hydrocarbon ring group represented by R is not particularly limited. However, it is generally in the range of 3 to 20, and preferably 5 to 15.

The number of carbon atoms of the aryl group represented by R is not particularly limited. However, it is generally in the range of 6 to 20, and preferably 6 to 10. Specific examples of the aryl group include a phenyl group, a naphthyl group, and the like.

The number of carbon atoms of the aralkyl group represented by R is not particularly limited. However, it is generally in the range of 7 to 20, preferably 7 to 11. Specific examples of the aralkyl group include a benzyl group and the like.

In the alkyl group, the monovalent aliphatic hydrocarbon ring group, the aryl group, or the aralkyl group as R, a hydrogen atom thereof may be substituted with a substituent. Examples of the substituent include an alkyl group, a monovalent aliphatic hydrocarbon ring group, an aryl group, an aralkyl group, an alkoxy group, an aryloxy group, an alkylcarbonyloxy group, an alkyloxycarbonyl group, and the like.

In the compounds represented by the general formula (BS-1), it is preferable that only one of the three R's be a hydrogen atom.

Specific examples of the compounds of the general formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline, and the like.

Furthermore, any of the compounds of the general formula (BS-1) in which at least one of the R's is an alkyl group substituted with a hydroxyl group can be mentioned as a preferred form of compound. Specific examples of the compound include triethanolamine, N,N-dihydroxyethylaniline, and the like.

Furthermore, with respect to the alkyl group as R, an oxygen atom may be present in the alkyl chain to form an oxyalkylene chain. The oxyalkylene chain is preferably —$CH_2CH_2O$—. Specific examples thereof include tris(methoxyethoxyethyl)amine, compounds shown in column 3, line 60 et seq. of U.S. Pat. No. 6,040,112A, and the like.

(2) Compounds Having Nitrogen-Containing Heterocyclic Structure

The heterocyclic structure may or may not have aromaticity. Further, it may have a plurality of nitrogen atoms, and also may have a heteroatom other than nitrogen. Specific examples thereof include compounds with an imidazole structure (2-phenylbenzoimidazole, 2,4,5-triphenylimidazole and the like), compounds with a piperidine structure (N-hydroxyethylpiperidine, bis(1,2,2,6,6-pentamethyl-4-piperidyl)sebacate and the like), compounds with a pyridine structure (4-dimethylaminopyridine and the like), compounds with an antipyrine structure (antipyrine, hydroxyantipyrine and the like), etc.

Furthermore, compounds with two or more ring structures are also appropriately used. Examples thereof include 1,5-diazabicyclo[4.3.0]nona-5-ene, 1,8-diazabicyclo[5.4.0]-undec-7-ene, and the like.

(3) Amine Compounds Having Phenoxy Group

The amine compounds with a phenoxy group are those having a phenoxy group at the end of the alkyl group of each amine compound opposite to the nitrogen atom. The phenoxy group may have a substituent, such as an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group, and the like.

Compounds having at least one oxyalkylene chain between the phenoxy group and the nitrogen atom are preferred. The number of oxyalkylene chains in each molecule is preferably in the range of 3 to 9, and more preferably 4 to 6. Among the oxyalkylene chains, —$CH_2CH_2O$— is preferred.

Specific examples thereof include 2-[2-{2-(2,2-dimethoxy-phenoxyethoxy)ethyl}-bis-(2-methoxyethyl)]-amine, compounds (C1-1) to (C3-3) shown in Paragraphs [0066] of US2007/0224539A1, and the like.

(4) Ammonium Salts

In the present invention, ammonium salts are also appropriately used. Hydroxides and carboxylates are preferred, and tetraalkylammonium hydroxides, typically such as tetrabutylammonium hydroxide, are more preferred.

(5) Compound that Increases its Basicity by Action of Acid

A compound that increases its basicity by the action of an acid can also be used as a type of basic compound. An example thereof include compounds with the structure of the general formula (A) below. These compounds per se exhibit low basicity because of the presence of an electron withdrawing ester bond adjacent to the N atom. However, when an acid acts on the compounds, it is construed that the moiety —C(Rb)(Rb)(Rb) is first decomposed and subsequently the ester bond moiety is decarbonated, so that the moiety of the electron withdrawing ester bond is removed, thereby exhibiting a substantial basicity.

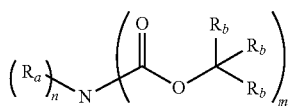

(A)

In the general formula (A), Ra represents a hydrogen atom, an alkyl group, a monovalent aliphatic hydrocarbon ring group, an aryl group or an aralkyl group. With n=2, two Ra's may be the same as or different from each other, and two Ra's may be bonded to each other to form a divalent heterocyclic hydrocarbon group (preferably having 20 or less carbon atoms) or a derivative thereof.

Each of Rb's independently represents a hydrogen atom, an alkyl group, a monovalent aliphatic hydrocarbon ring group, an aryl group or an aralkyl group in which in the formula —C(Rb)(Rb)(Rb), three Rb's are not hydrogen atoms at the same time.

At least two Rb's may be bonded to each other to form an alicyclic hydrocarbon group, an aromatic hydrocarbon group, a heterocyclic hydrocarbon group, or a derivative thereof.

In, the formula, n represents an integer of 0 to 2, and in represents an integer of 1 to 3, with n+m=3.

In the general formula (A), each of the alkyl group, the monovalent aliphatic hydrocarbon ring group, the aryl group, and the aralkyl group, each represented by Ra and Rb, may be substituted with a functional group, such as a hydroxyl group, a cyano group, an amino group, a pyrrolidino group, a piperidino group, a morpholino group, an oxo group, and the like as well as an alkoxy group or a halogen atom.

Examples of the alkyl group, the monovalent aliphatic hydrocarbon ring group, the aryl group, and the aralkyl group, represented by Ra and Rb above (these alkyl group, cycloalkyl group, aryl group, and aralkyl group may be substituted with the above functional group, an alkoxy group, or a halogen atom) include:

a group derived from a linear or branched alkane, such as methane, ethane, propane, butane, pentane, hexane, heptane, octane, nonane, decane, undecane, dodecane, and the like, and a group as obtained by substituting the above alkane-derived group with a cycloalkyl group;

a group derived from a cycloalkane, such as cyclobutane, cyclopentane, cyclohexane, cycloheptane, cyclooctane, norbornane, adamantane, noradamantane, and the like, and a group as obtained by substituting the above cycloalkane-derived group with a linear or branched alkyl group;

a group derived from an aromatic compound, such as benzene, naphthalene, anthracene, and the like, and a group as obtained by substituting the above aromatic-compound-derived group with a linear or branched alkyl group; and a group derived from a heterocyclic compound, such as pyrrolidine, piperidine, morpholine, tetrahydrofuran, tetrahydropyran, indole, indoline, quinoline, perhydroquinoline, indazole, benzimidazole, and the like, a group as obtained by substituting the above heterocyclic-compound-derived group with a linear or branched alkyl group or an aromatic-compound-derived group, a group as obtained by substituting the above linear or branched-alkane-derived group or cycloalkane-derived group with an aromatic-compound-derived group, and any of groups as obtained by substituting the above substituents with a functional group, such as a hydroxyl group, a cyano group, an amino group, a pyrrolidino group, a piperidino group, a morpholino group, an oxo group, and the like; etc.

Examples of the divalent heterocyclic hydrocarbon group (preferably having 2 to 20 carbon atoms) formed by the mutual bonding of Ra's or a derivative thereof include a group derived from a heterocyclic compound, such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, 1,5,9-triazacyclododecane, and the like; a group as obtained by substituting the above heterocyclic-compound-derived group with at least one or at least one type of linear or branched-alkane-derived group, cycloalkane-derived group, aromatic-compound-derived group, heterocyclic-compound-derived group or functional group, such as a hydroxyl group, a cyano group, an amino group, a pyrrolidino group, a piperidino group, a morpholino group, an oxo group, and the like; etc.

Specific particularly preferred examples of the compound that increases its basicity by the action of an acid in the present invention will be shown below, but the present invention is not limited thereto.

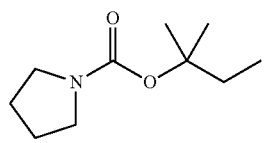

(D-1)

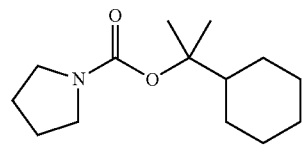

(D-2)

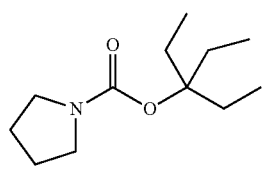

(D-3)

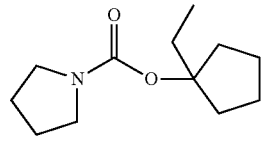

(D-4)

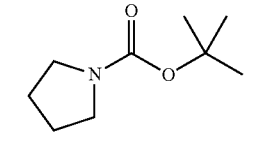

(D-5)

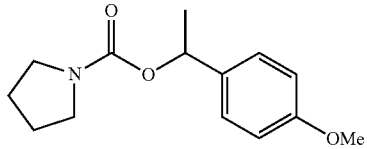

(D-6)

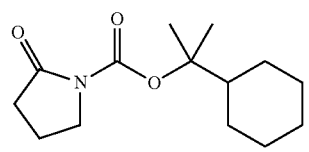 (D-7)
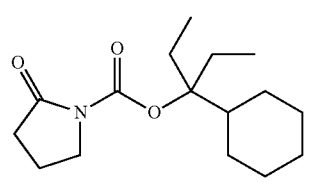 (D-8)
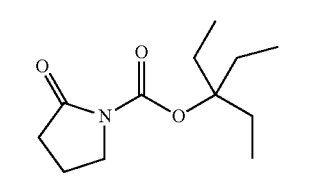 (D-9)
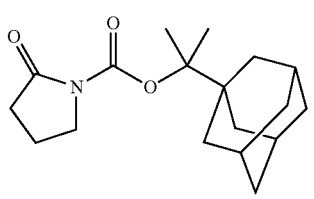 (D-10)
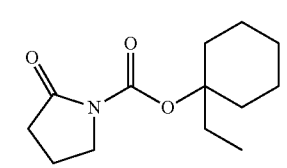 (D-11)
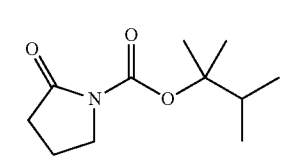 (D-12)
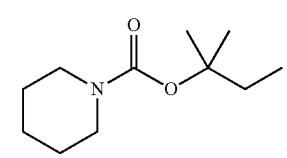 (D-13)
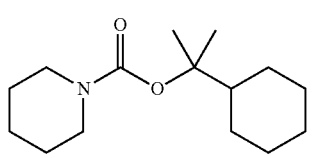 (D-14)
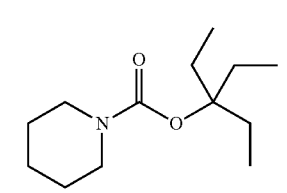 (D-15)
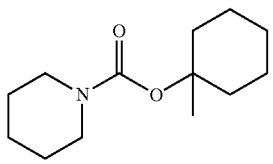 (D-16)
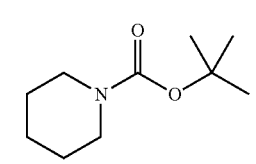 (D-18)
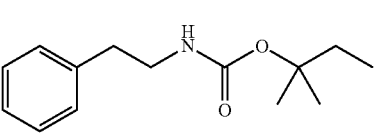 (D-19)
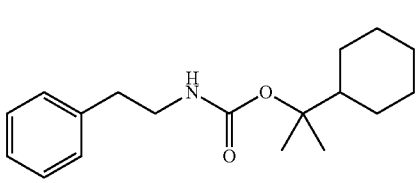 (D-20)
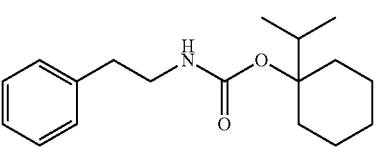 (D-21)
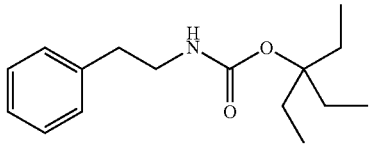 (D-23)
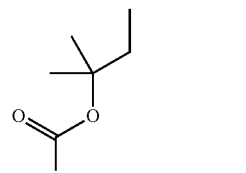 (D-24)
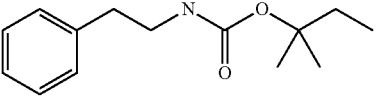
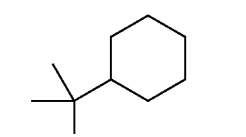 (D-25)
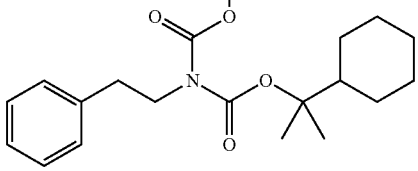

(D-26)
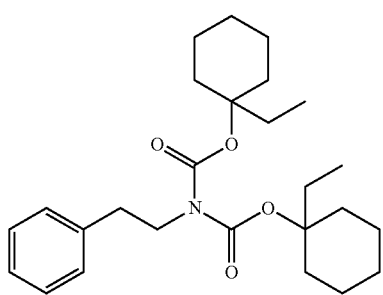
(D-28)
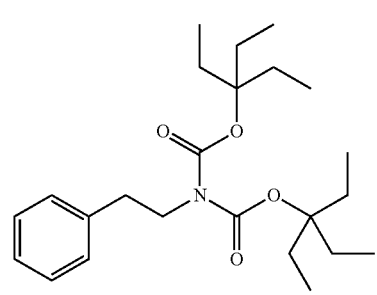
(D-29)
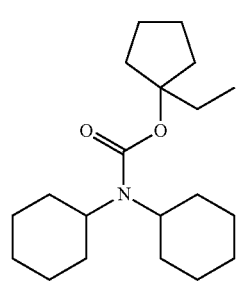
(D-31)
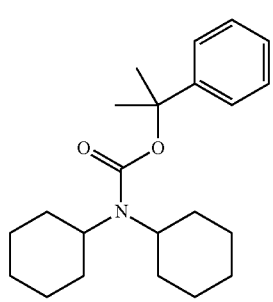
(D-32)
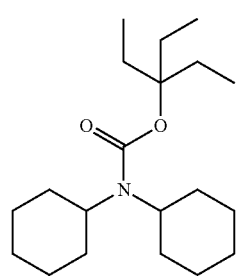
(D-33)
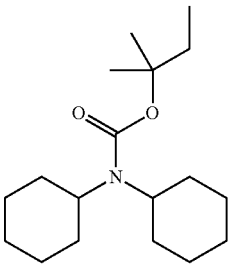
(D-34)
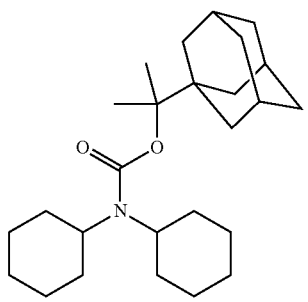
(D-35)
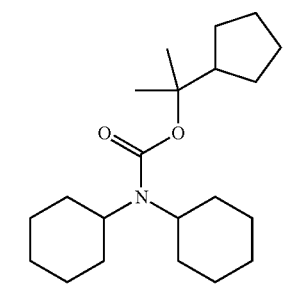
(D-36)
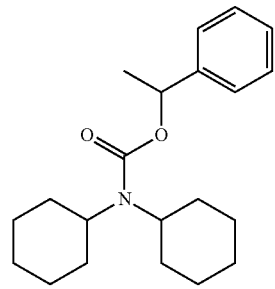
(D-37)
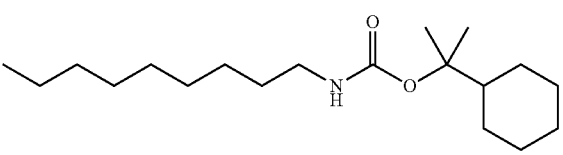
(D-38)
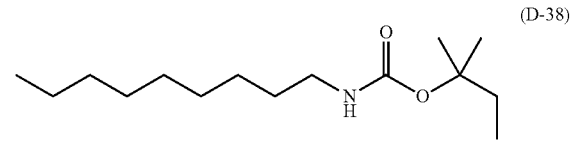
(D-39)
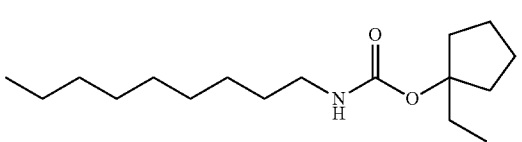

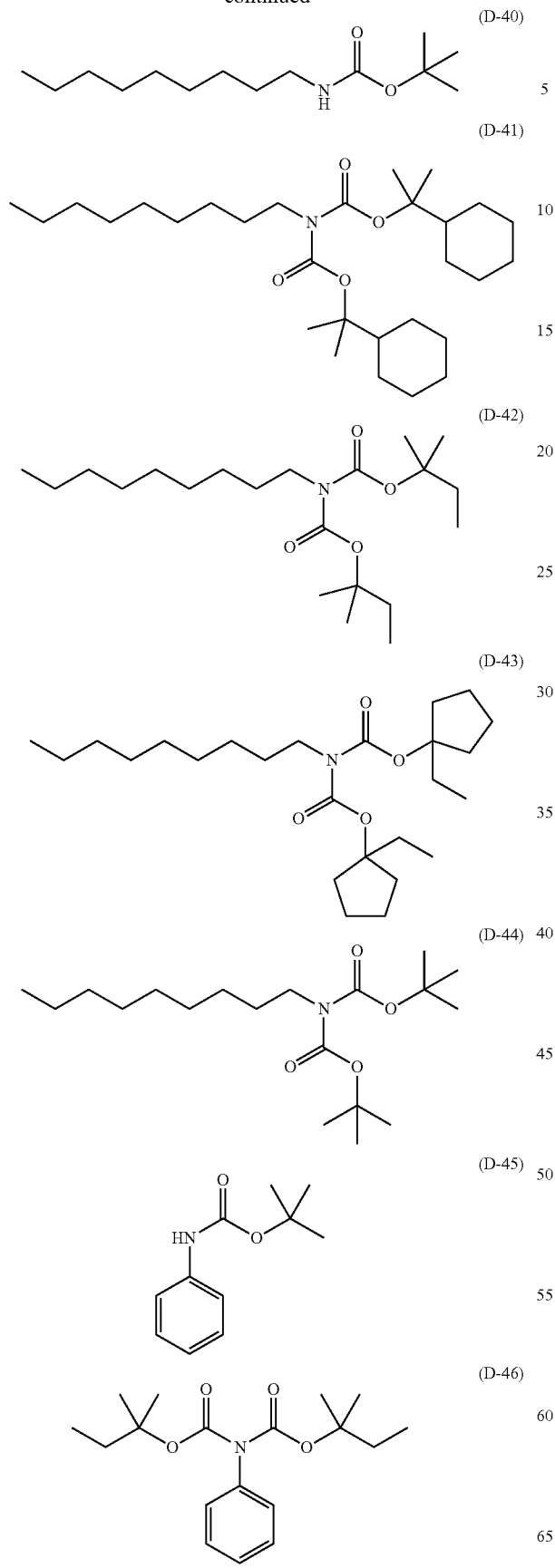
The compound represented by the general formula (A) can be easily synthesized from commercially available amines by the methods described in the fourth edition of "Protective Groups in Organic Synthesis", and the like. The most general method comprises causing a bicarbonic ester or a haloformic ester to act on commercially available amines. In the formulae, X represents a halogen atom, and R$_a$ and R$_b$ are as defined in the general formula (A).

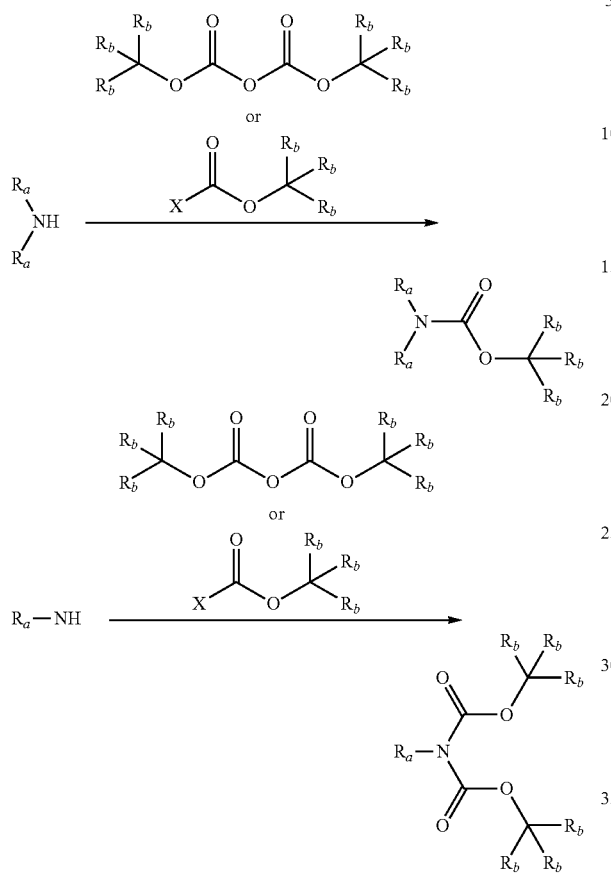

Examples of other compounds usable in the composition of the present invention include the compounds synthesized in Examples of JP2002-363146A, the compounds described in Paragraph 0108 of JP2007-298569A, and the like.

These basic compounds can be used singly or in combination of two or more kinds thereof.

The amount of the basic compound used is generally in the range of 0.001 to 10% by mass, and preferably 0.01 to 5% by mass, based on the solids of the composition.

The molar ratio of the acid generator/the basic compound is preferably from 2.5 to 300. That is the molar ratio of 2.5 or more is preferred from the viewpoint of sensitivity and resolution, and 300 or less is preferred from the viewpoint of inhibition of the reduction of resolution by the thickening of the pattern in aging after exposure until heat treatment. The molar ratio is more preferably 5.0 to 200, and still more preferably 7.0 to 150.

Furthermore, the acid generator in the above molar ratio is the amount of a sum total of the repeating unit (a) contained in the resin (P) and the later-described acid generator other than the resin (P).

[5] Low-Molecular-Weight Compound Containing a Group which Decomposes by Action of Acid or Alkali The composition of the present invention can include a low-molecular-weight compound containing a group which decomposes by the action of an acid or alkali (provided that the above-mentioned compound that increases its basicity by the action of an acid is excluded). Such a low-molecular-weight compound preferably has a molecular weight of 3000 or less. The group which decomposes by the action of an acid or alkali is not particularly limited. However, an acetal group, a carbonate group, a carbamate group, a tertiary ester group, a tertiary hydroxyl group, a hemiaminal ether group and a lactone structure are preferred, and a carbamate group and a hemiaminal ether group are particularly preferred.

In the case where irradiation with an electron beam or EUV light is carried out, it is preferable to contain a compound with a structure formed by substitution of a phenolic hydroxyl group of phenolic compound with an acid-decomposable group. The phenolic compound preferably contains 1 to 9 phenol skeletons, and more preferably 2 to 6 phenol skeletons.

Specific examples of such a structure will be shown, below, but the present invention is not limited thereto.

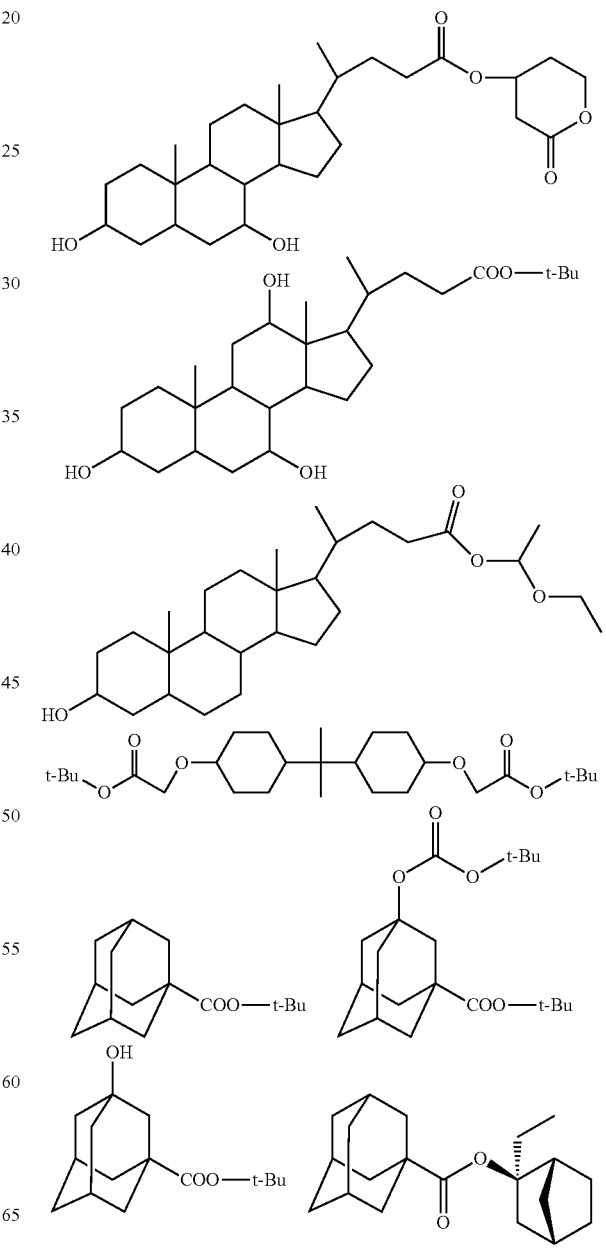

-continued

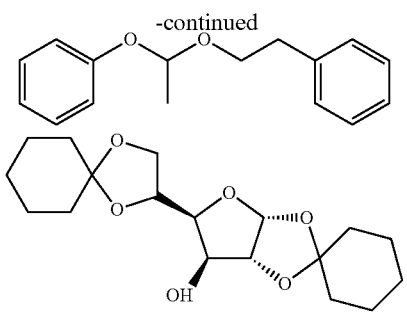

The low-molecular-weight compound containing a group which decomposes by the action of an acid or alkali may be any of commercially available products or any of those synthesized by heretofore known methods.

[6] Surfactant

The composition of the present invention may further contain a surfactant. When the composition contains, a surfactant, the surfactant is preferably a fluorinated and/or siliconized surfactant.

Examples of such a surfactant include Megafac F176 and Megafac R08 manufactured by Dainippon Ink & Chemicals, Inc. PF656 or PF6320 manufactured by Omnova Solutions, Inc., Troy Sol S-366 manufactured by Troy Chemical Co. Ltd., Floral FC430 manufactured by Sumitomo 3M Ltd., polysiloxane polymer KP-341 manufactured by Shin-Etsu Chemical Co., Ltd., and the like.

Furthermore, surfactants other than these fluorinated and/or siliconized surfactants can also be used. Specific examples thereof include polyoxyethylene alkyl ethers, polyoxyethylene alkyl aryl ethers, and the like.

Moreover, known surfactants can be appropriately used. Examples of the useful surfactants include those described in [0273] et seq of US2008/0248425A1.

These surfactants may be used singly or in combination of two or more kinds thereof.

The amount of the surfactant to be used is preferably in the range of 0 to 2% by mass, more preferably 0.0001 to 2% by mass, and particularly more preferably 0.0005 to 1% by mass, based on the total solids of the active light ray sensitive or radioactive ray sensitive resin composition.

[7] Solvent

The solvent that is usable in the preparation of the composition is not particularly limited as long as it can dissolve the components of the composition. Examples of the solvent include an alkylene glycol monoalkyl ether carboxylate, an alkylene glycol monoalkyl ether, an alkyl lactate, a cyclolactone, a linear or cyclic ketone, an alkylene carbonate, an alkyl carboxylate, an alkyl alkoxyacetate, an alkyl pyruvate, and the like. Examples of other useful solvents include those described in [0244] et seq. of US2008/0248425A1, and the like.

Examples of a preferably usable solvent include 2-heptanone, cyclopentanone, γ-butyrolactone, cyclohexanone, butyl acetate, ethyl lactate, ethylene glycol monoethyl ether acetate, propylene glycol monomethyl ether acetate, propylene glycol monomethyl ether, ethyl 3-ethoxypropionate, ethyl pyruvate, acetic acid 2-ethoxyethyl ester, acetic acid 2-(2-ethoxyethoxy)ethyl ester, and propylene carbonate. Examples of a particularly preferred solvent include propylene glycol monomethyl ether acetate, and propylene glycol monomethyl ether.

These solvents may be used singly or in combination of two or more kinds thereof. In the case where two or more kinds of solvents are mixed together, it is preferred to mix a solvent having a hydroxyl group with a solvent having no hydroxyl group. The mass ratio of the solvent having a hydroxyl group to the solvent having no hydroxyl group is from 1/99 to 99/1, preferably from 10/90 to 90/10, and more preferably from 20/80 to 60/40.

The solvent having a hydroxyl group is preferably an alkylene glycol monoalkyl ether. The solvent having no hydroxyl group is preferably an alkylene glycol monoalkyl ether carboxylate.

The content of the solvent in the composition of the present invention can be appropriately regulated in accordance with desired film thickness, or the like, but it is generally regulated so that the concentration of the total solids of the composition falls within the range of 0.5 to 30% by mass, preferably 1.0 to 20% by mass, and more preferably 1.5 to 10% by mass.

[8] Substance which Decomposes by Action of Acid to Generate Acid Stronger than Carboxylic Acid The composition of the present invention may be loaded with a substance which decomposes by the action of an acid to generate an acid stronger than carboxylic acid (which is hereinafter also referred to as an "acid amplifier").

The acid generated by the acid amplifier is preferably an acid which exhibits a high acid strength, and in particular, the dissociation constant (pKa) of the acid is preferably 3 or below, and more preferably 2 or below. The acid generated by the acid amplifier is preferably sulfonic acid.

As the acid amplifier, the acid amplifier described in WO95/29968A, WO98/24000A, JP1996-305262A (JPH08-305262A), JP1997-34106A (JPH09-34106A), JP1996-248561A (JPH08-248561A). Japanese PCT National Publication No. 8-503082, U.S. Pat. No. 5,445,917A, Japanese PCT National Publication No. 8-503081, U.S. Pat. Nos. 5,534,393A, 5,395,736A, 5,741,630A, 5,334,489A, U5,582, 956A, 5,578,424A, 5,453,345A, 5,445,917A, European Patent No. 665,960, European Patent No. 757,628, European Patent No. 665,961, U.S. Pat. No. 5,667,943A, JP1998-1508A (JPH10-1508A), JP1998-282642A (JPH10-282642A). JP1997-512498A (JH0P9-512498A). JP2000-62337A, JP2005-17730A, JP2008-209889A, and the like can be used singly or in combination of two or more kinds thereof.

Specifically, the compounds represented by the following general formulae (1) to (6) are preferred.

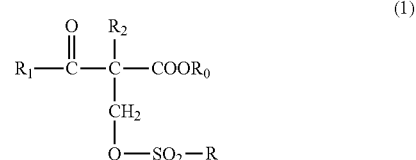
(1)

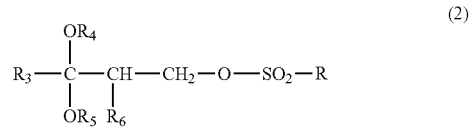
(2)

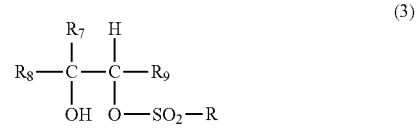
(3)

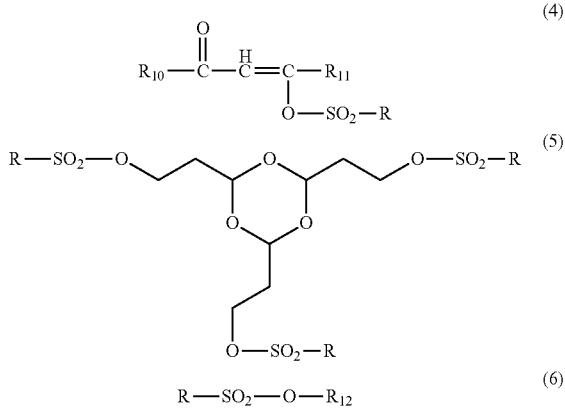

In the general formulae (1) to (6),

R represents an alkyl group, a monovalent aliphatic hydrocarbon ring group, an aryl group, or an aralkyl group.

$R_0$ represents a group that is cleaved under the action of an acid.

$R_1$ represents an alkyl group, a monovalent aliphatic hydrocarbon ring group, an aryl group, an aralkyl group, an alkoxy group, or an aryloxy group.

$R_2$ represents an alkyl group or an aralkyl group.

$R_3$ represents an alkyl group, a monovalent aliphatic hydrocarbon ring group, an aryl group, or an aralkyl group.

Each of $R_4$ and $R_5$ independently represents an alkyl group, in which $R_4$ and $R_5$ may be bonded to each other to form a ring.

$R_6$ represents a hydrogen atom or an alkyl group.

$R_7$ represents a hydrogen atom, an alkyl group, a monovalent aliphatic hydrocarbon ring group, an aryl group, or an aralkyl group.

$R_8$ represents an alkyl group, a monovalent aliphatic hydrocarbon ring group, an aryl group or an aralkyl group.

$R_9$ represents a hydrogen atom, an alkyl group, a monovalent aliphatic hydrocarbon ring group, an aryl group, or an aralkyl group.

$R_9$ and $R_7$ may be bonded to each other to form a ring.

$R_{10}$ represents an alkyl group, a monovalent aliphatic hydrocarbon ring group, an alkoxy group, an aryl group, an aralkyl group, an aryloxy group, or an alkenyloxy group.

$R_{11}$ represents an alkyl group, a monovalent aliphatic hydrocarbon ring group, an alkoxy group, an aryl group, an aralkyl group, an aryloxy group, or an alkenyl group.

$R_{10}$ and $R_{11}$ may be bonded to each other to form a ring.

$R_{12}$ represents an alkyl group, a monovalent aliphatic hydrocarbon ring group, an aryl group, an alkenyl group, an alkynyl group, or a cycloimido group.

Preferred examples of each of the groups of R, $R_0$, and $R_1$ to $R_{11}$ are as follows.

R: a methyl group, an ethyl group, a propyl group, a butyl group, an octyl group, a trifluoromethyl group, a nonafluorobutyl group, a heptadecafluorooctyl group, a 2,2,2-trifluoroethyl group, a phenyl group, a pentafluorophenyl group, a methoxyphenyl group, a toluoyl group, a mesityl group, a fluorophenyl group, a naphthyl group, a cyclohexyl group, or a camphor group.

$R_0$: a t-butyl group, a methoxymethyl group, an ethoxymethyl group, a 1-ethoxyethyl group, or a tetrahydropyranyl group.

$R_1$: a methyl group, an ethyl group, a propyl group, a cyclopropyl group, a cyclopentyl group, a cyclohexyl group, a phenyl group, a naphthyl group, a benzyl group, a phenethyl group, a methoxy group, an ethoxy group, a propoxy group, a phenoxy group, or a naphthoxy group.

$R_2$: a methyl group, an ethyl group, a propyl group, a butyl group, or a benzyl group.

$R_3$: a methyl group, an ethyl group, a propyl group, a cyclopropyl group, a cyclopentyl group, a cyclohexyl group, a phenyl group, a naphthyl group, a benzyl group, a phenethyl group, or a naphthylmethyl group.

$R_4$ and $R_5$: a methyl group, an ethyl group, a propyl group, or an ethylene group or propylene group formed by mutual bonding thereof.

$R_6$: a hydrogen atom, a methyl group, or an ethyl group.

$R_7$ and $R_9$: a hydrogen atom, a methyl group, an ethyl group, a propyl group, a butyl group, a pentyl group, a cyclopropyl group, a cyclopentyl group, a cyclohexyl group, a phenyl group, a naphthyl group, a benzyl group, a phenethyl group, or a cyclopentyl ring or cyclohexyl ring formed by mutual bonding thereof.

$R_8$: a methyl group, an ethyl group, an isopropyl group, a t-butyl group, a neopentyl group, a cyclohexyl group, a phenyl group, or a benzyl group.

$R_{10}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group, a methylvinyloxy group, or a 3-oxocyclohexenyl ring or 3-oxoindenyl ring formed by bonding with $R_{11}$.

$R_{11}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group, an allyl group, or a 3-oxocyclohexenyl ring or 3-oxoindenyl ring formed by bonding with $R_{10}$.

In the general formula (6), when $R_{12}$ represents an alkyl group, the alkyl group is preferably a linear one having 1 to 12 carbon atoms or a branched one having 3 to 12 carbon atoms.

When $R_{12}$ represents a monovalent aliphatic hydrocarbon ring group, the monovalent aliphatic hydrocarbon ring group is preferably a monocyclic or polycyclic one having 5 to 10 carbon atoms.

When $R_{12}$ represents an aryl group, examples of the aryl group include a condensed ring formed by 1 to 3 benzene rings or a condensed ring formed by a benzene ring and a 5-membered unsaturated ring. Among these, a phenyl group and a naphthyl group are preferred. Further, the aryl groups include not only the above carbon-ring aryl group but also a heterocyclic aryl group. Examples of the heterocyclic aryl group include those each containing 3 to 20 carbon atoms and 1 to 5 heteroatoms, such as a pyridyl group and a furyl group as well as a quinolyl group, a benzofuryl group, a thioxanthone group, and a carbazole group, formed by condensation with a benzene ring.

When $R_{12}$ represents a substituted aryl group, as the substituted aryl group, use is made of one formed by introduction of, as a substituent, a monovalent nonmetallic atomic group excluding hydrogen in a ring-constructing carbon atom of the above aryl group. Examples of preferred substituents are the substituents mentioned as a substituent with respect to the alkyl group and the cycloalkyl group.

When $R_{12}$ represents an alkenyl group, a substituted alkenyl group [—$C(R_{14})$=$C(R_{15})(R_{16})$], an alkynyl group, or a substituted alkynyl group [—C≡C($R_{17}$)], $R_{14}$ to $R_{17}$ can be monovalent nonmetallic atomic groups. Preferred examples of $R_{14}$ to $R_{17}$ include a hydrogen atom, a halogen atom, an alkyl group, a substituted alkyl group, an aryl group, and a substituted aryl group. Specific examples thereof include those mentioned above by way of example. Examples of more preferred substituents of $R_{14}$ to $R_{17}$ include a hydrogen atom, a halogen atom, and a linear, branched, or cyclic alkyl group having 1 to 10 carbon atoms.

When $R_{12}$ represents a cycloimido group, examples of the cycloimide include cycloimides having 4 to 20 carbon atoms, such as succinimide, phthalimide, cyclohexanedicarboxylmide, norbornenedicarboxylmide, and the like.

Specific examples of the compounds represented by the general formulae (1) to (6) include the compounds (1-1) to (1-11), (2-1) to (2-6), (3-1) to (3-6), (4-1) to (4-7), (5-1) to (5-4), and (6-1) to (6-20) set forth as examples in [0215] et seq. of JP2008-209889A.

[9] Other Components

The composition of the present invention can appropriately contain, in addition to the above-described components, an onium salt of a carboxylic acid, and a dye, a plasticizer, a photosensitizer, a light absorber, and the like described in Proceeding of SPIE, 2724, 355 (1996), and the like.

[10] Pattern-Forming Method

The present invention further includes an active light ray sensitive or radioactive ray sensitive film formed by using the composition of the present invention.

Furthermore, the present invention further includes a pattern-forming method including the steps of exposing and developing the active light ray sensitive or radioactive ray sensitive film.

The composition of the present invention is used, for example, after the above components are dissolved in a solvent, filtered, and then applied onto a support.

The filter is preferably made of polytetrafluoroethylene, polyethylene, or nylon having a pore size of 0.1 μm or less, more preferably 0.05 μm or less, and even more preferably 0.03 μm or less.

The film thickness of the film is not particularly limited, but it is preferably from 0.01 to 0.2 μm, and more preferably from 0.02 to 0.1 μm.

The method of application onto a substrate is preferably a spin coating method, in which the rotating speed is preferably from 1000 to 3000 rpm.

The composition is applied onto a substrate, such as one for use in the production of integrated circuit elements, photomasks, imprint molds, and the like (for example, silicon/silicon dioxide coating), by appropriate application means, such as a spinner. Thereafter, the applied composition is dried to obtain an active light ray sensitive or radioactive ray sensitive film.

This film is irradiated with active light ray or radioactive ray through a predetermined mask, preferably baked (heated), developed, and rinsed. Thus, a favorable pattern can be obtained. Further, when the film is irradiated with an electron beam, lithography without a mask (direct lithography) is generally carried out.

Furthermore, with respect to the details of the fabrication of an imprint mold structure using the composition of the present invention, reference can be made to, for example, "Fundamentals of nanoimprint and its technology development/application deployment-technology of nanoimprint substrate and its latest technology deployment" edited by Yoshihiko Hirai, published by Frontier Publishing (issued in June, 2006), JP4109085B, JP2008-162101A, and the like.

The active light ray or radioactive ray is not particularly limited, and, for example, a KrF excimer laser, an ArF excimer laser, an electron beam, X-rays, EUV light, or the like is preferred, and an electron beam, X-rays, or EUV light is particularly preferred.

In the development step, an alkali developing liquid is generally used. Generally, a quaternary ammonium salt, typically tetramethylammonium hydroxide, is used in the alkali developing liquid for the development step. The alkali developing liquid is not limited to this, and an aqueous solution of an alkali selected from among an inorganic alkali (for example, sodium hydroxide, potassium hydroxide, sodium carbonate, sodium silicate, sodium metasilicate, and the like), a primary to tertiary amine (for example, ethylamine, n-propylamine, diethylamine, di-n-butylamine, triethylamine, methyl diethylamine and the like), an alcoholamine (for example, dimethylethanolamine, triethanolamine, and the like), a cycloamine (for example, pyrrole, piperidine, and the like), etc. can be used.

Before the use of the above alkali developing liquid, appropriate amounts of an alcohol and a surfactant may be further added thereto.

The alkali concentration of the alkali developing liquid is generally from 0.1 to 20% by mass.

The pH value of the alkali developing liquid is generally from 10.0 to 15.0.

Pure water can be used as the rinse liquid, and before the use, an appropriate amount of surfactant may be added thereto and used.

Moreover, prior to the formation of an active light ray sensitive or radioactive ray sensitive film, the substrate may be coated with an antireflection film. As examples of the antireflection film, use can be made of not only an inorganic film of titanium, titanium oxide, titanium nitride, chromium oxide, carbon, amorphous silicon and the like but also an organic film composed of a light absorber and a polymer substance. Also, as the organic antireflection film, use can be made of commercially available organic antireflection films, such as the DUV30 Series and DUV40 Series manufactured by Brewer Science Inc., AR-2, AR-3, and AR-5 manufactured by Shipley Co., Ltd., and the like.

EXAMPLES

The present invention will be described in more detail below with reference to Examples, but the gist of the present invention is limited to these Examples.

Synthesis Example 1

Synthesis of M-I-1

100.00 parts by mass of p-acetoxystyrene was dissolved in 400 parts by mass of ethyl acetate and cooled to 0° C., and 47.60 parts by mass of sodium methoxide (28% methanol solution) was added dropwise to the cooled solution over a period of 30 minutes, followed by stirring at room temperature for 5 hours. Ethyl acetate was added thereto and the organic layer was washed with distilled water three times. The organic layer was dried over anhydrous sodium sulfate, and the solvent was distilled off to obtain 131.70 parts by mass of p-hydroxystyrene (54% ethyl acetate solution). 18.52 parts by mass of the p-hydroxystyrene (54% ethyl acetate solution) was dissolved in 56.00 parts by mass of ethyl acetate, and 31.58 parts by mass of 1,1,2,2,3,3-hexafluoropropane-1,3-disulfonyl difluoride was added thereto, followed by cooling to 0° C. A solution obtained by dissolving 12.63 parts by mass of triethylamine in 25.00 parts by mass of ethyl acetate was added dropwise to the mixture over a period of 30 minutes, followed by stirring while cooling at 0° C. for 4 hours. Ethyl acetate was added thereto, the organic layer was washed with saturated saline three times, and then dried over anhydrous sodium sulfate. The solvent was evaporated, and then the residue was dissolved in 315 parts by mass of methanol, followed by cooling to 0° C. 245 parts by mass of a 1 N aqueous sodium hydroxide solution was added thereto, followed by stirring at room temperature for 2 hours. The solvent was evaporated, followed by addition of ethyl acetate. The organic layer was washed with saturated saline three times, and then dried over anhydrous sodium sulfate. The solvent was evaporated, and then the residue was dissolved in 200 parts by mass of methanol. 27.22 parts by mass of triphenylsulfonium bromide was added thereto, followed by stirring at room temperature for 3 hours. The solvent was evaporated, followed by extraction with chloroform three times. The resultant organic layer was washed with saturated saline three times and then the solvent was evaporated to obtain 50.55 parts by mass of a desired compound (M-I-1).

The other monomers (M-I-3, M-I-8, M-I-29, M-I-34, M-I-36, M-I-41, M-I-43, M-I-60, M-III-76, M-I-89, M-I-93, M-II-1, and M-III-36) were synthesized in the same manner.

Synthesis Example 2

Synthesis of Resin P-1

8.10 parts by mass of 1-methoxy-2-propanol was heated at 80° C. under nitrogen air flow. To this liquid was added dropwise a mixed liquid of 5.28 parts by mass of a monomer (M-I-1), 6.12 parts by mass of a monomer of the following structural formula (A), 6.01 parts by mass of a monomer of the following structural formula (B), 32.5 parts by mass of 1-methoxy-2-propanol, and 1.61 parts by mass of dimethyl 2,2'-azobisisobutyrate [V-601, manufactured by Wako Pure Chemical Industries, Ltd.] over 2 hours under stirring. After completion of addition dropwise, the solution was stirred at 80° C. for additional 4 hours. The reaction liquid was left to be cooled, then reprecipitated with a large amount of hexane/ethyl acetate, and thereafter, dried in vacuo to obtain 13.5 parts by mass of the resin (P-1) of the present invention.

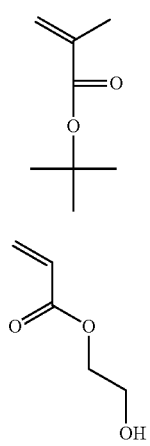

(A)

(B)

The obtained resin had a weight average molecular weight (Mw: polystyrene equivalent) as determined by means of GPC (carrier: N-methyl-2-pyrrolidone (NMP)) of Mw=7200 and a dispersity of Mw/Mn=1.55.

Hereinafter, in the same manner as above, the resins (P-2) to (P-20) were synthesized. The structures, the composition ratios, the weight average molecular weights, and the dispersities of each the synthesized resins are shown below.

P-1

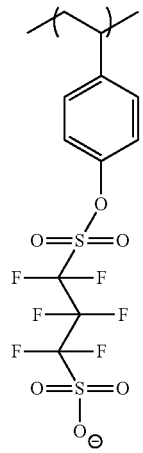 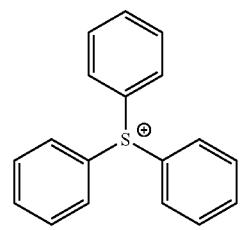

M-I-1

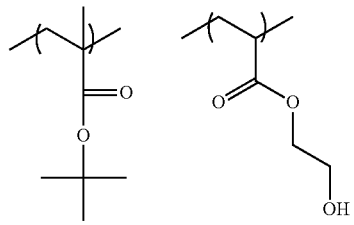

composition ratio: 10/40/50
Mw: 7200
Mw/Mn: 1.55

P-2

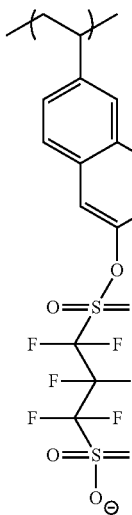 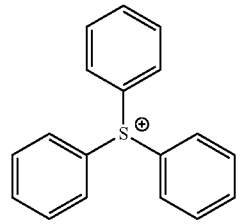

M-I-3

-continued
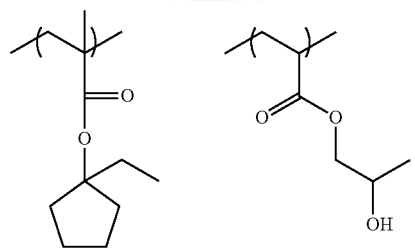
composition ratio: 10/50/40
Mw: 6600
Mw/Mn: 1.62
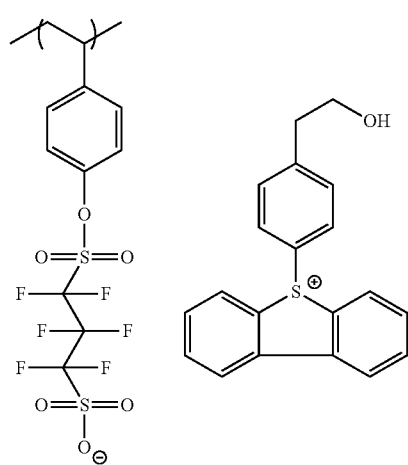
M-I-89
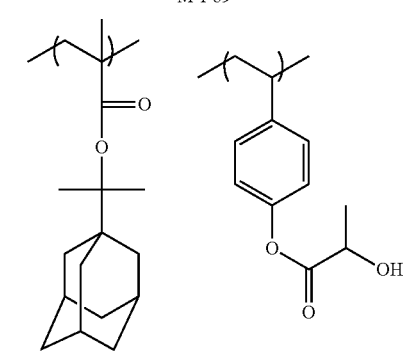
composition ratio: 15/55/30
Mw: 7800
Mw/Mn: 1.68
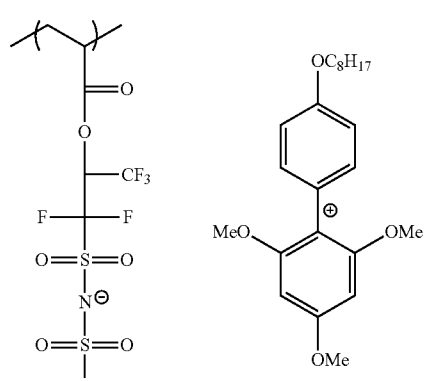
M-III-76
-continued
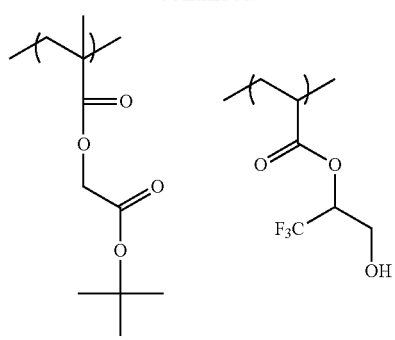
composition ratio: 10/45/45
Mw: 8600
Mw/Mn: 1.71
P-3
M-I-6
P-5
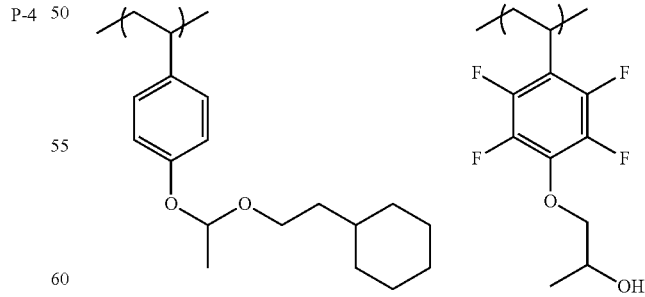
composition ratio: 12/48/40
Mw: 8800
Mw/Mn: 1.64
P-4

-continued
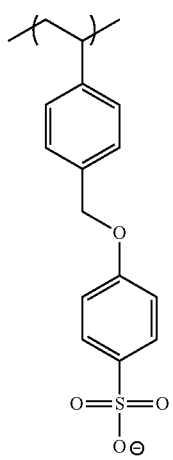 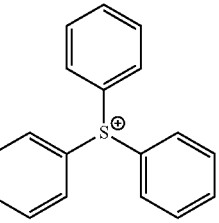
P-6
M-I-29
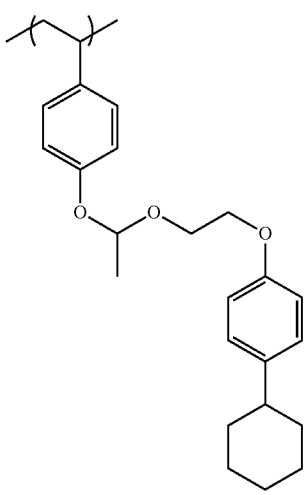
Mw: 12400
Mw/Mn: 1.66
composition ratio: 10/55/35
P-7
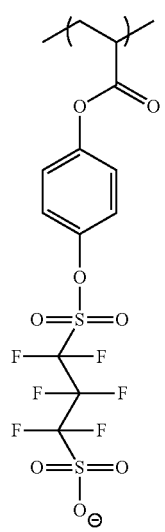
M-I-34
-continued
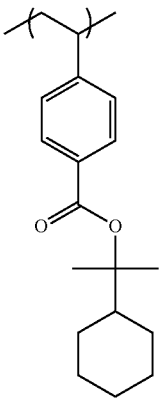 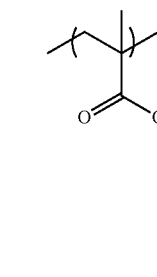
composition ratio: 8/50/42
Mw: 6400
Mw/Mn: 1.71
P-8
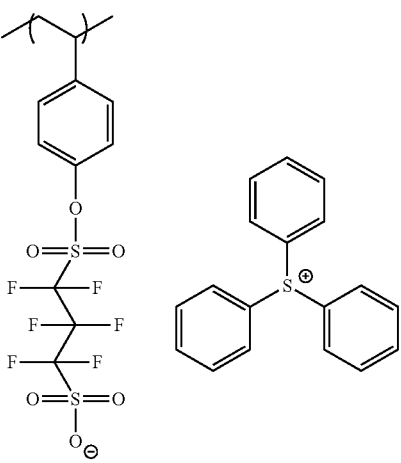
M-I-1
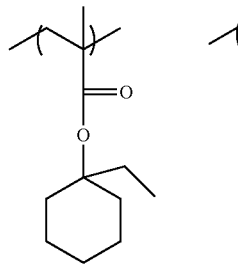 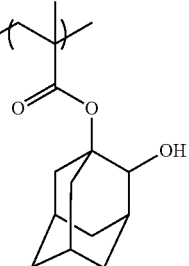
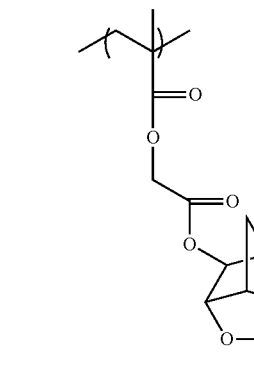
composition ratio: 7/43/40/10
Mw: 6800
Mw/Mn: 1.64

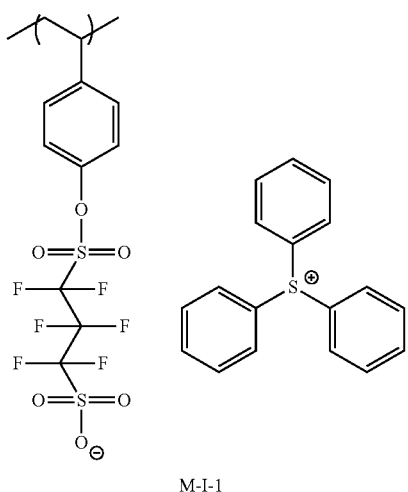
M-I-1
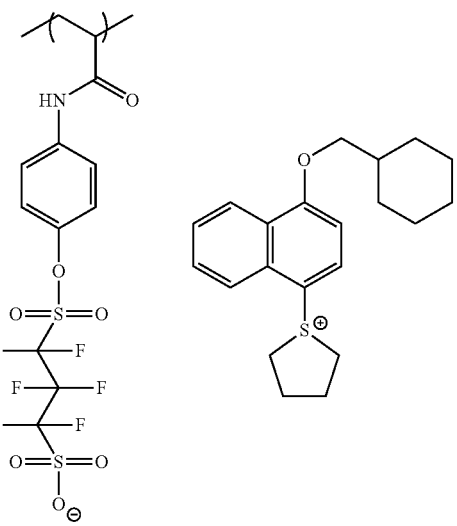
M-I-38
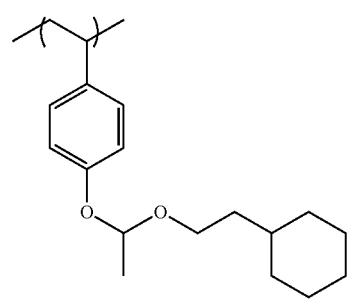
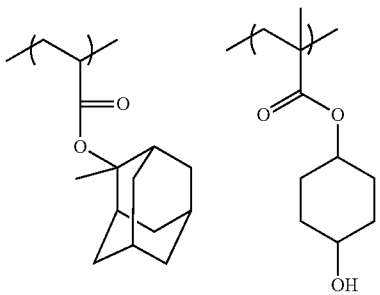
composition ratio: 10/25/65
Mw: 5800
Mw/Mn: 1.62
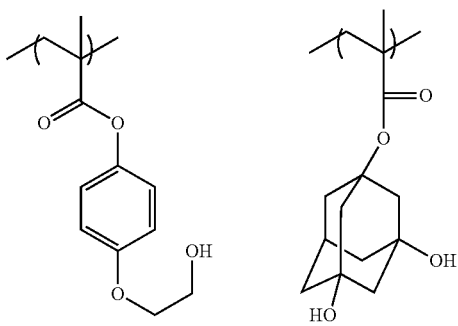
composition ratio: 12/38/40/10
Mw: 11500
Mw/Mn: 1.61
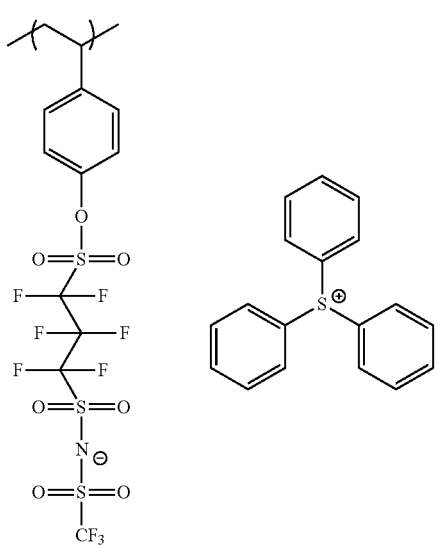
M-I-41

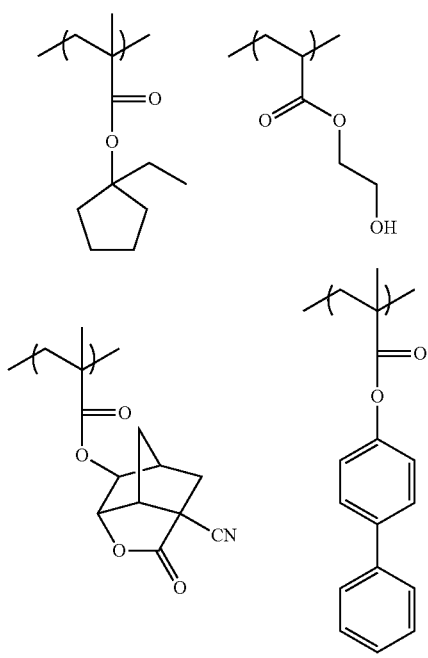
composition ratio: 10/45/30/5
Mw: 6800
Mw/Mn: 7.60
P-12
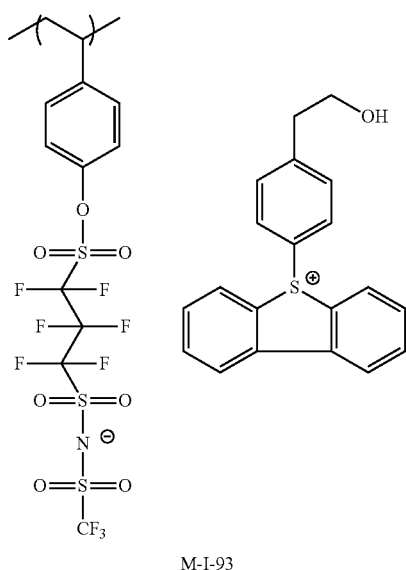
M-I-93
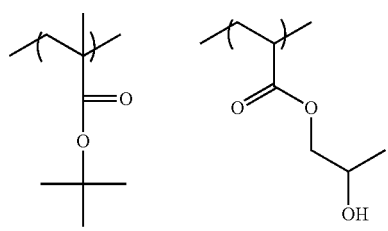
composition ratio: 10/35/55
Mw: 8900
Mw/Mn: 1.58
P-13
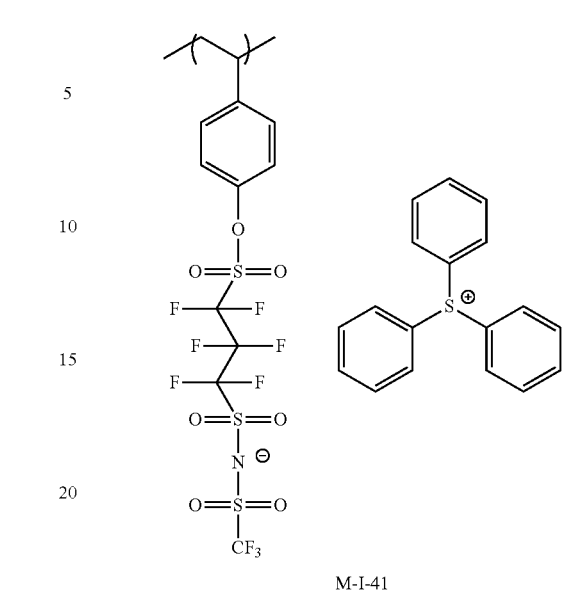
M-I-41
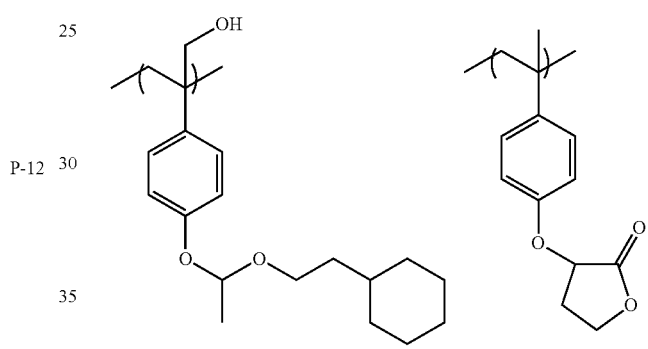
composition ratio: 15/75/10
Mw: 11000
Mw/Mn: 1.58
P-14
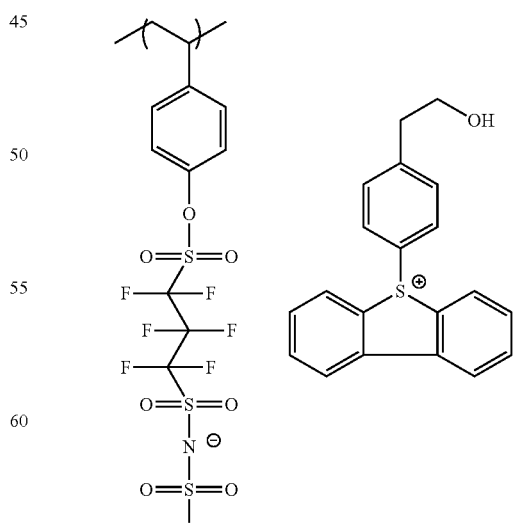
M-I-93

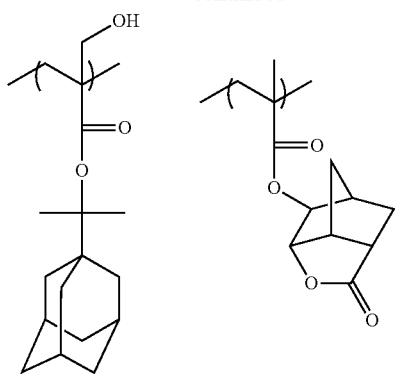
composition ratio: 7/63/30
Mw: 6900
Mw/Mn: 1.65
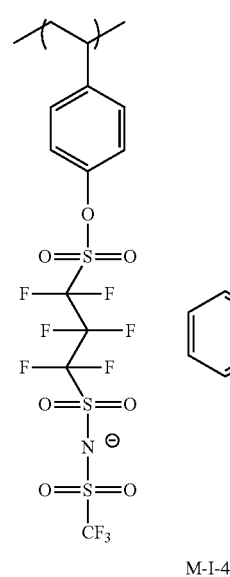
M-I-43
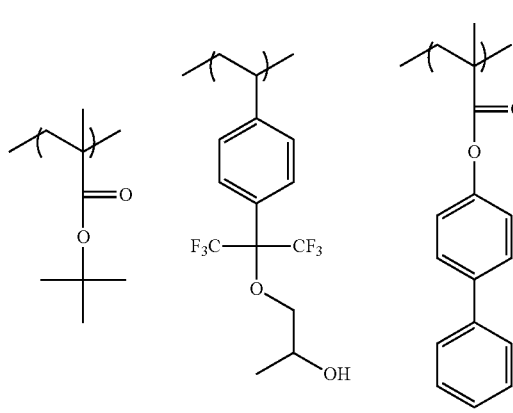
composition ratio: 10/37/50/3
Mw: 4500
Mw/Mn: 1.60
P-15
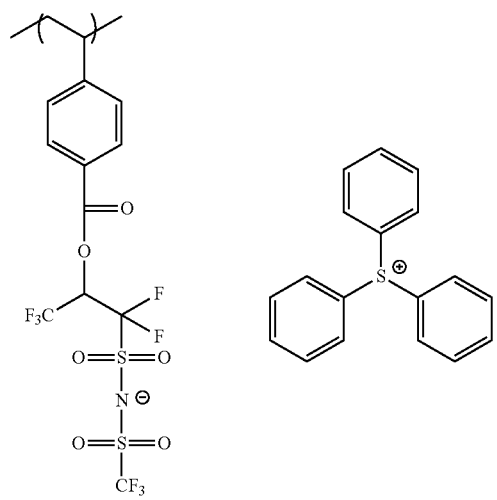
M-I-60
P-16
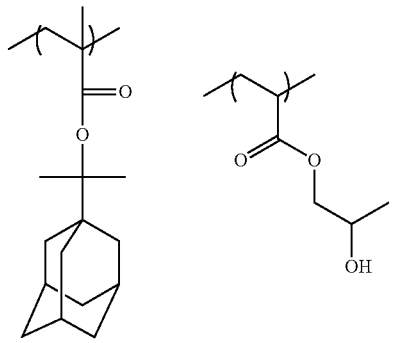
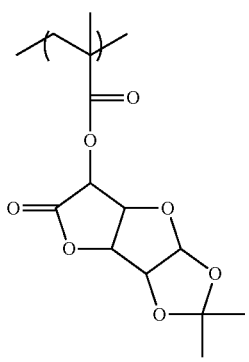
composition ratio: 15/25/50/10
Mw: 5800
Mw/Mn: 1.64

P-17
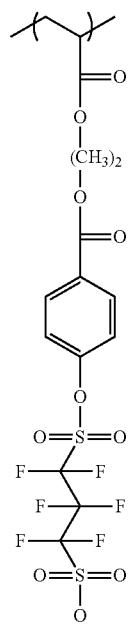
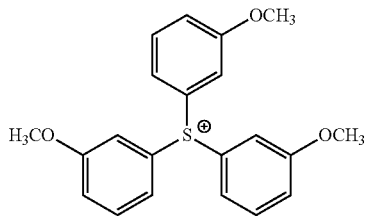
M-II-1
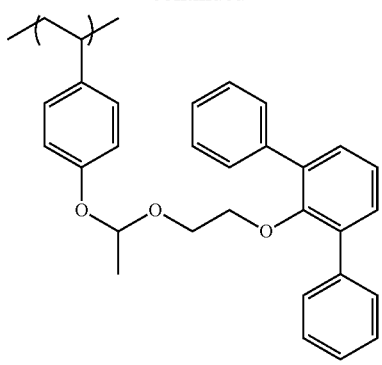
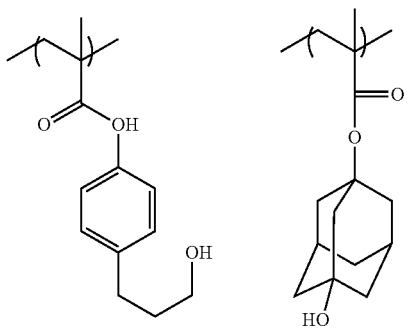
composition ratio: 10/55/30/5
Mw: 10800
Mw/Mn: 1.88
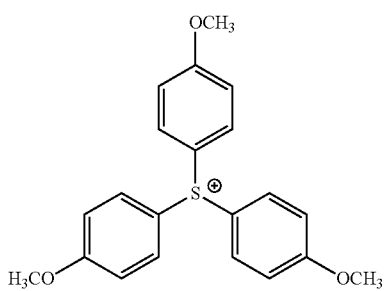
composition ratio: 10/40/45/5
Mw: 5800
Mw/Mn: 1.55
P-19
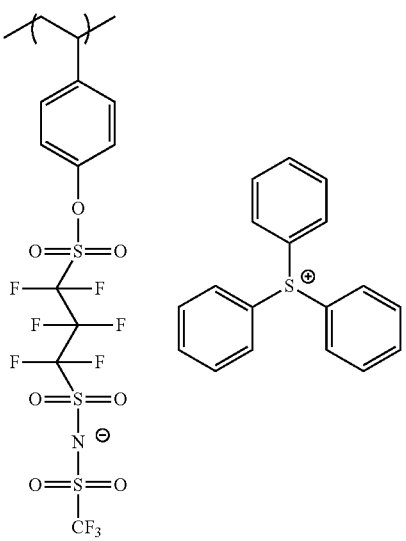
M-I-41
P-18
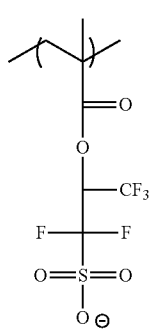
M-III-36

-continued
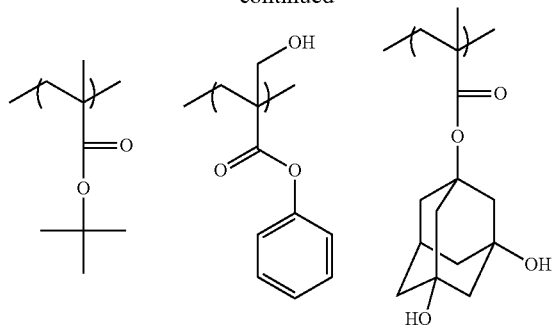
composition ratio: 10/40/20/30
Mw: 7700
Mw/Mn: 1.85
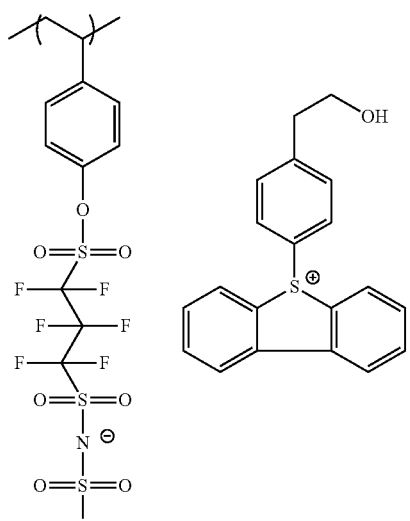
M-I-93
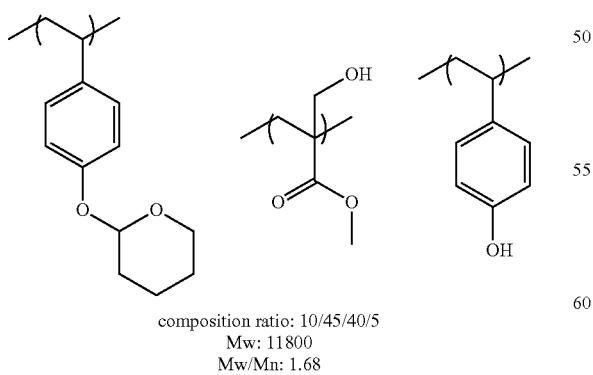
composition ratio: 10/45/40/5
Mw: 11800
Mw/Mn: 1.68
Other resins, photoacid generators, basic compounds, surfactants, and solvents used in Examples and Comparative Examples are shown below.
[Resins]
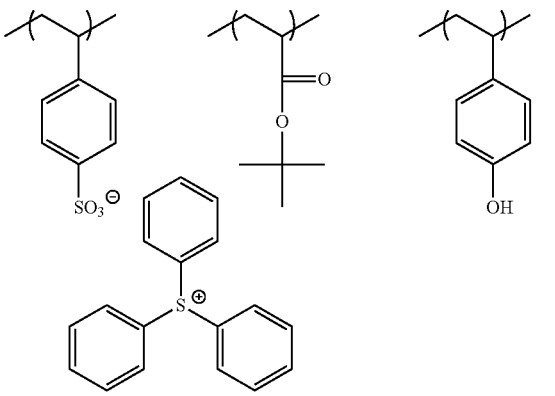
P-21
composition ratio: 5/35/60
Mw: 6900
Mw/Mn: 1.59
P-20
P-22
composition ratio: 10/30/60
Mw: 8500
Mw/Mn: 1.58
P-23
composition ratio: 40/60
Mw: 7200
Mw/Mn: 1.55

-continued

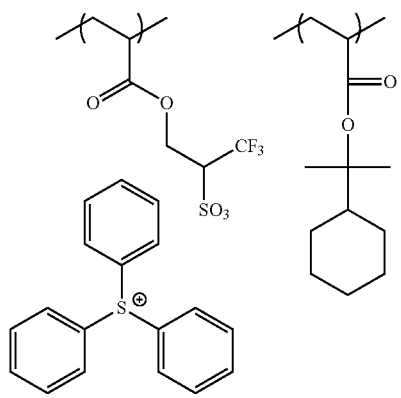

P-24 composition ratio: 7/63/30
Mw: 6900
Mw/Mn: 1.59

[Photoacid Generator]

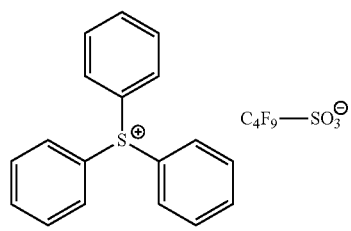

PAG-1

[Basic Compound]
TBAH: tetrabutylammonium hydroxide
TOA: tri(n-octyl)amine
TPI: triphenylimidazole

[Surfactant]
  W-1: Megafac F176 (manufactured by Dainippon Ink & Chemicals, Inc., fluorinated),
  W-2: Megafac R08 (manufactured by Dainippon Ink & Chemicals, Inc., fluorinated and siliconized), and
  W-3: Polysiloxane polymer KP-341 (manufactured by Shin-Etsu Chemical Co., Ltd., siliconized).
  W-4: PF6320 (manufactured by Omnova Solutions, Inc.,) (fluorinated)

[Solvent]
  S1: propylene glycol monomethyl ether acetate (PGMEA; 1-methoxy-2-acetoxypropane)
  S2: propylene glycol monomethyl ether (PGME; 1-methoxy-2-propanol)
  S3: cyclohexanone
  S4: γ-butyrolactone <Evaluation of Resist>

The components shown in Table 2 below were dissolved in a solvent to prepare a solution having a solid concentration of 4% by mass with respect to the individual component, and filtered through a polytetrafluoroethylene filter having a pore size of 0.10 μm, thereby preparing an active light ray sensitive or radioactive ray sensitive resin composition. The active light ray sensitive or radioactive ray sensitive resin composition was evaluated by the following methods and the results are shown in Table 2 below.

For each of the components shown in Table 2 below, the ratio in the case of using a plurality of components is a mass ratio.

Exposure Condition 1

EB Exposure

Examples 1 to 25 and Comparative Examples 1 to 4

The active light ray sensitive or radioactive ray sensitive resin composition prepared was uniformly applied onto a silicon substrate that had been subjected to a hexamethyldisilazane treatment using a spin coater, and dried by heating on a hot plate at 120° C. for 90 seconds to form an active light ray sensitive or radioactive ray sensitive film having a film thickness of 100 nm. This active light ray sensitive or radioactive ray sensitive film was irradiated with an electron beam by means of an electron beam irradiation apparatus (HL750 manufactured by Hitachi, Ltd., acceleration voltage 50 keV). Immediately after irradiation, the film was heated on a hot plate at 110° C. for 90 seconds. Further, the film was developed with an aqueous tetramethylammonium hydroxide solution having a concentration of 2.38% by mass at 23° C. for 60 seconds, rinsed with pure water for 30 seconds, and then spin-dried to obtain a resist pattern.

Exposure Condition 2

EUV Exposure

Examples 26 to 30

The active light ray sensitive or radioactive ray sensitive resin composition prepared was uniformly applied onto a silicon substrate that had been subjected to a hexamethyldisilazane treatment using a spin coater, and dried by heating on a hot plate at 120° C. for 90 seconds to form an active light ray sensitive or radioactive ray sensitive film having a film thickness of 100 nm. This active light ray sensitive or radioactive ray sensitive film was irradiated using an EUV irradiation apparatus. Immediately after irradiation, the film was heated on a hot plate at 110° C. for 90 seconds. Further, the film was developed with an aqueous tetramethylammonium hydroxide solution having a concentration of 2.38% by mass at 23° C. for 60 seconds, rinsed with pure water for 30 seconds, and then spin-dried to obtain a resist pattern.

(Evaluation of Sensitivity)

The cross-sectional shape of the pattern obtained was observed using a scanning electron microscope (S-9220, manufactured by Hitachi, Ltd.). The minimum irradiation energy for resolving a 100-nm line (line:space=1:1) was defined as the sensitivity.

(Evaluation of Resolving Power)

The resolving power was defined as a limiting resolving power (line and space separated and resolved from each other) under the irradiation amount exhibiting the above sensitivity.

(Evaluation of Pattern Configuration)

The cross-sectional shape of each 100-nm line pattern formed under the irradiation amount exhibiting the above sensitivity was observed using a scanning electron microscope (S-4300, manufactured by Hitachi, Ltd.), and evaluation was performed with two steps of "rectangle" and "tapering"

(Evaluation of LER)

Under the irradiation amount exhibiting the above sensitivity, a distance between an actual edge and a reference line on which edges were to be present was measured at an arbitrary 30 points within 50 μm in the longitudinal direction of a 100-nm line pattern using a scanning electron microscope (S-9220, manufactured by Hitachi, Ltd.), a standard deviation of the distance was determined, and 3σ was calculated therefrom.

(Outgassing Performance: Evaluation of Film Thickness Variation by Exposure)

The film was irradiated at an irradiation dose 2.0 times the irradiation dose giving the above-described sensitivity, the film thickness after exposure and before post-heating was measured, and the variation was determined from the thickness at the unexposed time according to the following formula:

Film thickness variation (%)=[(film thickness at unexposed time−film thickness after exposure)/film thickness at unexposed time]×100

These measurement results are shown in Table 2 below. Further, in Table 2, the concentration of each component means "% by mass" based on the total solids.

TABLE 2

| Examples | Resin (P) | Concentration | Other resin | Concentration | Conventional acid generator | Concentration | Basic compound | Concentration | Organic solvent |
|---|---|---|---|---|---|---|---|---|---|
| Example 1 | P-1 | 99.85 | None | | None | | TPI | 0.1 | S1/S2 |
| Example 2 | P-2 | 99.85 | None | | None | | TBAH | 0.1 | S1/S2 |
| Example 3 | P-3 | 99.75 | None | | None | | TPI | 0.2 | S1/S2 |
| Example 4 | P-4 | 89.75 | P-19 | 10 | None | | TPI | 0.2 | S1/S2 |
| Example 5 | P-5 | 99.85 | None | | None | | TBAH | 0.1 | S1/S2 |
| Example 6 | P-6 | 98.85 | None | | PAG-1 | 1 | TPI | 0.15 | S1/S2/S3 |
| Example 7 | P-7 | 99.85 | None | | None | | TPI | 0.1 | S1/S2 |
| Example 8 | P-8 | 99.85 | None | | None | | TPI | 0.1 | S1/S2 |
| Example 9 | P-9 | 99.9 | None | | None | | TBAH | 0.05 | S1/S2 |
| Example 10 | P-10 | 99.85 | None | | None | | TPI | 0.1 | S3/S4 |
| Example 11 | P-11 | 99.8 | None | | None | | TBAH | 0.15 | S1/S2 |
| Example 12 | P-12 | 99.85 | None | | None | | TBAH | 0.1 | S1/S2 |
| Example 13 | P-13 | 99.85 | None | | None | | TBAH | 0.1 | S1/S2 |
| Example 14 | P-14 | 99.75 | None | | None | | TPI | 0.2 | S1/S2 |
| Example 15 | P-15 | 99.85 | None | | None | | TOA | 0.1 | S1/S2 |
| Example 16 | P-16 | 99.75 | None | | None | | TPI | 0.2 | S1/S2/S3 |
| Example 17 | P-17 | 99.85 | None | | None | | TPI | 0.1 | S1/S2 |
| Example 18 | P-18 | 99.85 | None | | None | | TPI | 0.1 | S1/S2 |
| Example 19 | P-19 | 99.85 | None | | None | | TPI | 0.1 | S1/S2 |
| Example 20 | P-20 | 99.85 | None | | None | | TPI | 0.1 | S1/S2 |
| Example 21 | P-1 | 99.75 | None | | None | | TBAH | 0.2 | S1/S2 |
| Example 22 | P-3 | 99.85 | None | | None | | TBAH | 0.1 | S1/S2/S3 |
| Example 23 | P-8 | 99.65 | None | | None | | TBAH | 0.3 | S1/S2 |
| Example 24 | P-11 | 99.85 | None | | None | | TOA | 0.1 | S1/S2 |
| Example 25 | P-14 | 99.85 | None | | None | | TBAH | 0.1 | S1/S2 |
| Comparative Example 1 | P-21 | 99.85 | None | | None | | TBAH | 0.1 | S1/S2 |
| Comparative Example 2 | P-22 | 99.85 | None | | None | | TBAH | 0.1 | S1/S2 |
| Comparative Example 3 | P-23 | 89.95 | None | | PAG-1 | 10 | TOA | 0.1 | S1/S2 |
| Comparative Example 4 | P-24 | 99.85 | None | | None | | TBAH | 0.1 | S1/S2 |

| Examples | Mass ratio | Surfactant | Concentration | Total solid concentration | Sensitivity (μC/cm$^2$) | Resolving power (nm) | Pattern configuration | LER (nm) | Outgassing performance (%) |
|---|---|---|---|---|---|---|---|---|---|
| Example 1 | 40/60 | W-1 | 0.05 | 4.0 | 28.9 | 55 | Rectangle | 5.0 | 4.2 |
| Example 2 | 40/60 | W-2 | 0.05 | 4.0 | 29.4 | 65 | Rectangle | 6.4 | 3.9 |
| Example 3 | 40/60 | W-3 | 0.05 | 4.0 | 29.6 | 65 | Rectangle | 6.1 | 2.0 |
| Example 4 | 40/60 | W-1 | 0.05 | 4.0 | 31.6 | 70 | Rectangle | 5.8 | 1.5 |
| Example 5 | 40/60 | W-2 | 0.05 | 4.0 | 29.2 | 70 | Rectangle | 6.0 | 3.8 |
| Example 6 | 30/60/10 | None | 0 | 4.0 | 32.6 | 70 | Rectangle | 5.9 | 4.5 |
| Example 7 | 40/60 | W-1 | 0.05 | 4.0 | 30.1 | 55 | Rectangle | 5.5 | 4.2 |
| Example 8 | 40/60 | W-3 | 0.05 | 4.0 | 29.1 | 50 | Rectangle | 5.3 | 4.3 |
| Example 9 | 40/60 | W-2 | 0.05 | 4.0 | 27.6 | 55 | Rectangle | 6.0 | 4.5 |
| Example 10 | 40/60 | W-4 | 0.05 | 4.0 | 28.9 | 65 | Rectangle | 5.1 | 3.4 |
| Example 11 | 40/60 | W-2 | 0.05 | 4.0 | 29.6 | 55 | Rectangle | 5.0 | 4.2 |
| Example 12 | 40/60 | W-1 | 0.05 | 4.0 | 28.4 | 50 | Rectangle | 5.0 | 1.9 |
| Example 13 | 40/60 | W-3 | 0.05 | 4.0 | 26.9 | 55 | Rectangle | 5.3 | 3.9 |
| Example 14 | 40/60 | W-2 | 0.05 | 4.0 | 31.5 | 60 | Rectangle | 5.2 | 1.6 |
| Example 15 | 40/60 | W-1 | 0.05 | 4.0 | 29.6 | 55 | Rectangle | 5.4 | 3.8 |
| Example 16 | 30/60/10 | W-2 | 0.05 | 4.0 | 26.9 | 65 | Rectangle | 5.4 | 4.1 |
| Example 17 | 40/60 | W-1 | 0.05 | 4.0 | 29.6 | 60 | Rectangle | 5.2 | 2.5 |
| Example 18 | 40/60 | W-1 | 0.05 | 4.0 | 29.5 | 65 | Rectangle | 5.6 | 2.5 |
| Example 19 | 40/60 | W-1 | 0.05 | 4.0 | 29.3 | 65 | Rectangle | 5.6 | 4.2 |
| Example 20 | 40/60 | W-1 | 0.05 | 4.0 | 29.1 | 60 | Rectangle | 5.6 | 3.3 |

TABLE 2-continued

| Example | | | | | | | | | |
|---|---|---|---|---|---|---|---|---|---|
| Example 21 | 40/60 | W-1 | 0.05 | 4.0 | 30.5 | 50 | Rectangle | 4.9 | 4.3 |
| Example 22 | 30/60/10 | W-3 | 0.05 | 4.0 | 29.5 | 70 | Rectangle | 5.1 | 2.2 |
| Example 23 | 40/60 | W-2 | 0.05 | 4.0 | 29.4 | 50 | Rectangle | 5.2 | 4.1 |
| Example 24 | 40/60 | W-1 | 0.05 | 4.0 | 28.9 | 55 | Rectangle | 5.6 | 4.2 |
| Example 25 | 40/60 | W-2 | 0.05 | 4.0 | 30.5 | 55 | Rectangle | 5.2 | 1.9 |
| Comparative Example 1 | 40/60 | W-2 | 0.05 | 4.0 | 32.8 | 75 | Rectangle | 7.0 | 4.5 |
| Comparative Example 2 | 40/60 | W-1 | 0.05 | 4.0 | 35.5 | 75 | Rectangle | 7.5 | 4.8 |
| Comparative Example 3 | 40/60 | W-3 | 0.05 | 4.0 | 38.6 | 90 | Tapering | 8.0 | 7.5 |
| Comparative Example 4 | 40/60 | W-1 | 0.05 | 4.0 | 36.5 | 75 | Rectangle | 6.8 | 4.9 |

| Examples | Resin (P) | Concentration | Other resin | Concentration | Conventional acid generator | Concentration | Basic compound | Concentration |
|---|---|---|---|---|---|---|---|---|
| Example 26 | P-1 | 99.85 | None | | None | | TPI | 0.1 |
| Example 27 | P-1 | 99.85 | None | | None | | TPI | 0.1 |
| Example 28 | P-3 | 99.85 | None | | None | | TBAH | 0.1 |
| Example 29 | P-8 | 99.85 | None | | None | | TBAH | 0.1 |
| Example 30 | P-14 | 99.85 | None | | None | | TPI | 0.1 |

| Examples | Organic solvent | Mass ratio | Surfactant | Concentration | Total solid concentration | Sensitivity (mJ/cm$^2$) | Pattern configuration |
|---|---|---|---|---|---|---|---|
| Example 26 | S1/S2 | 40/60 | W-1 | 0.05 | 4.0 | 20.2 | Rectangle |
| Example 27 | S1/S2 | 40/60 | W-1 | 0.05 | 4.0 | 21.2 | Rectangle |
| Example 28 | S1/S2 | 40/60 | W-1 | 0.05 | 4.0 | 19.5 | Rectangle |
| Example 29 | S1/S2 | 40/60 | W-1 | 0.05 | 4.0 | 22.6 | Rectangle |
| Example 30 | S1/S2 | 40/60 | W-1 | 0.05 | 4.0 | 19.8 | Rectangle |

From the results described in the Tables above, it is apparent that the active light ray sensitive or radioactive ray sensitive resin composition of the present invention satisfies high sensitivity, high resolution, good pattern configuration, good line edge roughness, low outgassing performance, and excellent stability over time at the same time with respect to EB exposure.

It is also apparent that the active light ray sensitive or radioactive ray sensitive resin composition of the present invention satisfies high sensitivity and good pattern configuration at the same time with respect to EUV exposure.

What is claimed is:

1. An active light ray sensitive or radioactive ray sensitive resin composition comprising:
   a resin (P) containing a repeating unit (A) which decomposes by irradiation with the active light ray or the radioactive ray to generate an acid, and a repeating unit (C) containing a primary or secondary hydroxyl group, wherein
   the repeating unit (A) is a repeating unit represented by the general formula (I) or the general formula (II):

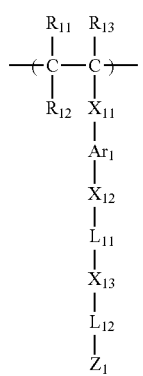

(I)

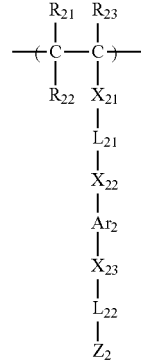

(II)

wherein in the general formula (I) and (II),
each of $R_{11}$, $R_{12}$, $R_{13}$, $R_{21}$, $R_{22}$, and $R_{23}$ independently represents a hydrogen atom, an alkyl group, a monovalent aliphatic hydrocarbon ring group, a halogen atom, a cyano group, or an alkoxycarbonyl group;
each of $X_{11}$, $X_{13}$, and $X_{22}$ independently represents a single bond, —O—, —S—, —CO—, —SO$_2$—, —NR—, a divalent nitrogen-containing non-aromatic heterocyclic group, or a group formed by combination thereof, wherein R represents a hydrogen atom or an alkyl group;
$X_{12}$ represents —OCO—, —OSO$_2$—, —NR—, or a divalent nitrogen-containing non-aromatic heterocyclic group, wherein R represents a hydrogen atom or an alkyl group;
$X_{21}$ represents —O—, —S—, —CO—, —SO$_2$—, —NR—, a divalent nitrogen-containing non-aromatic heterocyclic group, or a group formed by combination thereof, wherein R represents a hydrogen atom or an alkyl group;
$X_{23}$ represents a single bond, —O—, —S—, —SO$_2$—, —NR—, a divalent nitrogen-containing non-aromatic heterocyclic group, or a group formed by combination thereof, wherein R represents a hydrogen atom or an alkyl group;

$L_{11}$ represents a single bond, an alkylene group, an alkenylene group, a divalent aliphatic hydrocarbon ring group, a divalent aromatic ring group, or a group formed by combination of two or more thereof;

$L_{12}$ represents a single bond, an alkylene group, an alkenylene group, a divalent aliphatic hydrocarbon ring group, a divalent aromatic ring group, or a group formed by combination of two or more thereof, in which the hydrogen atoms of these groups are partially or entirely substituted with a substituent selected from among a fluorine atom, a fluoroalkyl group, a nitro group, and a cyano group;

each of $Ar_1$ and $Ar_2$ represents a divalent aromatic ring group, or a group formed by combination of a divalent aromatic ring group and an alkylene group;

each of $Z_1$ and $Z_2$ represents a moiety that is converted to a sulfonate group, an imidate group, or a methide group by irradiation with active light ray or radioactive ray;

$L_{21}$ represents an alkylene group, an alkenylene group, a divalent aliphatic hydrocarbon ring group, or a group formed by combination of two or more thereof;

$L_{22}$ represents an alkylene group, an alkenylene group, a divalent aliphatic hydrocarbon ring group, a divalent aromatic ring group, or a group formed by combination of two or more thereof, in which the hydrogen atoms of these groups are partially or entirely substituted with a substituent selected from among a fluorine atom, a fluoroalkyl group, a nitro group, and a cyano group.

2. The composition according to claim 1, wherein the repeating unit (C) is represented by the following general formula (IV):

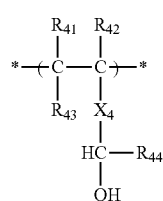
(IV)

wherein in the formula (IV), each of $R_{41}$, $R_{42}$, and $R_{43}$ independently represents a hydrogen atom, an alkyl group, a monovalent aliphatic hydrocarbon ring group, a halogen atom, a cyano group, or an alkoxycarbonyl group, provided that $R_{43}$ may be combined with $X_4$ to form a ring, and in this case, $R_{43}$ represents an alkylene group;

$R_{44}$ represents a hydrogen atom or a monovalent substituent, provided that $R_{44}$ may be combined with $X_4$ to form a ring, and in this case, $R_{44}$ represents an alkylene group; and $X_4$ represents a linking group.

3. The composition according to claim 1, wherein the repeating unit (C) is represented by the following general formula (VII):

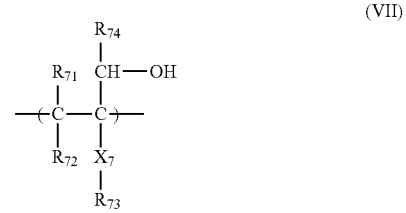
(VII)

wherein in formula (VII)

each of $R_{71}$ and $R_{72}$ independently represents a hydrogen atom, an alkyl group, a monovalent aliphatic hydrocarbon ring group, a halogen atom, a cyano group, or an alkoxycarbonyl group, provided that $R_{72}$ may be combined with $X_7$ to form a ring, and in this case, $R_{72}$ represents an alkylene group;

each of $R_{73}$ and $R_{74}$ independently represents a hydrogen atom or a monovalent substituent; and $X_7$ represents a linking group.

4. The composition according to claim 1, wherein the resin (P) further contains a repeating unit (B) which decomposes by the action of an acid to generate an alkali-soluble group.

5. The composition according to claim 2, wherein the resin (P) further contains a repeating unit (B) which decomposes by the action of an acid to generate an alkali-soluble group.

6. The composition according to claim 3, wherein the resin (P) further contains a repeating unit (B) which decomposes by the action of an acid to generate an alkali-soluble group.

7. The composition according to claim 4, wherein the repeating unit (B) is represented by the following general formula (V) or (VI):

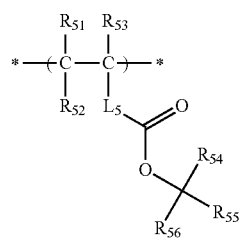
(V)

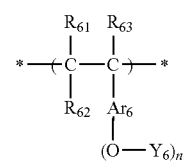
(VI)

wherein in the general formula (V), each of $R_{51}$, $R_{52}$, and $R_{53}$ independently represents a hydrogen atom, an alkyl group, a monovalent aliphatic hydrocarbon ring group, a halogen atom, a cyano group, or an alkoxycarbonyl group, provided that $R_{52}$ may be combined with $L_5$ to form a ring, and in this case, $R_{52}$ represents an alkylene group;

$R_{54}$ represents an alkyl group, and each of $R_{55}$ and $R_{56}$ independently represents a hydrogen atom, an alkyl group, a monovalent aliphatic hydrocarbon ring group or a monovalent aromatic ring group, provided that $R_{55}$ and $R_{56}$ may be bonded to each other to form a ring, and further provided that $R_{55}$ and $R_{56}$ are not a hydrogen atom at the same time; and $L_5$ represents a single bond or a linking group, and in the general formula (VI), each of $R_{61}$, $R_{62}$, and $R_{63}$ independently represents a hydrogen atom, an alkyl group, a monovalent aliphatic hydrocarbon ring group, a halogen atom, a cyano group, or an alkoxycarbonyl group, provided that $R_{62}$ may be combined with $Ar_6$ to form a ring, and in this case, $R_{62}$ represents an alkylene group;

$Ar_6$ represents an aromatic ring group;

in the case of n≥2, each of $Y_6$'s independently represents a hydrogen atom or a group cleaved by the action of an acid, provided that at least one of $Y_6$'s represents a group cleaved by the action of an acid; and n represents an integer of 1 to 4.

8. The composition according to claim 5, wherein the repeating unit (B) is represented by the following general formula (V) or (VI):

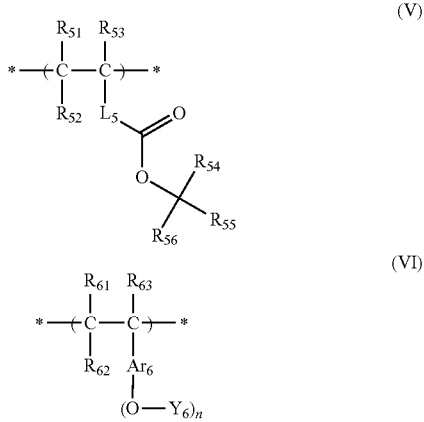

wherein in the general formula (V), each of $Y_6$'s $R_{51}$, $R_{52}$, and $R_{53}$ independently represents a hydrogen atom, an alkyl group, a monovalent aliphatic hydrocarbon ring group, a halogen atom, a cyano group, or an alkoxycarbonyl group, provided that $R_{52}$ may be combined with $L_5$ to form a ring, and in this case, $R_{52}$ represents an alkylene group;

$R_{54}$ represents an alkyl group, each of $R_{55}$ and $R_{56}$ independently represents a hydrogen atom, an alkyl group, a monovalent aliphatic hydrocarbon ring group or a monovalent aromatic ring group, provided that $R_{55}$ and $R_{56}$ may be bonded to each other to form a ring, and further provided that $R_{55}$ and $R_{56}$ are not a hydrogen atom at the same time; and $L_5$ represents a single bond or a linking group, and in the general formula (VI), each of $R_{62}$, and $R_{63}$ independently represents a hydrogen atom, an alkyl group, a monovalent aliphatic hydrocarbon ring group, a halogen atom, a cyano group, or an alkoxycarbonyl group, provided that $R_{62}$ may be combined with $Ar_6$ to form a ring, and in this case, $R_{62}$ represents an alkylene group;

$Ar_6$ represents an aromatic ring group;

in the case of n≥2, each of $Y_6$'s independently represents a hydrogen atom or a group cleaved by the action of an acid, provided that at least one of $Y_6$'s represents a group cleaved by the action of an acid; and n represents an integer of 1 to 4.

9. The composition according to claim 6, wherein the repeating unit (B) is represented by the following general formula (V) or (VI):

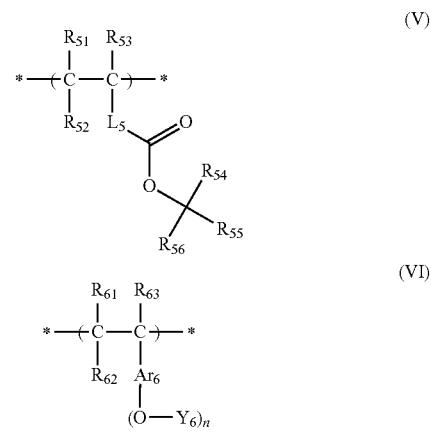

wherein in the general formula (V), each of $R_{51}$, $R_{52}$, and $R_{53}$ independently represents a hydrogen atom, an alkyl group, a monovalent aliphatic hydrocarbon ring group, a halogen atom, a cyano group, or an alkoxycarbonyl group, provided that $R_{52}$ may be combined with $L_5$ to form a ring, and in this case, $R_{52}$ represents an alkylene group;

$R_{54}$ represents an alkyl group; each of $R_{55}$ and $R_{56}$ independently represents a hydrogen atom, an alkyl group, a monovalent aliphatic hydrocarbon ring group or a monovalent aromatic ring group, provided that $R_{55}$ and $R_{56}$ may be bonded to each other to form a ring, and further provided that $R_{55}$ and $R_{56}$ are not a hydrogen atom at the same time; and $L_5$ represents a single bond or a linking group, and in the general formula (VI), each of $R_{61}$, $R_{62}$, and $R_{63}$ independently represents a hydrogen atom, an alkyl group, a monovalent aliphatic hydrocarbon ring group, a halogen atom, a cyano group, or an alkoxycarbonyl group, provided that $R_{62}$ may be combined with $Ar_6$ to form a ring, and in this case, $R_{62}$ represents an alkylene group;

$Ar_6$ represents an aromatic ring group;

in the case of n≥2, each of $Y_6$'s independently represents a hydrogen atom or a group cleaved by the action of an acid, provided that at least one of $Y_6$'s represents a group cleaved by the action of an acid; and n represents an integer of 1 to 4.

10. An active light ray sensitive or radioactive ray sensitive film formed by using the composition according to claim 1.

11. A pattern-forming method comprising:

forming a film using the composition according to claim 1, exposing the film, and developing the exposed film.

12. The composition according to claim 1, wherein the repeating unit (A) is a repeating unit represented by the general formula (I):

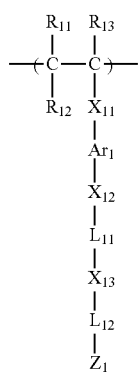

(I)

wherein in the general formula (I),
X$_{11}$ represents a single bond; and
R$_{11}$, R$_{12}$, R$_{13}$, X$_{12}$, X$_{13}$, L$_{11}$, L$_{12}$, Ar$_1$, and Z$_1$ have the same meanings as in claim 1.

13. The composition according to claim 1, further containing a compound that increases basicity by the action of an acid.

14. An active light ray sensitive or radioactive ray sensitive resin composition comprising:
a resin (P) containing a repeating unit (A) which decomposes by irradiation with the active light ray or the radioactive ray to generate an acid, and a repeating unit (C) containing a primary or secondary hydroxyl group, wherein
the repeating unit (C) is represented by the following general formula (IV):

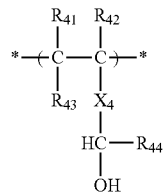

(IV)

wherein in the formula (IV),
each of R$_{41}$, R$_{42}$, and R$_{43}$ independently represents a hydrogen atom, an alkyl group, a monovalent aliphatic hydrocarbon ring group, a halogen atom, a cyano group, or an alkoxycarbonyl group, and R$_{43}$ may be combined with X$_4$ to form a ring, and in this case, R$_{43}$ represents an alkylene group;
R$_{44}$ represents a monovalent substituent, and R$_{44}$ may be combined with X$_4$ to form a ring, and in this case, R$_{44}$ represents an alkylene group; and
X$_4$ represents a linking group.

15. The composition according to claim 1, wherein
the repeating unit (A) is a repeating unit represented by the general formula (III):

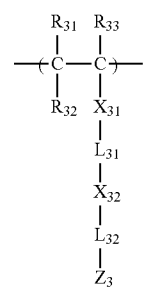

(III)

wherein in the general formula (III),
each of R$_{31}$, R$_{32}$, and R$_{33}$ independently represents a hydrogen atom, an alkyl group, a monovalent aliphatic hydrocarbon ring group, a halogen atom, a cyano group, or an alkoxycarbonyl group;
X$_{31}$ represents —COO—;
X$_{32}$ represents —COO— or —OCO—;
L$_{31}$ represents a single bond, an alkylene group, an alkenylene group, a divalent aliphatic hydrocarbon ring group, or a group formed by combination of two or more thereof;
L$_{32}$ represents —CF$_2$— or —CF$_2$—CH(CF$_3$)—; and
Z$_3$ represents a moiety that becomes a sulfonate group, an imidate group, or a methide group by irradiation with active light ray or radioactive ray.

* * * * *